United States Patent
Frauenrath et al.

(10) Patent No.: US 10,787,576 B2
(45) Date of Patent: Sep. 29, 2020

(54) METHOD FOR THE PREPARATION OF A COATING COMPRISING OLIGOMERIC ALKYNES

(71) Applicant: ÉCOLE POLYTECHNIQUE FÉDÉRALE DE LAUSANNE (EPFL) EPFL-TTO, Lausanne (CH)

(72) Inventors: Holger Frauenrath, Lausanne (CH); Stephen Schrettl, Lausanne (CH); Bjoern Schulte, Morges (CH); Yves Leterrier, Lausanne (CH)

(73) Assignee: ÉCOLE POLYTECHNIQUE FÉDÉRALE DE LAUSANNE (EPFL) EPFL-TTO, Lausanne (CH)

( * ) Notice: Subject to any disclaimer, the term of this patent is extended or adjusted under 35 U.S.C. 154(b) by 0 days.

(21) Appl. No.: 15/570,538

(22) PCT Filed: May 2, 2016

(86) PCT No.: PCT/EP2016/059773
§ 371 (c)(1),
(2) Date: Oct. 30, 2017

(87) PCT Pub. No.: WO2016/174266
PCT Pub. Date: Nov. 3, 2016

(65) Prior Publication Data
US 2019/0048202 A1 Feb. 14, 2019

Related U.S. Application Data

(60) Provisional application No. 62/154,807, filed on Apr. 30, 2015.

(30) Foreign Application Priority Data

May 27, 2015 (WO) .................. PCT/EP2015/061763

(51) Int. Cl.
*C09D 4/00* (2006.01)
*G03F 7/025* (2006.01)
(Continued)

(52) U.S. Cl.
CPC .................. *C09D 4/00* (2013.01); *C09D 5/00* (2013.01); *C09D 149/00* (2013.01); *G03F 7/025* (2013.01); *C08F 38/00* (2013.01); *G03F 7/165* (2013.01)

(58) Field of Classification Search
CPC ......... C08L 49/00; C09D 149/00; C09D 4/00; C08F 38/00; C08F 138/00; C08F 238/00; G03F 7/025
See application file for complete search history.

(56) References Cited

U.S. PATENT DOCUMENTS

| | | | |
|---|---|---|---|
| 4,927,897 A * | 5/1990 | Kawata | C08F 38/00 502/159 |
| 4,954,428 A | 9/1990 | Lewis et al. | |

(Continued)

FOREIGN PATENT DOCUMENTS

WO 2016/189047 12/2016

OTHER PUBLICATIONS

Schrettl et al., "Functional carbon nanosheets prepared from hexayne amphiphile monolayers at room temperature," Nature Chem. 6, 468-476, Supplementary Information (May 4, 2014).*

(Continued)

*Primary Examiner* — Kregg T Brooks
(74) *Attorney, Agent, or Firm* — Honigman LLP; Andrew N. Weber; Jonathan P. O'Brien

(57) ABSTRACT

The invention relates to a method for the preparation of a coating comprising at least one coating layer on a substrate, the method comprising the steps of a. providing monomers (Continued)

of the type R—(N)$_x$-(L)$_m$-(C≡C)$_n$-(L')$_o$-(N')$_y$—R', wherein R is a head moiety, R' is a tail moiety, (C≡C)$_n$ is an oligoyne moiety, L and L' are linker moieties, N and N' independently are branched or unbranched optionally substituted C$_1$-C$_{25}$ alkyl moieties optionally containing 1 to 5 heteroatoms, x, m, o, and y are independently 0 or 1, n is 4 to 12, and wherein the head moiety allows for an interaction with the surface of the substrate; b. bringing the monomers into contact with the substrate wherein the interaction of the head moieties of the monomers with the surface of the substrate induces at least a part of the monomers to align in a defined manner thereby forming a film on the surface and bringing the oligoyne moieties of the monomers into close contact with each other; c. inducing a reaction between oligoyne moieties by providing an external stimulus so as to at least partially cross-link the aligned monomers, thereby forming a coating layer on the substrate. The invention further relates to a coating obtainable according to the method of the invention, the use of a coating obtainable according to the method of the invention, a substrate comprising a coating obtainable according to the invention and the use of solid substrate. The invention further relates to a method for the synthesis of the monomers according to the invention.

22 Claims, 59 Drawing Sheets

(51) Int. Cl.
*C09D 5/00* (2006.01)
*C09D 149/00* (2006.01)
*C08F 38/00* (2006.01)
*G03F 7/16* (2006.01)

(56) References Cited

U.S. PATENT DOCUMENTS

2006/0223947 A1  10/2006  Olesik et al.
2018/0171152 A1   6/2018  Frauenrath et al.

OTHER PUBLICATIONS

Written Opinion of the International Searching Authority for PCT/EP2016/059773 dated Dec. 5, 2016.
International Preliminary Report on Patentability for PCT/EP2016/059773 dated Nov. 9, 2017.
Schrettl, Stephen et al., "Facile synthesis of oligoyne amphiphiles and their rotaxanes", Chemical Science, vol. 6, No. 1, Jan. 1, 2015, pp. 564-574.
Schrettl, Stephen et al., "Functional carbon nanosheets prepared from hexayne amphiphile monolayers at room temperature", Nature Chemistry, vol. 6, No. 6, May 4, 2014, pp. 468-476.
Hoheisel, Tobias N. et al., "A Convenient Negishi Protocol for the Synthesis of Glycosylated Oligo(ethynylene)s", Organic Letters, vol. 10, No. 20, Oct. 16, 2008, pp. 4525-4528.
International Search Report for PCT/EP2016/061828 dated Sep. 2, 2016.
Written Opinion of the International Searching Authority for PCT/EP2016/061828 dated Sep. 2, 2016.
International Preliminary Report on Patentability for PCT/EP2016/061828 dated Nov. 28, 2017.
International Search Report for PCT/EP2016/059773 dated Dec. 5, 2016.

* cited by examiner

1

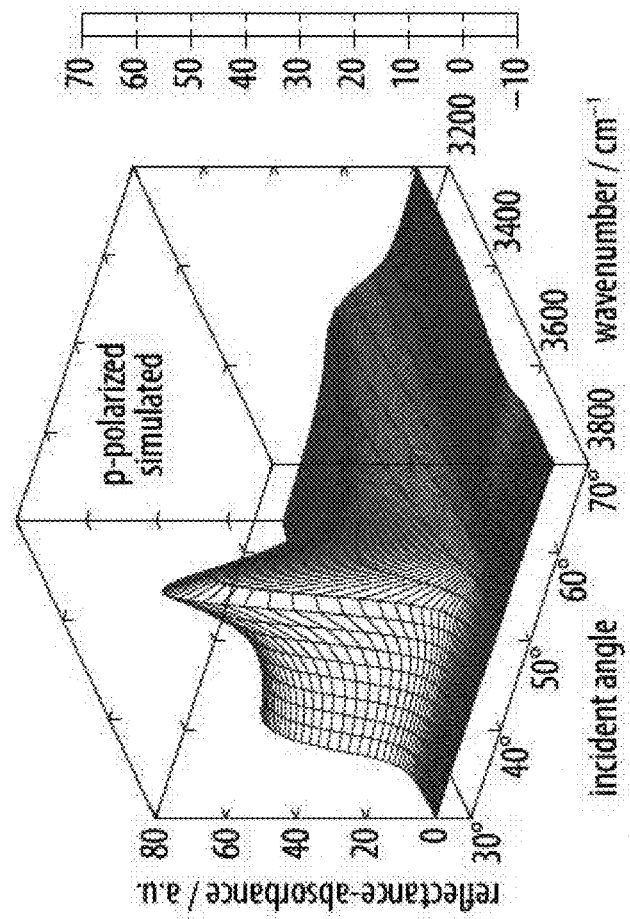
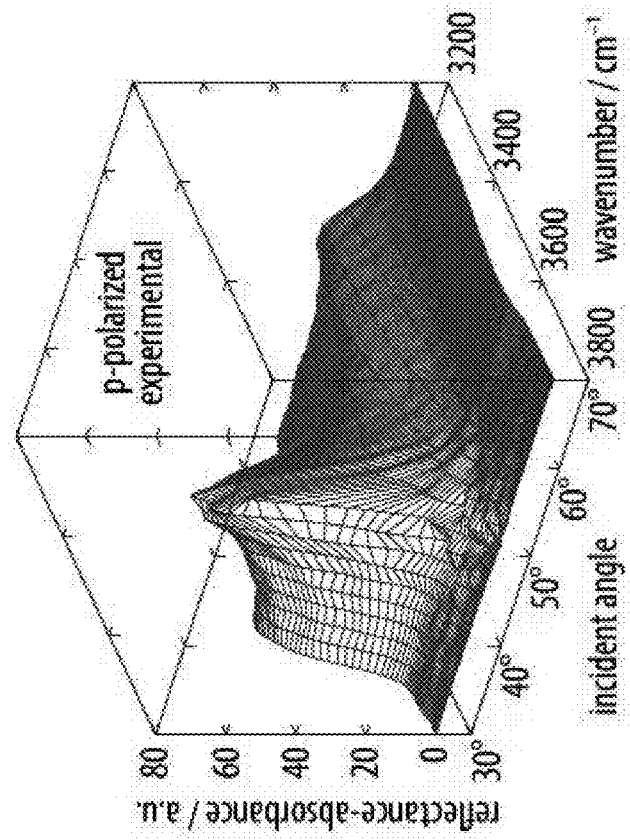
Figure 10A

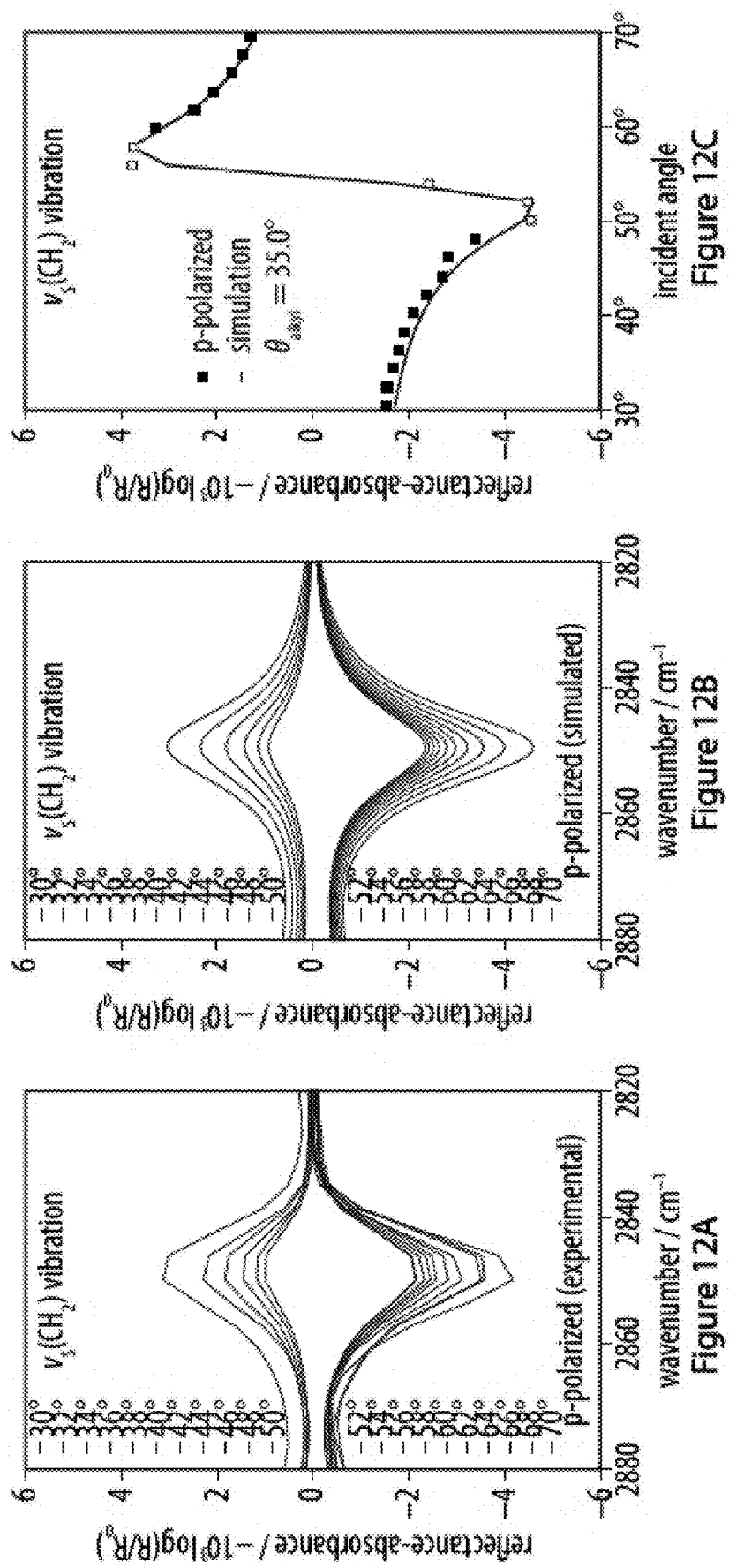

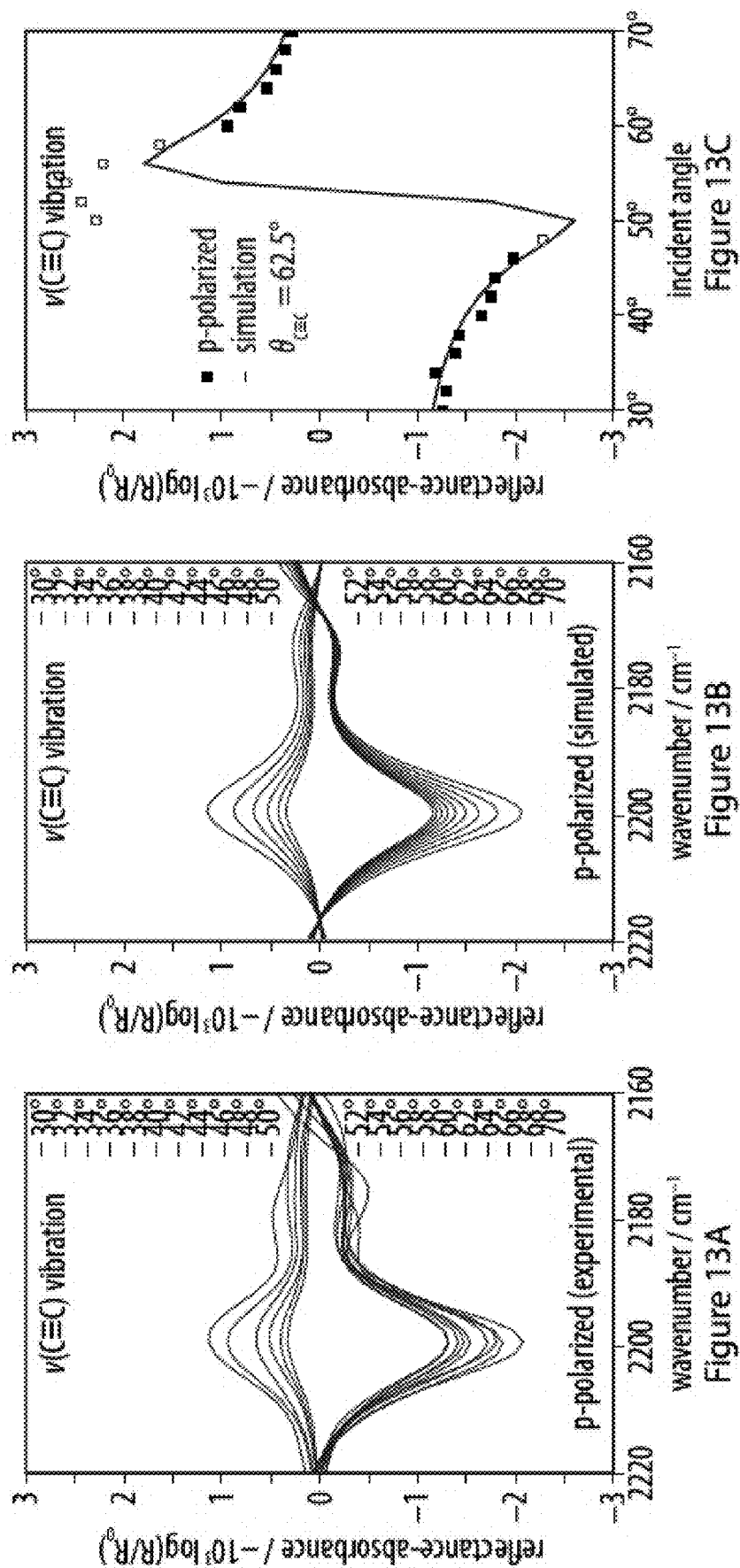

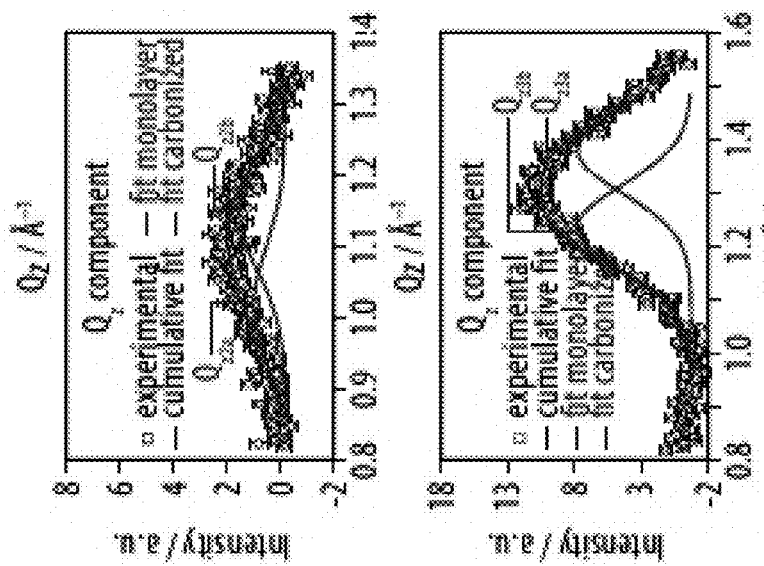
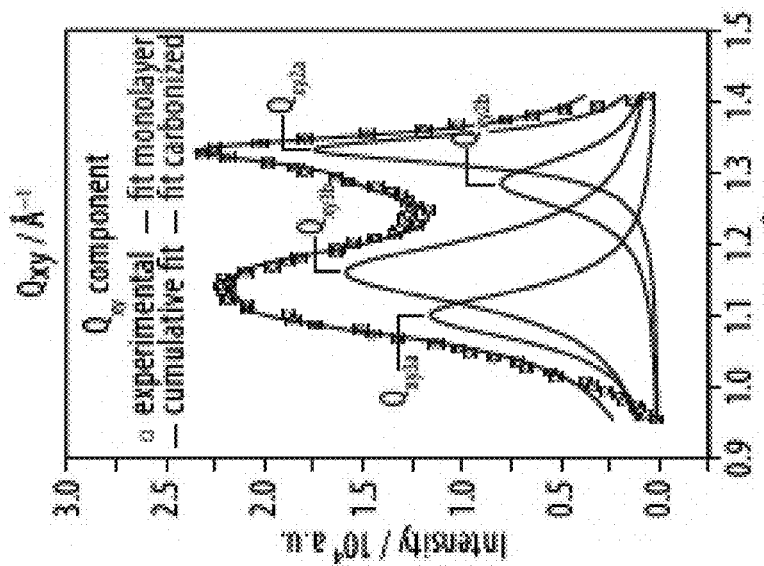
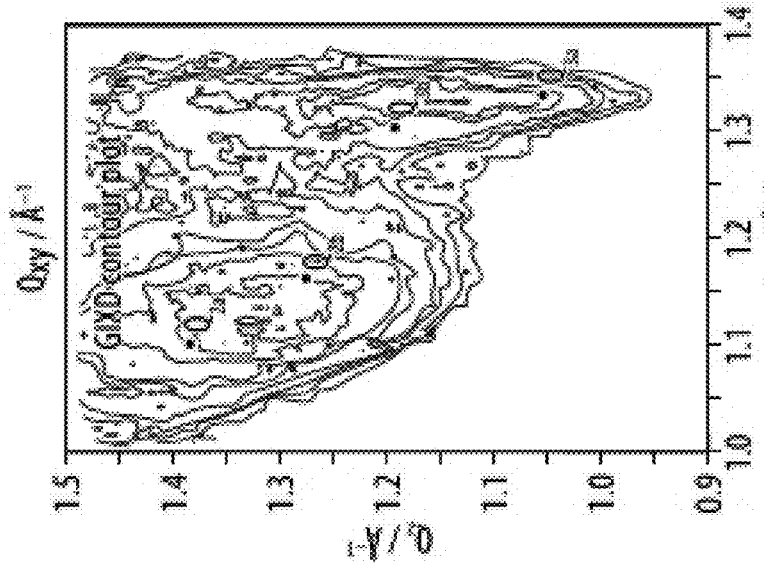
Figure 14I
Figure 14H
Figure 14G

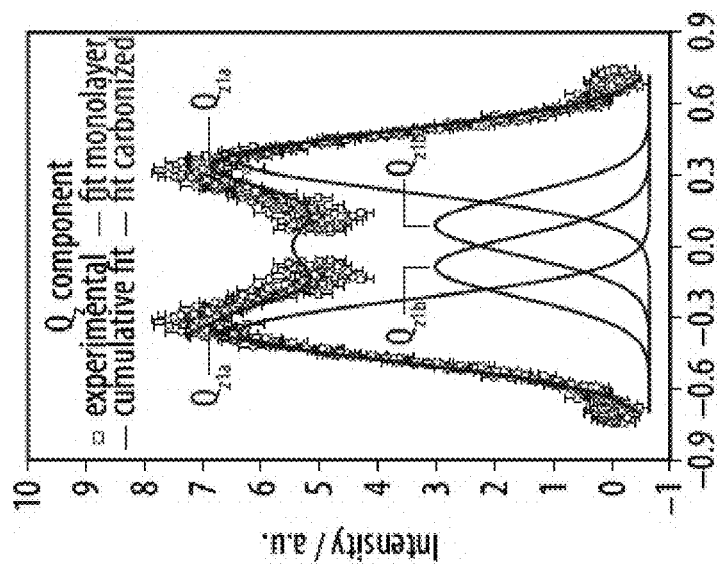
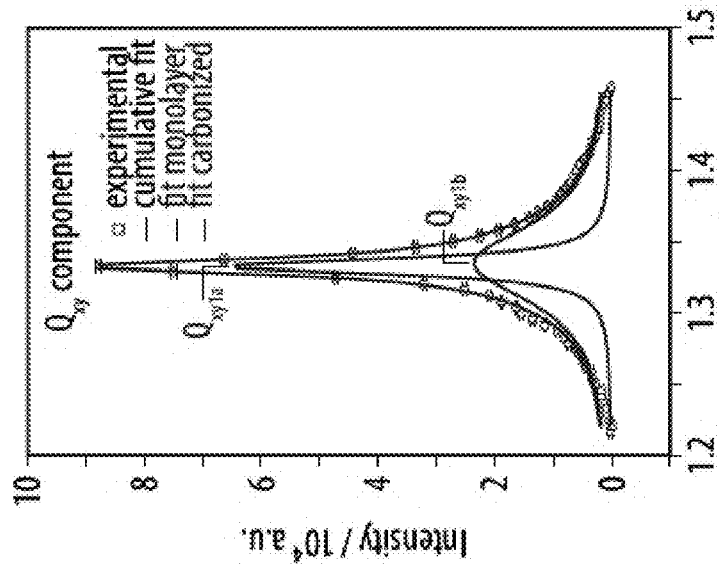
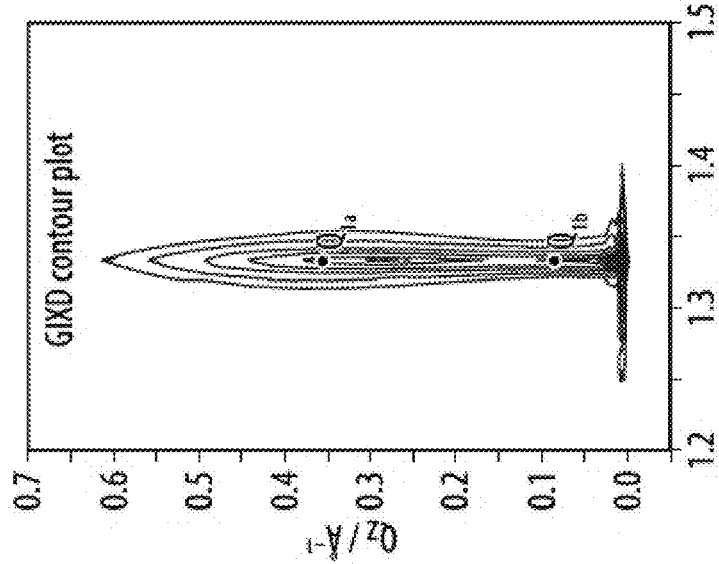
Figure 16A
Figure 16B
Figure 16C

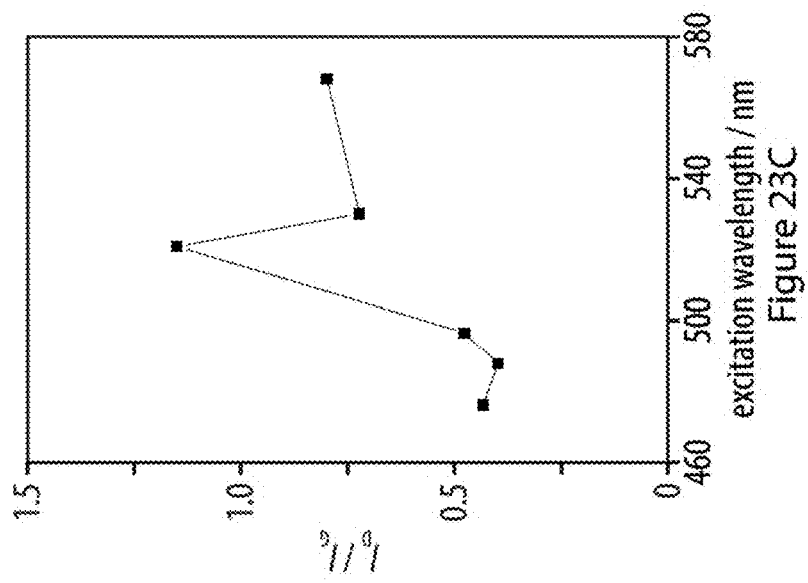
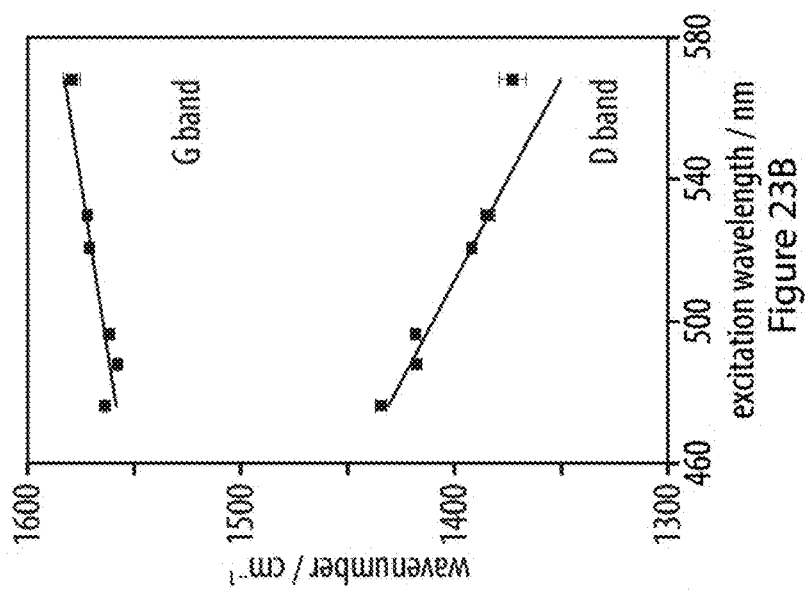
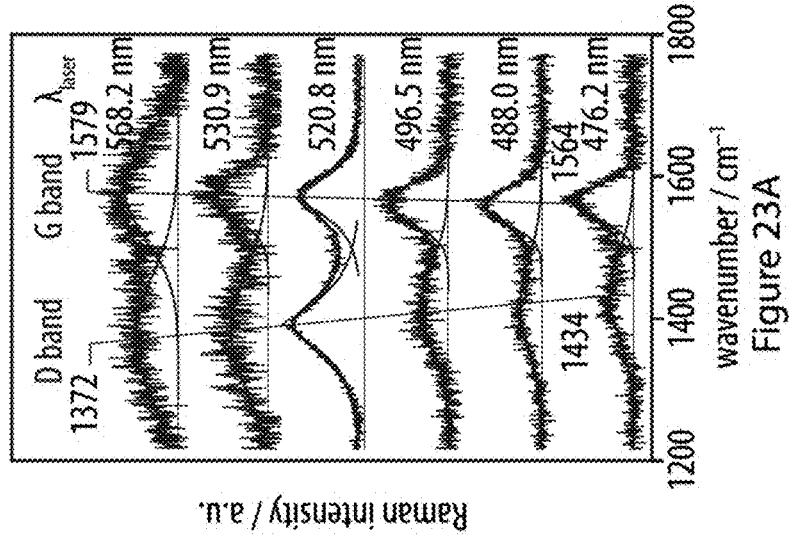
Figure 23C
Figure 23B
Figure 23A

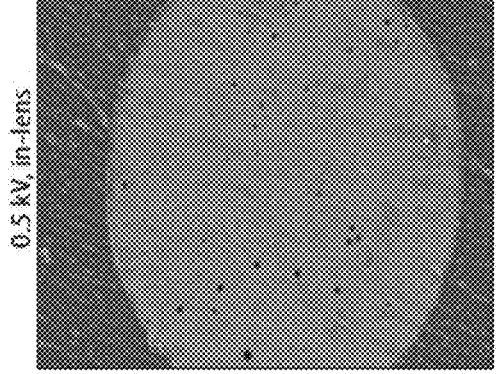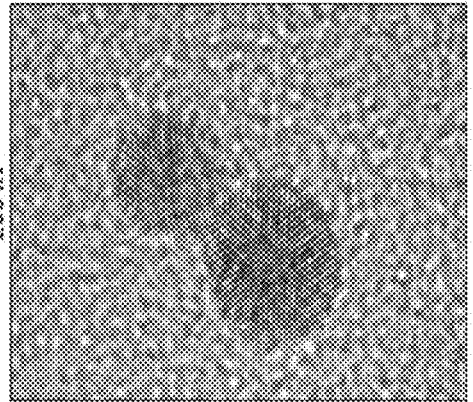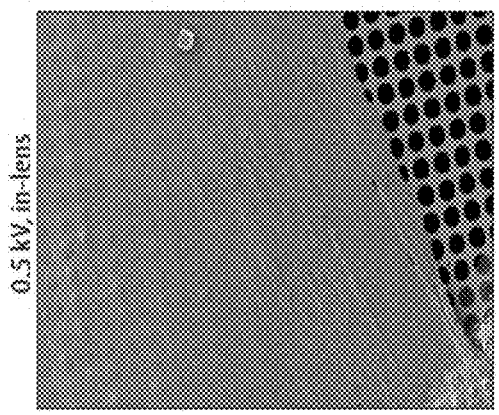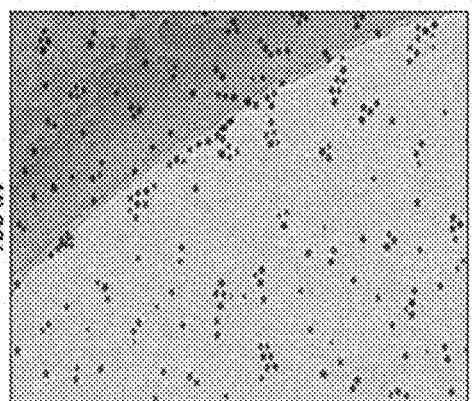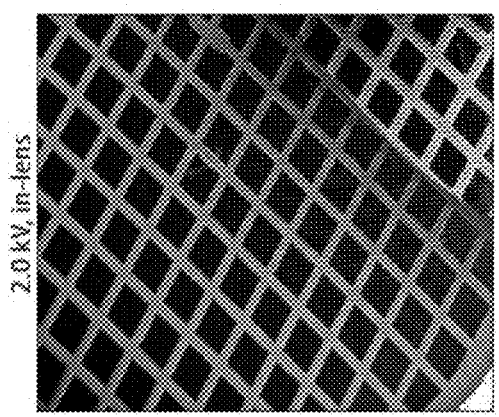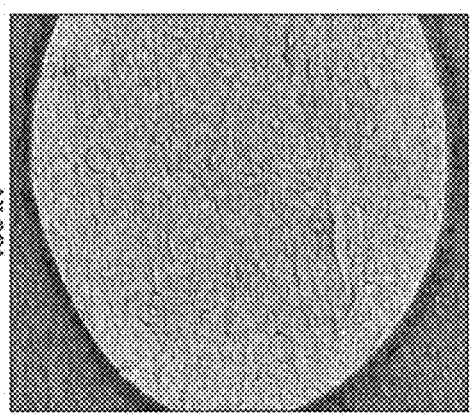

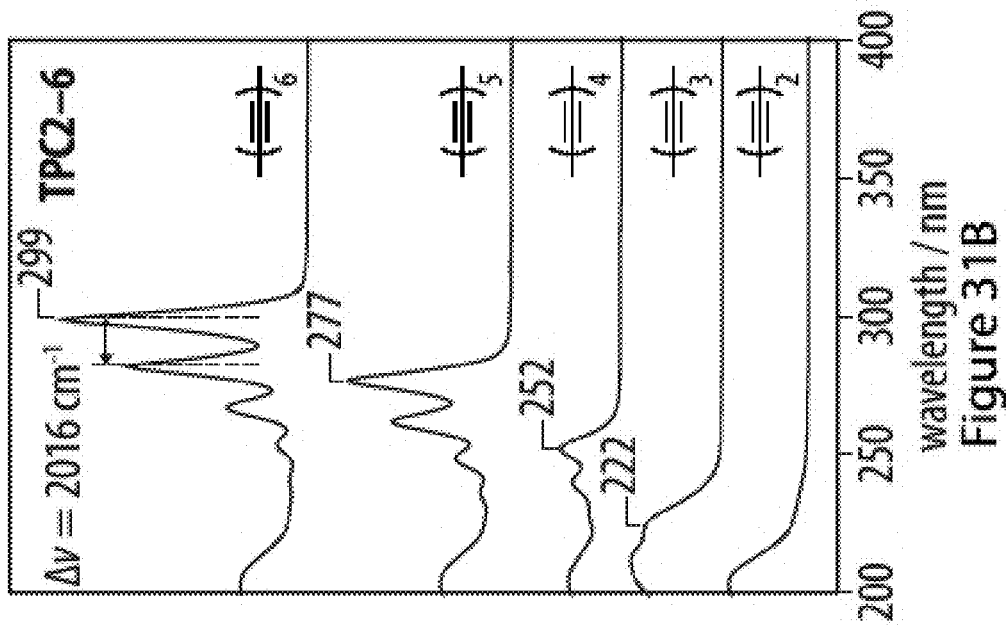
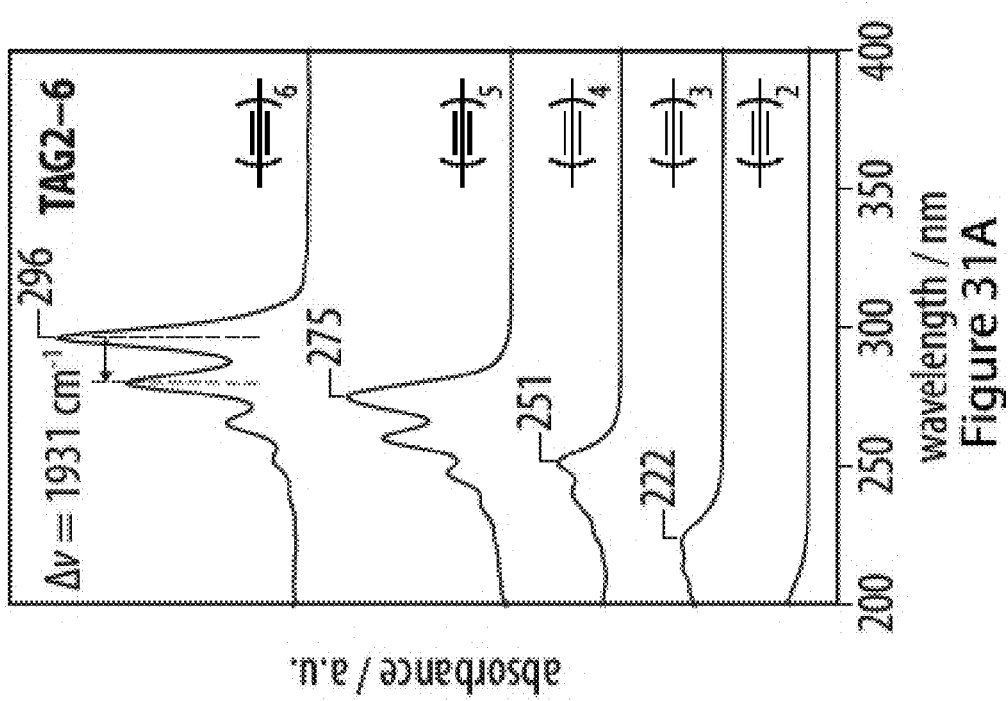

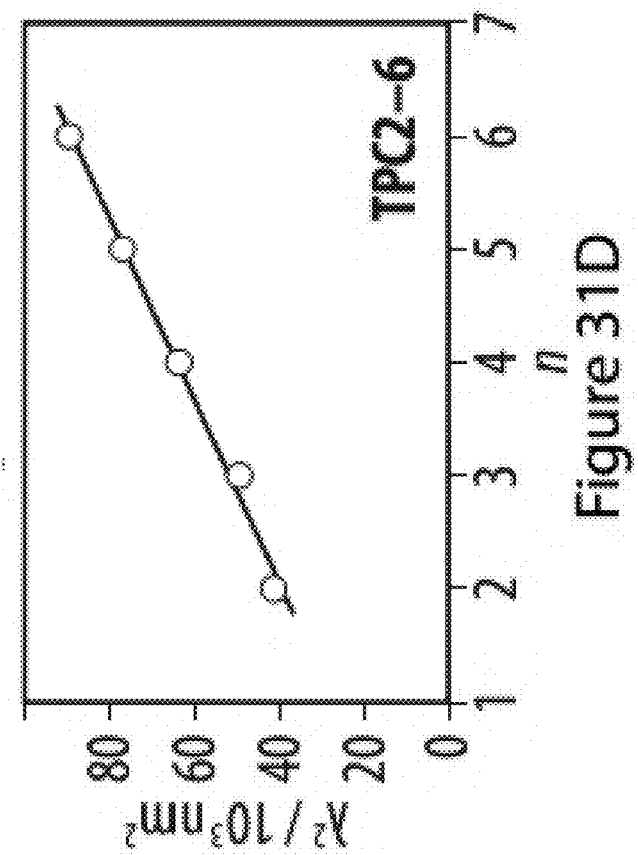
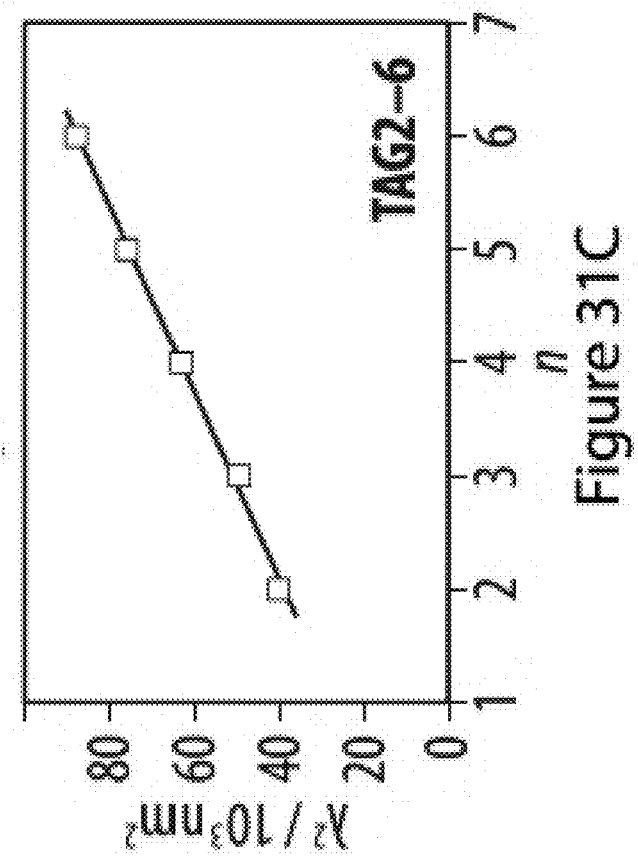
Figure 31D
Figure 31C

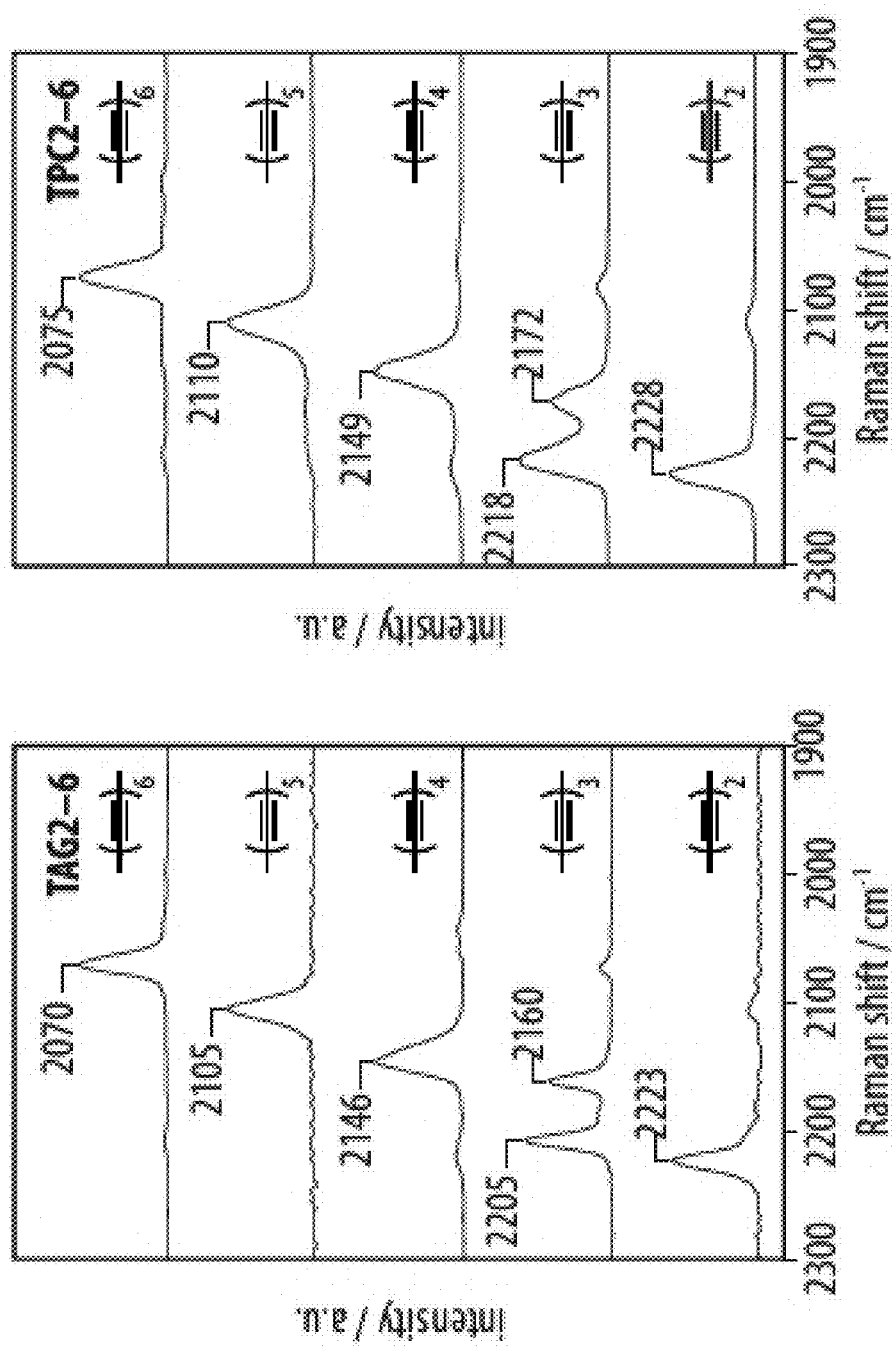

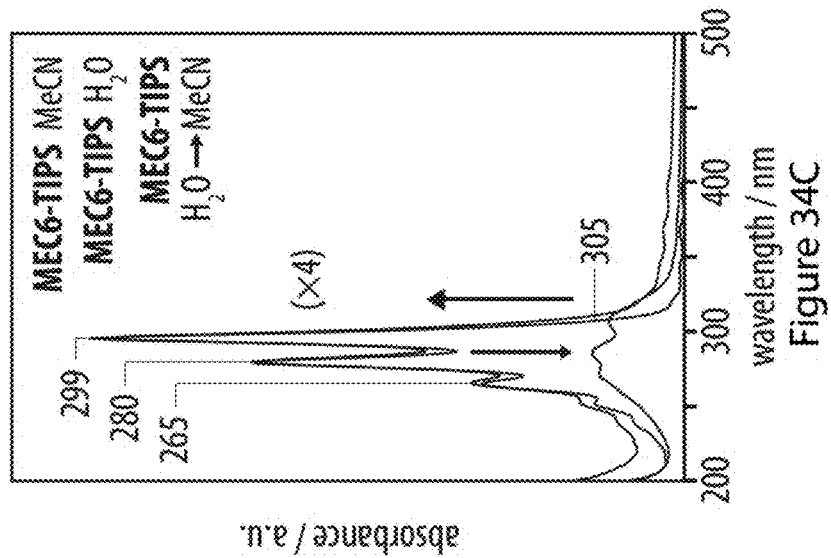
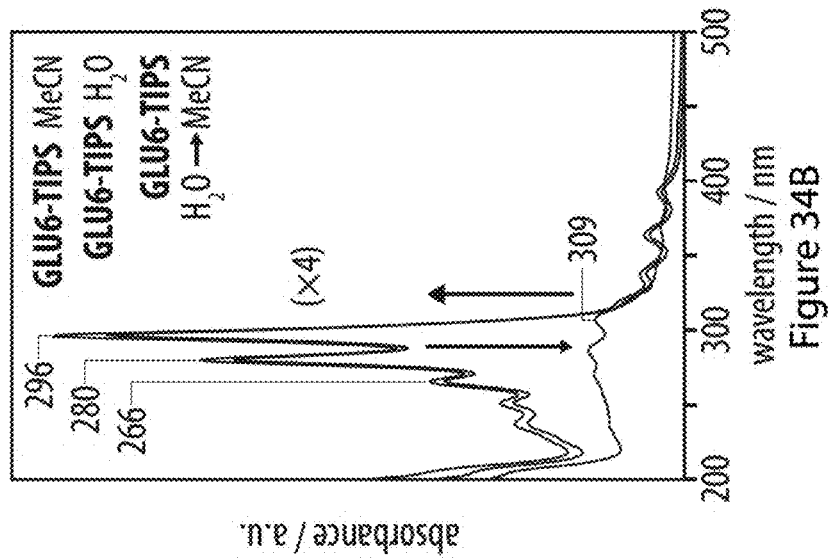
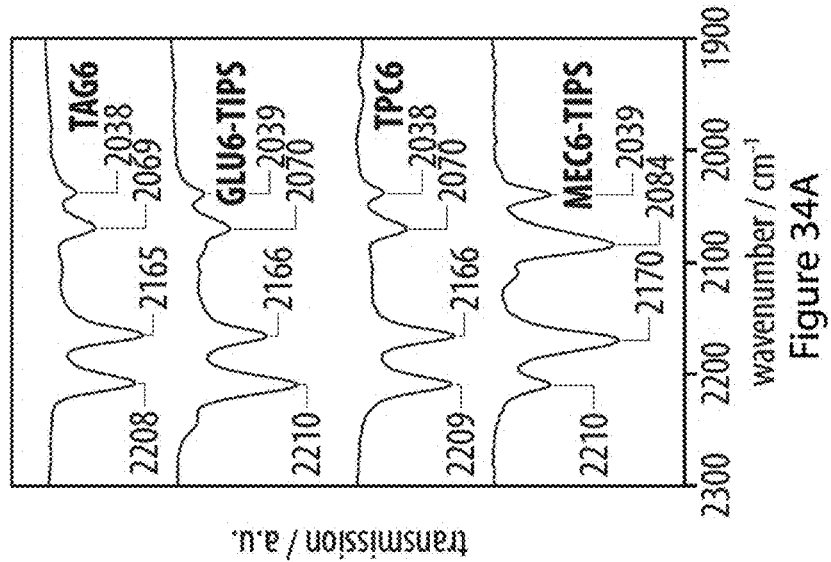
Figure 34C
Figure 34B
Figure 34A

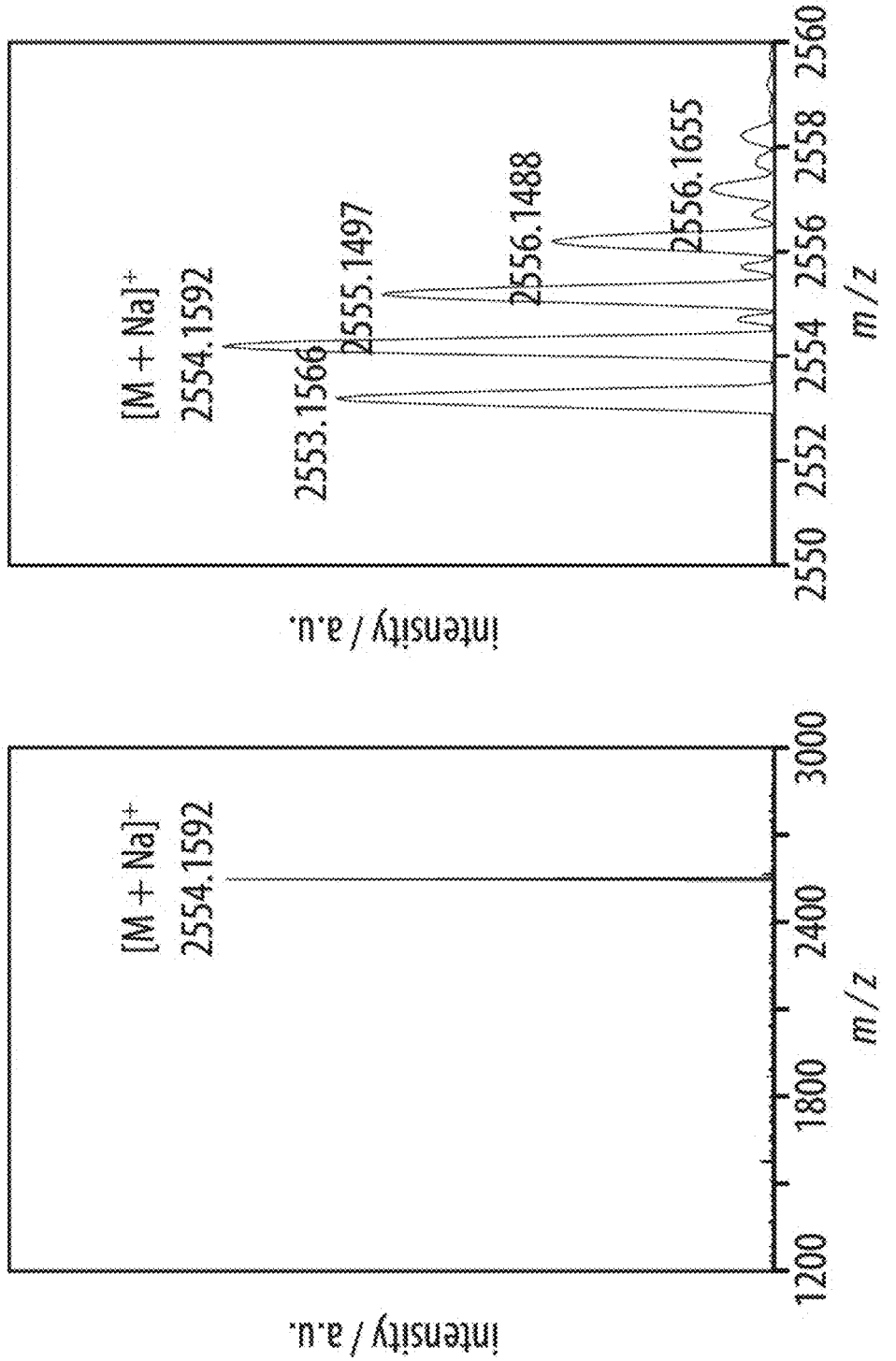

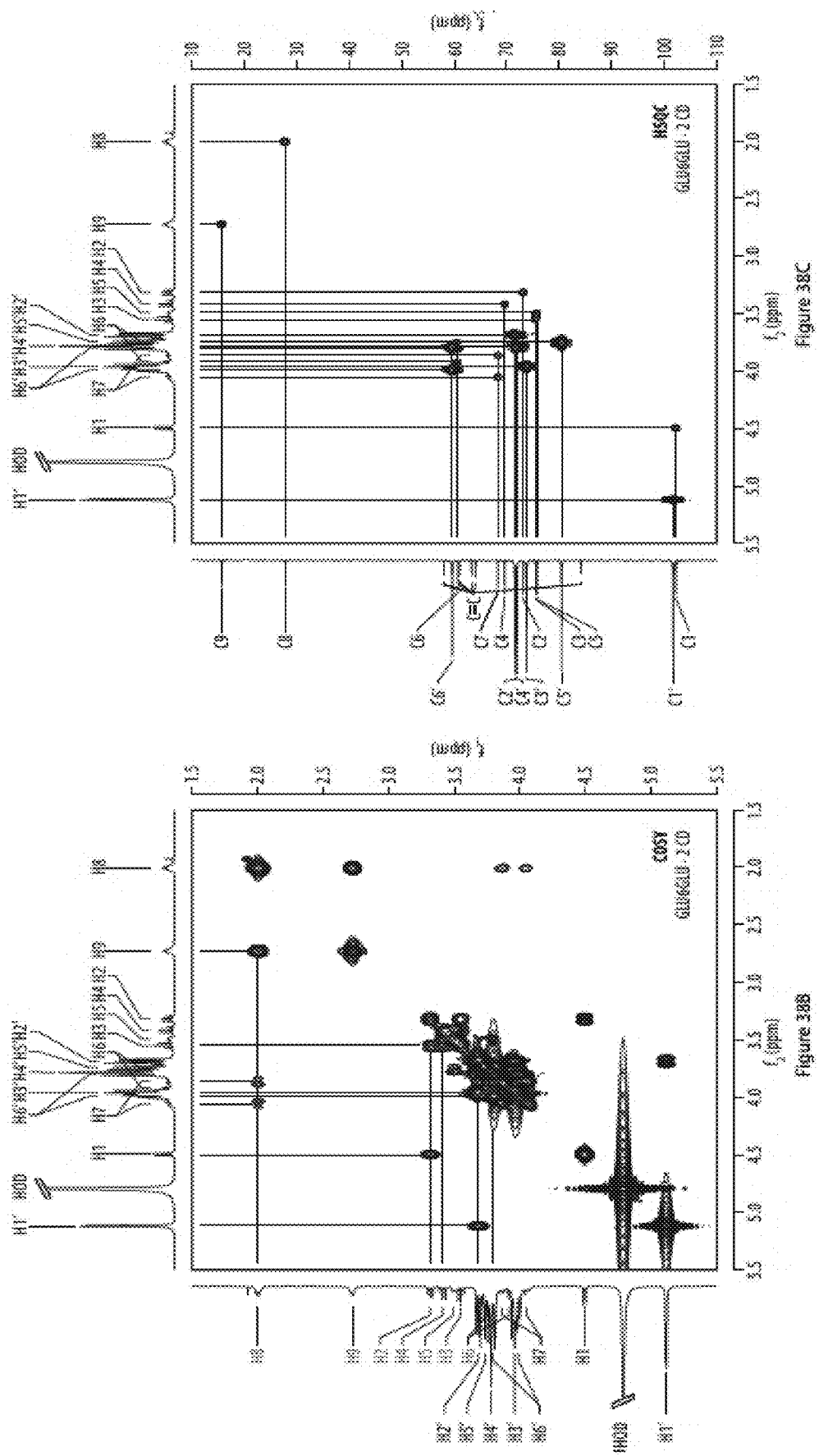

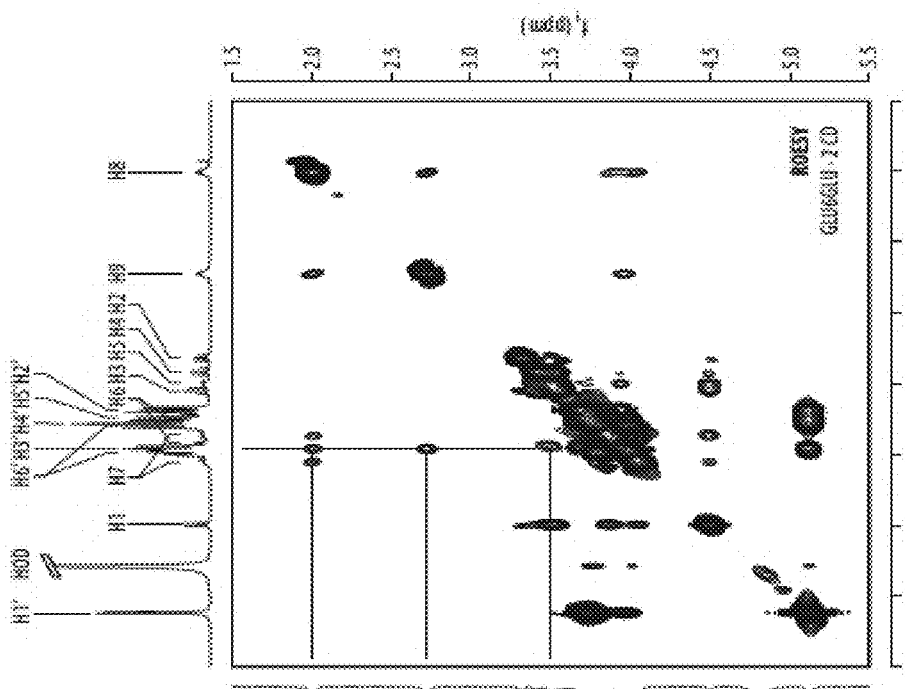
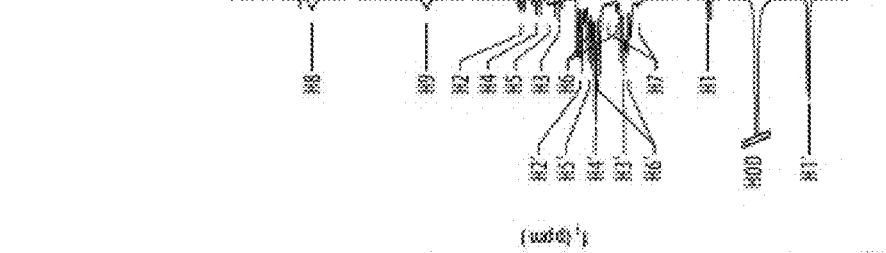
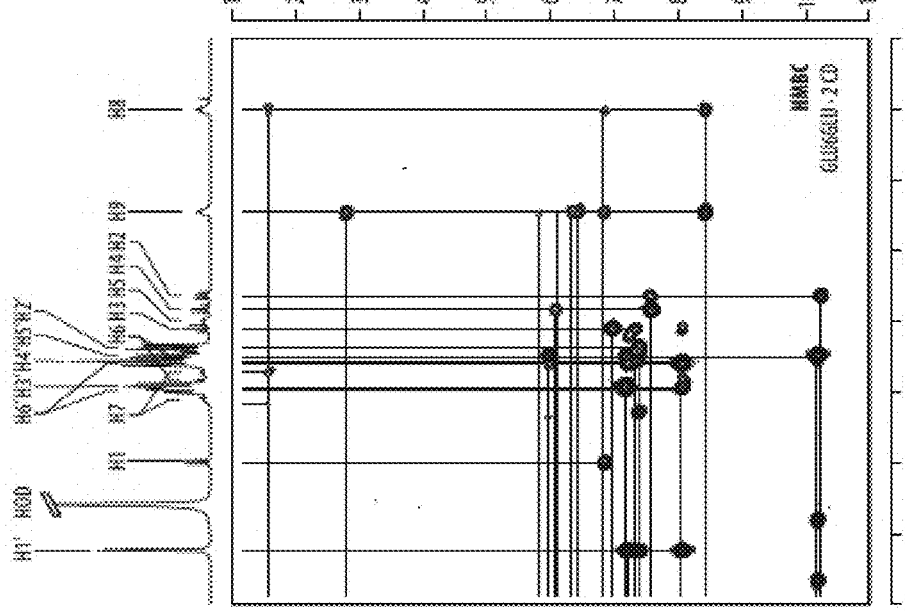
Figure 38E
Figure 38D

METHOD FOR THE PREPARATION OF A COATING COMPRISING OLIGOMERIC ALKYNES

CROSS-REFERENCE TO RELATED APPLICATIONS

This application claims priority under 35 U.S.C. § 371 to PCT/EP2016/059773 filed May 5, 2016, entitled "METHOD FOR THE PREPARATION OF A COATING," which claims priority to under 35 U.S.C. § 119(e) filed Apr. 4, 2015, entitled "METHOD FOR THE PREPARATION OF A COATING," both of which are herein incorporated by reference in their entirety.

FIELD OF THE INVENTION

The invention relates to a method for the preparation of a coating comprising at least one coating layer. The invention further relates to a coating obtainable according to the method according to the invention. Moreover, the invention relates to the use of a coating according to the invention. The invention also relates to a substrate comprising a coating according to the invention. In addition, the invention relates to the use of a substrate comprising a coating according to the invention. The invention further relates to a method for the synthesis of the monomers according to the invention.

BACKGROUND OF THE INVENTION

Coatings are important in technological applications in which a material needs to be protected from compounds in its environment that are detrimental for its structural integrity or function, or where the material protects another product from such compounds. Barrier layers such as diffusion barrier layers are important components that help to confine gases in a defined compartment. Barrier layers may also comprise a coating. The use of sub-micrometer and micrometer-thick coatings and/or barrier layers has been technically implemented for decades. However, their use may adversely affect the properties of the materials, for example their optical properties. Furthermore, it is economically sensible to reduce the thickness of a coating in order to ensure that as little material as necessary is used while a good result is still achieved. Coatings with a thickness in the nanometer range represent the maximum reduction in thickness possible for a coating or a barrier layer. For thin coatings or barrier layers, it is particularly desirable to prepare coatings or barrier layers that have as few as possible defects. Ideally, these thin coatings or barrier layers are atomically dense, that is they have substantially no defect sites. The smaller the number of defect sites in a coating or a barrier layer, the more effective is the coating or barrier layer at preventing diffusion, gas permeation and/or corrosion. Moreover, coatings and/or barrier layers may add additional functional properties to the bulk material, for example, to modify the surface polarity and/or to give it the ability to change its properties under changed environmental conditions.

Coatings and/or barrier layers are important in packaging materials and/or materials for encapsulation. Materials with good diffusion barrier properties are essential for the protection and packaging of products and devices, for example, in the food industry, the pharmaceutical industry, and the electronics industry (for example, for the packaging of light emitting diodes in display technology or solar cells in photovoltaics). Moreover, coatings and/or barrier layers that provide reduced gas permeation at a low weight are relevant for sustainable solutions in the mobility sector, for example, by allowing for the fabrication of energy-saving tires. Typical coatings and/or barrier layers need to be inexpensive, particularly for the food, pharmaceutics, tubing, and photovoltaic application domains. Moreover, coatings and/or barrier layers should be easily processable. Further, coatings and/or barrier layers should ideally be also at least partially recyclable. For numerous food packaging solutions, an established approach is the use of polymers as barrier layers, such as poly(ethylene terephthalate) (PET) or poly(propylene) (PP) that already show a low enough intrinsic gas permeability with oxygen transmission rates (OTR) of 10 to 100 cm$^3$ m$^{-2}$ d$^{-1}$ bar$^{-1}$ and/or water vapor transmission rates (WVTR) of 10 to 100 g m$^2$ d$^{-1}$. To improve the barrier properties to withstand a broad variety of chemical compounds, the polymer can be laminated with other polymers. Alternatively, a thin metal layer (for example, aluminum) or an inorganic layer such as silica may be applied to improve the barrier porperties. Various processes like physical vapor deposition, (plasma-enhanced) chemical vapor deposition, or atomic layer deposition are technically established for the application of such metal or inorganic layers. The choice of the process depends on the composition of the coating, its desired thickness and/or the necessity to strictly control uniformity (Chatham, *Surf. Coat. Technol.* 1996, 78, 1; Wyser, *Packag. Technol. Sci.* 2003, 16, 149). By applying such a metal or an inorganic layer, the resulting OTR can be decreased by a factor of approximately 10 to 100. The aforementioned approaches, however, pose problems with respect to the mechanical integrity of the brittle coatings. These problems result in substantially higher overall cost. Additionally, there are toxicological and environmental concerns with regard to these coatings (Duncan, *J. Colloid Interf. Sci.* 2011, 363, 1). The use of single-crystalline, defect-free graphene coating on a polymer surface can be used to realize materials with good barrier properties. Graphene is impermeable to gas molecules (McEuen, P. L. *Nano Lett.* 2008, 8, 2458), and graphene nanolayers were successfully used to prevent the oxidation of metals (Nilson, *ACS Nano* 2012, 6, 10258; Chen, *ACS Nano* 2011, 5, 1321). However, large-scale production and processing of graphene is difficult and incompatible to existing film processing techniques. Therefore, the chemical reduction of graphene oxide has been explored as an alternative. In this respect, flexible barrier layers based on laminates formed from reduced graphene oxide on PET (Geim, Nair, *Nat. Commun.* 2014, 5, 4843) were formed that show a moisture permeation of up to 10$^{-2}$ g m$^{-2}$ per day that significantly exceeds the barrier properties of commercially available metallized PET (with rates of 0.5 g m$^{-2}$/day).

Barrier layers based on nanocomposites in which nanoparticles are embedded as filler into a matrix polymer, allow to address some of the abovementioned shortcomings. The nanoparticles are supposed to be impenetrable for gas molecules, resulting in a hindered diffusion of volatile compounds through the material. Enhanced barrier properties are achieved, in particular, if the nanoparticle fillers have a high aspect ratio (Grunlan, *Nano Lett.* 2010, 10, 4970). Typical filler materials are clays and silica nanoparticles (Choudalakis, *European Polym. J.* 2009, 45, 967; Shen, *Chem. Rev.* 2008, 108, 3893). Recent progress shows that the alignment of clay platelets in such composites leads to improved barrier properties (Hagen, *RSC Adv.* 2014, 4, 18354). High aspect ratio nanostructures, such as graphene, graphene oxide (Geim, A. K., *Science* 2012, 335, 442), or reduced graphene oxide have also been used as filler materials (Park, J. App. Polym. Sci. 2014, DOI 10.1002/APP.39628). In particular, nanosheets of reduced graphene oxide (rGO) are interesting, since they possess a high aspect ratio and are well-dispersable due to the presence of chemical functional groups. However, the barrier properties of nanocomposites that employ rGO as a high aspect ratio filler are inferior to nanocomposites using the established clay particles.

In order to ensure the performance and lifetime of the corresponding devices, a sufficient protection of the active layers of organic electronic devices through an encapsulation with a material that provides improved barrier properties against, for example, oxygen and moisture, and other gases and volatile compounds is required (Logothetidis, *Handbook of Flexible Organic Electronics*, 2014, Woodhead Publishing). However, the development of suitable encapsulation materials remains a major challenge.

Recently, ultrahigh-performance barrier layers based on multilayered organic-inorganic structures have been developed for the encapsulation of optoelectronic and microelectronic devices such as light emitting diodes and photovoltaic devices (Letterier, *Prog. Mater. Sci.* 2003, 48, 1; Dhoble, *Renew. Sus. Energ. Rev.* 2015, 44, 319). For example, poly(ethylene naphtalate) (PEN) was used in combination with aluminum nitride and UV curable resins to prepare multilayered laminates that encapsulate organic light emitting diodes (OLED). The brittle nature of the inorganic layers, however, led to a deterioration of the WVTR values from 0.008 g m$^{-2}$ d$^{-1}$ to 0.02 g m$^{-2}$ d$^{-1}$ upon the application of mechanical stress (Park, *Synth. Met.* 2014, 193, 77). Many similar combinations of multilayered organic-inorganic structures have been investigated; however, materials with significantly lower OTR and WVTR values of below 10$^{-6}$ cm$^3$ m$^{-2}$ d$^{-1}$ bar$^{-1}$ and 10$^{-6}$ g m$^{-2}$ d$^{-1}$, respectively, as required for the encapsulation of organic light emitting diodes, have not yet been identified (Lewis, *Mater. Today*, 2006, 9, 38; Burrows, *Displays*, 2001, 22, 65). While multilayered organic-inorganic composites with sufficient barrier performance have been suggested, the encapsulation of devices while simultaneously ensuring a sufficient transparency, solvent resistance, and/or ease of processability remains a challenge.

Anticorrosive coatings are another important technical field. The purpose of an anticorrosive coating is to protect the coated material from compounds or physical processes in its environment that would adversely affect the material's structural integrity and/or function. In order to protect materials against corrosion, several approaches are feasible: (i) the use of a sacrificial coating that is subject to corrosion before the bulk material, (ii) the use of a metal that forms a passivating surface layer, (iii) or the obstruction of diffusion of oxygen, water, or ions through a barrier coating that encapsulates the substrate or covers the surface (Weinell, C. E., *J. Coat. Technol. Res.* 2009, 6, 135). The latter aspect is especially relevant to counteract pitting and crevice corrosion (Gupta, *Corrosion Science* 2015, 92, 1; Smyrl, *ECS Transactions* 2008, 16, 39). In both cases, local galvanic corrosion occurs on the nano- or micrometer scale, leading to deterioration of the material.

In general, anticorrosive coatings can be individually designed to withstand the conditions in the specific environment in which the respective substrate is located. Typically, the employed coatings are multilayer systems, encompassing a primer to secure adhesion to the substrate, an intermediate coating to prevent diffusion to the material's surface, and a top coating to impart the desired surface properties (Kjernsmo, D.; Corrosion Protection. Bording A/S, Copenhagen, 2003). The overall thorough and dense coverage of the clean substrate surface is crucial to prevent diffusion through the coating, which would result in underfilm corrosion (Mayne, *J. Oil. Color Chem. Assoc.* 1975, 58, 155.), blistering, or delamination (Elsner, *CI Prog. Org. Coat.* 2003, 48, 50.). Adhesion to the substrate is achieved either mechanically through penetration of the coating into surface pits, chemically through covalent bonds, or physically through secondary interactions such as van-der-Waals interactions or hydrogen bonding. Inorganic coatings are typically employed to improve the adhesion to the surface of the substrate, but organic coatings would have the advantage that they are mechanically more flexible and less prone to cracking. Typical examples of organic anticorrosive coatings are epoxy resins, alkyd resins, as well as cross-linked poly(siloxane)s or polyurethanes that are applied as monomers but form a chemically resistant coating after polymerization and cross-linking. Multilayer coatings are used to complement the properties of different coating materials. For example, epoxies are known to show good adhesion properties due to facile reaction with functional groups on the surface of the substrate, but are easily susceptible to UV damage. As another example, polyurethanes may easily fulfill the desired gloss requirements, but delaminate from metal surfaces. Therefore, they are only used as top coatings (Weiss, K. D. *Prog. Polym. Sci.* 1997, 22, 203.).

Promising recent approaches to combine the functions of the primer and the intermediate coating have made use of organophosphonates that are known to adhere well to metal surfaces and show a low sensitivity to hydrolysis (To, *Corros. Sci.* 1997, 39, 1925). For example, poly(sulfone)s equipped with phosphonate side groups have been employed as anticorrosive layers and shown enhanced protection of a steel surface against corrosion (Chauveau, *J. Appl. Polym. Sci.* 2015, DOI: 10.1002/APP.41890). Along similar lines, a hydrophilic adhesion promoter has been reported based on a poly(glycidol) with phosphonate and acrylate side groups (Koehler, J. *J. Mater. Chem. B.* 2015, 3, 804.), allowing for UV curing after adsorption to a metal surface. Moreover, bifunctional monomers equipped with a phosphonate group for surface attachment and a pyrrol or a thiophene group resulted in polymeric coatings with thicknesses above 50 nm that showed improved performance in delamination tests (Jaehne, *Prog. Org. Coat.* 2008, 61, 211).

The processes from the prior art have in common that for the preparation of thin coatings, materials that are difficult to handle such as graphene are required, or that multilayer coatings comprising several layers from different materials are required. A further disadvantage of some of the prior art approaches is the fact that composite materials in which nanoparticles are imbedded inside a matrix are required the preparation of which is costly. A solution-phase approach would be desirable for this purpose.

As a step in this direction, Olesik and Ding prepared carbon nanospheres in a wet-chemical approach by carbonization of a dispersion of deca-2,4,6,8-tetrayne-1,10-diol as the molecular precursor in a THF/water mixture (Olesik, *Nano Lett* 2004, 4, 2271; Olesik, *Chem. Mater.* 2005, 17, 2353; Olesik, Chemical Synthesis of Polymeric Nanomaterials and Carbon Nanomaterials, 2006, US 2006/0223947 A1). The carbonization was carried out by heating the mixture to 70° C., and the addition of surfactants efficiently helped to control the size of the obtained water-soluble carbon nanospheres.

Zhao and coworkers conducted a solid-state polymerization of different fullerene-substituted tetrayne derivatives (Zhao, *J. Am. Chem. Soc.* 2005, 127, 14154; Zhao, *J. Org. Chem.* 2010, 75, 1498). Films of the molecular precursors were prepared by drop-casting or spin-coating of toluene solutions on a mica surface, and their reaction was induced by thermal treatment at a temperature of 160° C. One of the investigated tetrayne derivatives gave rise to homogeneously distributed carbon nanospheres with a uniform diameter below 20 nm after the thermal treatment.

Frauenrath and coworkers prepared oligoyne amphiphiles, that is, molecules comprising a segment $(-C\equiv C-)_n$ with alternating carbon-carbon triple and single bonds, as well as a hydrophilic head group (Schrettl, *Chem. Sci.* 2015, 6, 564). Amphiphilic glycosylated hexayne amphiphiles were prepared in this way to self-assemble into vesicles in aqueous dispersions that gave rise to carbon nanocapsules upon UV irradiation below room temperature (Szilluweit, *Nano Lett.* 2012, 12, 2573). Similarly, carbon nanosheets on water were prepared by UV irradiation at room temperature, starting from a self-assembled monolayer of a hexayne-containing methyl carboxylate amphiphile self-assembled at the air-water interface (Schrettl, *Nature. Chem.* 2014, 6, 468).

However, none of these approaches using reactive molecular precursors yielded a thin carbonaceous coating on a substrate, in particular, they did not yield a thin carbonaceous coating on a substrate directly from molecular precursors on a substrate.

Moreover, none of these approaches using reactive molecular precursors yielded a thin coating on a substrate, in particular a solid substrate, in particular, they did not yield a thin coating on a substrate, in particular a solid substrate, directly from molecular precursors on substrate, in particular a solid substrate.

Starting from the prior art, an object of the invention is to provide a method for the preparation of a thin coating on a substrate, in particular a solid substrate, that employs compounds and/or materials that are compatible with existing film processing techniques. A particular aspect of the invention is to provide a method for the preparation of a thin coating on a substrate, in particular a solid substrate, that is based on a solution phase approach.

A further object of the invention is to provide a method for the preparation of a thin coating on a substrate, in particular a solid substrate, that comprises only a few coating layers.

A further object of the invention is to provide a method for the preparation of a thin coating on a substrate, in particular a solid substrate, that is substantially free from defect sites.

A further object of the invention is to provide a method for the preparation of a thin coating on a substrate, in particular a solid substrate, that employs reactive molecular precursors that undergo carbonization under mild conditions.

A further object of the invention is to provide a method for the preparation of a thin coating on a substrate, in particular a solid substrate, that employs reactive molecular precursors that are equipped with a head group that allows for binding to the surface of the substrate, in particular the solid substrate. A particular object of the invention is to provide a method for the preparation of a thin coating on a substrate, in particular a solid substrate, that provides good adhesion to the substrate, in particular the solid substrate.

A further object of the invention is to provide a method for the preparation of a thin coating on a substrate, in particular a solid substrate, that has a defined density and/or nature of functional moieties on at least one of the sides of the coating.

SUMMARY OF THE INVENTION

By employing the present invention, some or all of the difficulties and drawbacks found in the prior art can be overcome. In particular, some or all of the difficulties and drawbacks of the prior art can be overcome by the method of claim 1, the method of claim 35, the coating of claim 39, the use of claim 41, the substrate of claim 42, the use of claim 43, the method of claim 44, and the method of claim 45.

Further embodiments of the invention are described in the dependent claims and will be discussed in the following.

The invention provides for a method for the manufacture of a coating comprising at least one coating layer on a substrate, the method comprising the steps of a. providing monomers of the type $R-(N)_x-(L)_m-(C\equiv C)_n-(L')_o-(N')_y-R'$, wherein
R is a head moiety,
R' is a tail moiety,
$(C\equiv C)_n$ is an oligoyne moiety,
L and L' are linker moieties,
N and N' independently are branched or unbranched optionally substituted $C_1-C_{25}$ alkyl moieties optionally containing 1 to 5 heteroatoms,
x, m, o, and y are independently 0 or 1,
n is 4 to 12,
and wherein the head moiety allows for an interaction with the surface of the substrate;

b. bringing the monomers into contact with the substrate wherein the interaction of the head moieties of the monomers with the surface of the substrate induces at least a part of the monomers to align in a defined manner thereby forming a film on the surface and bringing the oligoyne moieties of the monomers into close contact with each other;

c. inducing a reaction between oligoyne moieties by providing an external stimulus so as to at least partially cross-link the aligned monomers, thereby forming a coating layer on the substrate.

Preferably, N and N' independently are branched or unbranched optionally substituted $C_1-C_{14}$ alkyl moieties optionally containing 1 to 5 heteroatoms. Examples for N and N' may include $C_1-C_{12}-OC(=O)-$, $C_1-C_{12}-NHC(=O)-$, $C_1-C_{12}-NHC(=O)O-$, $C_1-C_{12}-SC(=O)-$, $C_1-C_{12}-O-$, $C_1-C_{12}-NH-$, $C_1-C_{12}-S-$, $-OC(=O)-$, $-NHC(=O)-$, $-NHC(=O)O-$.

According to a preferred embodiment, the substrate is a solid substrate.

It has surprisingly been found that using the above method, a coating can be obtained that can overcome some or all of the drawbacks of the prior art mentioned above. In particular, the use of a head moiety that allows for an interaction with the surface of the substrate, in particular the solid substrate, and induces at least part of the monomers to align in a defined manner thereby forming a film on the surface and bringing the oligoyne moieties of the monomers into close contact with each other appears to be helpful in overcoming the drawbacks of the prior art. Without wishing to be bound to a scientific theory, the surprising effect appears to be explainable by the fact that the close contact of the oligoyne moieties allows for an efficient at least partial cross-linking of the monomers. Moreover, the close contact of the oligoyne moieties with each other may also favor the formation of a layer that is substantially free from defect sites. A further advantage of the method according to the invention is that the surfaces to which the coatings are applied in the method according to the invention do not need to be atomically flat in order to achieve a dense surface coverage and a strong binding of the coating to the surface.

According to a preferred embodiment, the oligoyne moieties of the monomers aligned in a defined manner are thereby brought into close contact.

According to another preferred embodiment, the substrate is a liquid substrate, in particular water. Preferably, in this embodiment, the monomers are brought into contact with the substrate, in particular the liquid substrate, in solution in a solvent that is immiscible with water, in particular in chloroform. Advantageously, in this embodiment, the method includes an additional step after bringing the monomers into contact with the substrate, in particular the liquid substrate, in which the surface area of the surface of the substrate, in particular the liquid substrate, is reduced.

In the case the substrate is water, the monomer is advantageously spread using techniques known to the skilled person. In particular, the monomers can by applied to the aqueous surface by spreading them on the water surface from a dilute solution in an organic solvent such as chloroform that is immiscible with the aqueous subphase. Without wishing to be bound by theory, at least a part of the monomers will thereby align in a defined manner due to the interaction of the head group, preferably the polar head group, with the surface of the water subphase, thereby forming a film. This can be enhanced by spreading the monomers on the water surface from a dilute solution in a water-immiscible organic solvent (applied to the water surface by simple casting or spraying techniques) such as chloroform at a monomer concentration that ensures a dense coverage of the whole water surface with a monomer monolayer or a multilayer and/or by reducing the surface area of the surface of the water or the air-water interface as described herein. Inducing a reaction on the water surface then yields a coating comprising at least one coating layer on a water surface. This coating can then, for example be transferred from the water to a different substrate such as a solid substrate. In an alternative example, before inducing the reaction on the water surface, the film can be transferred from the water to a different substrate, such as a solid substrate. For a liquid substrate other than water, preferably a solvent that is immiscible with the liquid substrate is used. This helps to ensure that the monomers arrange mainly at the surface of the liquid substrate.

BRIEF DESCRIPTION OF THE DRAWINGS

In the drawings:

FIGS. 10A-10B show the fitting of experimental infrared reflection-absorption spectra of an exemplary amphiphile a the air-water interface;

FIGS. 12A-12F show experimental and simulated $CH_2$ stretching vibrations of infrared reflection-absorption spectra for a layer of an exemplary amphiphile;

FIGS. 13A-13F show experimental and simulated acetylene stretching vibrations of infrared reflection-absorption spectra for a layer of an exemplary amphiphile;

FIGS. 14A-14I show spectra of X-ray reflectivity (XR) measurements as well as grazing incidence X-ray diffraction (GIXD) data for a layer of an exemplary amphiphile;

FIGS. 16A-16F show spectra demonstrating integration of scattering intensity over various vector components;

FIGS. 23A-23C show spectra of carbon nanosheets analyzed using Raman spectroscopy to determine carbon microstructure obtained using carbonization of an exemplary amphiphile at an air-water interface;

FIGS. 24A-24F show scanning and transmission electron microscopy (SEM, TEM) images of carbon nanosheets obtained by carbonization of an exemplary amphiphile at an air-water interface after transfer to a holey carbon TEM grid;

FIGS. 31A-31F show UV-Vis spectra of tetra-O-acetyl β-d-glucosyl oligoynes in acetonitrile;

FIGS. 32A-32F show infra-red (IR) and Raman spectra for a series of tetra-O-acetyl β-d-glucosyl oligoynes and tritylphenyl carboxylates;

FIGS. 34A-34C show comparisons of solid-state IR spectra of protected hexaynes with corresponding deprotected glucosyl hexaynes and methyl carboxylates;

FIGS. 37A-37C show MALDI-TOF mass spectrum of a rotaxane featuring two α-cyclodextrin hosts;

FIGS. 38A-38E show the structure and corresponding 2D NMR spectra of a rotaxane featuring two α-cyclodextrin hosts;

DEFINITIONS

Figure 1:
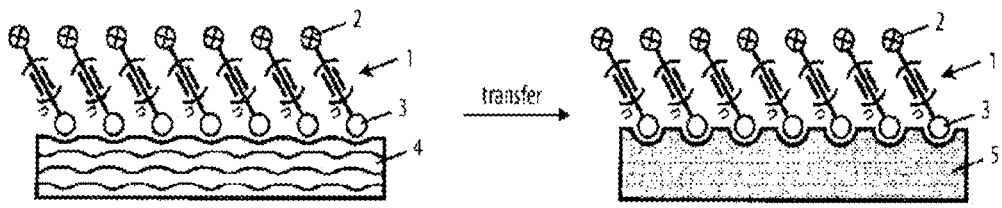
FIG. 1 shows a scheme of an exemplary procedure for bringing monomers into contact with a solid substrate.

The following definitions shall apply throughout unless otherwise noted.

"Alkyl" means an aliphatic hydrocarbon moiety which may be straight or branched having about 1 to about 25 carbon atoms in the chain. Preferred alkyl moieties have 1 to about 20, more preferred 1 to about 14, carbon atoms in the chain. Branched means that one or more lower alkyl moieties such as methyl, ethyl or propyl are attached to a linear alkyl chain. "Lower alkyl" means about 1 to about 4 carbon atoms in the chain that may be straight or branched. "Substituted alkyl" means an alkyl moiety as defined above which is substituted with one or more "aliphatic moiety substituents" (preferably 1 to 3) which may be the same or different, and are as defined herein. Alkyl moieties may contain 1 to 5 heteroatoms as defined herein. Preferred heteroatoms for alkyl moieties are oxygen, nitrogen, and sulfur. Substituted alkyl moieties may contain 1 to 5 heteroatoms as defined herein. Preferred heteroatoms for substituted alkyl moieties are oxygen, nitrogen, and sulfur. In a substituted alkyl moiety, one or more heteroatoms may be adjacent to a chain atom bearing an aliphatic moiety substituent as defined herein. In an alkyl moiety, a heteroatom may bear an aliphatic moiety substituent as defined herein. Preferred substituted alkyl moieties are $C_1$-$C_{12}$—OC(=O)—, $C_1$-$C_{12}$—NHC(=O)—, $C_1$-$C_{12}$—NHC(=O)O—, $C_1$-$C_{12}$—SC(=O)—. Preferred alkyl moieties are $C_1$-$C_{12}$—O—, $C_1$-$C_{12}$—NH—, $C_1$-$C_{12}$—S—.

"Aliphatic" means alkyl, alkenyl or alkynyl as defined herein.

"Aliphatic moiety substituent(s)" mean substituents attached to an aliphatic moiety as defined herein inclusive of aryl, heteroaryl, hydroxy, alkoxy such as methoxy or ethoxy, cyclyloxy, aryloxy, heteroaryloxy, acyl or its thioxo analogue, cyclylcarbonyl or its thioxo analogue, aroyl or its thioxo analogue, heteroaroyl or its thioxo analogue, acyloxy, cyclylcarbonyloxy, aroyloxy, heteroaroyloxy, halo, nitro, cyano, carboxy (acid), —C(=O)—NHOH, —C(=O)—CH$_2$OH, —C(=O)—CH$_2$SH, —C(=O)—NH—CN, sulpho, phosphono, alkylsulphonylcarbamoyl, tetrazolyl, arylsulphonylcarbamoyl, N-methoxycarbamoyl, heteroarylsulphonylcarbamoyl, 3-hydroxy-3-cyclobutene-1,2-dione, 3,5-dioxo-1,2,4-oxadiazolidinyl or hydroxyheteroaryl such as 3-hydroxyisoxazolyl, 3-hydoxy-1-methyl-pyrazolyl, alkoxycarbonyl, cyclyloxycarbonyl, aryloxycarbonyl, heteroaryloxycarbonyl, alkylsulfonyl, cyclylsulfonyl, arylsulfonyl, heteroarylsulfonyl, alkylsulfinyl, cyclylsulfinyl, arylsulfinyl, heteroarylsulfinyl, alkylthio, cyclylthio, arylthio, heteroarylthio, cyclyl, aryldiazo, heteroaryldiazo, thiol, methylene (H$_2$C=), Oxo (O=), thioxo (S=). Acidic/amide aliphatic moiety substituents are carboxy (acid), —C(=O)—NHOH, —C(=O)—CH$_2$OH, —C(=O)—CH$_2$SH, —C(=O)—NH—CN, sulpho, phosphono, alkylsulphonylcarbamoyl, tetrazolyl, arylsulphonylcarbamoyl, N-methoxycarbamoyl, heteroarylsulphonylcarbamoyl, 3-hydroxy-3-cyclobutene-1,2-dione, 3,5-dioxo-1,2,4-oxadiazolidinyl or hydroxyheteroaryl such as 3-hydroxyisoxazolyl, 3-hydoxy-1-methylpyrazolyl. Non-acidic polar aliphatic moiety substituents are hydroxy, oxo (O=), thioxo (S=), acyl or its thioxo analogue, cyclylcarbonyl or its thioxo analogue, aroyl or its thioxo analogue, heteroaroyl or its thioxo analogue, alkoxycarbonyl, cyclyloxycarbonyl, aryloxycarbonyl, heteroaryloxycarbonyl, acyloxy, cyclylcarbonyloxy, aroyloxy, heteroaroyloxy, alkylsulfonyl, cyclylsulfonyl, arylsulfonyl, heteroarylsulfonyl, alkylsulfinyl, cyclylsulfinyl, arylsulfinyl, heteroarylsulfinyl, thiol. Exemplary aliphatic moieties bearing an aliphatic moiety substituent include methoxymethoxy, methoxyethoxy, ethoxyethoxy, (methoxy-, benzyloxy-, phenoxy-, ethoxy-, or propyloxy-)carbonyl(methyl, ethyl, or propyl), (methoxy-, benzyloxy-, phenoxy-, ethoxy-, or propyloxy-)carbonyl, (methyl, ethyl, or propyl)aminocarbonyl(methyl, ethyl, or propyl), (methyl, ethyl, or propyl)aminocarbonyl, pyridylmethyloxy-carbonylmethyl, methoxyethyl, ethoxymethyl, n-butoxymethyl, cyclopentylmethyloxyethyl, phenoxypropyl, phenoxyallyl, trifluoromethyl, cyclopropylmethyl, cyclopentylmethyl, carboxy(methyl or ethyl), 2-phenethenyl, benzyloxy, 1- or 2-naphthyl-methoxy, 4-pyridyl-methyloxy, benzyloxyethyl, 3-benzyloxyallyl, 4-pyridylmethyloxyethyl, 4-pyridylmethyl-oxyallyl, benzyl, 2-phenethyl, naphthylmethyl, styryl, 4-phenyl-1,3-pentadienyl, phenylpropynyl, 3-phenylbut-2-ynyl, pyrid-3-ylacetylenyl and quinolin-3-ylacetylenyl, 4-pyridyl-ethynyl, 4-pyridylvinyl, thienylethenyl, pyridylethenyl, imidazolylethenyl, pyrazinylethenyl, pyridylpentenyl, pyridylhexenyl and pyridylheptenyl, thienylmethyl, pyridylmethyl, imidazolylmethyl, pyrazinylmethyl, tetrahydropyranylmethyl, tetrahydropyranyl-methyloxymethyl, and the like. A preferred aliphatic moiety substituent is oxo (O=).

"Acyl" means an H—C(=O)— or (aliphatic or cyclyl)-C(=O)— moiety wherein the aliphatic moiety is as herein described. Preferred acyls contain a lower alkyl. Exemplary acyl moieties include formyl, acetyl, propanoyl, 2-methylpropanoyl, butanoyl, palmitoyl, acryloyl, propynoyl, cyclohexylcarbonyl, and the like.

"Acyloxy" means an H—C(=O)—O— or (aliphatic or cyclyl)-C(=O)—O moiety wherein the aliphatic moiety is as herein described. Preferred acyloxys contain a lower alkyl. Exemplary acyloxy moieties include acetoxy and propionyloxy, and the like.

"Alkenoyl" means an alkenyl-C(=O)— moiety wherein alkenyl is as defined herein.

"Alkenyl" means an aliphatic hydrocarbon moiety containing a carbon-carbon double bond and which may be straight or branched having about 2 to about 15 carbon atoms in the chain. Preferred alkenyl moieties have 2 to about 12 carbon atoms in the chain; and more preferably about 2 to about 4 carbon atoms in the chain. Branched means that one or more lower alkyl moieties such as methyl, ethyl or propyl are attached to a linear alkenyl chain. "Lower alkenyl" means about 2 to about 4 carbon atoms in the chain that may be straight or branched. Exemplary alkenyl moieties include ethenyl, propenyl, n-butenyl, i-butenyl, 3-methylbut-2-enyl, n-pentenyl, heptenyl, octenyl, cyclohexylbutenyl, decenyl, and the like. "Substituted alkenyl" means an alkenyl moiety as defined above which is substituted with one or more "aliphatic moiety substituents" (preferably 1 to 3) which may be the same or different and are as defined herein. Exemplary alkenyl alphatic moiety substituents include halo or cycloalkyl moieties. Alkenyl moieties may contain 1 to 5 heteroatoms as defined herein. Substituted alkenyl moieties may contain 1 to 5 heteroatoms as defined herein. In a substituted alkenyl moiety, one or more heteroatoms may be adjacent to a chain atom bearing an aliphatic moiety substituent as defined herein. In an alkenyl moiety, a heteroatom may bear an aliphatic moiety substituent as defined herein.

"Alkenyloxy" means an alkenyl-O— moiety wherein the alkenyl moiety is as herein described. Exemplary alkenyloxy moieties include allyloxy, 3-butenyloxy, and the like.

"Alkoxy" means an alkyl-O— moiety wherein the alkyl moiety is as herein described. Exemplary alkoxy moieties include methoxy, ethoxy, n-propoxy, i-propoxy, n-butoxy, heptoxy, and the like.

"Alkoxycarbonyl" means an alkyl-O—C(=O)— moiety, wherein the alkyl moiety is as herein defined. Exemplary alkoxycarbonyl moieties include methoxycarbonyl, ethoxycarbonyl, t-butyloxycarbonyl, and the like.

"Alkylsulfinyl" means an alkyl-SO— moiety wherein the alkyl moiety is as defined above. Preferred moieties are those wherein the alkyl moiety is lower alkyl.

"Alkylsulfonyl" means an alkyl-$SO_2$-moiety wherein the alkyl moiety is as defined above. Preferred moieties are those wherein the alkyl moiety is lower alkyl.

"Alkylsulphonylcarbamoyl" means an alkyl-$SO_2$—NH—C(=O)— moiety wherein the alkyl moiety is as herein described. Preferred alkylsulphonylcarbamoyl moieties are those wherein the alkyl moiety is lower alkyl.

"Alkylthio" means an alkyl-S— moiety wherein the alkyl moiety is as herein described. Exemplary alkylthio moieties include methylthio, ethylthio, i-propylthio and heptylthio.

"Alkynyl" means an aliphatic hydrocarbon moiety containing a carbon-carbon triple bond and which may be straight or branched having about 2 to about 15 carbon atoms in the chain. Preferred alkynyl moieties have 2 to about 12 carbon atoms in the chain; and more preferably about 2 to about 4 carbon atoms in the chain. Branched means that one or more lower alkyl moieties such as methyl, ethyl or propyl are attached to a linear alkynyl chain. "Lower alkynyl" means about 2 to about 4 carbon atoms in the chain that may be straight or branched. The alkynyl moiety may be substituted by one or more halo. Exemplary alkynyl moieties include ethynyl, propynyl, n-butynyl, 2-butynyl, 3-methylbutynyl, n-pentynyl, heptynyl, octynyl, decynyl, and the like. "Substituted alkynyl" means alkynyl as defined above which is substituted with one or more "aliphatic moiety substituents" (preferably 1 to 3) which may be the same or different, and are as defined herein.

"Aromatic moiety" means aryl or heteroaryl as defined herein. Exemplary aromatic moieties include phenyl, halo substituted phenyl, azaheteroaryl, and the like.

"Aroyl" means an aryl-C(=O)— moiety wherein the aryl moiety is as herein described. Exemplary aroyl moieties include benzoyl, 1- and 2-naphthoyl, and the like.

"Aroyloxy" means an aryl-C(=O)—O— moiety wherein the aryl moiety is as herein described "Aryl" means an aromatic monocyclic or multicyclic ring system of about 6 to about 14 carbon atoms, preferably of about 6 to about 10 carbon atoms. The aryl is optionally substituted with one or more "ring moiety substituents" which may be the same or different, and are as defined herein. Exemplary aryl moieties include phenyl or naphthyl, or phenyl substituted or naphthyl substituted. "Substituted aryl" means an aryl moiety as defined above which is substituted with one or more "ring moiety substituents" (preferably 1 to 3) which may be the same or different and are as defined herein.

"Aryloxy" means an aryl-O— moiety wherein the aryl moiety is as defined herein. Exemplary aryloxy moieties include phenoxy and 2-naphthyloxy.

"Aryloxycarbonyl" means an aryl-O—C(=O)— moiety wherein the aryl moiety is as defined herein. Exemplary aryloxycarbonyl moieties include phenoxycarbonyl and naphthoxycarbonyl.

"Arylsulfonyl" means an aryl-$SO_2$— moiety wherein the aryl moiety is as defined herein.

"Arylsulphonylcarbamoyl" means an aryl-$SO_2$—NH—C(=O)— moiety wherein the aryl moiety is as herein described. An exemplary arylsulphonylcarbamoyl moiety is phenylsulphonylcarbamoyl.

"Arylsulfinyl" means an aryl-SO— moiety wherein the aryl moiety is as defined herein.

"Arylthio" means an aryl-S— moiety wherein the aryl moiety is as herein described. Exemplary arylthio moieties include phenylthio and naphthylthio.

"Carboxy" means an HO(O=)C— (carboxylic acid) moiety.

"Cycloalkenyl" means a non-aromatic mono- or multicyclic ring system of about 3 to about 10 carbon atoms, preferably of about 5 to about 10 carbon atoms, and which contains at least one carbon-carbon double bond. Preferred ring sizes of rings of the ring system include about 5 to about 6 ring atoms; and such preferred ring sizes are also referred to as "lower". "Substituted cycloalkenyl" means an cycloalkyenyl moiety as defined above which is substituted with one or more "ring moiety substituents" (preferably 1 to 3) which may be the same or different and are as defined herein. Exemplary monocyclic cycloalkenyl include cyclopentenyl, cyclohexenyl, cycloheptenyl, and the like. An exemplary multicyclic cycloalkenyl is norbornylenyl.

"Cycloalkyl" means a non-aromatic mono- or multicyclic ring system of about 3 to about 10 carbon atoms, preferably of about 5 to about 10 carbon atoms. Preferred ring sizes of rings of the ring system include about 5 to about 6 ring atoms; and such preferred ring sizes are also referred to as "lower". "Substituted cycloalkyl" means a cycloalkyl moiety as defined above which is substituted with one or more "ring moiety substituents" (preferably 1 to 3) which may be the same or different and are as defined herein. Exemplary monocyclic cycloalkyl include cyclopentyl, cyclohexyl, cycloheptyl, and the like. Exemplary multicyclic cycloalkyl include 1-decalin, norbornyl, adamant-(1- or 2-)yl, and the like.

"Cyclic" or "Cyclyl" means cycloalkyl, cycloalkenyl, heterocyclyl or heterocyclenyl as defined herein. The term "lower" as used in connection with the term cyclic is the same as noted herein regarding the cycloalkyl, cycloalkenyl, heterocyclyl or heterocyclenyl.

"Cyclylcarbonyl" means a cyclyl-C(=O)— moiety wherein the cyclyl moiety is as defined herein.

"Cyclylcarbonyloxy" means a cyclyl-C(=O)—O— moiety wherein the cyclyl moiety is as defined herein.

"Cyclyloxy" means a cyclyl-O— moiety wherein the cyclyl moiety is as herein described. Exemplary cyclyloxy moieties include cyclopentyloxy, cyclohexyloxy, quinuclidyloxy, pentamethylenesulfideoxy, tetrahydropyranyloxy, tetrahydrothiophenyloxy, pyrrolidinyloxy, tetrahydrofuranyloxy or 7-oxabicyclo[2.2.1]heptanyloxy, hydroxytetrahydropyranyloxy, hydroxy-7-oxabicyclo[2.2.1]heptanyloxy, and the like.

"Cyclyloxycarbonyl" means a cyclyl-O—C(=O)— moiety wherein the cyclyl moiety is as herein described.

"Cyclylsulfinyl" means a cyclyl-S(O)— moiety wherein the cyclyl moiety is as herein described.

"Cyclylsulfonyl" means a cyclyl-S(O)$_2$— moiety wherein the cyclyl moiety is as herein described.

"Cyclylthio" means a cyclyl-S— moiety wherein the cyclyl moiety is as herein described.

"Diazo" means a bivalent —N=N— radical.

"Halo" means fluoro, chloro, bromo, or iodo. Preferred are fluoro, chloro or bromo.

"Heteroaroyl" means a heteroaryl-C(=O)— moiety wherein the heteroaryl moiety is as herein described. Exemplary heteroaroyl moieties include thiophenoyl, nicotinoyl, pyrrol-2-ylcarbonyl, 1- and 2-naphthoyl, pyridinoyl, and the like.

"Heteroaroyloxy" means a heteroaryl-C(=O)—O moiety wherein the heteroaryl moiety is as defined herein.

"Heteroaryl" means an aromatic monocyclic or multicyclic ring system of about 5 to about 14 carbon atoms, preferably about 5 to about 10 carbon atoms, in which one or more of the carbon atoms in the ring system is/are heteroatom(s) other than carbon, for example boron, nitrogen, oxygen, phosphorous, sulfur, silicon, or germanium. Preferably the ring system includes 1 to 3 heteroatoms. Preferred ring sizes of rings of the ring system include about 5 to about 6 ring atoms. "Substituted heteroaryl" means a heteroaryl moiety as defined above which is substituted with one or more "ring moiety substituents" (preferably 1 to 3) which may be the same or different and are as defined herein. The designation of the aza, oxa or thia as a prefix before heteroaryl define that at least a nitrogen, oxygen or sulfur atom is present, respectively, as a ring atom. A nitrogen atom of a heteroaryl may be a basic nitrogen atom and may also be optionally oxidized to the corresponding N-oxide. Exemplary heteroaryl and substituted heteroaryl moieties include pyrazinyl, thienyl, isothiazolyl, oxazolyl, pyrazolyl, furazanyl, pyrrolyl, 1,2,4-thiadiazolyl, pyridazinyl, quinoxalinyl, phthalazinyl, imidazo[1,2-a]pyridine, imidazo[2,1-b]thiazolyl, benzofurazanyl, azaindolyl, benzimidazolyl, benzothienyl, thienopyridyl, thienopyrimidyl, pyrrolopyridyl, imidazopyridyl, benzoazaindolyl, 1,2,4-triazinyl, benzthiazolyl, furanyl, imidazolyl, indolyl, indolizinyl, isoxazolyl, isoquinolinyl, isothiazolyl, oxadiazolyl, pyrazinyl, pyridazinyl, pyrazolyl, pyridyl, pyrimidinyl, pyrrolyl, quinazolinyl, quinolinyl, 1,3,4-thiadiazolyl, thiazolyl, thienyl, triazolyl, and the like.

"Heteroatom" means an atom other than carbon, for example boron, nitrogen, oxygen, phosphorous, sulfur, silicon, or germanium.

"Heteroaryldiazo" means a heteroaryl-diazo-moiety wherein the heteroaryl and diazo moieties are as defined herein.

"Heteroaryldiyl" means a bivalent radical derived from a heteroaryl, wherein the heteroaryl is as described herein. An exemplary heteroaryldiyl radical is optionally substituted pyridinediyl.

"Heteroaryloxy" means a heteroaryl-O— moiety wherein the heteroaryl moiety is as herein described.

"Heteroaryloxycarbonyl" means a heteroaryl-O—C(=O)— moiety wherein the heteroaryl moiety is as herein defined.

"Heteroarylsulfinyl" means a heteroaryl-S(O)— moiety wherein the heteroaryl moiety is as defined herein.

"Heteroarylsulfonyl" means a heteroaryl-S(O)$_2$— moiety wherein the aryl moiety is as defined herein.

"Heteroarylsulphonylcarbamoyl" means a heteroaryl-SO$_2$—NH—C(=O)— moiety wherein the heteroaryl moiety is as herein described.

"Heterocyclenyl" means a non-aromatic monocyclic or multicyclic hydrocarbon ring system of about 3 to about 10 carbon atoms, preferably about 5 to about 10 carbon atoms, in which one or more of the carbon atoms in the ring system is/are heteroatom(s) other than carbon, for example boron, nitrogen, oxygen, phosphorous, sulfur, silicon, or germanium, and which contains at least one carbon-carbon double bond or carbon-nitrogen double bond. Preferably, the ring includes 1 to 3 heteroatoms. Preferred ring sizes of rings of the ring system include about 5 to about 6 ring atoms; and such preferred ring sizes are also referred to as "lower". The designation of the aza, oxa or thia as a prefix before heterocyclenyl define that at least a nitrogen, oxygen or sulfur atom is present, respectively, as a ring atom. "Substituted heterocyclenyl" means a heterocyclenyl moiety as defined above which is substituted with one or more "ring moiety substituents" (preferably 1 to 3) which may be the same or different and are as defined herein. The nitrogen atom of a heterocyclenyl may be a basic nitrogen atom. The nitrogen or sulfur atom of the heterocyclenyl may also be optionally oxidized to the corresponding N-oxide, S-oxide or S,S-dioxide. Exemplary monocyclic azaheterocyclenyl moieties include 1,2,3,4-tetrahydropyridine, 1,2-dihydropyridyl, 1,4-dihydropyridyl, 1,2,3,6-tetra-hydropyridine, 1,4,5,6-tetrahydropyrimidine, 2-pyrrolinyl, 3-pyrrolinyl, 2-imidazolinyl, 2-pyrazolinyl, and the like. Exemplary oxaheterocyclenyl moieties include 3,4-dihydro-2H-pyran, dihydrofuranyl, and fluorodihydrofuranyl. An exemplary multicyclic oxaheterocyclenyl moiety is 7-oxabicyclo[2.2.1]heptenyl. Exemplary monocyclic thiaheterocyclenyl rings include dihydrothiophenyl and dihydrothiopyranyl.

"Heterocyclyl" means a non-aromatic saturated monocyclic or multicyclic ring system of about 3 to about 10 carbon atoms, preferably about 5 to about 10 carbon atoms, in which one or more of the carbon atoms in the ring system is/are heteroatom(s) other than carbon, for example boron, nitrogen, oxygen, phosphorous, sulfur, silicon, or germanium. Preferably, the ring system contains from 1 to 3 heteroatoms. Preferred ring sizes of rings of the ring system include about 5 to about 6 ring atoms; and such preferred ring sizes are also referred to as "lower". The designation of the aza, oxa or thia as a prefix before heterocyclyl define that at least a nitrogen, oxygen or sulfur atom is present respectively as a ring atom. "Substituted heterocyclyl" means a heterocyclyl moiety as defined above which is substituted with one or more "ring moiety substituents" (preferably 1 to 3) which may be the same or different and are as defined herein. The nitrogen atom of a heterocyclyl may be a basic nitrogen atom. The nitrogen or sulfur atom of the heterocyclyl may also be optionally oxidized to the corresponding N-oxide, S-oxide or S,S-dioxide. Exemplary monocyclic heterocyclyl rings include piperidyl, pyrrolidinyl, piperazinyl, morpholinyl, thiomorpholinyl, thiazolidinyl, 1,3-dioxolanyl, 1,4-dioxanyl, tetrahydrofuranyl, tetrahydrothiophenyl, tetrahydrothiopyranyl, and the like.

"Ring moiety substituents" mean substituents attached to aromatic or non-aromatic ring systems inclusive of aryl, heteroaryl, hydroxy, alkoxy, cyclyloxy, aryloxy, heteroaryloxy, acyl or its thioxo analogue, cyclylcarbonyl or its thioxo analogue, aroyl or its thioxo analogue, heteroaroyl or its thioxo analogue, acyloxy, cyclylcarbonyloxy, aroyloxy, heteroaroyloxy, halo, nitro, cyano, carboxy (acid), —C(=O)—NHOH, —C(=O)—CH$_2$OH, —C(=O)—CH$_2$SH, —C(=O)—NH—CN, sulpho, phosphono, alkylsulphonylcarbamoyl, tetrazolyl, arylsulphonylcarbamoyl, N-methoxycarbamoyl, heteroarylsulphonylcarbamoyl, 3-hydroxy-3-cyclobutene-1,2-dione, 3,5-dioxo-1,2,4-oxadiazolidinyl or hydroxyheteroaryl such as 3-hydroxyisoxazolyl, 3-hydoxy-1-methylpyrazolyl, alkoxycarbonyl, cyclyloxycarbonyl, aryloxycarbonyl, heteroaryloxycarbonyl, alkylsulfonyl, cyclylsulfonyl, arylsulfonyl, heteroarylsulfonyl, alkylsulfinyl, cyclylsulfinyl, arylsulfinyl, heteroarylsulfinyl, alkylthio, cyclylthio, arylthio, heteroarylthio, cyclyl, aryldiazo, heteroaryldiazo, thiol. When a ring system is saturated or partially saturated, the "ring moiety substituents" further include, methylene (H$_2$C=), oxo (O=) and thioxo (S=). Acidic/amide ring moiety substituents are carboxy (acid), —C(=O)—NHOH, —C(=O)—CH$_2$OH, —C(=O)—CH$_2$SH, —C(=O)—NH—CN, sulpho, phosphono, alkylsulphonylcarbamoyl, tetrazolyl, arylsulphonylcarbamoyl, N-methoxycarbamoyl, heteroarylsulphonylcarbamoyl, 3-hydroxy-3-cyclobutene-1,2-dione, 3,5-dioxo-1,2,4-oxadiazolidinyl or hydroxyheteroaryl such as 3-hydroxyisoxazolyl, 3-hydoxy-1-methylpyrazolyl. Non-acidic polar ring moiety substituents are hydroxy, oxo (O=), thioxo (S=), acyl or its thioxo analogue, cyclylcarbonyl or its thioxo analogue, aroyl or its thioxo analogue, heteroaroyl or its thioxo analogue, alkoxycarbonyl, cyclyloxycarbonyl, aryloxycarbonyl, heteroaryloxycarbonyl, acyloxy, cyclylcarbonyloxy, aroyloxy, heteroaroyloxy, alkylsulfonyl, cyclylsulfonyl, arylsulfonyl, heteroarylsulfonyl, alkylsulfinyl, cyclylsulfinyl, arylsulfinyl, heteroarylsulfinyl, thiol.

"Amino acid" means an amino acid selected from the group consisting of natural and unnatural amino acids as defined herein. Amino acid is also meant to include amino acids having L or D stereochemistry at the alpha-carbon. Preferred amino acids are those possessing an alpha-amino group. The amino acids may be neutral, positive or negative depending on the substituents in the side chain. "Neutral amino acid" means an amino acid containing uncharged side chain substituents. Exemplary neutral amino acids include alanine, valine, leucine, isoleucine, proline, phenylalanine, tryptophan, methionine, glycine, serine, threonine and cysteine. "Positive amino acid" means an amino acid in which the side chain substituents are positively charged at physiological pH. Exemplary positive amino acids include lysine, arginine and histidine. "Negative amino acid" means an amino acid in which the side chain substituents bear a net negative charge at physiological pH. Exemplary negative amino acids include aspartic acid and glutamic acid. Preferred amino acids are alpha-amino acids. Exemplary natural amino acids are alanine, isoleucine, proline, phenylalanine, tryptophan, methionine, glycine, serine, threonine, cysteine, tyrosine, asparagine, glutamine, lysine, arginine, histidine, aspartic acid and glutamic acid. "Unnatural amino acid" means an amino acid for which there is no nucleic acid codon. Exemplary unnatural amino acids include, for example, the D-isomers of the natural alpha-amino acids as indicated above; Aib (aminobutyric acid), beta-Aib (3-amino-isobutyric acid), Nva (norvaline), beta-Ala, Aad (2-aminoadipic acid), beta-Aad (3-aminoadipic acid), Abu (2-aminobutyric acid), Gaba (gamma-aminobutyric acid), Acp (6-aminocaproic acid), Dbu (2,4-diaminobutryic acid), alpha-aminopimelic acid, TMSA (trimethylsilyl-Ala), alle (allo-isoleucine), Nle (norleucine), tert-Leu, Cit (citrulline), Orn, Dpm (2,2'-diaminopimelic acid), Dpr (2,3-diaminopropionic acid), or beta-Nal, Cha (cyclohexyl-Ala), hydroxyproline, Sar (sarcosine), and the like; cyclic amino acids; Nα-alkylated amino acids such as MeGly (Nα-methylglycine), EtGly (Nα-ethylglycine) and EtAsn (Nα-ethylasparagine); and amino acids in which the alpha-carbon bears two side-chain substituents. The names of natural and unnatural amino acids and residues thereof used herein follow the naming conventions suggested by the IUPAC Commission on the Nomenclature of Organic Chemistry and the IUPAC-IUB Commission on Biochemical Nomenclature as set out in "Nomenclature of a-Amino Acids (Recommendations, 1974)" Biochemistry, 14(2), (1975). To the extent that the names and abbreviations of amino acids and residues thereof employed in this specification and appended claims differ from those noted, differing names and abbreviations will be made clear.

"Oligopeptidyl moiety" means a moiety that contains 2 to 8 amino acid moieties connected by amide bonds between the amino acid moieties wherein the amino acids are as defined herein. Amino acid moieties are preferably natural amino acids.

Within the context of this invention, "thiol" and "mercapto" are used interchangeably and mean an —SH moiety.

Within the context of this invention, a "defect site" can be a site for example in a coating layer that is, compared to the same coating layer that is free from defects, empty or differently occupied. For example, a defect site can be a hole in a coating layer. A defect site can also be a different compound that is incorporated into a coating layer.

DETAILED DESCRIPTION OF THE INVENTION

The monomers of the type R—(N)$_x$-(L)$_m$-(C≡C)$_n$-(L')$_o$-(N')$_y$—R' of the present invention can be prepared by various methods known to the person skilled in the art (see, for example, Schrettl, Chem. Sci. 2015, 6, 564, Szilluweit, Nano Lett. 2012, 12, 2573, Schrettl, Nature. Chem. 2014, 6, 468, Frauenrath, Org. Lett. 2008, 10, 4525). The following procedures serve as examples for the preparation of monomers of the type R—(N)$_x$-(L)$_m$-(C≡C)$_n$-(L')$_o$-(N')$_y$—R' and/or their intermediates, wherein x, m, o, and y are independently 0 or 1 and n is 4 to 12, and wherein R and R' are either the same or different moieties and L and L' are either the same or different linker moieties, unless otherwise specified. The monomers and the intermediates can be prepared from commercially available starting materials.

An example of a suitable monomer is hexayne R—(N)$_x$-(L)$_m$-(C≡C)$_6$-(L')$_o$-(N')$_y$—R'. Exemplary starting materials include compounds that comprise a —C≡C—H moiety. For the synthesis of the monomers R—(N)$_x$-(L)$_m$-(C≡C)$_n$-(L')$_o$-(N')$_y$—R', the starting materials can be subjected to a sequence of bromination and palladium-catalyzed cross coupling reactions resulting in an elongation of the oligoyne segment.

In an exemplary procedure for the preparation of monomers of the type R—(N)$_x$-(L)$_m$-(C≡C)$_n$-(L')$_o$-(N')$_y$—R', one can start from a chemically functionalized terminal alkyne R—(N)$_x$-(L)$_m$-C≡C—H and protect the head moiety R with a sterically demanding protecting group R*. This sterically demanding protecting group can serve to avoid premature cross-linking or degradation of the reactive oligoyne moiety in subsequent synthetic steps.

For example, for the synthesis of hexayne monomers and/or intermediates R"OOC—(CH$_2$)$_3$—(C≡C)$_6$—(CH$_2$)$_3$—R', wherein R" can be R—(N)$_x$—, 5-hexynoic acid can be first converted to the corresponding tritylphenyl ester (Trtph=Ph$_3$C(C$_6$H$_4$)) through an esterification reaction with tritylphenol. This reaction can be followed by a bromination reaction that converts the alkyne into the corresponding bromoalkyne intermediate. The bromoalkyne intermediate can then be subjected to a palladium-catalyzed cross-coupling reaction with the zinc acetylide of another alkyne or oligoyne. For example, the zinc derivative of a diyne can furnish the corresponding triyne intermediate as the reaction product. The copper-catalyzed homocoupling reaction of this triyne intermediate, for example, can give direct access to the symmetric hexayne monomer and/or intermediate TrtphOOC—(CH$_2$)$_3$—(C≡C)$_6$—(CH$_2$)$_3$—COOTrtph.

For the preparation of unsymmetric oligoyne monomers and/or intermediates, a different compound with an alkyne or oligoyne moiety can be prepared following substantially the same synthetic procedures. For example, in order to covalently link two different oligoyne intermediates, one of the two can be converted into the oligoyne bromide intermediate while the other can be converted into the corresponding oligoyne zinc acetylide. For example, the trityl phenyl ester with a triyne moiety can be brominated and directly used in the palladium-catalyzed cross-coupling reaction with a triyne zinc acetylide carrying another chemical functional group. This can give access to an unsymmetric hexayne monomer and/or intermediate TrtphOOC—j(CH$_2$)$_3$—(C≡C)$_6$-L'-R' carrying a sterically demanding ester on one side and a different moiety on the other side. For example, to prepare an unsymmetric hexayne monomer and/or intermediate with an alkyl group on the other side, one can employ the zinc acetylide of an alkyltriyne such as pentadeca-1,3,5-triyne. In the same way, an unsymmetric hexayne monomer and/or intermediate with a perfluoroalkyl group on the other side can be obtained from a perfluoroalkyltriyne such as 9,9,10,10,11,11,12,12,13,13,15,15,15-heptfluoropentadeca-1,3,5-triyne.

An unsymmetric hexayne monomer and/or intermediate with a hydrogen atom on one side can be prepared from zinc acetylides of alkynes, diynes, or triynes with a silyl moiety on one terminus. For example, the coupling of a triyne bromide intermediate equipped with a head moiety as above with a triisopropylsilyl-protected triyne zinc acetylide can furnish the triisopropylsilyl-substituted hexayne monomer and/or intermediate. Other silyl moieties can be used on the terminal acetylene carbon, as well, such as trimethylsilyl or triethylsilyl moieties. The removal of the silyl group can be readily achieved by employing a fluorine source, so that a hexayne monomer and/or intermediate with a terminal hydrogen atom is obtained.

In the same way, symmetric and unsymmetric oligoyne monomers of the type R—(N)$_x$-(L)$_m$-(C≡C)$_n$-(L')$_o$-(N')$_y$—R' with other types of terminal moieties can be obtained from different alkynes R—(N)$_x$-(L)$_m$-C≡C—H. For example, the hydroxyl-functionalized hexayne monomers and/or intermediates R*O—(CH$_2$)$_3$—(C≡C)$_6$—(CH$_2$)$_3$—OR* and R*O—(CH$_2$)$_3$—(C≡C)$_6$-(L')$_o$-(N')$_y$—R' equipped with a sterically demanding protecting moiety R* for the hydroxyl function, including but not limited to a trityl moiety, an acyl moiety such as a pivaloyl moiety, or a silyl moiety such as triisopropylsilyl, tert.-butyldimethylsilyl, or tert.-hexyldimethylsilyl, can be obtained by converting 4-pentynol with the corresponding trityl, acyl, or silyl chloride, and otherwise following the procedures described above. Likewise, symmetric and unsymmetric hexaynes monomers and/or intermediates R*S—(CH$_2$)$_3$—(C≡C)$_6$—(CH$_2$)$_3$—SR* and R*S—(CH$_2$)$_3$—(C≡C)$_6$-(L')$_o$-(N')$_y$—R' with thiol functions protected with a sterically demanding protecting moiety, R* including but not limited to a trityl moiety or a fluorenylmethyl moiety, can be obtained by reacting 4-pentynthiol with the corresponding trityl chloride or the fluorenylmethyl tosylate. Symmetric and unsymmetric hexayne monomers and/or intermediates R*NH—(CH$_2$)$_3$—(C≡C)$_6$—(CH$_2$)$_3$—NHR* and R*NH—(CH$_2$)$_3$—(C≡C)$_6$-(L')$_o$-(N')$_y$—R' with amine functions protected with sterically demanding protecting moieties R* including but not limited to fluorenylmethoxycarbonyl (Fmoc) can be obtained by reacting 4-pentynamine with fluorenylmethoxycarbonyl chloride. In all exemplary cases, the following reaction steps towards the final symmetric and unsymmetric hexayne monomers are preferably the same as those described in the previous paragraphs.

Preferred monomers are monomers of the type R—(N)$_x$-(L)$_m$-(C≡C)$_6$-(L')$_o$-(N')$_y$—R'. These preferred monomers can be symmetric or unsymmetric. It has been found that the carbon content of a corresponding film of the preferred monomers on a surface most closely matches the amount of carbon needed for an atomically dense carbon monolayer.

Nevertheless, the described exemplary schemes of synthetic procedures can also provide access to monomers and/or intermediates with shorter or longer oligoyne moieties, such as the corresponding monomers and/or intermediates, wherein the oligoyne moiety is a tetrayne, pentayne, heptayne, or octayne. Advantageously, monomers and/or intermediates that feature an odd number of acetylene units (that is, n is odd) are prepared by the cross-coupling methodology described herein. For example, the cross-coupling of a triyne bromide with a diyne zinc acetylide gives a pentayne monomer and/or intermediate. Depending on the moieties of the triyne bromide and the diyne zinc acetylide, both symmetric and unsymmetric pentayne monomers and/or intermediates can be prepared in this way.

Accordingly, the invention also relates to a method for the synthesis of compounds of the type X—W—(C≡C)$_a$—Y, wherein X is 2,3,4,6-tetra-O-acetyl-beta-D-glucopyranoside or (C$_6$H$_5$)$_3$—C—(C$_6$H$_4$)—O—C(═O)—, Y is selected from the group consisting of trimethylsilyl-, triisopropylsilyl-, and n-dodecyl-, (C≡C)$_a$ is an oligoyne moiety, a is 2 to 12, in particular 2 to 6, more particularly 6, W is (CH$_2$), (CH$_2$)$_2$ or (CH$_2$)$_3$, particularly (CH$_2$)$_3$, comprising reacting a compound of the type X—W—(C≡C)$_b$—Br, wherein X is as defined above, (C≡C)$_b$ is an oligoyne moiety, b is 1 to 9, in particular 1 to 3, more particularly 3, W is (CH$_2$), (CH$_2$)$_2$ or (CH$_2$)$_3$, particularly (CH$_2$)$_3$, with a compound of the type Cl—Zn—(C≡C)$_c$—Y, wherein Y is as defined above, (C≡C)$_c$ is an oligoyne moiety, c is 1 to 6, in particular 1 to 3, more particularly 3, in a solvent, in particular a mixture of tetrahydrofuran and toluene, in the presence of a palladium catalyst, in particular in the presence of (1,1'-bis(diphenylphosphino)ferrocene)palladium(II) dichloride.

Preferably, unsymmetric monomers and/or intermediates with an even number of acetylene units in the oligoyne moiety (that is, n is even) are prepared by the cross-coupling methodology described herein. For example, an unsymmetric monomer and/or intermediate with an oligoyne moiety, wherein n is 4, can be prepared by the cross-coupling reaction of a triyne bromide with an alkyne.

A symmetric tetrayne monomer and/or intermediate can be directly accessed through a homocoupling reaction of a diyne intermediate. Accordingly, symmetric octayne monomers and/or intermediates can be prepared by the homocoupling of the respective tetrayne intermediates. Unsymmetric octayne monomers and/or intermediates can be prepared by the cross-coupling of a tetrayne bromide monomer and/or intermediate with a tetrayne zinc acetylide.

Moreover, based on the described exemplary procedures, monomers and/or intermediates with various spacers L and L' can be prepared. For example, following the exemplary procedures described herein and starting from omega-octynoic, omega-heptynoic, or omega-pentynoic, or omega-butynoic acid the corresponding symmetric or unsymmetric oligoyne monomers and/or intermediates such as the symmetric or unsymmetric hexayne intermediates with protected acid moieties and pentylene, butylene, ethylene, or methylene spacers can be prepared. This can be used analogously for intermediates with other moieties $R^\#$, wherein $R^\#$ can be an appropriate moiety as described herein with the exception of —COOH, starting from appropriately functionalized terminal alkynes $R^\#$—$(N)_x$-$(L)_m$-C≡C—H, respectively. Using the resulting intermediates, the corresponding monomers can be prepared using the procedures described herein.

An alternative exemplary pathway towards further symmetric and unsymmetric oligoyne monomers of the type R—$(N)_x$-$(L)_m$-(C≡C)$_n$-$(L')_o$-$(N')_y$—R' is by way of functional group interconversion of intermediates and/or monomers F—$(N)_x$-$(L)_m$-(C≡C)$_n$-$(L')_o$-$(N')_y$—F', wherein F and F' independently may be appropriate moieties as described herein. This exemplary divergent synthetic pathway is a versatile alternative because it gives straightforward access to a large variety of differently functionalized compounds starting from the same oligoyne intermediate and/or monomer that is then produced on a larger scale and in an optimized reaction sequence. For example, the symmetric or unsymmetric hexayne esters R*OOC—$(CH_2)_3$—(C≡C)$_6$—$(CH_2)_3$—COOR* or R*OOC—$(CH_2)_3$—(C≡C)$_6$-$(L')_o$-$(N')_y$—R' can be subjected to a saponification under alkaline conditions to yield the corresponding hexayne monomer with one or two carboxylic acid functions. Alternatively, the symmetric or unsymmetric hexayne esters R*OOC—$(CH_2)_3$—(C≡C)$_6$—$(CH_2)_3$—COOR* or R*OOC—$(CH_2)_3$—(C≡C)$_6$-$(L')_o$-$(N')_y$—R' can be reduced with suitable reducing agents such as lithium aluminum hydride to directly yield the corresponding hexayne monomers with one or two hydroxyl functions.

Moreover, various other chemical functional groups can be introduced by carrying out transesterification reactions with appropriate alcohol derivatives. In the following, exemplary procedures are described. For example, a transesterification of either the unsymmetric hexayne intermediate and/or monomer R*OOC—$(CH_2)_3$—(C≡C)$_6$-$(L')_o$-$(N')_y$—R' or the symmetric hexayne intermediate and/or monomer *ROOC—$(CH_2)_3$—(C≡C)$_6$—$(CH_2)_3$—COOR* with tri (ethylene glycol) monomethyl ether under alkaline conditions can furnish the corresponding hexayne monomers and/or intermediates with one or two tri(ethylene glycol) segments, respectively. The transesterification of the aforementioned monomers and/or intermediates with a perfluoroalkyl alcohol under alkaline conditions can provide the unsymmetric or symmetric perfluoroalkyl-substituted hexaynes monomers and/or intermediates. The transesterification of the aforementioned monomers and/or intermediates with glycidol can provide the unsymmetric or symmetric glycidol-substituted hexayne monomer and/or intermediate.

Accordingly, the invention also relates to a method for the synthesis of monomers of the type Z—W'—(C≡C)$_a$—Y, wherein Z is beta-D-glucopyranoside or Me-O—C(=O)—,
Y is selected from the group consisting of trimethylsilyl-, triisopropylsilyl-, and n-dodecyl-,
(C≡C)$_a$ is an oligoyne moiety,
a is 2 to 12, in particular 2 to 6, more particularly 6,
W' is $(CH_2)$, $(CH_2)_2$ or $(CH_2)_3$, particularly $(CH_2)_3$,
comprising
reacting a compound of the type X—$(CH_2)_3$—(C≡C)$_a$—Y, wherein
X is 2,3,4,6-tetra-O-acetyl-beta-D-glucopyranoside or $(C_6H_5)_3$—C—$(C_6H_4)$—O—C(=O)—,
Y is selected from the group consisting of trimethylsilyl-, triisopropylsilyl-, and n-dodecyl-,
(C≡C)$_a$ is an oligoyne moiety,
a is 2 to 12, in particular 2 to 6, more particularly 6,
W' is $(CH_2)$, $(CH_2)_2$ or $(CH_2)_3$, particularly $(CH_2)_3$,
with sodium methanolate in solvent, in particular in a mixture of methanol and dioxane or methanol and dichloromethane.

In further exemplary procedures, the deprotection of the unsymmetric or symmetric hexayne monomers and/or intermediates R*O—$(CH_2)_3$—(C≡C)$_6$—$(CH_2)_3$—OR* or R*O—$(CH_2)_3$—(C≡C)$_6$-$(L')_o$-$(N')_y$—R' followed by esterification with acid chlorides or acid anhydrides, or the addition to isocyanates can provide other monomers and/or intermediates. For example, the reaction of HO—$(CH_2)_3$—(C≡C)$_6$—$(CH_2)_3$—OH or HO—$(CH_2)_3$—(C≡C)$_6$-$(L')_o$-$(N')_y$—R' with methacryloyl chloride can be used to prepare hexayne monomers and/or intermediates with one or two polymerizable methacrylate moieties. In another example, the addition of HO—$(CH_2)_3$—(C≡C)$_6$—$(CH_2)_3$—OH or HO—$(CH_2)_3$—(C≡C)$_6$-$(L')_o$-$(N')_y$—R' to triethoxysilylpropylisocyanate can be used to prepare unsymmetric or symmetric hexayne monomers and/or intermediates with one or two triethoxysilyl moieties.

In further exemplary procedures, the deprotection of the symmetric or unsymmetric hexayne intermediates R*S—$(CH_2)_3$—(C≡C)$_6$—$(CH_2)_3$—SR* or R*S—$(CH_2)_3$—(C≡C)$_6$-$(L')_o$-$(N')_y$—R' followed by thiol-ene reactions to Michael systems can be used to introduce further moieties. For example, the thiol-ene reaction with vinylphosphonates such as diethoxyvinylphosphonate yields unsymmetric or symmetric hexayne monomers and/or intermediates with one or two phosphonate moieties, respectively. These phosphonate moieties can be the head and tail moieties of the monomers, respectively.

It will be understood that the exemplary procedures described above can also be employed for monomers and/or intermediates with longer or shorter oligoyne moieties. The exemplary procedures described above can also be employed for monomers and/or intermediates with longer or shorter linker moieties.

With the exemplary procedures for the preparation of monomers and/or intermediates described herein, symmetric and/or unsymmetric oligoyne monomers of the type R—$(N)_x$-$(L)_m$-$(C\equiv C)_n$-$(L')_o$-$(N')_y$—R', with differently long oligoyne moieties and different linkers can be prepared. The monomers of the type R—$(N)_x$-$(L)_m$-$(C\equiv C)_n$-$(L')_o$-$(N')_y$—R' can have as head moiety and/or tail moiety one or two terminal (protected) carboxylic acids (and their derivatives such as esters, amides, peptides, and oligopeptides), trihalosilanes, trialkoxysilanes, amines (and their derivatives such as urethanes, peptides and oligopeptides), phosphines, phosphonic acids (and their derivatives such as alkyl or aryl phosphonates and phosphonamides), alcohols (including diols and polyols, ethers, urethanes, oligo(ethylene oxide)s of different lengths, thiols, sulfonic acids (and their derivatives such as alkyl or aryl sulfonates and sulfonamides), halogens, isocyanates, oligo(ethylene oxide)s, linear or branched alkyl groups, linear perfluoroalkyl groups, as well as polymerizable groups such as acrylates, methacrylates, styrenes, and epoxides.

According to an embodiment of the invention, the head moiety R of the monomers is selected from the group consisting of branched or unbranched alkyl, branched or unbranched haloalkyl, branched or unbranched alkenyl, branched or unbranched perfluoroalkyl, $C_6F_{13}C_6H_{12}$—, oligoethylenoxy such as triethylene glycol monomethyl ether or tetraethylene glycol monomethyl ether or pentaethylene glycol monomethyl ether or hexaethylene glycol monomethyl ether, phenyl, benzyl, aryl, heteroaryl, carboxy, ester, carboxamide, carbamoyl, oligopeptidyl, amine, halo, hydroxyl, mercapto, acryloyl, methacryloyl, styryl, isocyanate, sulfonyl hydroxide, phosphono or its derivatives, phosphate or its derivatives, oxiranyl, trihalosilyl, and trialkoxysilyl. Particularly preferred head moieties R are selected from the group consisting of phosphonic acid and its derivatives, phosphate and its derivatives, carboxy, hydroxyl, mercapto, oligoethylenoxy such as triethylene glycol monomethyl ether, oxiranyl, trihalosilyl, and trialkoxysilyl. The use of these head moieties allows for an effective binding to the surface of the substrate, in particular the solid substrate. This effective binding to the surface improves the adhesion of the coating to the surface.

According to a further embodiment of the invention, the tail moiety R' of the monomers is selected from the group consisting of —H, branched or unbranched alkyl, branched or unbranched haloalkyl, branched or unbranched alkenyl, branched or unbranched perfluoroalkyl, $C_6F_{13}C_6H_{12}$—, oligoethylenoxy such as triethylene glycol monomethyl ether or tetraethylene glycol monomethyl ether or pentaethylene glycol monomethyl ether or hexaethylene glycol monomethyl ether, phenyl, benzyl, aryl, heteroaryl, carboxy, ester, carboxamide, carbamoyl, oligopeptidyl, amine, halo, hydroxyl, mercapto, acryloyl, methacryloyl, styryl, isocyanate, sulfonyl hydroxide, phosphono or its derivatives, phosphate or its derivatives, oxiranyl, trihalosilyl, and trialkoxysilyl. Particularly preferred tail moieties R' are selected from the group consisting of unbranched alkyl, unbranched perfluoroalkyl, phosphonic acid and its derivatives, phosphate and its derivatives, mercapto, oligoethylenoxy such as triethylene glycol monomethyl ether, oxiranyl, trihalosilyl, and trialkoxysilyl. According to another embodiment of the invention, the linker components L and/or L' of the monomers are independently selected from the group consisting of methylene, ethylene, propylene, butylene, pentylene. These linker moieties allow for a particularly effective packing of the oligoyne moieties of the monomers. This aids in obtaining a coating that is substantially free from defect sites.

According to another embodiment of the invention, the tail moiety R' allows for an interaction with the surface of a substrate, in particular a solid substrate, of the same or a different material.

According to yet another embodiment of the invention, the head moiety R and the tail moiety R' are identical.

According to another embodiment of the invention, the head moiety R and the tail moiety R' are different. For this embodiment, the head moiety R and the tail moiety R' of the monomer can also have different polarities, for example the head moiety R can be more hydrophilic and the tail moiety R' can be less hydrophilic or the other way around. Alternatively, the head moiety R can be more hydrophobic and the tail moiety R' can be less hydrophobic or the other way around.

According to another embodiment of the invention, the polarities of the head moiety R and/or the tail moiety R' can be different from the polarities of the linker moieties L and/or L' and/or the oligoyne moiety $(C\equiv C)_n$. For example, the head moiety R and/or the tail moiety R' can be more hydrophilic than the linker moieties L and/or L' and/or the oligoyne moiety $(C\equiv C)_n$.

If the polarities of the head moiety R and the tail moiety R' of a monomer are different from each other or if the polarities of the head moiety R and the tail moiety R' of a monomer are different from the polarities of the linker moieties L and/or L' and/or the oligoyne moiety $(C\equiv C)_n$, these monomers can represent a new type of surfactant. In this new type of surfactant, the reactive oligoyne moiety can serve as a molecular carbon precursor. Further, the head moiety R and/or the tail moiety R' of this new type of surfactant can be chosen such that they can allow for an interaction with the surface of a substrate, in particular a solid substrate. The type of interaction between the head moiety and/or the tail moiety can be as described further below.

Preferred monomers are unsymmetric hexayne monomers with a head moiety R selected from the group consisting of —COOH, —COOMe, phosphonic acid and its diethyl ester, sulfonic acid, thiol, epoxide, triethoxysilane, and a tail moiety R' selected from the group consisting of dodecyl or $F_{13}C_6C_6H_{12}$—, and heptafluorododecyl. Other preferred monomers are symmetric hexayne monomers wherein the head moiety R and the tail moiety R' are identical and are selected from the group consisting of —COOH, —COOMe, phosphonic acid and its diethyl ester, sulfonic acid, thiol, epoxide, triethoxysilane. Hexayne monomers with these head moieties R and tail moieties R' can provide particularly strong binding to substrates, in particular solid substrates, such as for example noble metals, non-noble metals, and their metal oxides, including but not limited to aluminum, aluminum oxide, iron, steel, iron oxide, titanium, titanium oxide, magnesium, magnesium oxide, zinc, zinc oxide, chrome, chrome oxide, copper, copper oxide, indium tin oxide, silver, silver oxide, nickel, gold, palladium, or their alloys, as well as polymer surfaces such as polyamides such as Nylon-6 or Kevlar, semiaromatic polyamides, polyesters such as poly(lactic acid) (PLA), PET, PEN, vinyl and acrylic polymers such as poly(vinyl alcohol), poly(vinyl acetate), poly(vinylidene chloride), poly(ethylene), poly(propylene), poly(methyl methacrylate), poly(acrylic acid) or their copolymers. By careful choice of the tail moiety R' of an unsymmetric hexayne monomer, the specific adhesion to another layer can be achieved, or the surface properties can be controlled.

According to another embodiment of the invention, the monomers of the type R—$(N)_x$-$(L)_m$-$(C{\equiv}C)_n$-$(L')_o$-$(N')_y$—R', in particular monomers with the formula $CH_3$—O—C(=O)—$(CH_2)_3$—$(C{\equiv}C)_n$—$C_{12}H_{25}$, can self-assemble into monolayers at interfaces, for example at the air-water interface, the oil-water interface, or a solid surface in contact with water or an organic solvent.

According to the invention, the monomers are brought into contact with the substrate, in particular the solid substrate, wherein the interaction of the head moieties of the monomers with the surface of the substrate, in particular the solid substrate, induces at least a part of the monomers to align in a defined manner thereby forming a film on the surface. Depending on the amount of monomers per surface area, the film formed by the monomers on the surface of the substrate can be a monolayer or a multilayer, for example a double layer or a triple layer. In case of a monolayer, the majority, preferably all, of the head moieties of the monomers are in contact with the surface of the substrate. In case of a multilayer, only a part of the head moieties of the monomers is in contact with the surface of the substrate. "Bringing the monomers into contact" can therefore mean that at least a substantial part of the monomers is brought into direct contact. For example, in the case of a multilayer, the majority of the monomers in the layer that is closest to the surface of the substrate is in contact with the surface of the substrate.

The monomers can be brought into contact with the substrate, in particular the solid substrate, by various means. The following procedures serve as examples for pathways to bring the monomers into contact with the substrate, in particular the solid substrate.

For example, the monomers of the type R—$(N)_x$-$(L)_m$-$(C{\equiv}C)_n$-$(L')_o$-$(N')_y$—R' can form a self-assembled monolayer by spreading them on the water surface from a dilute solution in an organic solvent such as chloroform that is immiscible with the aqueous subphase. After evaporation of the solvent, the surface area of the air-water interface can be reduced by compression, for example with the moveable barriers of a Langmuir trough. The compression can be monitored by means of the surface pressure through the surface pressure microbalance, and the compression can be continued until the change in surface pressure indicates that the monomers are in close contact, for example in a condensed state. Alternatively, such monolayers as well as multilayers of such monolayers can be achieved by simply spreading the monomers on the water surface from a dilute solution in a water-immiscible organic solvent (applied to the water surface by simple casting or spraying techniques) such as chloroform at a monomer concentration that ensures a dense coverage of the whole water surface with a monomer monolayer or a multilayer.

The monomer monolayers or multilayers obtained at the air-water interface can then be transferred to an appropriately chosen substrate, in particular a solid substrate, by different techniques. For example, a suitable hydrophilic solid substrate such as a silicon oxide wafer can be immersed in the subphase (for example in the aqueous phase) and vertically aligned to the air-water interface before spreading the monomers on the water surface. After spreading of the monomer, the substrate, in particular the solid substrate, can be carefully removed, by pulling it slowly out of the water. This procedure can be employed for the transfer of monomers in the form of a monolayer or a multilayer to any substrate, in particular solid substrate, with a sufficiently hydrophilic surface such as metals, metal oxides, or glass, in particular silicon, steel, aluminum, aluminum oxide, or silicon dioxide. Moreover, this procedure can allow for the transfer of monomers in the form of a monolayer or a multilayer to different classes of polymeric substrates, in particular polyamides such as Nylon-6 or Kevlar, semiaromatic polyamides, polyesters such as poly (lactic acid), PET, PEN, vinyl and acrylic polymers such as poly(vinyl alcohol), poly(vinyl acetate), poly(vinylidene chloride), poly(ethylene), poly(propylene) or their copolymers. Monomer multilayers can also be prepared on the substrate, in particular the solid substrate, by repeating this procedure.

Accordingly, the invention also provides for a method for the manufacture of a coating comprising at least one coating layer on a target substrate, the method comprising the steps of a. providing monomers of the type R—$(N)_x$-$(L)_m$-$(C{\equiv}C)_n$-$(L')_o$-$(N')_y$—R', wherein
R is a head moiety,
R' is a tail moiety,
$(C{\equiv}C)_n$ is an oligoyne moiety,
L and L' are linker moieties,
N and N' independently are branched or unbranched optionally substituted $C_1$-$C_{25}$ alkyl moieties optionally containing 1 to 5 heteroatoms,
x, m, o, and y are independently 0 or 1,
n is 4 to 12,
and wherein the head moiety allows for an interaction with the surface of an auxiliary substrate and/or with the surface of the target substrate;

b. bringing the monomers into contact with the auxiliary substrate wherein the interaction of the head moieties of the monomers with the surface of the auxiliary substrate induces at least a part of the monomers to align in a defined manner thereby forming a film on the surface of the auxiliary substrate and bringing the oligoyne moieties of the monomers into close contact with each other;

c. optionally, reducing the surface area of the surface of the auxiliary substrate, d. transferring the film obtained in step b. or in step c. to a target substrate, in particular to a solid target substrate, more particularly to a sapphire target substrate, e. inducing a reaction between oligoyne moieties by providing an external stimulus so as to at least partially cross-link the aligned monomers, thereby forming a coating layer on the target substrate.

Preferably, the auxiliary substrate is a liquid substrate, in particular water. Preferably, the details for the substrate as described and defined herein also apply to the target substrate. Advantageously, the features described for the method of the invention for the manufacture of a coating comprising at least one coating layer on a substrate also apply to the method for the manufacture of a coating comprising at least one coating layer on a target substrate.

In another exemplary procedure, after spreading of the monomer on the water surface and formation of a monomer monolayer or multilayer at the air-water interface, this monomer monolayer or multilayer can also be transferred to a substrate, in particular a solid substrate, by the slow removal of the water subphase, in a way so that the monomer monolayer or multilayer slowly sinks onto the surface of a substrate, in particular a solid substrate, that has been immersed in the trough prior to the spreading of the monomers. This transfer technique can be universally employed for any type of substrate including but not limited to noble metals, non-noble metals, metal oxides, glasses, ceramics, or polymers. For example, a monomer monolayer or multilayer with its hydrophilic groups (such as carboxylic acids, esters, phosphonic esters, or phosphonates) oriented towards the aqueous subphase and its hydrophobic dodecyl or heptafluorododecyl chains oriented towards the air can be transferred to hydrophilic substrates, such as a silicon wafer (with a thermal $SiO_2$ surface layer), a steel slide, a metal electrode, as well as an aluminum oxide and a titanium oxide substrate in this manner.

In a further exemplary procedure, a monomer monolayer or multilayer can be transferred from the air-water interface onto a solid substrate by moving a solid substrate to the interface from above until the subphase wets the solid substrate. Thereafter, the solid substrate can be slowly removed from the interface while ensuring that the monomer monolayer or multilayer covers the substrate. This transfer technique can be employed with any type of substrate to which the respective monomers of the monomer monolayer or multilayer adhere, preferably adhere specifically. For example, a monomer monolayer or multilayer with the hydrophilic moieties (such as carboxylic acids, esters, phosphonic esters, or phosphonates) oriented towards the aqueous subphase and hydrophobic dodecyl or heptafluorododecyl moieties oriented towards the air can be transferred to hydrophobic substrates such as octadecyl-trichlorosilane-covered silicon, gold substrates, or copper substrates or hydrophobic polymers such as poly(ethylene), PET, PEN, PTFE.

Using the procedures described above, monomer monolayers and multilayers can for example be obtained from unsymmetric and/or symmetric hexayne monomers, for example with either a carboxylic acid, carboxylic acid ester, phosphonic acid, or phosphonic acid ester head moiety and a dodecyl, carboxylic acid, carboxylic acid ester, phosphonic acid, or phosphonic acid ester tail moiety on silicon wafers, aluminum oxide, sapphire, or mica substrates, glass substrates, gold-covered glass slides, as well as steel and iron substrates. For example, this method can also be used to produce monolayers from the unsymmetric hexayne derivatives with either a carboxylic acid, carboxylic acid ester, phosphonic acid, or phosphonic acid ester head moiety and a dodecyl tail moiety on silicon wafers, titanium oxide, aluminum oxide, sapphire or mica substrates, glass slides, gold-covered glass slides, aluminum substrates, or steel slides. In addition, this procedure can for example be used to produce monomer monolayers from the hexayne monomers with either an epoxide, hydroxyl, alkyl, or amide head moiety and a dodecyl tail moiety on Nylon-6, PET, PEN, poly(lactic acid), poly(vinyl alcohol), poly(ethylene), and poly(propylene) substrates.

According to a further embodiment of the invention, the monomers are brought into contact with the substrate, in particular the solid substrate, in solution in a solvent that wets the surface of the substrate, in particular the solid substrate. This facilitates a substantially homogeneous distribution of the monomers on the substrate. Preferably, the solution is brought into contact with the surface by painting, spraying, coating, dipping, immersion and/or casting.

For example, monomer films, in particular in the form of self-assembled monolayers, can be obtained on surfaces of suitable substrate, in particular solid substrates, if (one of) the head moiety R is chosen such that it provides a specific binding to the surface of the substrate. For this purpose, for example, a solution of the monomers in a suitable organic solvent that wets the surface of the substrate can be applied to the surface by different techniques, including painting, spraying, coating, dipping, immersion, or casting techniques. For example, aluminum oxide and other metal or metal oxide substrates can be immersed in a solution of monomer with a head moiety selected from the group consisting of a carboxylic acid, phosphonic acid, or phosphonate for a few minutes. The substrate can thereafter slowly be removed from the solution, and the residual solvent is preferably allowed to evaporate. The coated aluminum oxide surface can be directly used in further steps of the method or first washed with the pure solvent to remove any excess monomer.

In the same way, for example, monomers with a thiol head moiety can be applied to gold or other noble metal surfaces. Using this procedure, monomers with a triethoxysilane head moiety can, for example, also be applied to glass or quartz surfaces. With this procedure, for example, monomers with an alcohol- or epoxide head moiety can also be applied to polymer substrates such as PET, PEN, poly(lactic acid), poly(amide), or poly(vinyl alcohol).

Besides the above described exemplary dipping of the substrate, in particular the solid substrate, into a solution of the monomers, spraying, painting, coating, or casting techniques can for example be employed to bring the monomers into contact with the substrate, in particular the solid substrate. In another exemplary procedure, a monolayer of an unsymmetric hexayne monomer with a phosphonate head moiety and a dodecyl tail moiety on an aluminum oxide substrate can be obtained by immersion of the substrate, in particular the solid substrate, in a monomer solution. This procedure can be advantageous since with the substrate prepared in this manner, films in which the oligoyne moieties can be easily cross-linked can be obtained. In both cases, the resulting coating can be strongly bound to the aluminum oxide substrate. For example, a multilayer film of a symmetric hexayne monomer with an epoxide as a head moiety and an epoxide as a tail moiety can be formed on a PET substrate by drop-casting a solution of the monomer onto the substrate.

According to another embodiment of the invention, the interaction of the head moiety R of the monomers with the surface of the substrate, in particular the solid substrate, is specific binding. Advantageously, this specific binding allows for reversible and/or dynamic bond formation between the head moiety R and the surface of the substrate at room temperature.

According to yet another embodiment of the invention, the specific binding allows for the formation of covalent or non-covalent bonds between the head groups R and the surface of the substrate, in particular the solid substrate, using the head moieties R of the monomers as ligands that have an affinity to a matching receptor site on the surface of the substrate, in particular the solid substrate. The formation of the bonds may involve a chemical reaction. Advantageously, the strength of the bonds of the specific binding is from 5 kJ/mol to 460 kJ/mol, particularly from 10 kJ/mol to 200 kJ/mol, more particularly from 10 kJ/mol to 100 kJ/mol. Such bonds allow the monomers to align in such a way that the oligoyne moieties of the monomers are in close contact. For example, the head moieties may bind to specific materials surfaces through covalent bonds, coordinative bonds, ionic interactions, dipolar interactions, hydrogen bonds, van der Waals interactions, or a combination thereof. This can allow for the preparation of a cross-linked coating that is substantially free from defect sites.

The interaction of the head moiety R with the surface of the substrate, in particular the solid substrate, can be important both for the adhesion of the monomers and/or for the adhesion of the coatings. For example, monomers and/or coatings with carboxylic acid, carboxylic acid ester, phosphonic acid, phosphonic acid ester, sulfonic acid, thiol, or triethoxysilane functions can provide binding to noble metals, non-noble metals, and their metal oxides, including but not limited to aluminum, aluminum oxide, rubis, steel, iron, iron oxide, tin, tin oxide, solder, titanium, titanium oxide, magnesium, magnesium oxide, zinc, zinc oxide, chrome, chrome oxide, copper, copper oxide, brass, indium tin oxide, silver, silver oxide, nickel, gold, palladium, platinum, osmium, silicon, silicon oxide, cobalt, tantalum, zirconium, zirconium oxide, as well as their alloys and composites. Moreover, ceramics, glasses, thermoplastic polymers, elastomers, cross-linked polymers, resins, and nanocomposites, for instance epoxies used in microelectronics, can be also used as substrates for the current invention.

Examples for this specific binding may include:
hydroxyl moieties for a silicon surface; this specific binding may include the formation of covalent bonds;
hydroxyl moieties for polymers and polymeric resins such as epoxy resins and polyesters such as PET, PEN, or PLA; this specific binding may include the formation of covalent bonds for example via ring opening and/or transesterification;
hydroxyl moieties for polymers such as polyamide, polyurethanes, poly(vinyl alcohol); this specific binding may include the formation of hydrogen bonds;
carboxyl moieties for aluminum, iron, titanium, silver, and their oxides; this specific binding may include the formation of monodentate ionic and/or dipolar bonds;
amine moieties for mica and stainless steel; this specific binding may include the formation of ionic and/or dipolar bonds;
mercapto (or thiol) moieties for late transition metals such as gold, silver, copper, nickel, palladium, platinum, steel, and zinc; this specific binding may include the formation of thiol-metal bonds;
phosphonic acid or phosphonic acid derivative moieties for aluminum, aluminum oxide, magnesium, magnesium oxide, steel, indium tin oxide, mica, titanium, titanium dioxide, zirconium, zirconium oxide; this specific binding may include the formation of bidentate ionic and/or dipolar bonds;
phosphate or phosphate derivative moieties for aluminum oxide, tantalum oxide, and titanium oxide; this specific binding may include the formation of tridentate ionic and/or dipolar bonds;
trialkoxysilane or trihalosilane moieties for glass, indium tin oxide, titanium dioxide, zirconium oxide, and polyamines such as poly(ethylene imine); this specific binding may include the formation of covalent bonds;
oxiranyl (or epoxide) moieties for polyesters such as PET, PEN, and PLA; this specific binding may include the formation of covalent bonds by ring-opening of the epoxide and/or transesterification;
isocyanate moieties for polymers such as polyamides and polyurethanes including Nylons such as Nylon-6, Nylon-6,6, Nylon-6,10, and semiaromatic polyamides, and polyaramides such as Kevlar®; this specific binding may include the formation of covalent bonds;
acryloyl, methacryloyl, styryl, or vinyl-substituted phenyl moieties with polymers such as olefinic, dienic, methacrylic, acrylic, and vinylic polymers such as poly(vinyl acetate), poly(vinyl alcohol), poly(vinylidene chloride), poly(isoprene), poly(methyl methacrylate);
this specific binding may include the formation of covalent bonds, for example by polymerization of the moieties.

According to the invention, at least part of the monomers align in a defined manner. Preferably, most of the monomers align in a defined manner.

According to an embodiment of the invention, at least part of the monomers align such on the surface that a diffractogram measured in the plane of the film displays at least a first-order reflection. This applies in particular to flat substrate surfaces. Examples for such diffractograms can be X-ray diffractograms, in particular obtained by grazing incidence X-ray diffraction. Methods to obtain such diffractograms are known to the skilled person.

According to another embodiment of the invention, at least part of the monomers align such on the surface that the centers of gravity of the oligoyne moieties of the monomers are on a regular lattice within the immediate surroundings of a monomer. Preferably, the immediate surroundings of a monomer are within a radius of at least 0.5 nm, in particular at least 1 nm, more particularly at least 2 nm or at least 3 nm, from the center of gravity of the oligoyne moiety of that monomer. Such an arrangement can help in the preparation of a coating that is substantially free from defects and/or has a defined density and/or nature of functional moieties on at least one of the sides of the coating. Methods to determine the center of gravity of the oligoyne moieties are known to the skilled person. For example, the center of gravity of the oligoyne moiety can be obtained by calculation assuming the mass of the carbon atoms to be point shaped using the formula $r_s = 1/M \sum_{i=1}^{n} m_i r_i$, wherein $r_s$ is the coordinate vector of the center of gravity of the oligoyne moiety, M is the total mass of the oligoyne moiety, and $m_i$ and $r_i$ are the mass and the coordinate vectors of the individual atoms in the oligoyne moiety, respectively. For the bond lengths and the atomic weights, standard tabulated values can be used for the calculation. Standard tabulated values can for example be found in CRC Handbook of Chemistry and Physics, David R. Lide (editor-in-chief), $84^{th}$ edition, 2003-2004, CRC Press, pages 1-12 and 9-27 (the bond lengths in 1,3-butadiyne can be used for example for the bond lengths of the carbon-carbon single and carbon-carbon triple bonds in the oligoyne moiety). For this calculation, the origin of the coordinate system can be defined as one of the carbon atoms, in particular one of the terminal carbon atoms, which may simplify the calculation.

According to the invention, at least part of the monomers align in a defined manner on the surface of the substrate, in particular the solid substrate, thereby forming a film on the surface and bringing the oligoyne moieties of the monomers into close contact with each other. According to an embodiment of the invention, the close contact of the oligoyne moieties of the monomers is van-der-Waals contact. This allows for the preparation of an at least partially cross-linked coating under mild conditions. This can also allow for the preparation of a coating that is substantially free from defects.

According to the invention, the head moiety allows for an interaction with the surface of the substrate, in particular the solid substrate. According to an embodiment of the invention, the head moieties R of the monomers are in contact with the surface of the substrate, in particular the solid substrate. The contact of the monomers with the surface of the substrate, in particular the solid substrate, may be via specific binding as specified herein.

According to another embodiment of the invention, the oligoyne moieties of the monomers are substantially devoid of contact with the surface of the substrate, in particular the solid substrate. Advantageously, each monomer has a long axis defined as the axis through the two carbon atoms of the oligoyne moiety that are farthest apart from each other and that the monomers are oriented with their respective long axes standing up from the surface of the substrate, in particular the solid substrate. Practical experiments have shown that an orientation of the monomers in which the oligoyne moieties of the monomers are substantially in contact with the surface of the substrate, in particular the solid substrate, cross-linking of the resulting film may be difficult. If the oligoyne moieties are substantially devoid of contact with the surface of the substrate, in particular the solid substrate, and, particularly, if their respective long axes as defined herein are oriented away from the surface, in particular, if their respective long axes are standing up from the surface, it has been found that it may be easier to induce at least partial cross-linking of the resulting film.

According to a further embodiment of the invention, the film on the surface has a thickness of from 0.1 to 500 nm, particularly from 0.1 to 250 nm, more particularly from 0.1 to 100 nm or from 0.2 to 50 nm or from 0.3 to 30 nm or from 0.5 to 10 nm.

According to the invention, a reaction between oligoyne moieties is induced by providing an external stimulus. According to an embodiment of the invention, the external stimulus is heat, electromagnetic irradiation, and/or a chemical radical initiator. Examples for electromagnetic irradiation are irradiation with UV light (UV irradiation), irradiation with visible light, and irradiation with X-rays. Examples for chemical radical initiators are azoisobutyronitril, dibenzoylperoxide, dilauroylperoxide, di-tert-butyl-peroxide, diisopropylperoxidicarbonate, and potassium persulfate. Preferably, the external stimulus is UV irradiation. Examples for suitable sources for UV irradiation are a 250 W gallium-doped iron halide lamp, a Hg lamp, a laser, or an LED lighting source. This allows for a mild at least partial cross-linking of the film. Mild conditions may aid in obtaining a coating that is substantially free from defects. In addition, mild conditions may allow to maintain the head and/or tail moieties unchanged at the coating layer which may allow for specific binding and hence good adhesion of the coating layer to the substrate and/or to layers above.

According to another embodiment of the invention, the reaction between oligoyne moieties is a carbonization reaction. A carbonization reaction allows for a good at least partial cross-linking of the film.

According to a further embodiment of the invention, the reaction between oligoyne moieties is induced and/or conducted at a temperature from 25 to 200° C., preferably from 25 to 100° C., more preferably from 25 to 50° C. This allows for a mild at least partial cross-linking of the film. Mild conditions may aid in obtaining a coating that is substantially free from defects. In addition, mild conditions may allow to maintain the head and/or tail moieties unchanged at the coating layer which may allow for specific binding and hence good adhesion of the coating layer to the substrate and/or to layers above.

For example, a monolayer of an unsymmetric and/or a symmetric hexayne monomer with a carboxylic acid or ester head moiety and a carboxylic acid, carboxylic acid ester, or dodecyl tail moiety can be spread at the air-water interface and subsequently transferred to a silicon substrate thereby forming a film on the silicon substrate using the procedures described herein. Subsequently, the film on the silicon substrate can be exposed to irradiation with a UV lamp (such as a 250 W gallium-doped iron halide lamp, a Hg lamp, or an LED lighting source), inducing a reaction between oligoyne moieties. This can, for example, lead to the formation of a coating strongly bound to the silicon substrate. In another exemplary procedure, a monolayer of an unsymmetric hexayne monomer with a phosphonate head moiety and a dodecyl tail moiety on an aluminum oxide substrate can be obtained by immersion of the substrate, in particular the solid substrate, in a monomer solution as described above. For this film, a reaction between oligoyne moieties can be induced using for example irradiation, such as with a UV lamp (such as a 250 W gallium-doped iron halide lamp, a Hg lamp, or an LED lighting source), and/or by thermal annealing at temperatures above 25° C., in particular above 100° C. In another exemplary procedure, a multilayer film of a symmetric hexayne monomer with an epoxide as a head moiety and an epoxide as a tail moiety can be formed on a PET substrate by drop-casting a solution of the monomer onto the substrate as described above. Subsequently, a reaction between oligoyne moieties can be induced for example by irradiating the substrate, for example with a UV lamp such as a 250 W gallium-doped iron halide lamp.

According to yet another embodiment of the invention, the substrate, in particular the solid substrate, is selected from the group consisting of glass, quartz, indium tin oxide, ceramics, mica, brass, non-noble metals such as aluminum, steel, iron, tin, solder, titanium, magnesium, zinc, chrome, copper, nickel, silicon, cobalt, tantalum, zirconium and oxides and chalcogenides thereof, noble metals such as silver, gold, platinum, palladium, osmium, and alloys thereof, silver oxide, polymers such as epoxy resins, polyesters, poly(ethylene terephthalate), poly(ethylene naphthalate), poly(lactic acid), polyamides, polyurethanes, poly (vinylic) polymers, poly(vinyl alcohol), poly(vinyl actate), poly(vinylidene chloride), polyolefins, dienic polymers, poly(isoprene), poly(methacrylate)s, and poly(acrylate)s.

Further examples for substrates, in particular solid substrates, are noble metals, non-noble metals, and their metal oxides, including but not limited to aluminum, aluminum oxide, rubis, steel, iron, iron oxide, tin, tin oxide, solder, titanium, titanium oxide, magnesium, magnesium oxide, zinc, zinc oxide, chrome, chrome oxide, copper, copper oxide, brass, indium tin oxide, silver, silver oxide, nickel, gold, palladium, platinum, osmium, silicon, silicon oxide, cobalt, tantalum, zirconium, zirconium oxide, as well as their alloys and composites, ceramics, glasses, thermoplastic polymers, elastomers, cross-linked polymers, resins, and nanocomposites, for instance epoxies used in microelectronics.

According to another embodiment of the invention, the coating layer on the substrate, in particular the solid substrate, has a thickness of from 0.1 to 500 nm, particularly from 0.1 to 250 nm, more particularly from 0.1 to 100 nm or from 0.2 to 50 nm or from 0.3 to 30 nm or from 0.5 to 10 nm. A coating layer with a thickness of less than 0.1 nm did not have good properties in desired applications such as for example as barrier layer. Thick coating layers, in particular with a thickness of more than 500 nm were found to be too brittle for most applications.

According to another embodiment of the invention, the coating layer on the substrate, in particular the solid substrate, comprises an atomically dense carbon layer. Preferably, the carbon layer results from a carbonization reaction of the oligoyne moieties of the monomers. Particularly, the atomically dense carbon layer contains 75 to 90% $sp^2$ hybridized carbon atoms and 25 to 10% $sp^3$ hybridized carbon atoms. Advantageously, the head moieties and/or the tail moieties of the monomers are not affected by the carbonization reaction. Preferably, the coating comprises the head moieties and/or the tail moieties. The head moieties R and/or the tail moieties R' are preferably attached to the carbon layer, thereby forming the coating layer. Particularly, the head moieties R and/or the tail moieties R' are attached to the atomically dense carbon layer via the $sp^3$ hybridized carbon atoms. Advantageously, the carbon layer has a carbon density from 1 to 2 $g/cm^3$.

According to yet another embodiment of the invention, the oligoyne moieties $(C\equiv C)_n$ of the monomers serve as reactive precursors for the formation of two-dimensional, atomically dense carbon monolayers. Monomers with oligoyne moieties $(C\equiv C)_n$, wherein n is 6, 7, or 8, are preferred since for these monomers, the number of carbon atoms in the oligoyne moiety can match well the number of carbons required to densely cover an area that corresponds to the molecular area occupied by a typical alkyl-terminated surfactant depending on the size of its head moiety.

According to another embodiment of the invention, in an additional step after inducing the reaction between oligoyne moieties, the coating comprising at least one coating layer is transferred from the substrate to a different substrate, in particular to a solid substrate, more particularly to a sapphire substrate.

According to yet another embodiment of the invention, in an additional step before inducing the reaction between oligoyne moieties, a layer of an additional substrate, in particular a solid substrate, is deposited on the film. This can be helpful for the preparation of sandwich structures.

According to a further embodiment of the invention, in an additional step after inducing the reaction between oligoyne moieties, a layer of an additional substrate, in particular a solid substrate, is deposited on the coating layer. This can be helpful for the preparation of sandwich structures.

According to a preferred embodiment of the invention, the monomers have the formula $CH_3$—O—C(=O)—$(CH_2)_3$—$(C\equiv C)_n$—$C_{12}H_{25}$, in particular $CH_3$—O—C(=O)—$(CH_2)_3$—$(C\equiv C)_6$-n-$C_{12}H_{25}$. In this embodiment, the substrate is preferably a liquid substrate, in particular water.

The invention also relates to a coating obtainable by the method of the invention.

The details concerning the methods described herein are respectively also valid for the details concerning the coating obtainable according to the method of the invention. In particular the details concerning the binding, particularly the specific binding, of the head moieties to the substrate are also valid for the coating obtainable according to the method of the invention.

According to an embodiment of the invention, the coating has wear-resistant properties, anti-corrosive properties, protein-repellent properties, hydrophobic properties and/or oleophobic properties. The coating may also have the properties of biocompatibility or sensing of volatile organic compounds. These properties allow to tailor the properties of a surface in the way they are needed.

By employing the present invention, an effective coating can be obtained without using the otherwise required and significantly more expensive vapor-phase processes such as physical vapor deposition, chemical vapor deposition, or atomic layer deposition. Another advantage of the coating obtained by the method according to the invention is that the resulting coating can exhibit a defined and controlled surface coverage with chemical functional groups resulting from the head moieties and/or the tail moieties of the monomers that provide the possibility for a specific binding to the surface of the substrate to which they are applied, or to subsequent materials layers, or that can be used to introduce additional functions or properties.

According to another embodiment of the invention, the coating comprises a two-dimensional, extensively cross-linked, and atomically dense carbon monolayer. Preferably, this two-dimensional, extensively cross-linked, and atomically dense carbon monolayer has superior barrier properties against the diffusion of molecules or ions, comparable to those of atomically dense layers obtained by vapor deposition processes. Advantageously, the atomically dense carbon monolayers have defined moieties on either of their sides, because the moieties attached to the oligoyne moiety, that is the moieties $R-(N)_x-(L)_m$- and/or $-(L')_o-(N')_y-R'$, can remain attached to the carbon monolayers. The moieties on the sides of the atomically dense carbon monolayers can be the same or different. This can particularly aid in providing good adhesion to the substrate, in particular the solid substrate, by, for example, specific binding or covalent attachment or strong physical absorption, and/or to other material layer that can be deposited on top of the carbon monolayers. This can result in good tribological properties and/or resistance against wear, lift-off, or delamination of the carbon monolayer. The moieties on the top side of the coating can serve as a means to provide additional functions or properties to the material, such as hydrophobicity, oleophobicity, hydrophilicity and/or biocompatibility, as well as sensing properties.

The invention also relates to the use of a coating obtainable according to the methods of the invention to control the wettability and/or to increase the corrosion resistance of components in machine building and/or precision mechanics.

The coating prepared by the method according to the invention may provide an atomically dense barrier layer. This barrier layer may have a low permeability for molecules and/or ions. The coating may, for example, be used as a barrier layer to reduce or prevent the diffusion of gases including oxygen, water, carbon dioxide, volatile organic compounds (VOCs), and/or ions. The coating may for example be used in two different types of applications, that is, anticorrosive coatings and packaging or encapsulation materials for food items, pharmaceuticals, and/or microelectronic devices.

For anticorrosive coatings and packaging or encapsulation materials, a coating may, for example, be applied as described herein to the surface of the employed substrate, selected from the group consisting of noble metals, non-noble metals, metal oxides, glasses, ceramics, thermoplastic polymers, elastomers, or organic materials. For this purpose, the coating can be chosen such that it provides specific binding to the surface, with the goal to prevent the removal or degradation of the coating by delamination, crack formation, lift-off, and/or wear. The coating on the surface itself may provide an atomically dense barrier towards the diffusion of molecules and/or ions, including but not limited to oxygen, water, other (reactive) gases, acids, bases, reductants, oxidants, ions, organic solvents and reactants, or etching solutions; but also biomolecules, bacteria, or fungi. Moreover, the coating may provide additional protection against the environment, by way of the moieties not used for the surface attachment. Coatings equipped with alkyl chains may, for example, provide hydrophobic properties and/or additional protection against diffusion of polar compounds, including water and carbon dioxide, to the substrate. These effects may be caused by frustration of surface interactions.

For example, a coating that carries perfluorinated alkyl moieties on the surface may, in addition, be oleophobic. Such a coating may frustrate the wetting of the covered surface with both hydrophobic and hydrophilic molecules and may thus provide an additional protection against diffusion of various types of small molecules. By contrast, coatings that carry hydrophilic oligo(ethylene glycol) moieties may have improved wettability in contact with an aqueous environment. Such coatings may, for example, also provide an improved biocompatibility by preventing the unspecific adsorption of biomolecules. In all examples, the additional surface-exposed moieties may provide all advantages of respective self-assembled monolayers, but they may be collectively bound to the substrate, in particular the solid substrate, by a large number of surface-active moieties, so that this surface functionalization may have improved wear resistance.

In another exemplary use, the tail moieties of a coating may be used for a specific binding to additional coatings, so that the coating may serve as both an atomically dense diffusion barrier with excellent binding to the surface, and as a primer to ensure adhesion to further layers. For example, the above-described steel slide with a coating that is specifically bound to the surface by the phosphonic acid head moieties wherein the coating also has dodecyl moieties on its surface may have an enhanced resistance against corrosion. The corrosion protection properties of these coatings may be evaluated by means of electrochemical impedance spectroscopy. The anticorrosion properties may be further improved by the application of an additional, specifically bound layer of polymerized SU-8, as described above. Similarly, coatings with triethoxysilane head moieties may be used to improve the anticorrosion properties of aluminum substrates.

The invention also relates to a substrate, in particular a solid substrate, comprising a coating obtainable by the methods according to the invention.

With the method according to the invention sandwich structures may also be prepared. These sandwich structures may comprise one or multiple coating layers on a substrate in combination with further layers of different materials selected from the group consisting of noble metals, non-noble metals, metal oxides, metal chalcogenides, glasses, ceramics, thermoplastic polymers, elastomers, or organic materials. In sandwich structures, the head moieties and tail moieties on the two faces of the coating layer or coating layers can be the same or different. For example, the head moieties and tail moieties may be selected such that they provide specific binding to both of the possibly different layers of substrate, in particular solid substrate, below and above. Therefore, sandwich structures with the same type of material in the layers below and above the coating layers may be prepared from monomers of the type $R—(N)_x$-$(L)_m$-$(C\equiv C)_n$-$(L')_o$-$(N')_y$—$R'$ in which the head moiety R and the tail moiety R' are identical. The monomers may also be symmetric. Sandwich structures comprising different material layers above and below the coating layers may be prepared using unsymmetric monomers of the type $R—(N)_x$-$(L)_m$-$(C\equiv C)_n$-$(L')_o$-$(N')_y$—$R'$ in which the head moiety R and the tail moiety R' are different.

For the preparation of such sandwich structures, for example, monomer films in the form of a monolayer or multilayer of the monomers of the type $R—(N)_x$-$(L)_m$-$(C\equiv C)_n$-$(L')_o$-$(N')_y$—$R'$ specifically bound to a substrate, in particular a solid substrate, can be prepared using one of the methods described above. Then, an additional material's layer can be deposited on top of the monomer film by appropriate methods depending on the nature of the material. Appropriate methods for this deposition may include for example wet-chemical processes such as painting, spraying, coating, dipping, immersion, or casting techniques (e.g., for additional polymer layers), or vapor deposition techniques (e.g., for metals or metal oxides). The sandwiched monomer film can then be converted into a coating layer by exposure to irradiation and/or thermal annealing and/or by a chemical radical initiator as previously described. Alternatively, a monomer film specifically bound to a substrate, in particular a solid substrate, can be first converted into a coating layer by exposure to irradiation and/or thermal annealing and/or by a chemical radical initiator as previously described, and then the second material's layer can be deposited on top by using the appropriate methods depending on the nature of the material, as described above. After exposure to irradiation and/or thermal annealing and/or a chemical radical initiator and before deposition of the second materials layer, one or several other coating layers may be applied on top of the first coating layer by applying a monomer film on the coating layer which can be exposed to irradiation and/or thermal annealing and/or a chemical radical initiator, which may be repeated.

In these sandwich structures, the specific binding to the substrate and the specific binding to the layer deposited on top of the coating may involve additional chemical reactions between the head moieties R and/or tail moieties R' of the monomer or the coating layer with appropriate chemical functional groups in the deposited material.

For example, a coating layer with phosphonic acid head moieties bound to a steel substrate and hydroxyl tail moieties on the second face may provide specific binding for an epoxy based polymer such as SU-8. The coating layer may serve as a primer to ensure adhesion to the steel substrate as well as to the epoxy topcoat through specific binding towards both materials.

Another example is the use of coating layers as an additional barrier layer in laminates of standard packaging polymers that may provide additional, specific adhesion between the layers. For example, one or several coating layers with epoxide head moieties bound to a PET substrate and epoxide tail moieties on the second face may provide specific binding for another PET layer on top. Moreover, a PET substrate covered with one or several coating layers that have carboxylic acid tail moieties on the second face may provide specific binding for a poly(vinyl alcohol) layer on top. The combination of different types of one or several coating layers may be possible by consecutive transfer. For example, a coating layer that may have been prepared from a monomer film in the form of a multilayer with phosphonic acid head moieties bound to a steel substrate and hydroxyl tail moieties on the second face that can provide specific binding to a coating layer with epoxide head moieties that also carries perfluoroalkyl chains as tail moieties on the second face. In this way, a coating comprising multiple coating layers with specific binding between the coating layers can be provided that moreover can provide oleophobic properties. Such a multilayer system can also be beneficial to address defects in the coating layer and may reliably cover larger substrates. For example, a coating layer with epoxide head moieties bound to a PET substrate and epoxide tail moieties on the second face may provide specific binding to a coating layer with hydroxyl head moieties that also carries hydroxyl tail moieties on the second face providing adhesion to a top layer of poly(vinyl alcohol).

Furthermore, this approach may be extended to the formation of hybrid inorganic/organic multilayers, by way of chemical reactions of the moieties at the exposed surface of the coating layers with other suitable compounds. For example, a coating layer with either hydroxyl or trialkoxysilane moieties on the surface can initiate a reaction with silica precursors such as orthosilicates, leading to the formation of a silicate or amorphous silica layer covering the coating layer. A similar approach can also lead to the formation of a layer of a metal chalcogenide. For example, a coating layer with exposed thiol functional groups on the surface can be used as the substrate for the surface initiated growth of a layer of a hybrid with molybdenum disulfide.

The invention also relates to the use of a substrate, in particular a solid substrate, comprising a coating obtainable by the methods according to the invention as a barrier layer in food packaging, pharmaceutical packaging, and/or encapsulation of electronic devices. The details concerning the use of the coating layer described herein are also valid for the details concerning the substrate, in particular the solid substrate, comprising a coating.

For example, the barrier properties of substrates covered with the coatings may be measured by means of coulometric and/or electrolytic gas permeation measurements. For example, a coating with epoxide head moieties bound to a PET substrate and dodecyl chains as tail moieties on its surface may be used as a barrier layer in food packaging and/or pharmaceutical packaging and/or encapsulation of devices. Another example for a barrier layer may be obtained by deposition of an additional PET layer on top of this substrate comprising a coating to produce a sandwich structure in which the coating is specifically bound to both PET layers. For example, laminates comprising combinations of the coatings with specific binding to layers of PEN, poly(ethylene), poly(propylene), poly(vinyl alcohol) and combinations thereof can be used for barrier layers for the use in food packaging and/or pharmaceutical packaging and/or encapsulation of devices.

For example, preferred materials for encapsulation of microelectronics include PEN and PET, while preferred materials for packaging of foods include paper, cardboard, aluminum, aluminum oxide, silicon oxide, and synthetic polymers such as polyolefins (poly(propylene), high-density poly(ethylene), low-density poly(ethylene)), polyamides, poly(vinyl alcohol), PET and poly(lactic acid), and combinations thereof. Particularly effective for encapsulation of microelectronics and/or for the packaging of foods are laminates. An example of a laminate can comprise a PET layer and a heat-sealable polyolefin-based layer, and a coating according to the invention. The heat-sealable layer can be preferably made of poly(ethylene), and preferably low-density poly(ethylene) or linear low-density poly(ethylene). The coating according to the invention can for example be prepared on the PET layer as described herein or a coating can be transferred to the PET layer from a different substrate, in particular a solid substrate, by one of the herein described methods. For enhanced adhesion of the coating the surface of the PET layer may be altered using adequate surface modification such as corona-discharge. The PET layer coated with the coating can be subsequently laminated with the heat-sealable layer using suitable adhesive bonding, such as hot-melt adhesives. For enhanced adhesion between the layers, the surface of the heat-sealable layer may also be altered using e.g. corona-discharge.

Further described is a method for the synthesis of a compound of the type X—$(CH_2)_3$—$(C\equiv C)_d$—$(CH_2)_3$—X, wherein X is beta-D-glucopyranoside, $(C\equiv C)_d$ is an oligoyne moiety, d is 2 to 12, in particular 6, and wherein the oligoyne moiety is located inside the cavity of at least one, in particular two, alpha-cyclodextrin moieties, comprising reacting a compound of the type X—$(CH_2)_3$—$(C\equiv C)_e$—H, wherein X is beta-D-glucopyranoside, $(C\equiv C)_e$ is an oligoyne moiety, e is 1 to 6, in particular 3, in the presence of alpha-cyclodextrin, copper dibromide and tetramethylenediamine in a solvent, in particular a mixture of diethylether, methanol and water.

FIG. 1 shows an example for a procedure that can be employed to bring the monomers 1 into contact with the solid substrate. In this exemplary procedure, the monomers 1 are first spread at the air-water interface which brings the head moieties 3 in contact with the aqueous phase 4. The tail moieties 2 point away from the air-water interface. The monomers 1 are then transferred onto a solid substrate 5 such that the head moieties 3 are in contact with the solid substrate 5 and the tail moieties 2 point away from the solid substrate 5.

Figure 2:
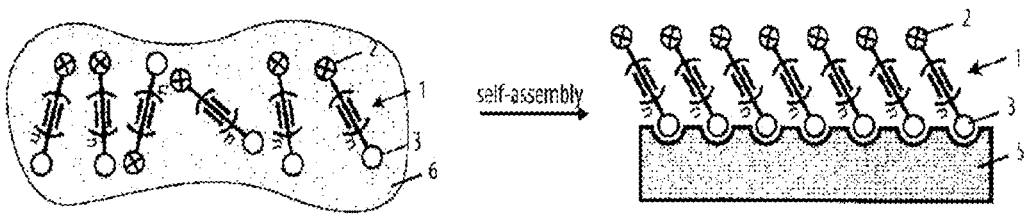
FIG. 2 shows a scheme of another exemplary procedure for bringing monomers into contact with a solid substrate.

FIG. 2 shows an example for a procedure that can be employed to bring the monomers 1 into contact with the solid substrate. In this exemplary procedure, a solution of the monomers 1 having head moieties 3 and tail moieties 2 in a solvent 6 is applied to a solid substrate 5. The monomers 1 align on the substrate such that the tail moieties 2 point away from the solid substrate 5, and the head moieties 3 are in contact with the solid substrate.

Figure 3:
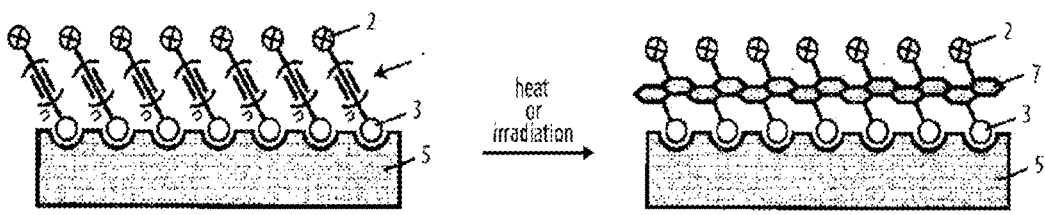
FIG. 3 shows a scheme of a an exemplary procedure for inducing a reaction between oligoyne moieties.

FIG. 3 shows an example for a procedure to induce a reaction between oligoyne moieties thereby at least partially cross-linking the monomers 1. In this exemplary procedure, monomers 1 are in contact with solid substrate 5 via the head moieties 3 of the monomers 1 while the tail moieties 2 point away from the solid substrate 5. The monomers 1 form a film in which the oligoyne moieties of the monomers 1 are in close contact with each other. Application of a mild external stimulus such as, for example, heat or irradiation, induces a reaction between the oligoyne moieties to form a coating layer 7.

Figure 4:
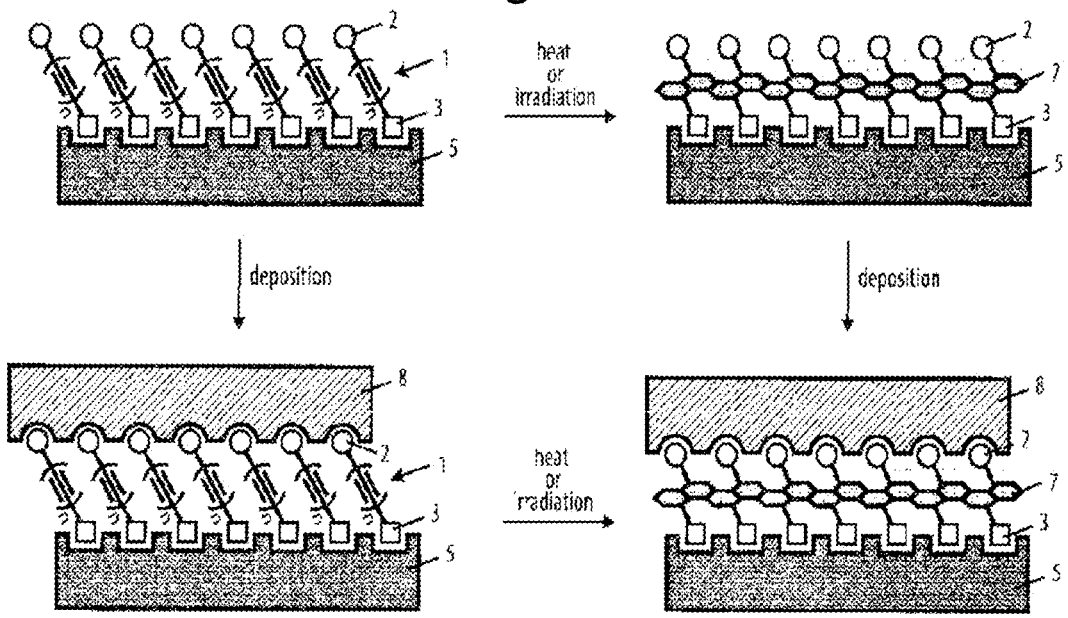
FIG. 4 shows a scheme with different exemplary procedures for the preparation of sandwich structures.

FIG. 4 shows different examples for the preparation of sandwich structures. In these exemplary procedures, monomers 1 are in contact with solid substrate 5 via the head moieties 3 of the monomers 1 while the tail moieties 2 point away from the solid substrate 5 thereby forming a film. Subsequently, an additional layer of a different solid substrate 8 is applied to the film such that tail moieties 2 of monomers 1 are in contact with the additional layer of solid substrate 8. Application of a mild external stimulus such as, for example, heat or irradiation, induces a reaction between the oligoyne moieties to form a coating layer 7. Alternatively, a reaction between oligoyne moieties can be induced in the film of the unreacted monomers 1 on solid substrate 5 by application of an external stimulus such as, for example, heat or irradiation before an additional layer of a solid substrate 8 is applied. Due to the external stimulus, a coating layer 7 is formed. Subsequently, an additional layer of a solid substrate 8 can be applied.

Figure 5A:
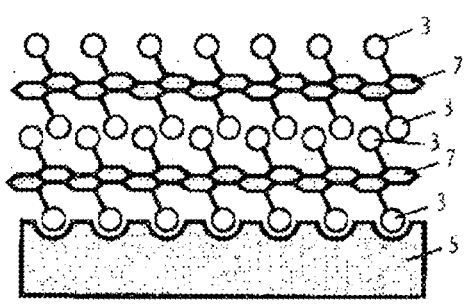
FIG. 5A shows an example of a coating comprising several coating layers.

FIG. 5a shows an example of a solid substrate 5 with a coating comprising two coating layers 7. The coating layers comprise identical head and tail moieties 3.

Figure 5B:
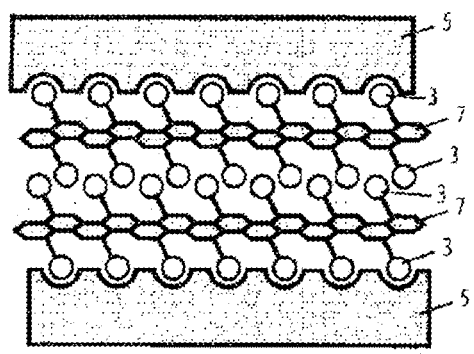
FIG. 5B shows an example of a laminated structure.

FIG. 5b shows an example of a laminated structure obtained from a solid substrate 5 comprising a coating layer 7 with identical head and tail moieties 3 in which adhesion inside the laminate is achieved via the tail moieties 3 of the coating layers 7.

Figure 5C:
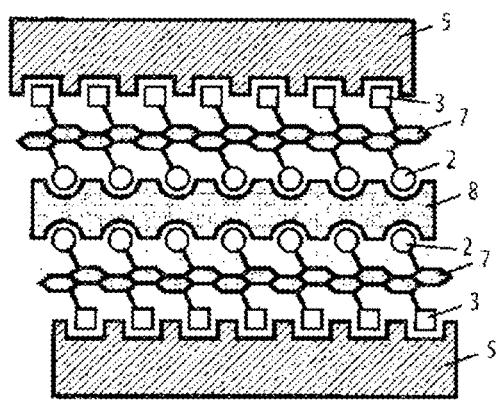
FIG. 5C shows an example of a laminated sandwich structure.

FIG. 5c shows an example of a laminated structure containing two solid substrates 5 each comprising a coating layer 7 that is in contact with the respective solid substrate 5 via its head moieties 3. Via its tail moieties 2, the coating layers 7 are in contact with a layer of an additional solid substrate 8.

Figure 6:
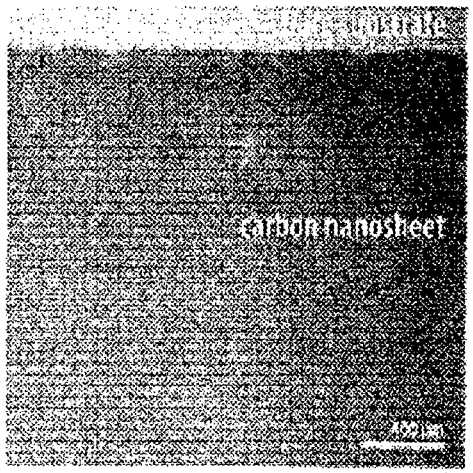
FIG. 6 shows a coating obtained on a solid substrate.

FIG. 6 shows a micrograph of a coating layer on a solid substrate obtained in Example 8. The coating layer can be seen as the darker area, and solid substrate without a coating layer can be seen as the lighter area at the top of the Figure.

EXAMPLES

In the following, the invention shall be explained in further detail using specific examples which are not to be construed as limiting in any way.

Chemicals and Materials:

Deuterated solvents (deuterated chloroform, $CDCl_3$, deuterated dimethylsulfoxide, $DMSO-d_6$) were purchased from Cambridge Isotope Laboratories, Inc. and Armar Chemicals. The TLC analyses were performed on TLC plates from Merck (Silica gel 60 F254). UV-light (366 or 254 nm) as well as anisaldehyde staining reagent were used for the visualization and detection of the samples. Purification by column chromatography was carried out with silica gel (Si 60, 40-60 μm) from Merck. Solvents used for column chromatography were purchased as reagent grade (Reactolab) and distilled once prior to use. Unless otherwise noted, all reactions were carried out in dried Schlenk glassware in an inert argon atmosphere, and all reagents were commercially obtained as reagent grade and used without further purification. Solvents were purchased as reagent grade and distilled once prior to use. For reactions in dry conditions, acetonitrile (MeCN), dichloromethane (DCM), tetrahydrofuran (THF), and toluene were purchased as HPLC grade (Fisher Chemicals) and dried as well as degassed using a solvent purification system (Innovative Technology, Inc., Amesbury, Mass., USA). Diethylether and methanol (MeOH) were purchased dry over molecular sieves (Acros Organics). Otherwise purchased chemicals were used as received from the following suppliers: silver fluoride (Fluorochem), sodium methanolate (NaOMe) (Acros), chloroform (VWR International), triethylene glycolmonomethylether (Fluka), sodium hydroxide (Sigma-Aldrich), 1,4-dioxane (Sigma-Aldrich), lithium hydroxide (Fluka), copper bromide (Acros), Amberlite IR-120 (H+) (Fluka), N,N,N',N'-tetramethylethane-1,2-diamine (Acros), hydrochloric acid (Reactolab), sodium chloride (VWR International), sodium sulfate (VWR International). All starting compound for the described syntheses were prepared according to standard literature procedures. The following equipment for the preparation of nanolayers and the transfer of molecular nanolayers as well as carbon nanolayers was used: Langmuir trough (R&K Potsdam), thermostat (E1 Medingen), Hamilton syringe Model 1810 RN SYR (BGB Analytik), UV lamp (250 W, Ga-doped metal halide bulb) (UV-Light Technology), holey carbon TEM grids (Electron Microscopy Sciences), silicon wafers (custom made EPFL cleanroom), Platinum-coated wafer (Bruker), scanning electron microscope (Zeiss), optical microscope (Olympus), filter paper Wilhelmy plate (VWR International).

For additional procedures, in particular for the preparation of some of the compounds described in the Examples, see, for example, Schrettl, *Chem. Sci.* 2015, 6, 564, Szilluweit, *Nano Lett.* 2012, 12, 2573, Schrettl, *Nature. Chem.* 2014, 6, 468, Frauenrath, *Org. Lett.* 2008, 10, 4525.

Monomer Preparation:

Example 1 (Monomer 1, Methyl 16-(triisopropylsilyl)hexadeca-5,7,9,11,13,15-hexaynoate)

In a flask shielded from light with aluminum foil 4-tritylphenyl-16-(triisopropylsilyl)hexadeca-5,7,9,11,13,15-hexaynoate (240 mg, 0.340 mmol) was dissolved in dichloromethane (DCM) (5 mL) and MeOH (1 mL). NaOMe (65 mg, 0.833 mmol) was added, and the resulting mixture was stirred for 5 hours. Then, Amberlite IR-120 (H+) was added until the solution was neutralized, and the resulting mixture was stirred for 1 hour. The solution was filtered from the Amberlite and transferred into a brown glass vial using a syringe with a fine needle. The crude compound was purified by column chromatography (silica gel; DCM). Freeze-drying yielded methyl 16-(triisopropylsilyl)hexadeca-5,7,9,11,13,15-hexaynoate as a yellow oil that was immediately redissolved in dioxane/MeOH and stored in the refrigerator. $^1H$ NMR (400 MHz, $CDCl_3$) δ 3.68 (s, 3H), 2.43 (dt, J=7.0 Hz, 4.8 Hz, 4H), 1.88 (p, J=7.1 Hz, 2H), 1.09-1.01 (m, 21H). $^{13}C$ NMR (101 MHz, $CDCl_3$) δ=173.5, 89.9, 87.3, 81.0, 69.9, 63.3, 63.2, 62.9, 62.9, 62.7, 62.1, 61.8, 61.2, 52.2, 33.0, 23.5, 19.5, 19.0, 11.7. $R_f$: 0.83 (dichloromethane).

Example 2 (Monomer 2, Dimethyl icosa-5,7,9,11,13,15-hexaynedioate)

In a flask shielded from light with aluminum foil 4-tritylphenyl-10-(trimethylsilyl)deca-5,7,9-triynoate (318 mg, 0.545 mmol) was dissolved in DCM (15 mL) and MeCN (10 mL) as well as AgF (83.5 mg, 0.572 mmol) were added. The mixture was stirred for 10 minutes, $CuBr_2$ (133.7 mg, 0.599 mmol) and N,N,N',N'-tetramethylethane-1,2-diamine (0.18 mL, 1.19 mmol) were added, and stirring was continued for 2 hours. The mixture was diluted with MeOH (10 mL) and NaOMe (136.2 mg, 2.18 mmol) was added. The reaction was stirred for 1 hour, diluted with DCM, washed twice with 1M HCl and once with saturated NaCl solution. The organic phase was dried over $Na_2SO_4$ and concentrated in vacuo. Column chromatography (silica gel; $CHCl_3$) yielded dimethyl icosa-5,7,9,11,13,15-hexaynedioate as a yellow solution. For analytical purposes, $DMSO-d_6$ (10 mL) was added, and the mixture was concentrated in vacuo. $^1H$ NMR (400 MHz, $DMSO-d_6$) δ=3.70 (s, 6H), 2.59 (t, J=7.1 Hz, 4H), 2.49 (t, J=7.3 Hz, 4H), 1.89 (p, J=7.2 Hz, 4H). $^{13}C$ NMR (101 MHz, $DMSO-d_6$) δ=172.25, 82.65, 65.12, 62.82, 62.08, 60.95, 59.60, 51.16, 31.99, 22.59, 18.12. $R_f$: 0.22 ($CHCl_3$).

Example 3 (Monomer 3, 16-(triisopropylsilyl)hexadeca-5,7,9,11,13,15-hexaynoic acid)

In a flask shielded from light with aluminum foil methyl 16-(triisopropylsilyl)hexadeca-5,7,9,11,13,15-hexaynoate (280 mg, 0.69 mmol) was dissolved in THF (5 mL) and MeOH (5 mL), water (5 mL), as well as LiOH (30 mg, 1.2 mmol) were consecutively added. The mixture was stirred for 2 hours at room temperature and Amberlite IR-120 (H+) was added until the solution was neutralized, and the resulting mixture was stirred for 30 min. The mixture was filtered, diluted with DCM, washed once with 1M HCl and once with saturated NaCl solution. The organic phase was dried over $Na_2SO_4$ and concentrated in vacuo to yield 16-(triisopropylsilyl)hexadeca-5,7,9,11,13,15-hexaynoic acid as a concentrated yellow solution.

Example 4 (Monomer 4, icosa-5,7,9,11,13,15-hexaynedioic acid)

In a flask shielded from light with aluminum foil dimethyl icosa-5,7,9,11,13,15-hexaynedioate (120 mg, 0.35 mmol) was dissolved in THF (5 mL) and MeOH (5 mL), water (5 mL), as well as LiOH (30 mg, 1.2 mmol) were consecutively added. The mixture was stirred for 2 hours at room temperature and Amberlite IR-120 (H+) was added until the solution was neutralized, and the resulting mixture was stirred for 30 min. The mixture was filtered and concentrated in vacuo to yield icosa-5,7,9,11,13,15-hexaynedioic acid as a concentrated yellow solution.

Example 5 (Monomer 5, Triethylene glycolmonomethylether 16-(triisopropylsilyl)hexadeca-5,7,9,11,13,15-hexaynoic acid ester)

In a flask shielded from light with aluminum foil 4-tritylphenyl-16-(triisopropylsilyl)hexadeca-5,7,9,11,13,15-hexaynoate (240 mg, 0.34 mmol) was dissolved in DCM (5 mL) and 1,4-dioxane (1 mL). Sodium triethyleneglycolmonomethylether (112 mg, 0.6 mmol) was added, and the resulting mixture was stirred for 5 hours. Then, Amberlite IR-120 (H+) was added until the solution was neutralized, and the resulting mixture was stirred for 1 hour. The solution was filtered from the Amberlite and transferred into a brown glass vial using a syringe with a fine needle. The crude compound was purified by column chromatography (silica gel; DCM:methanol 40:1). The product fractions were concentrated in vacuo to yield triethylene glycolmonomethylether 16-(triisopropylsilyl)hexadeca-5,7,9,11,13,15-hexaynoic acid ester as a concentrated yellow solution.

Example 6 (Monomer 6, Bis(triethylene glycolmonomethylether) icosa-5,7,9,11,13,15-hexaynediacid diester)

In a flask shielded from light with aluminum foil dimethyl icosa-5,7,9,11,13,15-hexaynedioate (180 mg, 0.52 mmol) was dissolved in DCM (5 mL) and 1,4-dioxane (1 mL). Sodium triethyleneglycolmonomethylether (230 mg, 1.2 mmol) was added, and the resulting mixture was stirred for 4 hours. Then, Amberlite IR-120 (H+) was added until the solution was neutralized, and the resulting mixture was stirred for 30 min. The solution was filtered from the Amberlite and transferred into a brown glass vial using a syringe with a fine needle. The crude compound was purified by column chromatography (silica gel; DCM:methanol 20:1). The product fractions were concentrated in vacuo to yield bis(triethylene glycolmonomethylether) icosa-5,7,9,11,13,15-hexaynediacid diester as a concentrated yellow solution.

Preparation of Coatings

Example 7 (Preparation and Transfer of Monomer Films to Solid Substrates)

Transfer of the monomer film from the air-water interface to a silicon wafer was achieved by the Langmuir-Blodgett technique using a computer-interfaced polytetrafluoroethylene Langmuir trough equipped with two barriers and a surface pressure microbalance with a filter paper Wilhelmy plate. All substrates were cleaned and stored in Millipore water prior to use. Tweezers attached to a mechanical arm were placed vertically above the Langmuir trough. Held by the tweezers, the silicon wafers with a native layer of silicon oxide were immersed in the subphase and the air-water interface was thoroughly cleaned before spreading of the molecular precursor. The film formation of the monomer methyl octacosa-5,7,9,11,13,15-hexaynoate at the air-water interface was achieved by spreading a dilute chloroform stock solution (c=1 mmol/L) on the surface of Millipore water in a polytetrafluoroethylene Langmuir trough equipped with two barriers and a surface pressure microbalance with a filter paper Wilhelmy plate was employed. Equilibration for 15 min allowed for the evaporation of the organic solvent. For the transfer, the film was compressed to a surface pressure of 8 mN/m at which the molecules were densely aggregated. The silicon wafer substrate was then slowly removed from the air-water interface by retreating the vertically aligned mechanical arm with a speed of 1.2 mm/min while keeping the surface pressure constant.

Example 8 (Coating Layer Preparation on a Solid Substrate)

Monomer films of the precursor molecule methyl octacosa-5,7,9,11,13,15-hexaynoate were obtained by transfer from the air-water interface as described above. The carbonization of a monomer film on a silicon wafer with a native layer of silicon oxide to form a coating layer was achieved by a UV-induced cross-linking of the hexayne moieties. The UV lamp was placed so that the complete surface of the substrate was illuminated and irradiation was carried out for 40 min. See also FIG. 6.

The invention further relates to the following embodiments. These embodiments are also described in detail in Schrettl et al. Chem. Sci., 2015, 6, 564, DOI: 10.1039/C4SC03154G as well as the corresponding Supplementary information and in Schrettl et al. Nature Chemistry, 6, 468 (2014), DOI: 10.1038/nchem.1939 as well as the corresponding Supplementary Information, all of which are herein expressly incorporated by reference:

Novel exemplary hexayne amphiphile 1 (FIG. 7A) was prepared as a reactive, carbon-rich sibling of typical fatty acid ester amphiphiles that formed well-ordered self-assembled monolayers at the air-water interface. Extensive structural investigations in combination with density functional theory (DFT) computations allowed us to obtain a detailed molecular model of the hexayne packing (FIG. 7B), indicating that the oligoynes were densely packed into a less than 7 Å thick carbon-rich sublayer suitable for carbonization (FIG. 7C). Quantitative carbonization was then achieved by UV irradiation, furnishing self-supporting carbon nanosheets comprising more than 80% of graphitic carbon centers and a hydrophilic surface decoration.

Figure 7A:
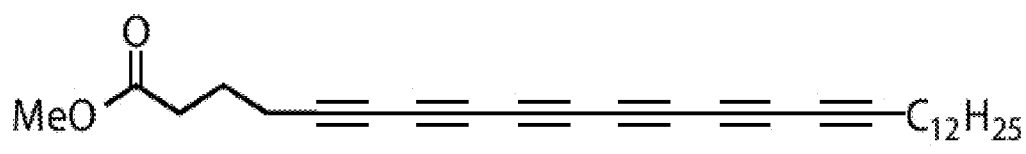
FIGS. 7A to 7C show a fatty acid ester amphiphile and a schematics of their packing structure.
Figure 7B:
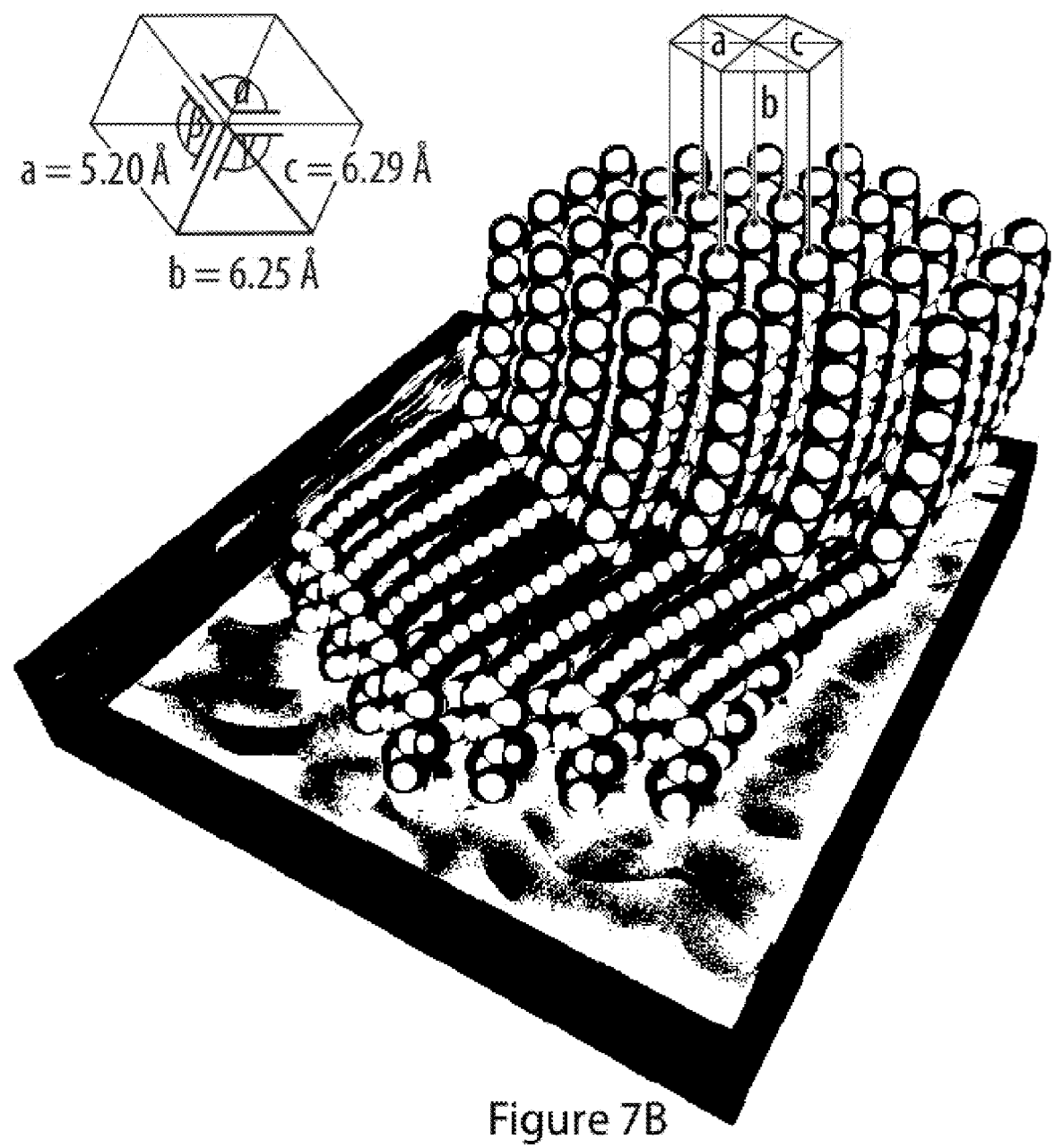
Figure 7C:
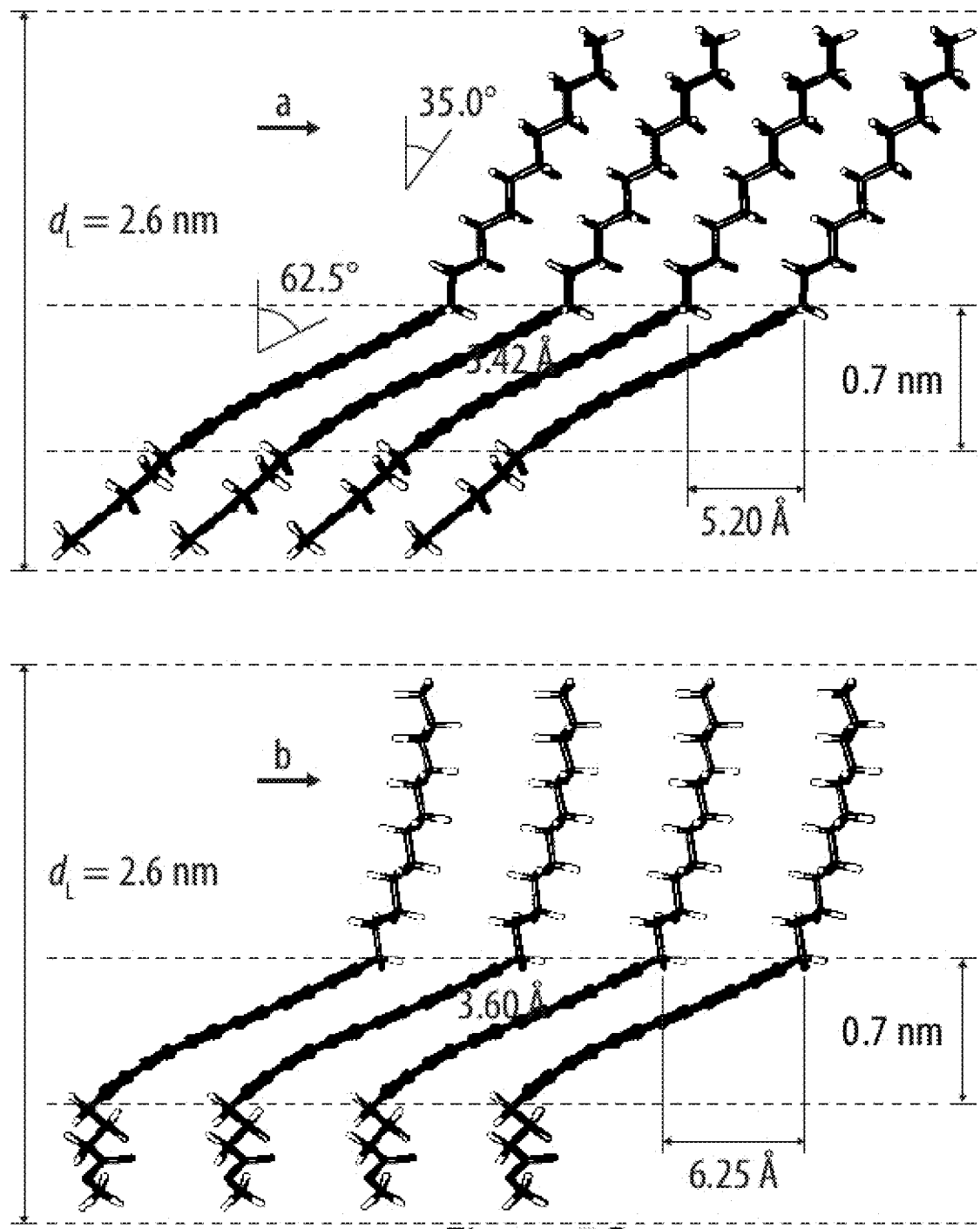

FIGS. 7A-7C shows a well-ordered monolayer of the exemplary hexayne amphiphile 1 at the air-water interface. FIG. 7A shows molecular structure of the exemplary carbon-rich hexayne amphiphile 1 that was found to self-assemble into monolayers at the air-water interface. FIG. 7B shows a structural model based on infrared reflection-absorption spectroscopy, X-ray reflectivity, and grazing-incidence X-ray diffraction results, after geometry optimization by density functional theory computations. The molecules assume a distorted hexagonal 2D lattice (a=5.20 Å, b=6.25

Å, c=6.29 Å, α=131.0°, β=114.9°, γ=114.1°) with spacings determined by the size of the polar head group hydrated with two water molecules (not shown). FIG. 7C shows that the hexayne and dodecyl segments are closely packed with tilt angles of 62.5° and 35.0° relative to the layer normal, resulting in an overall layer thickness $d_L$=2.6 nm. The packing of 1 revealed numerous carbon-carbon short contacts between the acetylene carbons of neighboring molecules, of 3.42-3.53 Å along the a axis (between C1-C9 and C4'-C12') and 3.60-3.78 Å along the b axis (between C3-C8 and C7'-C12'); only shortest contacts shown. The tight packing of the hexaynes within this less than 7 Å thick "carbon precursor" sublayer was suitable for quantitative carbonization upon UV irradiation at room temperature.

Figure 30A:
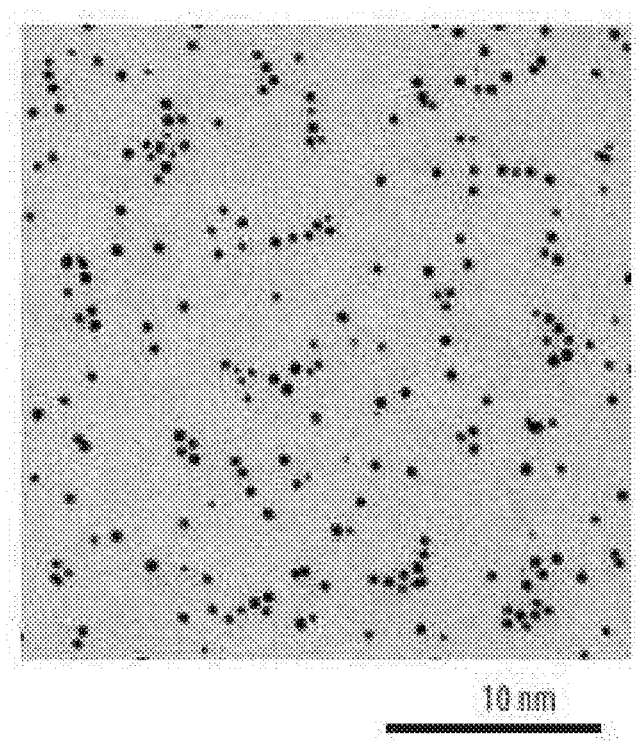
FIGS. 30A-30B show transmission electron microscopy (TEM) images of trimethylammonium functionalized gold nanoparticles on a carbon coated copper grid.
Figure 30B:
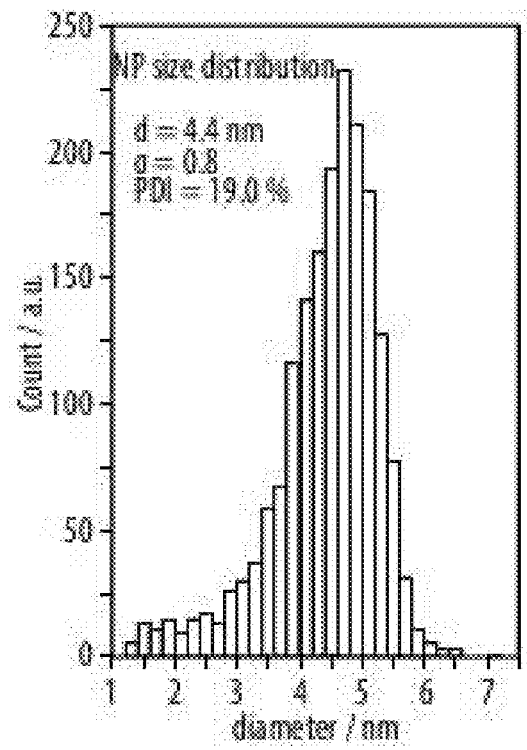

The hexayne amphiphile 1 was straightforwardly synthesized in five steps starting from hexynoic acid, using a recently developed Negishi-type protocol for the efficient direct coupling of two sp-hybridized carbon atoms (FIGS. 30A and 30B). Langmuir films were then prepared by spreading dilute solutions of 1 on the surface of Millipore water in a Langmuir trough. Surface pressure area isotherms of the films revealed an increase of the surface pressure upon compression below a mean molecular area of 24 Å$^2$, followed by a strongly tilted plateau at surface pressures between 9 and 15 mN/m and a second steep increase up to the collapse of the film at 37 mN/m (FIGS. 8A and 8B).

Figure 8B:
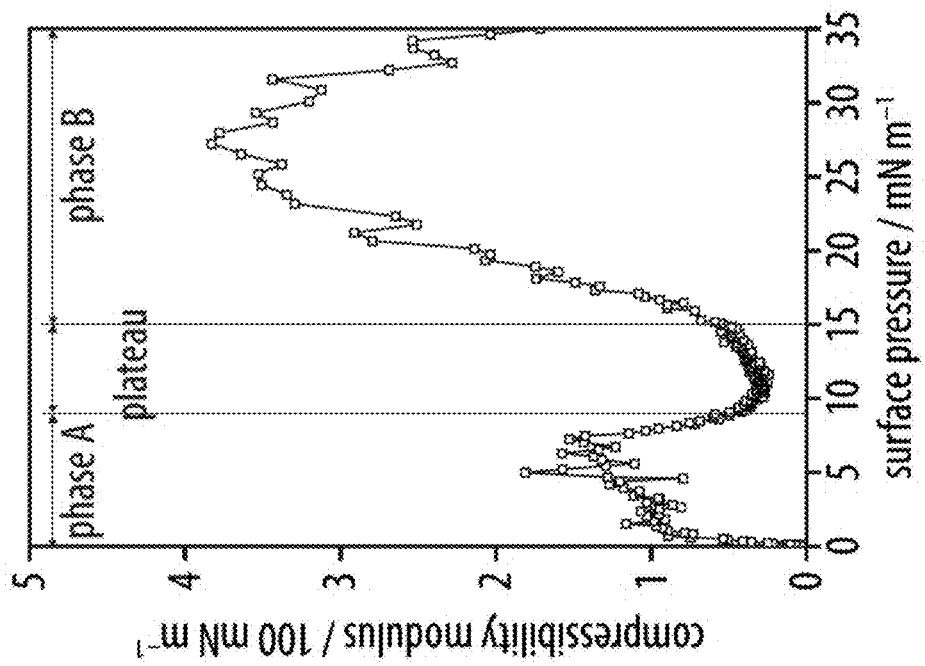
FIGS. 8a-8B show the respective surface pressure of an exemplary hexayne amphiphile at the air-water interface.
Figure 8A:
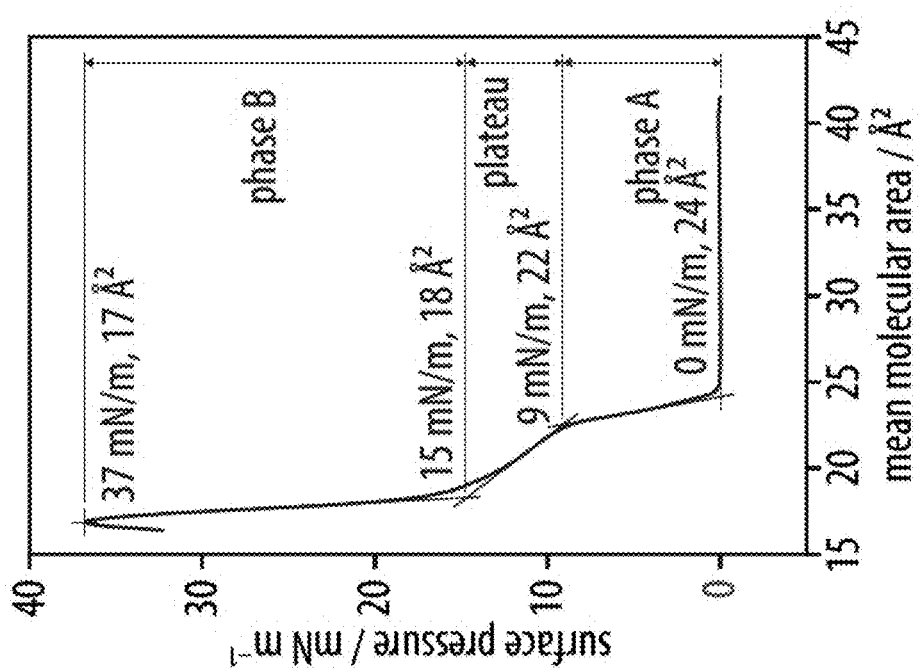

FIGS. 8A and 8B shows investigation of the exemplary reactive hexayne amphiphile 1 at the air-water interface. FIG. 8A shows that upon compression, the surface pressure area isotherm of a Langmuir film of 1 at 20° C. revealed two phases with a steep increase of the slope starting at a mean molecular area 22 Å$^2$ and 15 Å$^2$, respectively, separated by a strongly tilted plateau region between 9 and 15 mN/m; the collapse of the film occurred at a surface pressure of 37 mN/m corresponding to a minimal mean molecular area of 17 Å$^2$. FIG. 8B shows that the observed high compressibility modulus of the film, starting at very low surface pressures indicated a transition from a gas-analogous phase to a condensed phase with tightly packed molecules at the air-water interface; after a decrease of the modulus in the plateau region, a further increase was observed for surface pressures above the plateau.

The compressibility moduli of $C_s^{-1}$>100 mN/m and the positions of the asymmetric and symmetric $CH_2$ stretching vibration bands in infrared reflection-absorption (IRRA) spectra of the film at 2919 and 2849 cm$^{-1}$, respectively, indicated that the molecules were densely packed with the alkyl groups in an ordered all-trans state at surface pressures both above and below the plateau (FIGS. 8A-8B and 9A-9C). Since the films were less stable above the plateau, all further investigations on the structure and carbonization of the Langmuir films of the hexayne amphiphile 1 were conducted at surface pressures of 8 mN/m.

Figure 9A:
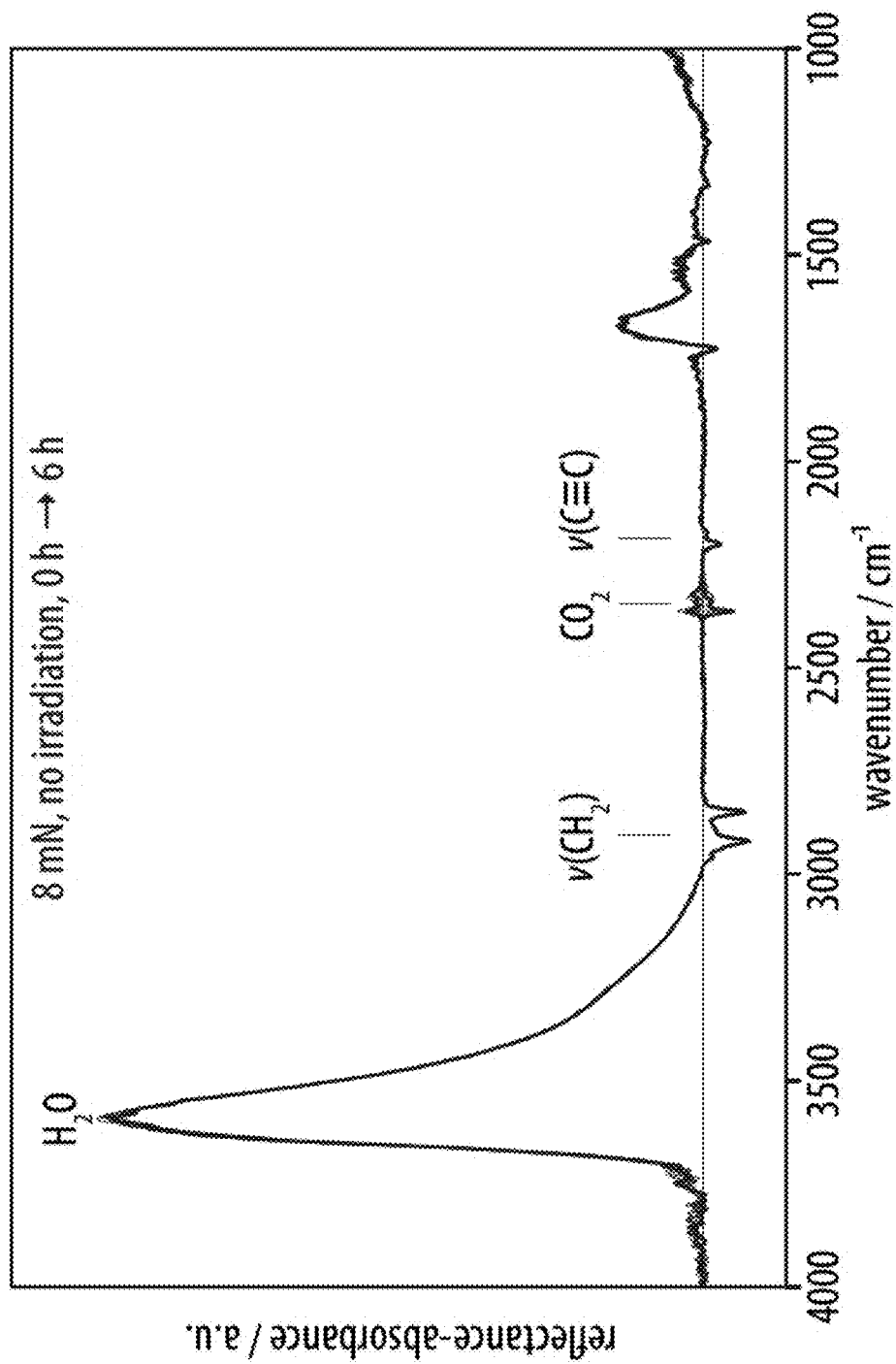
FIGS. 9A-9C show infrared reflection-absorption spectra of films of an exemplary amphiphile.
Figure 9C:
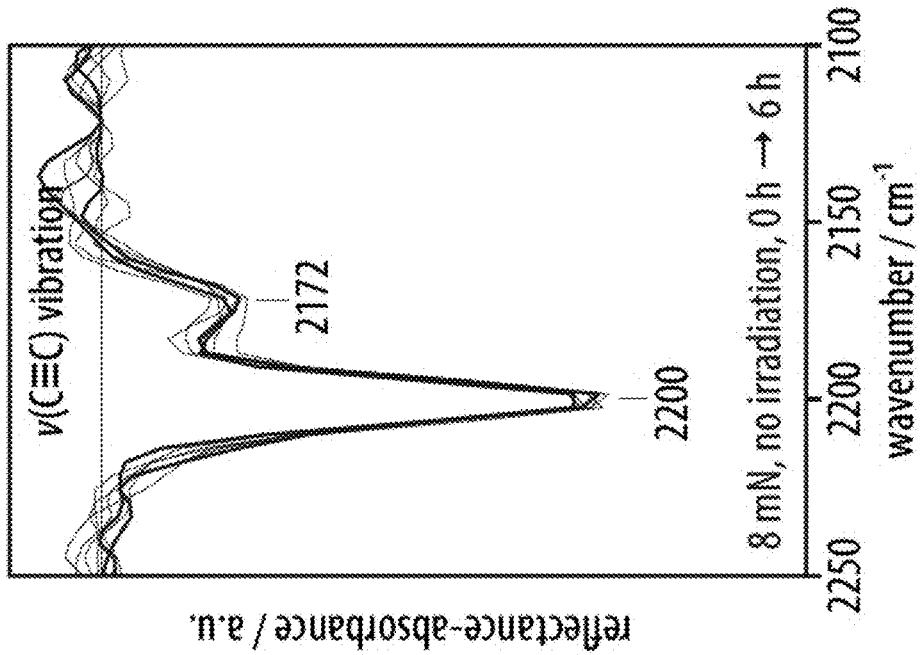
Figure 9B:
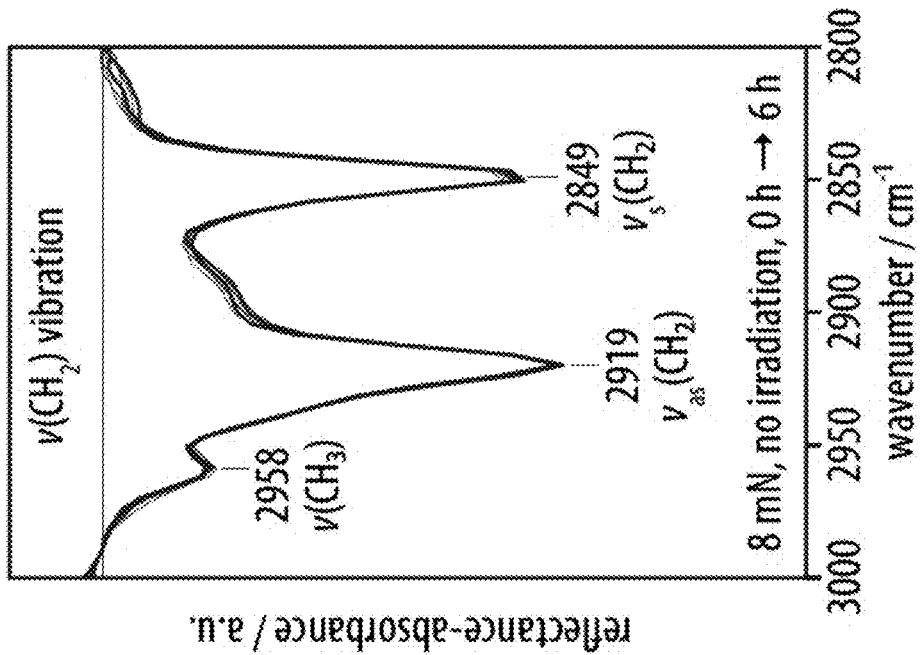

FIGS. 9A-9C shows infrared reflection-absorption (IRRA) spectra of the film of the exemplary amphiphile 1 (40°, p-polarized light) compressed to 8 mN/m. The film was monitored over the course of 6 h, and no change in the IRRA spectra was observed. While both p- and s-polarized spectra showed the same bands, the p-polarized spectra at 40° had the best signal-to-noise ratio and all results are displayed using these spectra. FIG. 9A shows that the full spectrum shows broad bands centered at 3600 and 1670 cm$^{-1}$ that arose from the water subphase while the peaks around 2350 cm$^{-1}$ remained due to insufficiently compensated carbon dioxide. The bands corresponding to the methylene and acetylene vibrations are highlighted. FIG. 9B shows the methylene stretching vibrations at 2919 and 2849 cm$^{-1}$ for the asymmetric and symmetric methylene vibrations, respectively, are characteristic for a liquid-condensed phase with the alkyl chains in an ordered all-trans state. FIG. 9C shows that the hexayne bands at 2200 and 2172 cm$^{-1}$ showed no change over the course of 6 h, indicating that 1 formed a stable Langmuir film at 8 mN/m. The surface pressure applied during compression of the molecules to a tightly packed film was not sufficient to induce a reaction of the hexayne moieties.

The analysis of experimental and simulated IRRA spectra of the films, specular X-ray reflectivity experiments, as well as grazing incidence X-ray diffraction (GIXD) measurements, allowed to develop a detailed model of the molecular packing of 1 within the films, corroborating that it is suitable for the subsequent carbonization. From a global fit of experimental IRRA spectra of the film recorded at different angles of incidence with both p- and s-polarized light and spectra simulated on the basis of the optical model of Kuzmin and Mickailov the layer thickness and the tilt angles of the hexayne and the dodecyl segments of 1 with respect to the surface layer normal could be estimated. Thus, an effective layer thickness above the subphase of $d_L$=2.2 nm was calculated from the fit of the intensity of the OH-stretching vibration ν(OH) of the subphase (FIGS. 10A and 10B and FIGS. 11A-11F). Assuming an extended molecular length of 1 of about 3.7 nm, this finding is consistent with the presence of a monolayer and suggests an average molecular tilt angle of 54° relative to the surface layer normal. Analogously, fitting the simulated to the experimental band intensities of the symmetric $CH_2$ stretching and the hexayne vibrations at 2849 cm$^{-1}$ and 2200 cm$^{-1}$ resulted in tilt angles of 35° and 62.5° for the dodecyl residue and the hexayne segment, respectively (FIGS. 10C and 10D; FIGS. 13A-13F, and FIGS. 14A-14I). These values are in excellent agreement with a close packing of the hexayne and dodecyl segments, considering their different respective cross-sectional areas, and result in virtually the same effective layer thickness as independently determined from the OH-stretching vibration.

Figure 10D:
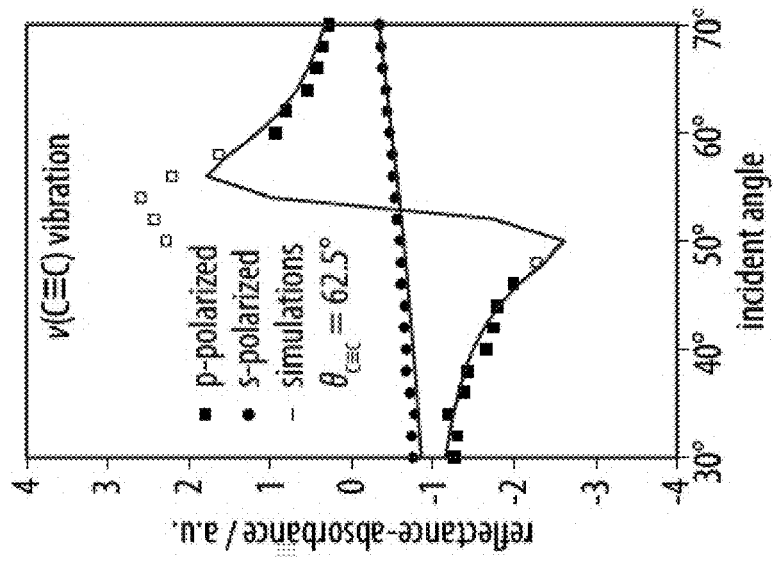
FIGS. 10C-10D show the fitting of experimental band intensities of the symmetric $CH_2$ stretching and the hexayne vibrations resulted in tilt angles of 35° and 62.5° for the dodecyl residue and the hexayne segment.
Figure 10C:
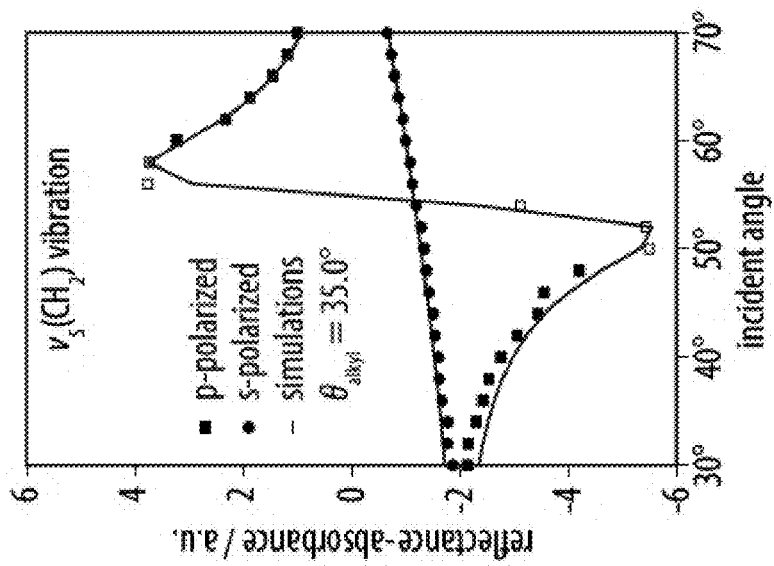
Figure 10B:
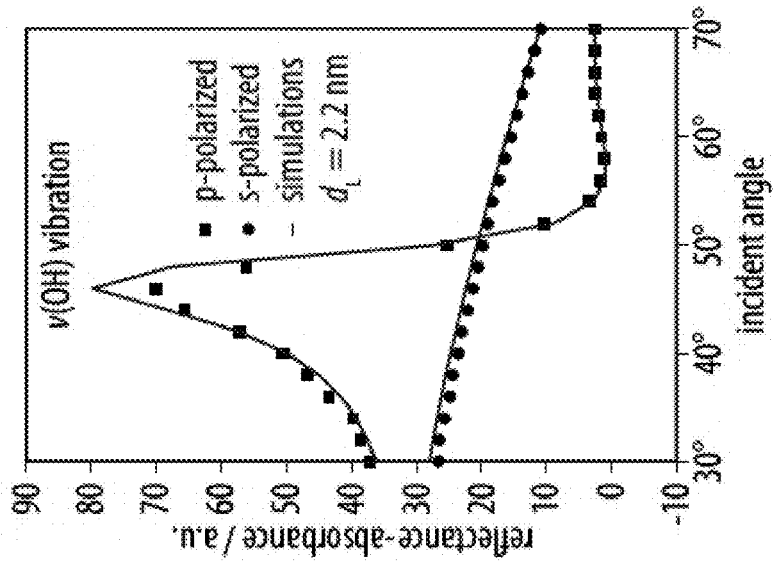

FIGS. 10A-10D above shows the fitting of the experimental IRRA spectra for a layer of exemplary 1 at the air-water interface. FIG. 10A shows the surface plots of the intensity (color coded) of the OH-stretching vibration ν(OH) of the aqueous subphase as a function of the incident angle for the experimental and simulated spectra in p-polarized light. FIGS. 10B-10D shows the corresponding plots of the experimental and simulated reflectance-absorbance intensities at the position of the OH-stretching vibration ν(OH) of the subphase, the symmetric $CH_2$ stretching vibration $ν_s(CH_2)$, and the hexayne vibration ν(C≡C). Layer thickness and tilt angles were determined from the best fit of the simulated to the experimental data. See FIGS. 11A-11F, FIGS. 12A-12F, and FIGS. 13A-13F for more details.

Figures 11A, 11B, 11C:
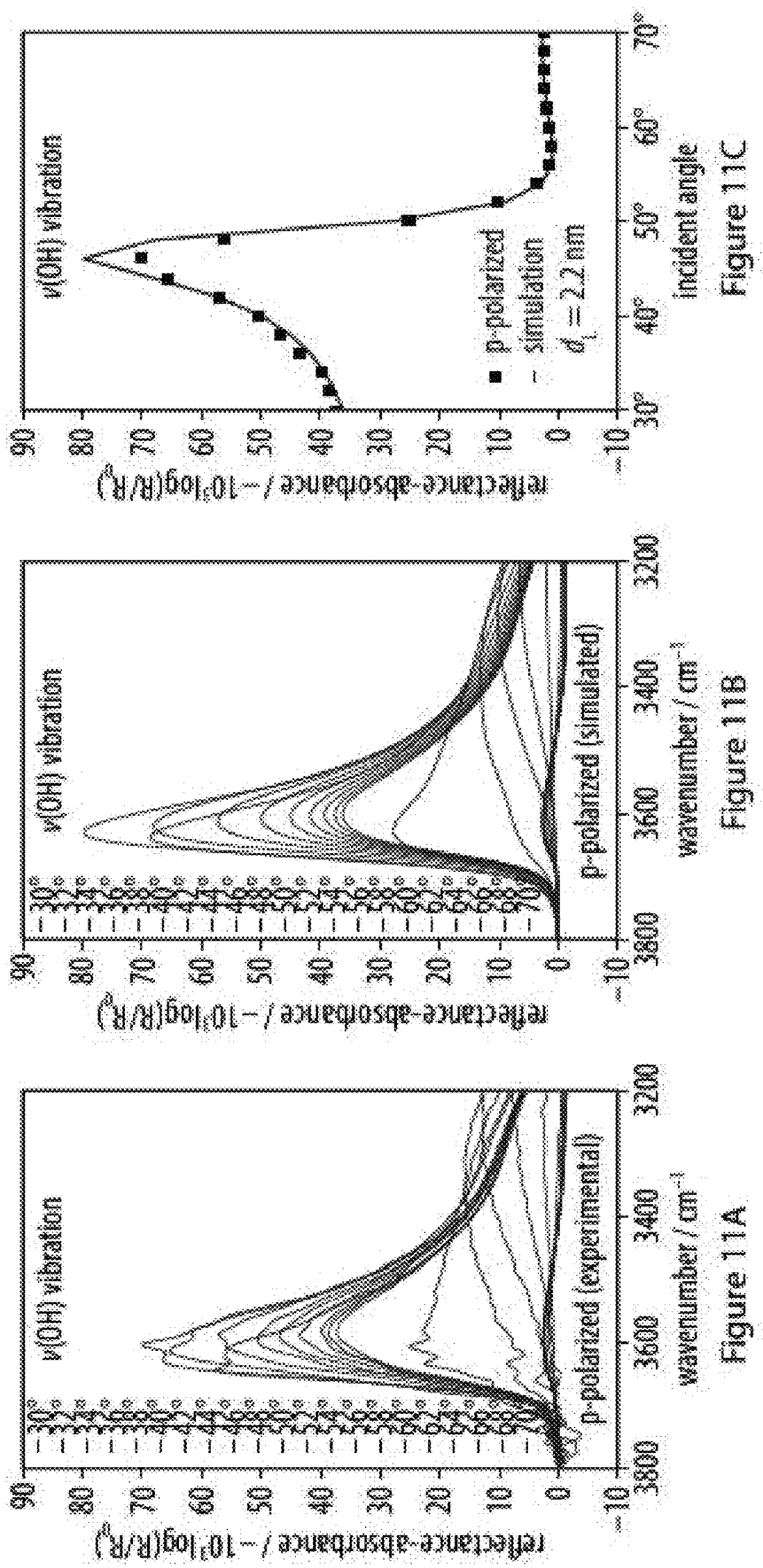
FIGS. 11A-11F show experimental and simulated OH stretching vibrations of infrared reflection-absorption spectra for a layer of an exemplary amphiphile.
Figure 11F:
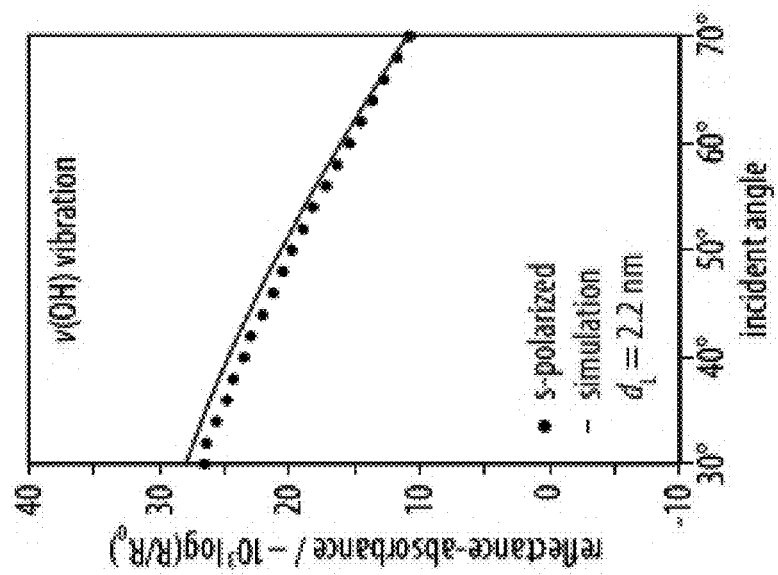
Figure 11E:
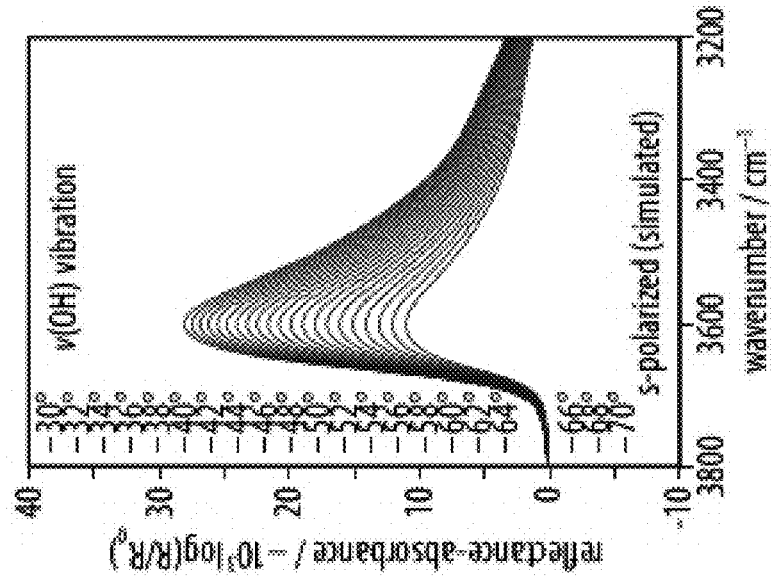
Figure 11D:
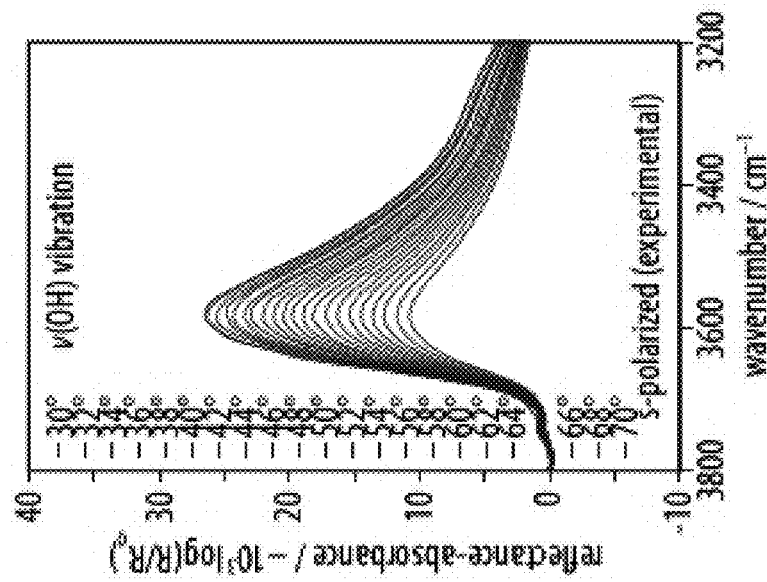

FIGS. 11A-11F shows the experimental and simulated OH-stretching vibration (ν(OH); 3600 cm$^{-1}$) of IRRA spectra of a layer of exemplary amphiphile 1 compressed to 8 mN/m. The best match between the experimental and simulated data was achieved with a layer thickness of d=2.2 nm and a refractive index of the layer of n=1.65. FIG. 11A shows the experimental spectra measured with p-polarized light at angles of incidence between 30° and 70°. FIG. 11B shows the corresponding simulated spectra. FIG. 11C shows the intensities of the experimentally measured (symbols) and simulated bands (line) of the OH-stretching vibration (p-polarized light) as a function of the angle of incidence. FIG. 11D shows experimental spectra measured with s-polarized light at angles of incidence between 30° and 70°. FIG. 11E shows the corresponding simulated spectra. FIG. 11F shows the intensities of the experimentally measured (symbols) and simulated bands (line) of the OH-stretching vibration (s-polarized light) as a function of the angle of incidence.

Figure 12F:
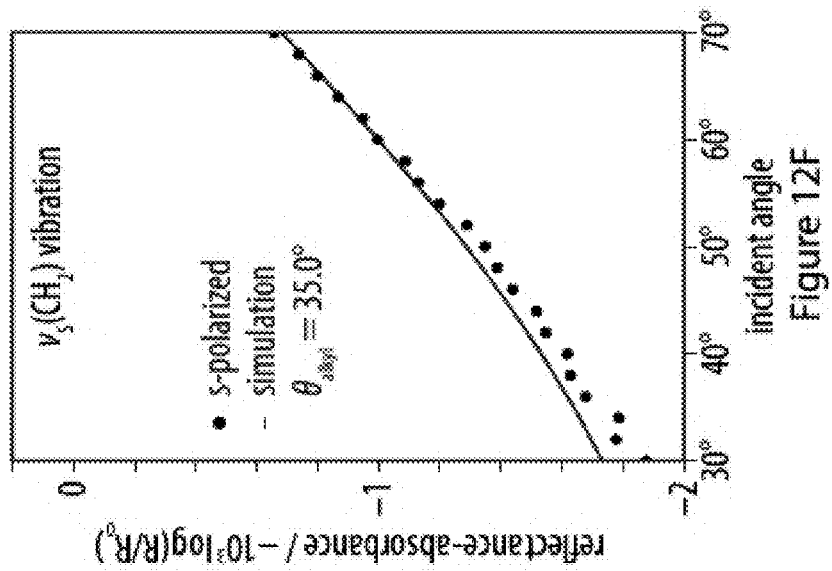
Figure 12E:
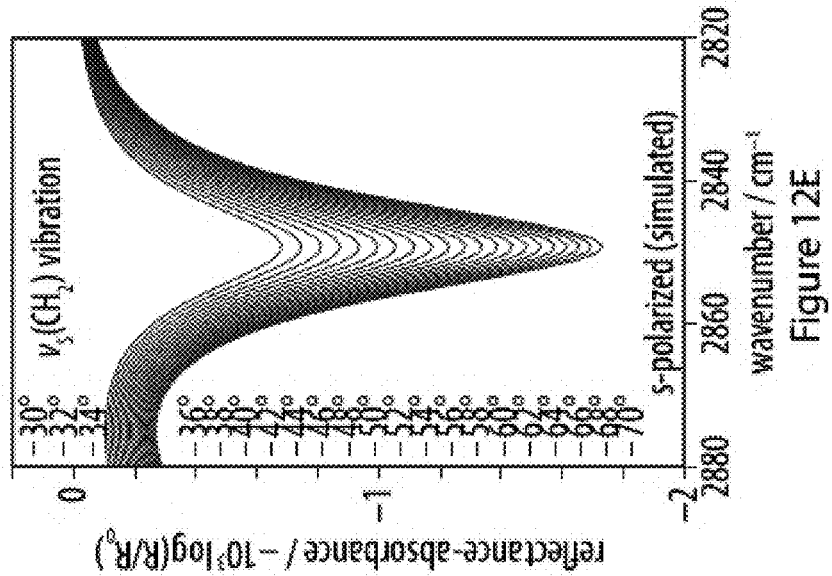
Figure 12D:
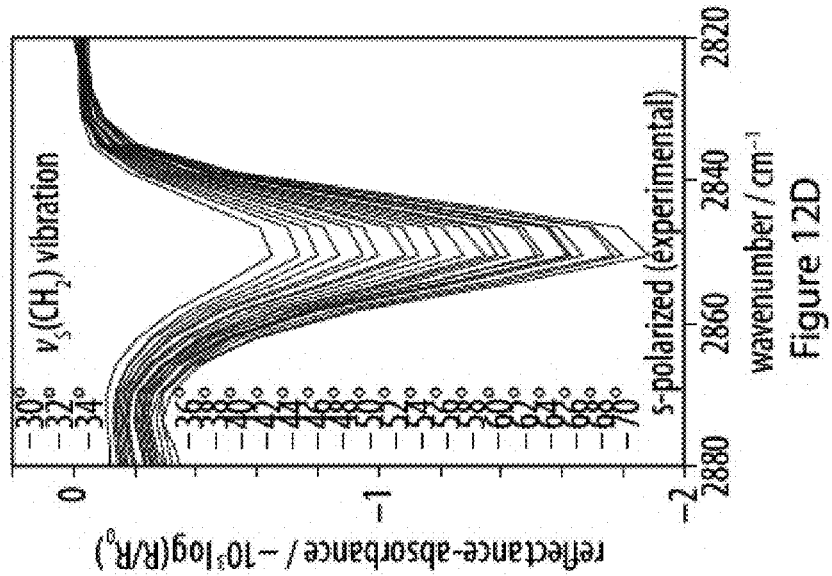

FIGS. 12A-12F shows the experimental and simulated symmetric $CH_2$ stretching vibration ($v_s(CH_2)$; 2849 cm$^{-1}$) of IRRA spectra of a layer of exemplary amphiphile 1 compressed to 8 mN/m. The best match was achieved with a tilt angle of the dodecyl chains of $\theta_{alkyl}$=35°. FIG. 12A shows the experimental spectra measured with p-polarized light at angles of incidence between 30° and 70°. The spectra at angles of incidence between 50° and 58° were omitted because of their low intensity. FIG. 12B shows the corresponding simulated spectra. FIG. 12C shows the intensities of the experimentally measured (symbols) and simulated bands (line) for the $CH_2$-stretching vibration of 1 (p-polarized light) as a function of the angle of incidence. The data points of the spectra taken with p-polarization and angles of incidence between 50° and 58° (empty symbols) were omitted from the fit because of the low reflectivity of the monolayer absorption near the Brewster angle. FIG. 12D shows the experimental spectra measured with s-polarized light at angles of incidence between 30° and 70°. FIG. 12E shows the corresponding simulated spectra. FIG. 12F shows the intensities of the experimentally measured (symbols) and simulated bands (line) for the $CH_2$-stretching vibration of 1 (s-polarized light) as a function of the angle of incidence.

Figure 13F:
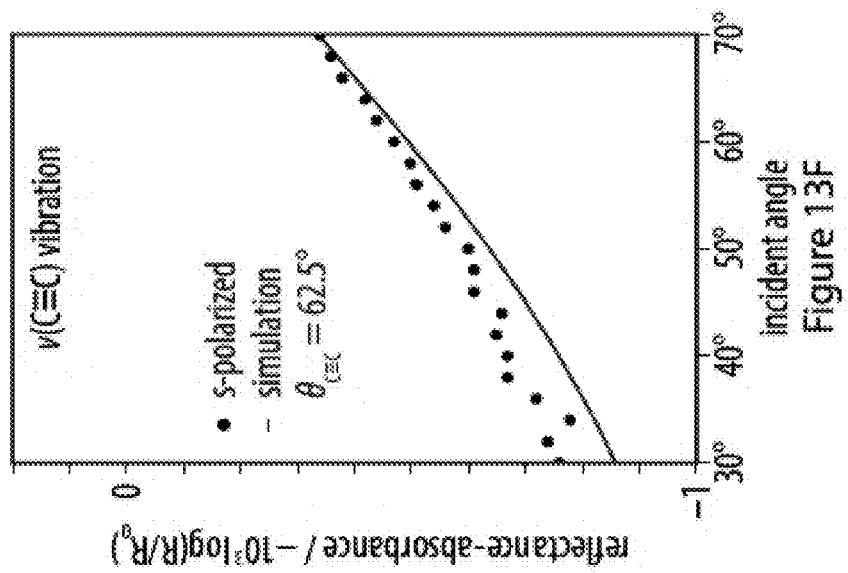
Figure 13E:
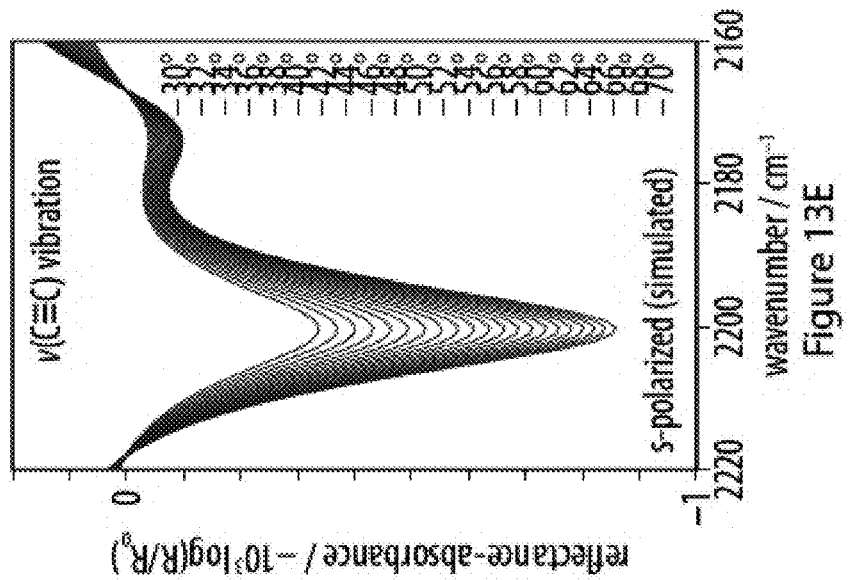
Figure 13D:
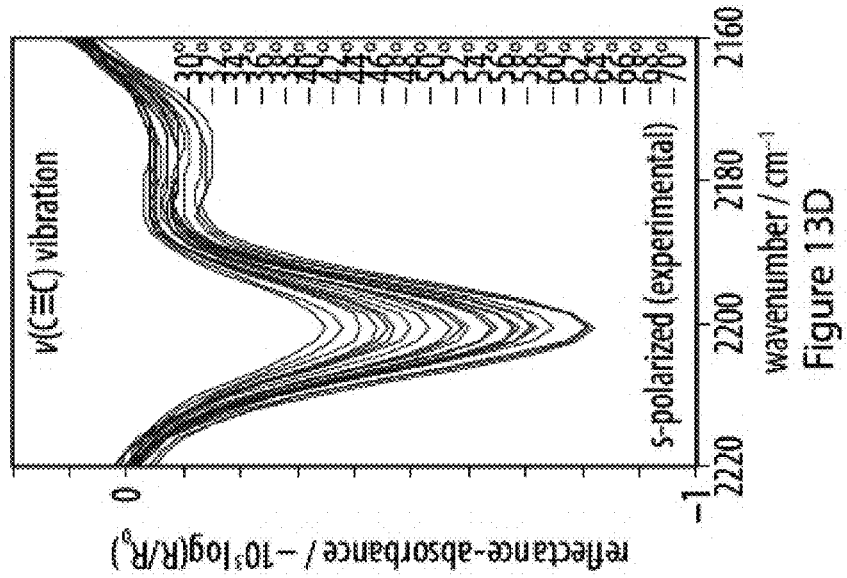

FIGS. 13A-13F shows the experimental and simulated acetylene stretching vibration (v(C≡C); 2220 cm$^{-1}$) of IRRA spectra of a layer of exemplary amphiphile 1 compressed to 8 mN/m. The best match was achieved with a tilt angle of the hexayne segment of $\delta_{C\equiv C}$=62.50. FIG. 13A shows the experimental spectra measured with p-polarized light at angles of incidence between 30° and 70°. The spectra at angles of incidence between 48° and 58° were omitted because of their low intensity. FIG. 13B shows the corresponding simulated spectra. FIG. 13C shows the intensities of the experimentally measured (symbols) and simulated bands (line) for the hexayne stretching vibration of 1 (p-polarized light) as a function of the angle of incidence. The data points of the spectra taken with p-polarization and angles of incidence between 50° and 58° (empty symbols) were omitted from the fit because of the low reflectivity of the monolayer absorption near the Brewster angle. FIG. 13D shows the experimental spectra measured with s-polarized light at angles of incidence between 30° and 70°. FIG. 13E shows the corresponding simulated spectra. FIG. 13F shows intensities of the experimentally measured (symbols) and simulated bands (line) for the hexayne stretching vibration of 1 (s-polarized light) as a function of the angle of incidence.

Figure 14C:
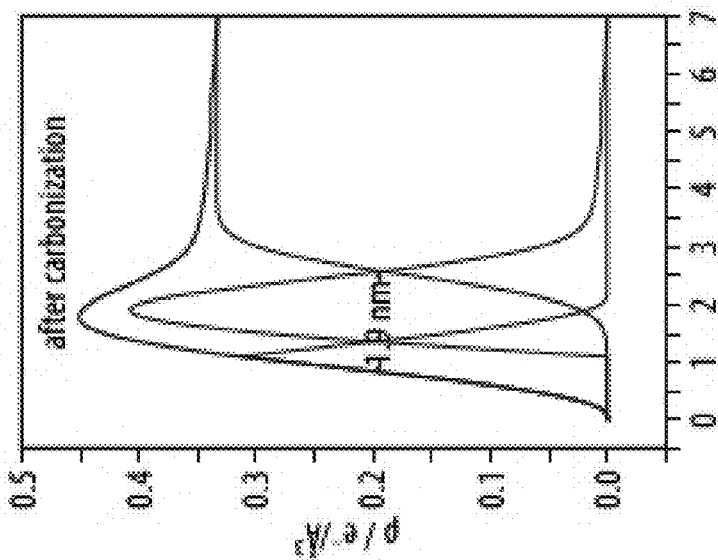
Figure 14B:
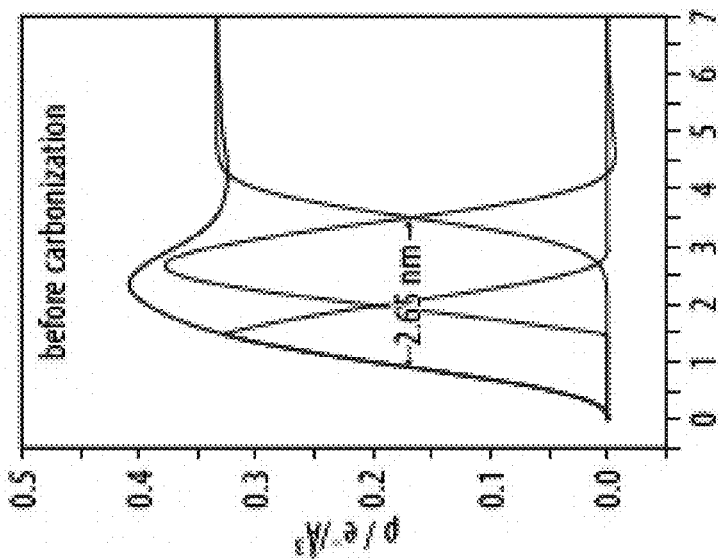
Figure 14A:
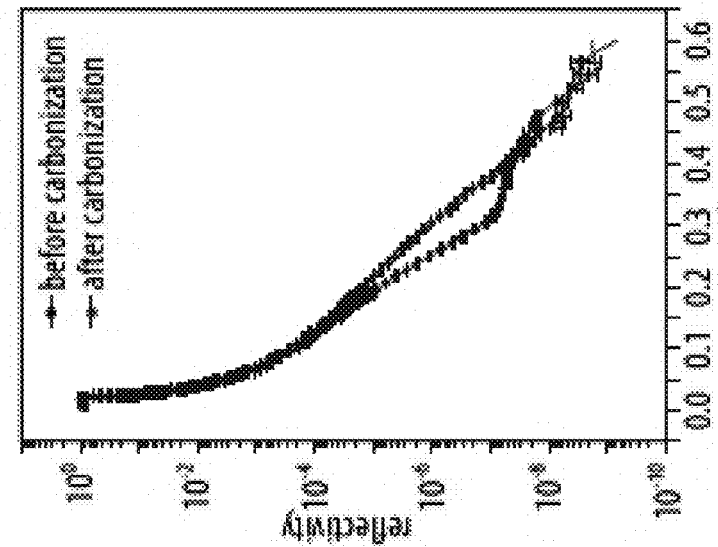
Figure 14F:
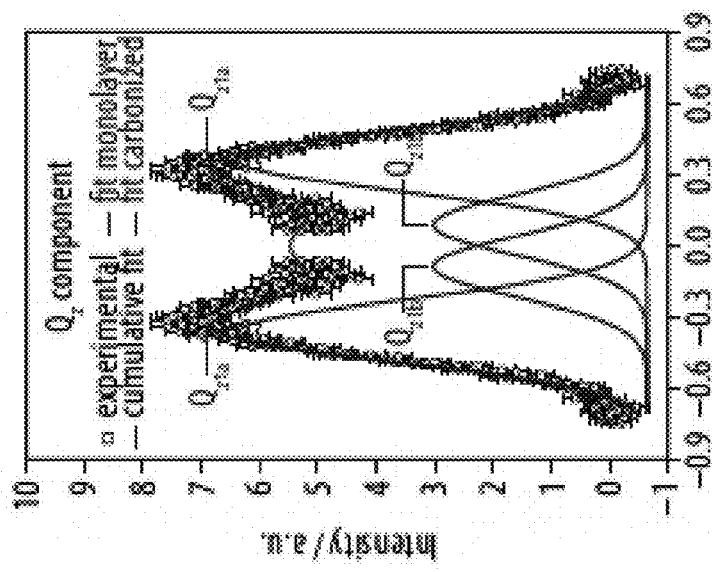
Figure 14E:
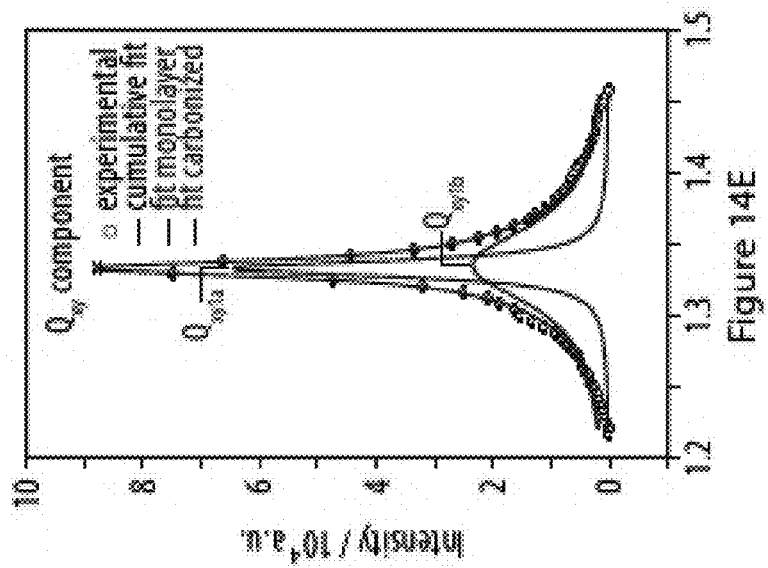
Figure 14D:
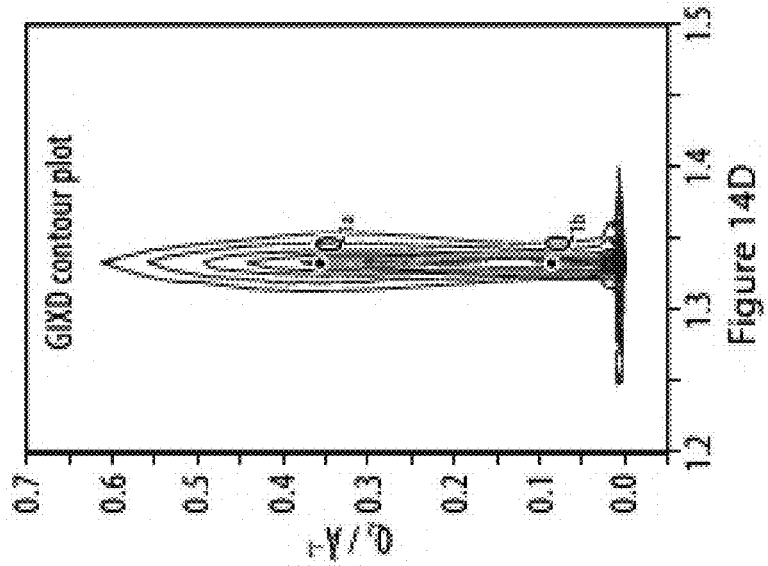
Figure 15C:
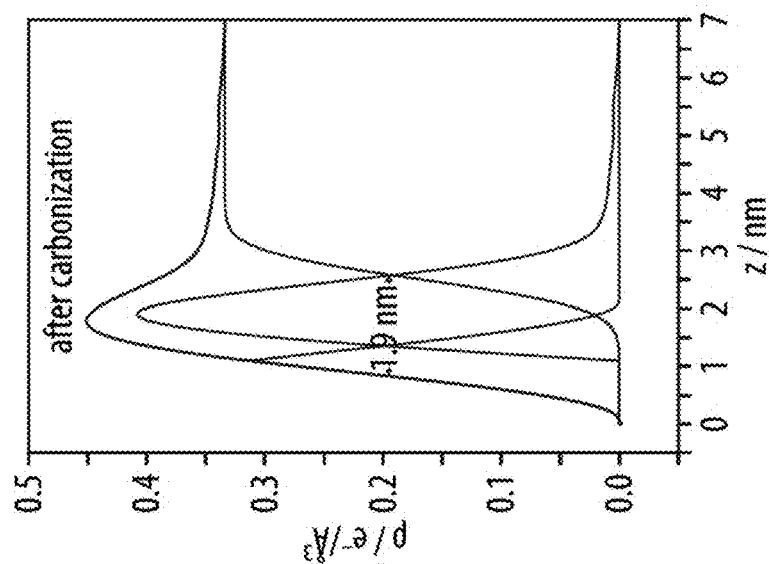
FIGS. 15A-15C show spectra of X-ray reflectivity (XR) measurements for a layer of an exemplary amphiphile before and after carbonization.
Figure 15B:
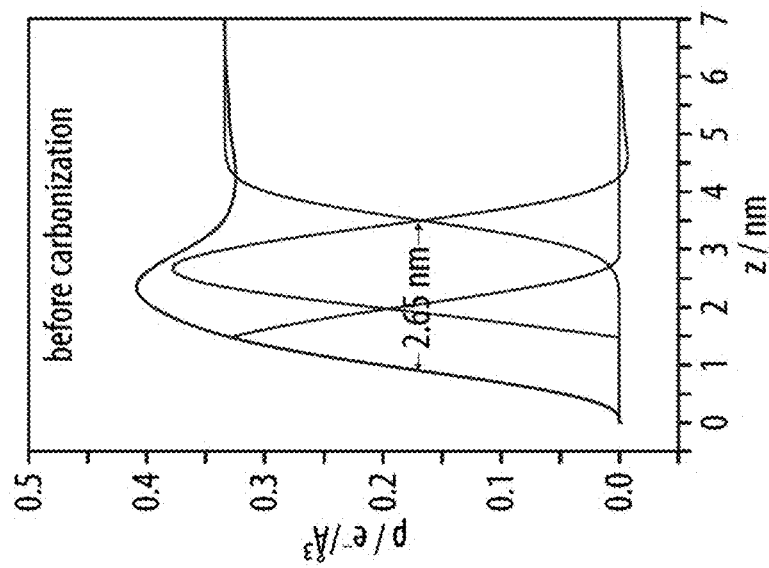
Figure 15A:
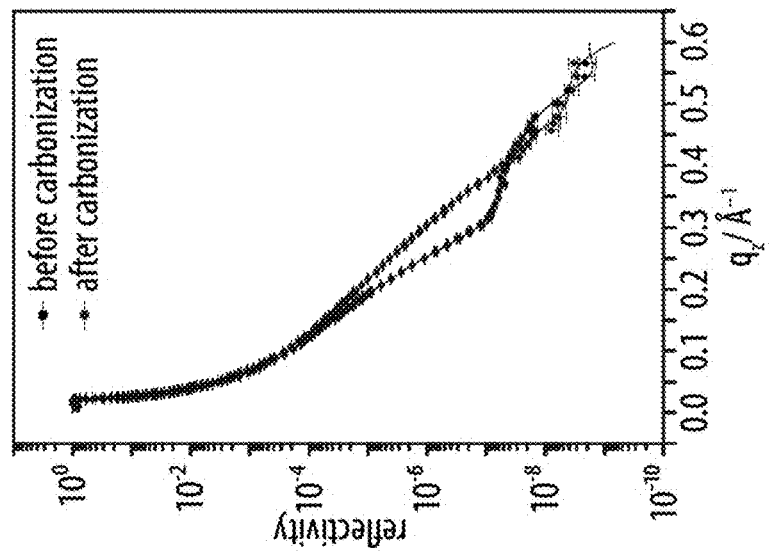

The interpretation of the IRRA spectroscopy data was supported by an analysis of the electron density distribution in the monolayer by means of specular X-ray reflectivity (XR) experiments (FIGS. 14A, 14B; FIGS. 15A-15C), from which an overall layer thickness of $d_L$=2.65 nm, including a sublayer thickness of 1.2 nm for the dodecyl segment was estimated. The slightly larger film thickness and resulting smaller average molecular tilt of 44° obtained by XR compared to the IRRA spectroscopy data can be explained by the contribution of the hydrated head group of amphiphile 1. Moreover, the tilt angle of 38° obtained for the dodecyl segment with a length of 1.52 nm in an all-trans conformation is in excellent agreement with the IRRA spectroscopy data. These findings were further confirmed by the synchrotron GIXD data obtained from a monolayer of 1 at the air-water interface (FIGS. 14D-14I). Due to the possible partial carbonization of the films in the synchrotron X-ray beam, the data were fitted as a composite of two coexisting structures, representing the uncarbonized and the partially carbonized film. Each structure exhibited three Bragg peaks (FIGS. 16A-16F and FIGS. 17A-17C), indicating an oblique unit cell. The lattice parameters of the uncarbonized film determined from the diffraction data corresponded to a distorted hexagonal packing with a=5.20 Å, b=6.25 Å, c=6.29 Å, α=131.0°, β=114.9°, γ=114.1° (FIG. 7B). Moreover, an average tilt angle of the hexayne and the dodecyl segments of 52° with respect to the surface layer normal was estimated (Tables 1-2), in excellent agreement with the IRRA spectroscopy and XR experiments. FIGS. 14A-14I shows spectra of the X-ray reflectivity (XR) measurements as well as grazing incidence X-ray diffraction (GIXD) data for a layer of exemplary amphiphile 1. FIG. 14A shows specular X-ray reflectivity data of amphiphile 1 at the air-water interface before carbonization and after carbonization UV irradiation at a surface pressure of 8 mN/m with the corresponding fits (solid lines). The corresponding electron density profiles along the surface normal z of a layer of the films, FIG. 14B before and FIG. 14C after carbonization, fitted by contributions of the dodecyl segment (first negative sloped curve going from left to right) and the residual molecule (last negative sloped curve going from left to right), assuming a root-mean-square roughness of 4 Å of the water subphase (third positive sloped curve going from left to right). FIGS. 14D, 14E show contour plots of the corrected GIXD intensities as a function of the in-plane ($Q_{xy}$) and out-of-plane ($Q_z$) scattering vector components, as well as $Q_{xy}$ and $Q_z$ plots of the scattering intensities integrated over FIGS. 14F, 14G a certain $Q_z$ window and FIGS. 14H, 14I a certain $Q_{xy}$ window, respectively. The $Q_{xy}$ plots show the Bragg peaks and the $Q_z$ plots the Bragg rods of three diffraction peaks of two co-existing structures (presumably from the uncarbonized and partially carbonized monolayer, labeled as a and b, respectively). See FIGS. 15A-15C, FIGS. 16A-16F and FIGS. 17A-17C and Tables 1-2 for details.

FIGS. 15A-5C shows spectra of the X-ray reflectivity (XR) measurements for a layer of exemplary amphiphile 1 before and after carbonization and electron density profiles of the monolayers obtained from these data. FIG. 15A shows specular X-ray reflectivity data of amphiphile 1 at the air-water interface before carbonization and after carbonization UV irradiation at a surface pressure of 8 mN/m with the corresponding fits (lines). The inversion of the XR data yields the laterally averaged electron density ρ(z) of the layer as a function of the vertical z coordinate. A model-independent method was applied in which the electron density was obtained by least-squares fitting of the XR data. FIG. 15B shows the electron density profile along the surface normal z of a layer of amphiphile 1 on water at a surface pressure of 8 mN/m as derived from the fit of the specular X-ray reflectivity data. The profile of the layer was described by contributions of the dodecyl segment (first negative sloped curve going from left to right) and the residual molecule (last negative sloped curve going from left to right), assuming a root-mean-square roughness of 4 Å for the water subphase (last positive sloped curve going from left to right). Without wishing to be bound by theory, the full-width at half-maximum (fwhm) of each contribution translates directly into the thickness of the corresponding sublayer, leading to a total layer thickness of 2.65 nm. The mean molecular area from the isotherm and the number of electrons of the dodecyl chain were used as constraints to subdivide the electron density profile and determine the thickness of the different sublayers. Thus, a thickness of 1.2 nm and the typical maximum electron density of 0.32 e⁻/Å³ for alkyl chains in a condensed state were estimated for the dodecyl segment. The remaining part of the monolayer had a thickness of 1.45 nm and a maximum electron density of 0.37 e⁻/Å³. The resulting number of electrons (135) of this sublayer suggested that two water molecules were coordinated to the hydrophilic head group of amphiphile 1 at the air-water interface, explaining the slightly increased thickness as compared to the value determined by IRRA spectroscopy. FIG. 15C shows the electron density profile along the surface normal z of a carbonized layer of amphiphile 1 on water as derived from the fit of the specular X-ray reflectivity data. The profile of the carbonized layer was described by a contribution of the dodecyl segment and the carbonized sublayer, assuming a root-mean-square roughness of 4 Å for the water subphase. The liquid-expanded state of the dodecyl chains determined by IRRA spectroscopy allowed us to use the typical electron density of a layer of fluid alkyl chains (0.31 e⁻/Å³) as a constraint for the fit. The obtained thickness of the alkyl part amounted to 0.7 nm. The remaining part of the carbon nanosheet including the head group had a thickness of 1.2 nm and a maximum electron density of 0.41 e⁻/Å³. Without wishing to be bound by theory, it is believed that carbonization of 1 at the air-water interface led to a vertical contraction in the course of the formation of a carbon nanosheet with an overall thickness of 1.9 nm.

Figure 16F:
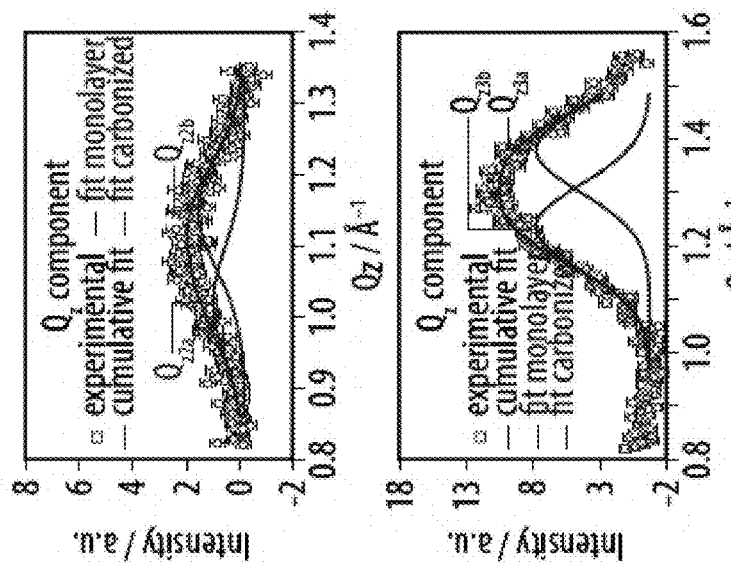
Figure 16E:
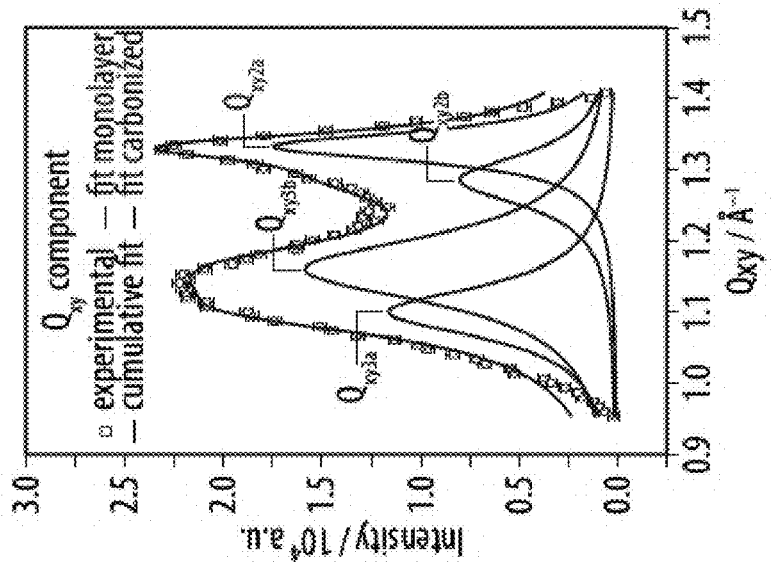
Figure 16D:
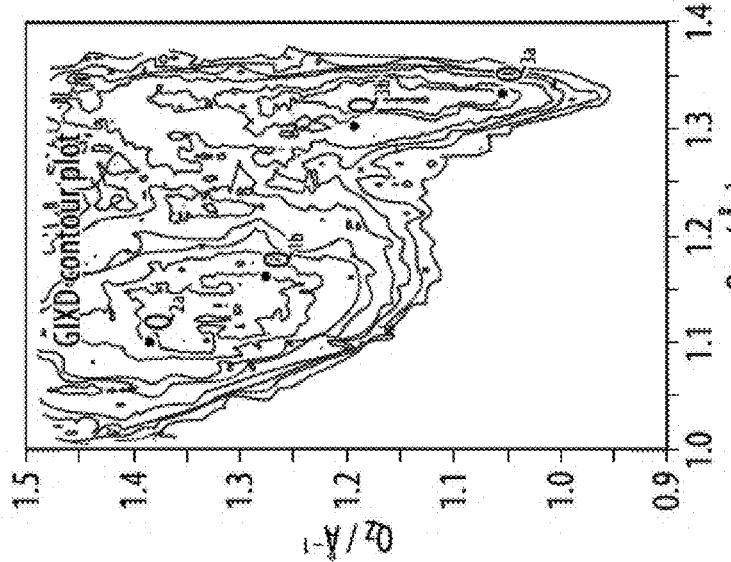

FIGS. 16A-16F shows various spectra. FIGS. 16A, 16D show contour plots of the corrected GIXD intensities as a function of the in-plane ($Q_{xy}$) and out-of-plane ($Q_z$) scattering vector components with three diffraction peaks of two co-existing structures (supposedly from the uncarbonized and partially carbonized monolayer, labeled as a and b, respectively). Each structure is characterized by three diffraction peaks (oblique structure) defined by the pairs of the scattering vector components ($Q_{xy}$, $Q_z$). FIGS. 16B, 16E show integration of the scattering intensity (corrected for polarization, effective area, and Lorentz factor) over a certain $Q_z$ window provides the Bragg peaks. Model peaks taken to be Lorentzians were fitted to the corrected intensities to accommodate the contributions of both the uncarbonized and the partially carbonized structures. The $Q_{xy}$ positions of the Bragg peaks yield the lattice repeat distances $d(hk)=2\pi/Q^{hk}_{xy}$, which may be indexed by two Miller indices h and k to yield the unit cell defined as a parallelogram with the sides a and b, the diagonal c, and the corresponding angles $\alpha$, $\beta$, as well as $\gamma$ (Table 1 and 2). Using these parameters, the area per unit cell can be determined as $A_{xy}=a \cdot b \cdot \sin \gamma$. FIGS. 16C, 16F shows integration of the scattering intensity over a certain $Q_{xy}$ window provides the Bragg rods. Model peaks taken to be Gaussians were fitted to the corrected intensities to accommodate the contributions of both the uncarbonized and the partially carbonized structures. The scattering peaks in FIG. 16A are located close to the horizon, so that the Bragg rod profiles in FIG. 16C are influenced by the corresponding ones located below the horizon. The latter ones cannot be measured and are therefore described by the mirror image of the experimentally determined Bragg rod profile above the horizon. For the two oblique structures, each characterized by three diffraction peaks, the tilt angle θ of the alkyl chains is calculated as $Q^{hk}_z = Q^{hk}_{xy} \cdot \cos \psi^*_{hk} \cdot \tan \theta$, where $\psi^*_{hk}$ is the tilt azimuth between the tilt direction projected onto the xy-plane and the corresponding reciprocal lattice vector. Using the tilt angle of the chains, the cross-sectional area per chain can be calculated from the in-plane area per chain $A_{xy}$ as $A_0 = A_{xy} \cos \theta$.

Figures 17A, 17B:
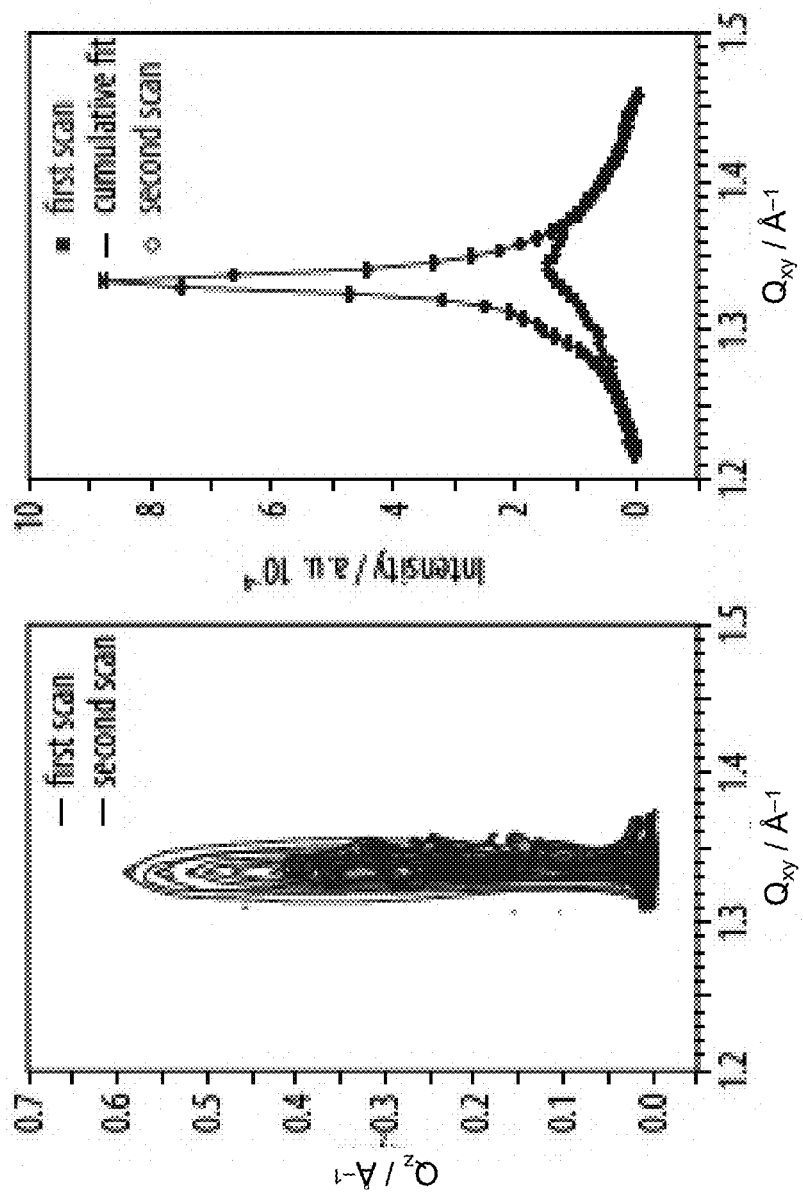
FIGS. 17A-17B show grazing incidence X-ray diffraction (GIXD) data for a layer of an exemplary amphiphile on water.

FIGS. 17A-17B shows grazing incidence X-ray diffraction (GIXD) data of repeated measurements on a monolayer of exemplary amphiphile 1 on water (8 mN/m, 10° C.). FIG. 17A shows a comparison between the contour plots obtained for the first GIXD scan (rounded pattern) and a second scan (coiled pattern) at the same position of the Langmuir trough. A third measurement in the same position lacked any diffraction signal. FIG. 17B shows a comparison between the corresponding Bragg peaks ($Q_{xy}$ component of the scattering vectors) of the repeated scans at the same trough position highlights the significant loss of signal intensity. Apparently, exposure of a monolayer of 1 to the intense synchrotron X-ray beam induced a partial carbonization. Additional GIXD experiments of carbonized (by UV irradiation) monolayers of 1 corroborated this interpretation, as no diffraction peaks were obtained from the carbonized film. To account for this partial carbonization, all GIXD data were fitted as a composite of a non-carbonized monolayer of 1 and a partially carbonized structure (FIGS. 16A-16F and Tables 1-2).

TABLE 1

Peak and rod positions according to the GIXD results (FIGS. 15A-15C, FIGS. 16A-16F and FIGS. 17A-17B) for a monolayer of amphiphile 1 at a surface pressure of 8 mN/m, defining the coexisting uncarbonized (a) and partially carbonized (b) structures.

| Structures | $Q_{xy1}/$ Å⁻¹ | $Q_{z1}/$ Å⁻¹ | $Q_{xy2}/$ Å⁻¹ | $Q_{z2}/$ Å⁻¹ | $Q_{xy3}/$ Å⁻¹ | $Q_{z3}/$ Å⁻¹ |
|---|---|---|---|---|---|---|
| uncarbonized (a) | 1.332 | 0.359 | 1.333 | 1.020 | 1.101 | 1.379 |
| partially carbonized (b) | 1.335 | 0.088 | 1.286 | 1.146 | 1.160 | 1.234 |

TABLE 2

Lattice parameters a, b, c and α, β, γ, of the unit cell, lattice distortion (d), chain tilt from the surface normal (θ), chain tilt direction (ψ), in plane area per alkyl chain ($A_{xy}$), and chain cross-sectional area ($A_0$) according to the GIXD results (FIGS. 15A-15C, FIGS. 16A-16F and FIGS. 17A-17B) for a monolayer of amphiphile 1 at a surface pressure of 8 mN/m, defining the coexisting uncarbonized (a) and partially carbonized (b) structures.

| Structures | a/b/c | α/β/γ | distortion d | tilt θ | tilt direction ψ | $A_{xy}/$ Å² | $A_0/$ Å² |
|---|---|---|---|---|---|---|---|
| un- carbonized (a) | 5.201 Å 6.250 Å 6.293 Å | 131.0° 114.9° 114.1° | 0.232423 | 52.1° | 192.8° 126.9° 257.9° | 29.7 | 18.2 |
| partially carbonized (b) | 5.354 Å 5.931 Å 6.162 Å | 127.5° 118.5° 114.0° | 0.162408 | 49.6° | 205.3° 139.3° 266.8° | 29.0 | 18.8 |

Figure 18A:
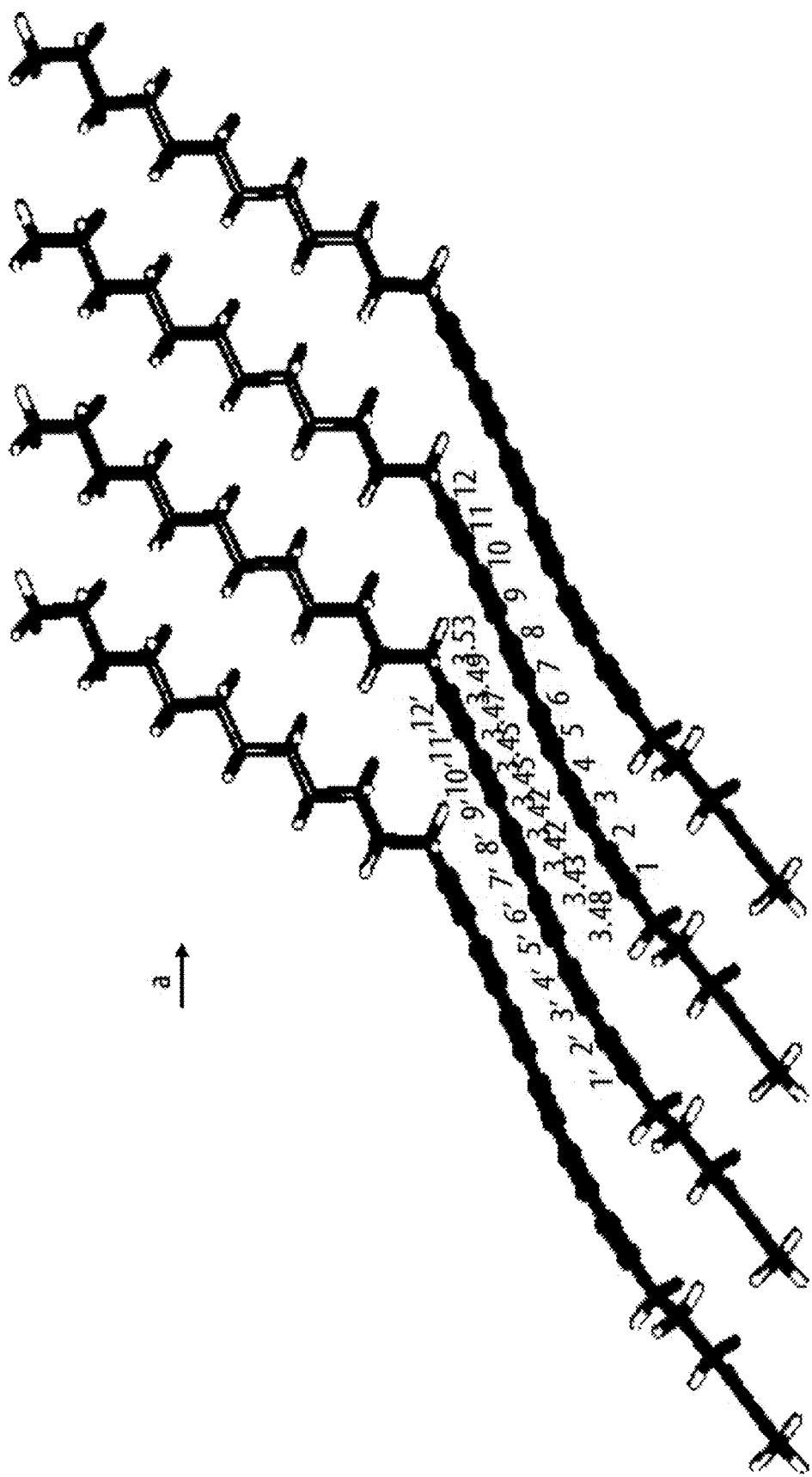
FIGS. 18A-18B show molecular packing obtained after geometry optimization using density functional theory.
Figure 18B:
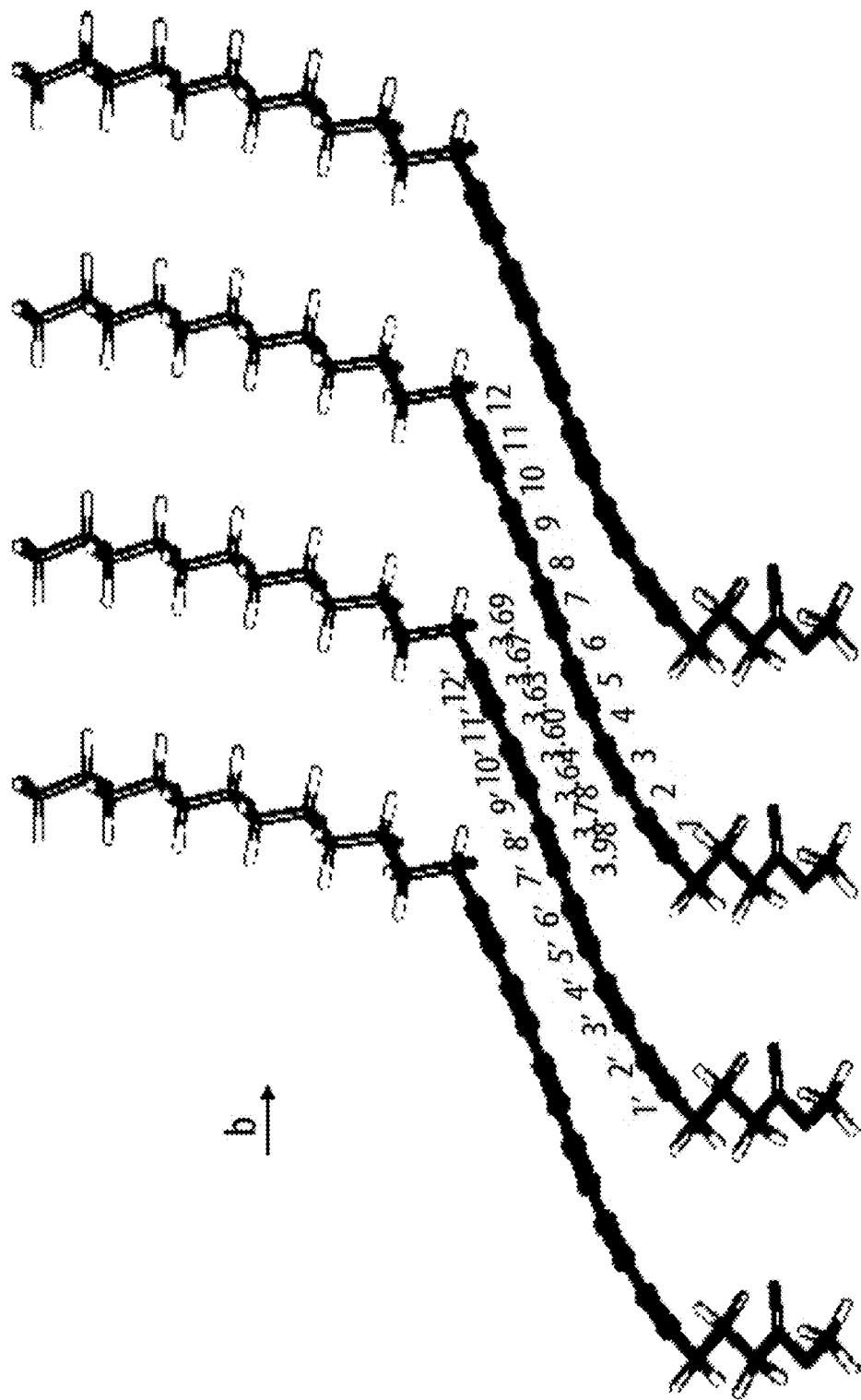

Thus, both the spectroscopy and diffraction experiments were consistent with the presence of a monolayer of 1 that comprised a densely packed array of the hexayne amphiphiles with the alkyl chains in an ordered all-trans state. To further elucidate the molecular packing, in particular, with regards to the experimentally inaccessible dihedral angles between the head group, hexayne, and dodecyl segments, we performed geometry optimizations by DFT computations at the PBE-D2 level with periodic boundary conditions and fixed unit cell dimensions based on the experimental GIXD results. The obtained energy-optimized structure revealed hexayne segments that were slightly bent (FIGS. 7B, 7C), but much less so than often observed in single-crystals of oligoynes with sterically demanding head groups. The computations showed that this bending as well as the adjustment of the individual tilt and dihedral angles allowed the molecules to better accommodate the different segments' steric demand and thereby resulted in an optimized arrangement of the amphiphiles. The optimized monolayer exhibited a thickness of 2.4 nm (without the experimentally observed hydrating water molecules) and tilt angles of 61.9° and 27.0° for the hexayne and dodecyl segment, respectively, in excellent agreement with the experimental values. Most importantly, however, the optimized structure revealed a very tight packing of the hexayne segments with a whole series of close carbon-carbon short contacts of 3.42-3.53 Å between acetylene carbons C1-C9 and C4'-C12' (along the a axis) and 3.60-3.78 Å between acetylene carbons C3-C8 and C7'-C12' (along the b axis) of neighboring molecules (FIG. 7C and FIGS. 18A-18B). In other words, the tight and two-dimensional arrangement of the reactive hexayne segments observed in the monolayers of 1 may be considered as a less than 7 Å thick "carbon precursor" sublayer, with the reactive carbon distances well below the threshold of 4 Å known from the topochemical diacetylene polymerization, and hence well-suited for an extensive cross-linking by an irradiation-induced carbonization.

FIGS. 18A-18B above shows the molecular packing obtained after geometry optimization by density functional theory computations at the PBE-D2 level with fixed cell dimensions based on the unit cell determined from GIXD and periodic boundary conditions revealed numerous carbon-carbon short contacts of 3.42-3.53 Å between acetylene carbons C1-C9 and C4'-C12' (along the a axis) and 3.60-3.78 Å between acetylene carbons C3-C8 and C7'-C12' (along the b axis) of neighboring molecules.

Accordingly, the complete carbonization of the hexayne layer in the films of exemplary 1 at the air-water interface was successfully accomplished by cross-linking through UV irradiation at room temperature. Following the progress of this irradiation-induced carbonization by monitoring the intensity of the hexayne band at 2200 cm$^{-1}$ in the IRRA spectra revealed that the conversion of the hexayne moiety was virtually complete after about 40 min of UV irradiation, although the presence of a small fraction of residual isolated triple bonds cannot be excluded. The derived pseudo-kinetic plot of band intensity versus irradiation time showed a linear relation up to acetylene conversions of more than 80%. Without wishing to be bound by theory, if one interprets this observation as pseudo-zero order kinetics, it would imply that the carbonization process does not (solely) rely on the excitation of hexayne monomers (FIGS. 19A, 19B; FIGS. 20A-20C). Brewster angle microscopy (BAM) experiments showed a change in the texture of the films upon UV irradiation. The new texture was maintained, and no defects were observed in the carbonized films even after expansion of the barriers and reduction of the surface pressure; a rupture of the carbonized films was only achieved by violent manipulation with a needle, which left large islands floating at the air-water interface, providing an indication of the drastically increased mechanical stability of the monolayers after carbonization (FIGS. 19C, 19D; FIGS. 21A-21F).

Figure 19E:
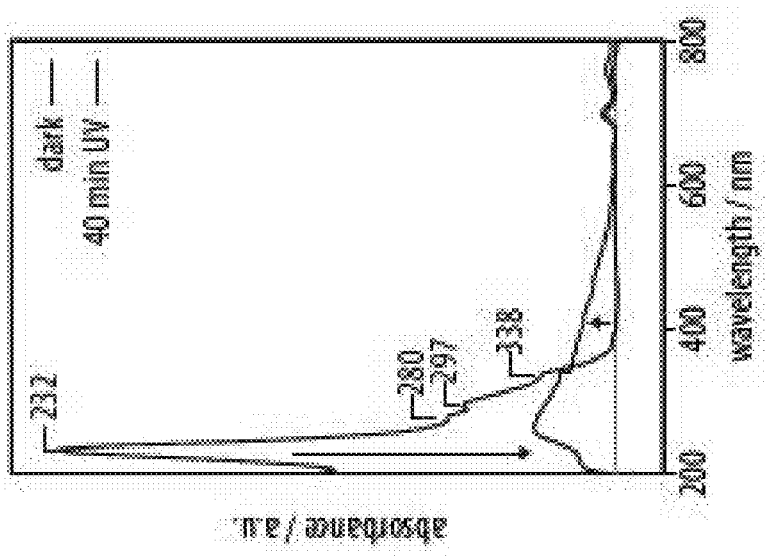
FIGS. 19A-19F show carbonization processes of a film of an exemplary amphiphile as monitored by infrared reflection-absorption spectroscopy.
Figure 19C:
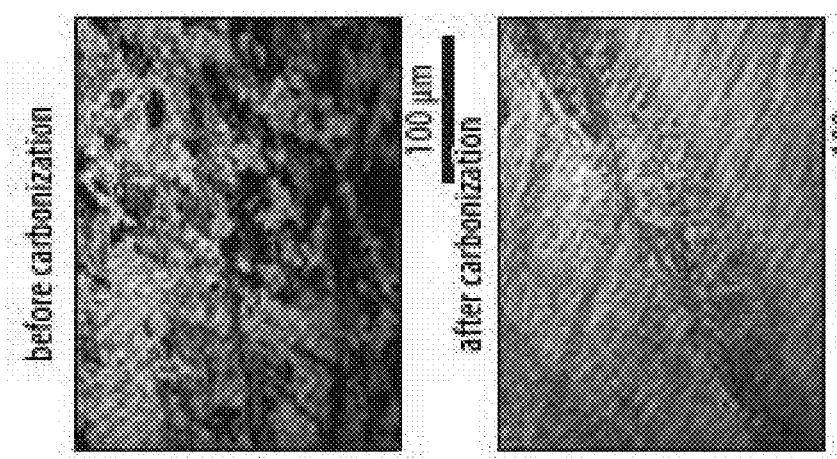
Figure 19A:
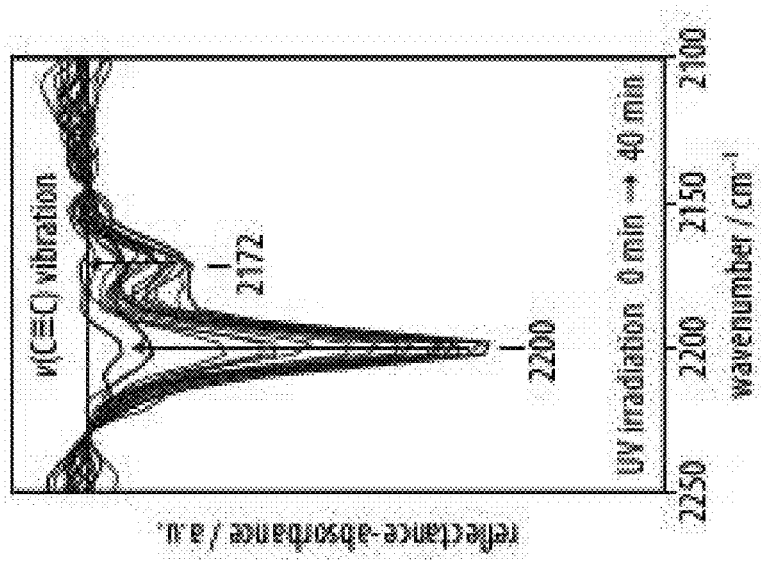
Figure 19F:
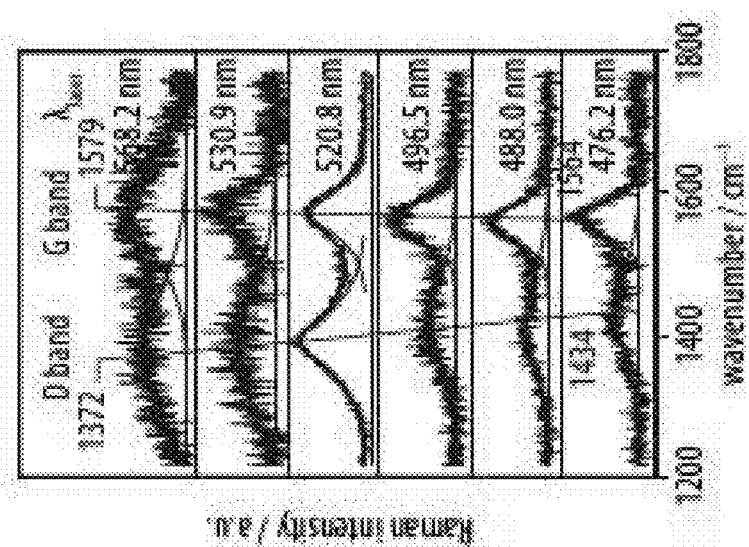
Figure 19D:
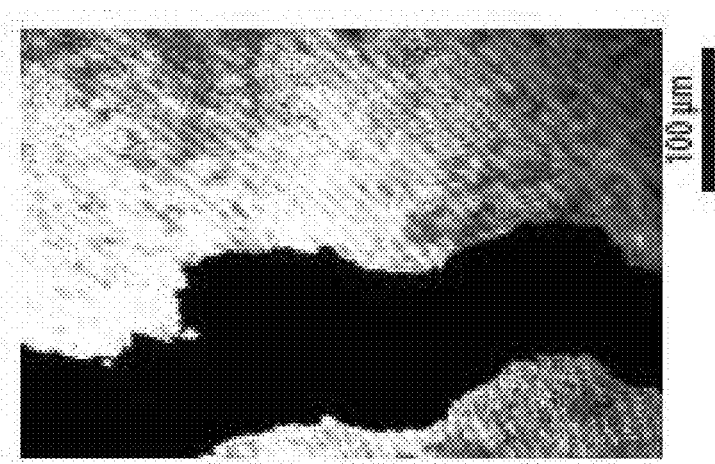
Figure 19B:
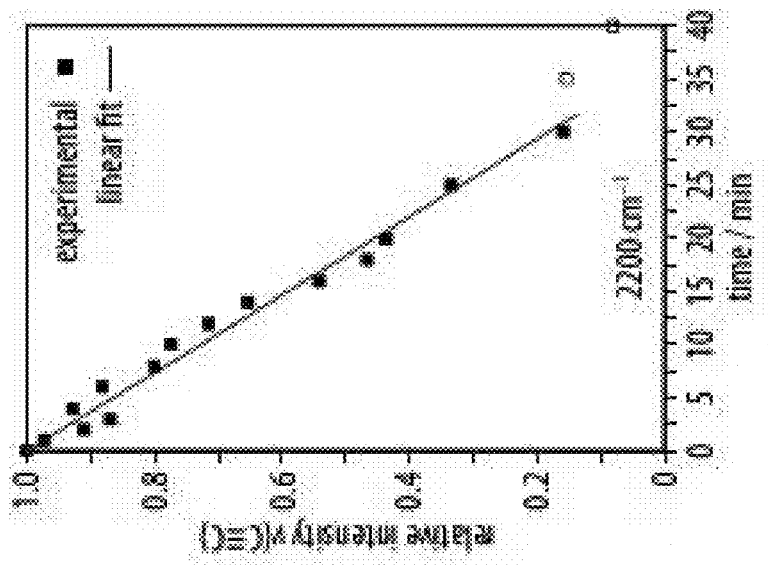
Figure 20A:
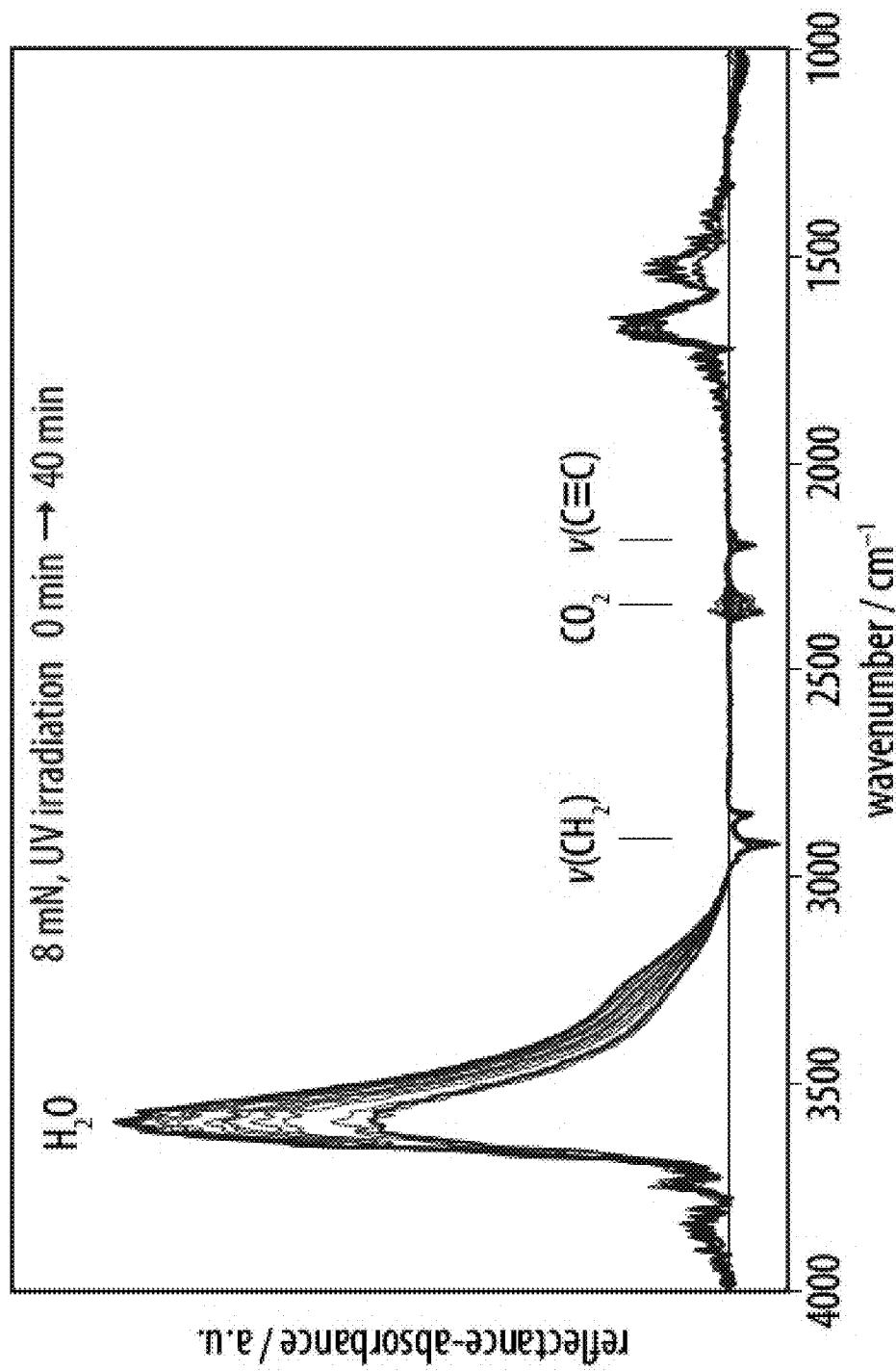
FIGS. 20A-20C show progression of carbonization of a film of an exemplary amphiphile as monitored by infrared reflection-absorption spectroscopy.
Figure 20C:
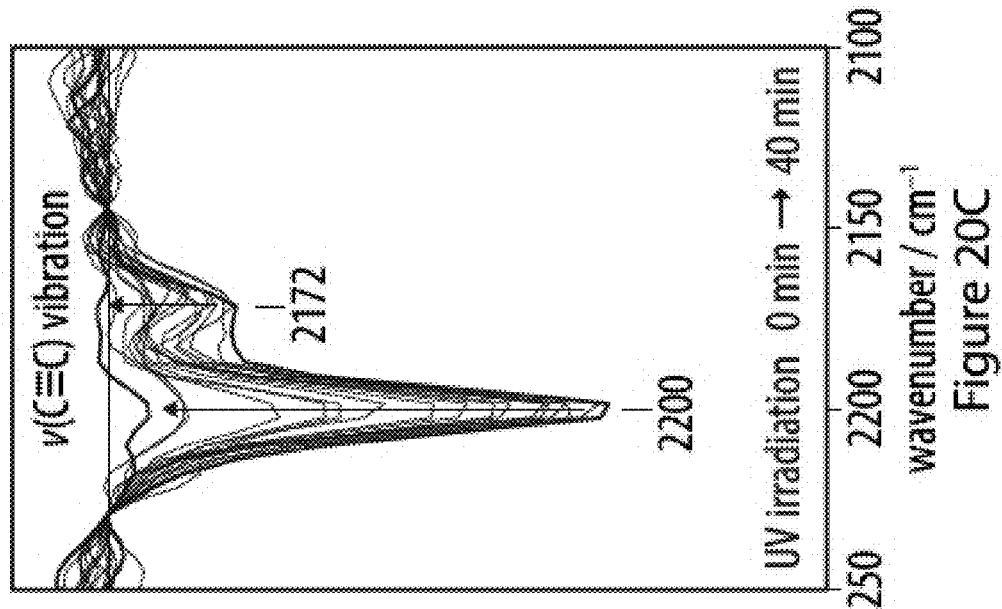
Figure 20B:
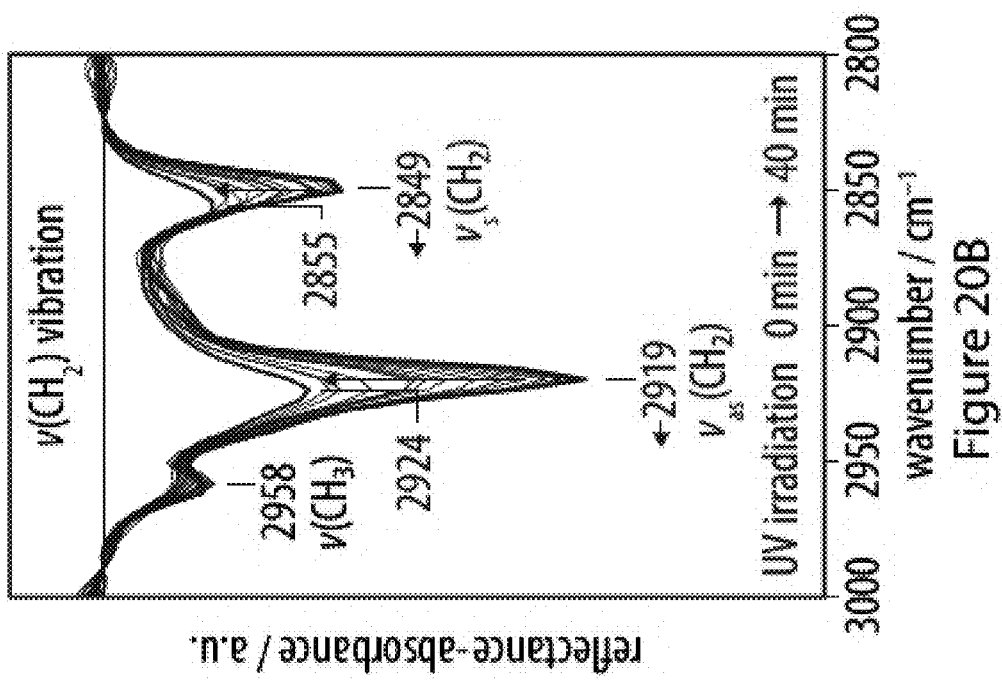

FIGS. 19A-19F shows the carbonization process of a film of exemplary 1 monitored by infrared reflection-absorption (IRRA) spectroscopy and characterization of the carbonized films by Brewster angle microscopy as well as UV/vis and Raman spectroscopy. FIG. 19A shows IRRA spectra of the film before (lowest reflectance absorbance line) and after 1-40 min (higher reflectance absorbance lines) of UV irradiation showed that the bands of the hexayne segment (2200, 2172 cm$^{-1}$) completely disappeared upon UV irradiation. FIG. 19B shows that a pseudo-kinetic plot of the hexayne band intensity versus irradiation time suggests a linear relation up to conversions of above 80%. FIGS. 19C, 19D shows that Brewster angle micrographs of the carbon nanosheets after UV irradiation showed a uniform film that could only be ruptured by violent manipulation. FIG. 19E shows UV/vis spectra of irradiated films transferred to sapphire substrate showed a broad and featureless absorption at wavelengths of up to 600 nm. FIG. 19F shows that Raman spectroscopy on multilayered material transferred to SiO$_2$ substrates gave rise to the signature Raman bands of carbon materials. See FIGS. 20A-20C, FIGS. 21A-21F, FIGS. 22A-22C, and FIGS. 23A-23C for details.

FIGS. 20A-20C shows how the progress of the carbonization of a film of the exemplary, reactive, carbon-rich amphiphile 1 was monitored by means of infrared-reflection absorption (IRRA) spectroscopy. Spectra of the monolayer were recorded before (lowest reflectance absorbance line) and after 1-40 min (higher reflectance absorbance lines) of UV irradiation. FIG. 20A shows that in the course of irradiation, the OH band of the subphase (v(OH)) at 3600 cm$^{-1}$ decreased in intensity, indicating a decrease in the effective film thickness and corroborating the results obtained by specular X-ray reflectivity (FIG. 10D and FIGS. 15A-15C). FIG. 20B shows that the methylene bands at 2919 and 2849 cm$^{-1}$ decreased in intensity in the course of UV irradiation and were shifted to 2924 and 2855 cm$^{-1}$, respectively. These positions are characteristic for alkyl chains in a liquid-expanded, unordered (gauche) state. Thus, the carbonization led to a loss of the liquid-condensed packing of the dodecyl chains, as a result of the observed lateral expansion of the layer and consistent with the GIXD results (FIGS. 17A-17B and FIGS. 22A-22C). FIG. 20C shows that the bands at 2200 and 2172 cm$^{-1}$ associated with the hexayne segment completely disappeared after the accumulated 40 min of UV irradiation, suggesting a complete conversion.

Figure 21A:
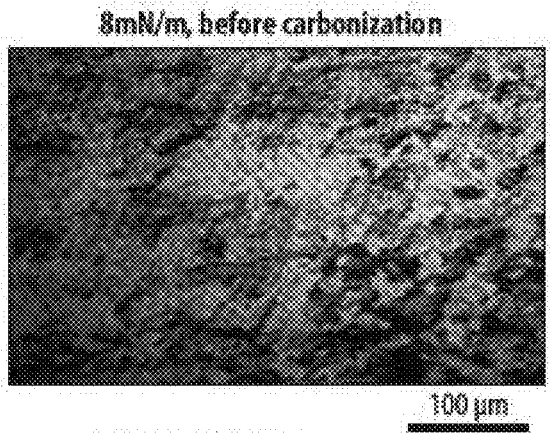
FIGS. 21A-21F show Brewster Angle Microscopy (BAM) images of an exemplary amphiphile at an air-water interface before and after carbonization by UV radiation.
Figure 21B:
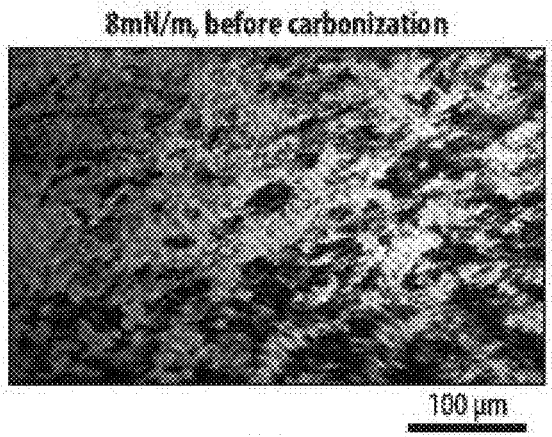
Figure 21C:
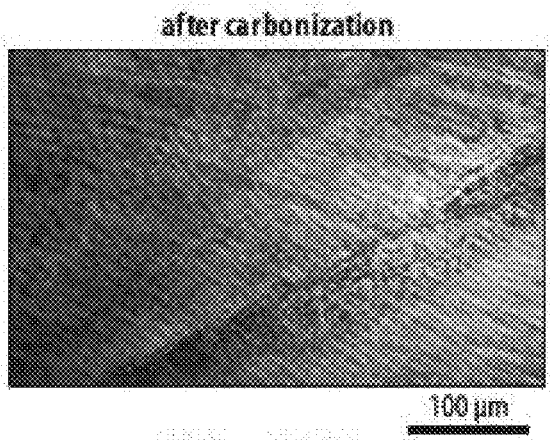
Figure 21D:
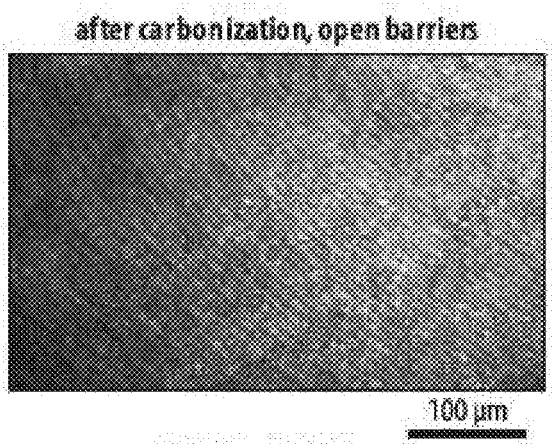
Figure 21E:
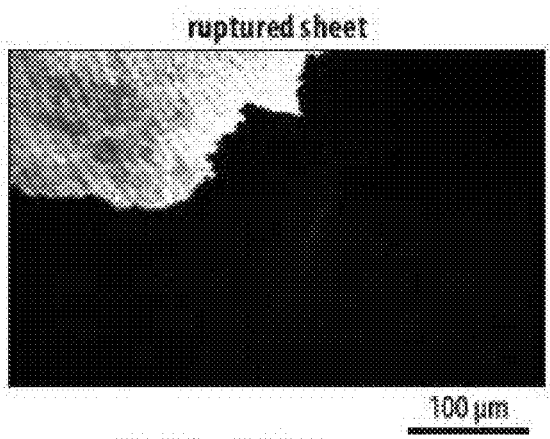
Figure 21F:
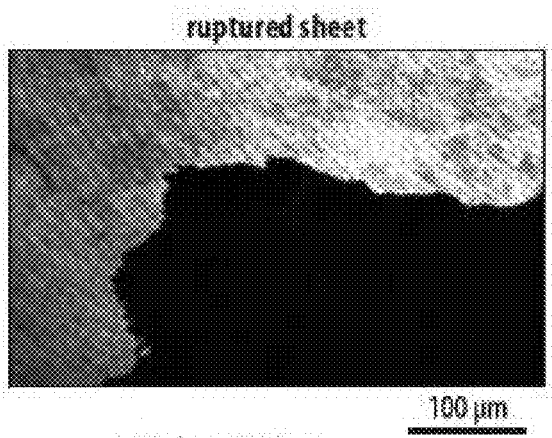

FIGS. 21A-21F shows Brewster angle microscopy (BAM) experiments carried out with a film of the exemplary carbon-rich amphiphile 1 at the air-water interface before and after carbonization by UV irradiation. FIGS. 21A-21B shows that the micrographs of a monolayer of 1 compressed to 8 mN/m showed a film with imperfections or voids (black regions) formed by compression of the rigid condensed domains (bright regions) coexisting at close to zero pressure with the gas-analogous phase. FIG. 21C shows that after UV irradiation at constant area leading to an increase of the surface pressure, a clear change in the texture of the film was observed. The voids disappeared but a corrugated texture was obtained due to the film expansion during carbonization. FIG. 21D shows that the texture of the carbonized films was even more homogenous (no wrinkles and no defects) after allowing the film to expand by opening the barriers and reducing the surface pressure. FIGS. 21E-21F show tupture of these carbonized films only achieved by violent manipulation with a needle, which left large islands floating at the air-water interface, providing an indication of the drastically increased mechanical stability of the monolayers after carbonization.

Figures 22A, 22B, 22C:
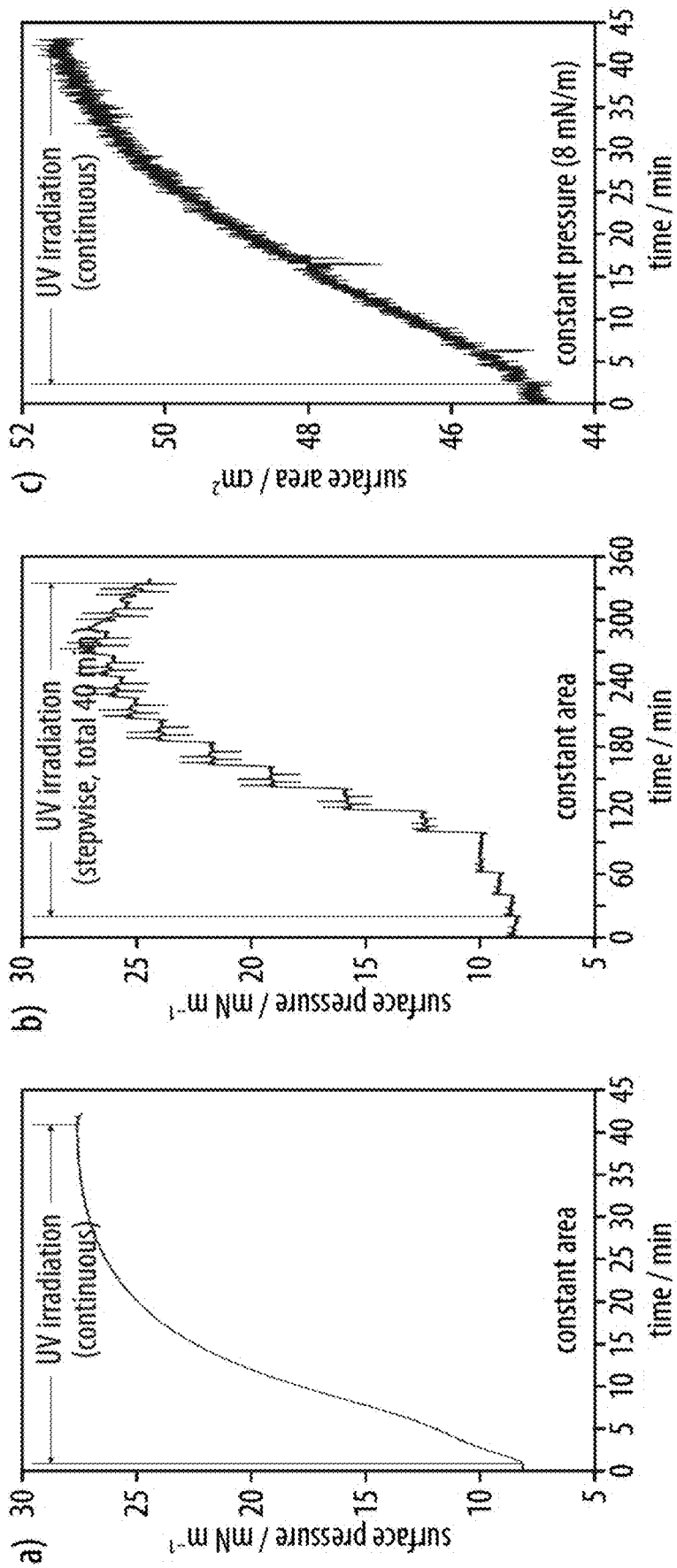
FIGS. 22A-22C show lateral pressure versus surface area and time of an exemplary amphiphile at an air-water interface recorded during carbonization by UV radiation.

FIGS. 22A-22C shows the lateral pressure and the surface area of a monolayer of exemplary amphiphile 1 at the air-water interface recorded during the carbonization by UV irradiation. The covalent cross-linking of the densely packed hexayne moieties of 1 appears to have been accompanied by a lateral expansion of the layer that led to a substantial increase of the surface pressure (experiments at constant area) or surface area (experiments at constant lateral pressure), respectively. In FIG. 22A after compression of a monolayer of 1 to 8 mN/m, the barriers of the Langmuir trough were fixed at a constant position during the carbonization. The surface pressure increased substantially in the course of the 40 min of continuous UV irradiation to values beyond 27 mN/m. FIG. 22B shows that a similar increase was observed for an experiment in which the irradiation was carried out stepwise. The total irradiation time was again 40 min but with time intervals in between for the measurement of the IRRA spectra. The spikes in the isotherm are artifacts due to the shuttling of the tough while measuring the IRRA spectra. In FIG. 22C the carbonization of a monolayer of 1 was carried out at a constant surface pressure of 8 mN/m, leading to a significant increase of the total surface area.

FIGS. 23A-23C shows spectra of the carbon nanosheets investigated by Raman spectroscopy to determine the carbon microstructure obtained by carbonization of a monolayer of exemplary 1 at the air-water interface. Thus, carbon nanosheets were collapsed at the air-water interface by closing the barriers after carbonization and the formed multilayered material was transferred to $SiO_2$ substrates from the air-water interface. In FIG. 23A Raman spectroscopy was carried out at different laser excitation wavelengths ($\lambda_{ex}$=476.2, 488.0, 496.5, 520.8, 530.9, 568.2 nm), and the background-corrected spectra displayed the G and D bands characteristic for $sp^2$-rich carbon materials. From the position of the G band (1579 at a laser excitation wavelength $\lambda_{ex}$=520.8 nm), one may conclude that the carbon microstructure of the carbon nanosheets resembled the one of nanocrystalline graphite or $sp^2$-rich amorphous carbon materials with a low amount of $sp^3$ hybridized carbon atoms of about 10%. Both the dispersion of the G and D bands in FIG. 23B (from 1564 and 1434 $cm^{-1}$ at a laser excitation wavelength $\lambda_{ex}$=476.2 nm to 1579 and 1372 $cm^{-1}$ at a laser excitation wavelength $\Delta_{ex}$=568.2 nm) and the dependence of the D and G peak intensity ratio $I_D/I_G$ on the laser excitation wavelength ex in FIG. 23C corroborated our interpretation. A comparison to other carbon materials showed a similar dispersion behavior for sputtered amorphous carbons, microcrystalline graphite, or annealed (800-1000° C.) tetrahedral amorphous carbons with a very high $sp^2$-content. Thus, the results obtained by Raman spectroscopy suggested that the carbonization of 1 afforded carbon nanosheets that exhibited a carbon microstructure rich in $sp^2$-hybridized carbon atoms containing a low amount of $sp^3$-hybridized carbon atoms of about 10%. Carbon materials with similar Raman signatures are typically obtained by carbonization above the onset of graphitization.

Interestingly, the surface pressure at the air-water interface was found to increase in the course of the carbonization for monolayers irradiated at constant surface area, while a significant expansion of the surface area was observed when the experiment was performed at constant surface pressure (FIGS. 22A-22C). This lateral expansion of the monolayer upon carbonization indicates that a further planarization of the acetylenic carbons in the precursor layer is taking place during this transformation. Since the density of the carbon sublayer is expected to even increase as a result of the covalent cross-linking, its thickness can be estimated to be reduced from 7 Å to well below 6 Å, which is the upper bound estimated from the 15% increase in surface area. X-ray reflectivity experiments indeed confirmed that the carbonization of the Langmuir films of 1 was accompanied by a vertical contraction of the overall layer thickness from 2.65 to 1.9 nm (FIG. 14C). Without wishing to be bound by theory, this significantly reduced layer thickness is believed to be the combined result of the vertical contraction of the carbon sublayer described above and a concomitant rearrangement of the dodecyl segments as a consequence of the lateral expansion of the film. Thus, the bands for the asymmetric and symmetric $CH_2$ stretching vibrations shifted to 2924 and 2855 $cm^{-1}$, respectively, the positions characteristic for alkyl chains in a liquid-expanded state (FIGS. 20A-20C). Consistent with this loss of in-plane ordering in the hexayne and dodecyl segments throughout the UV-induced carbonization, GIXD experiments performed on carbonized films did not show any diffraction peaks.

UV/vis and Raman spectroscopy on irradiated Langmuir films of exemplary 1 transferred to solid substrates provided conclusive evidence for the extensive carbonization and formation of $sp^2$-rich carbon nanosheets. UV/vis spectra on films transferred to sapphire substrates showed a broad, featureless absorption at wavelengths of up to 600 nm after the UV-induced carbonization, while lacking the absorption bands of the hexayne chromophore in the range of $\lambda$=232-338 nm (FIG. 19E). The main absorbance peak of the carbon nanosheets at ~260 nm is consistent with the reported characteristic position for spectra of reduced graphene oxide and has been attributed to the $\pi$-$\pi^*$ transition of the carbon-carbon double bonds. Moreover, the optical band gap of approximately 2.2 eV at the observed absorption edge of about 550 nm suggested the presence of at least nanometer-sized graphene-like domains according to studies of graphene oxide materials. At the same time, background-corrected multi-wavelength Raman spectra on material transferred to $SiO_2$ substrates revealed the G and D bands (1579 and 1372 $cm^{-1}$ at a laser excitation wavelength $\lambda_{ex}$=496.5 nm) characteristic for $sp^2$-rich carbon materials (FIG. 19F; FIGS. 23A-23C). The signal-to-noise ratio of the spectra was strongly affected by the photoluminescence background typical for such carbon materials and appeared to be subject to resonance enhancement close to the absorption edge of the carbon nanosheets, lending further credence to the interpretation of the absorption spectra. A detailed analysis of the positions and intensities of the G and D bands as a function of the laser excitation wavelength allowed us to conclude that the carbon microstructure consisted mainly of extended $sp^2$-hybridized carbon clusters (>80%) with a minor amount of "edge states" connected to $sp^3$-hybridized carbon centers (10-15%). The presence of small fractions of sp-hybridized carbons from isolated triple bonds cannot be fully excluded. This is consistent with the production of carbon nanosheets in ambient conditions that are extensively conjugated and closely resemble "amorphous carbon" (a-C) materials obtained under conditions well above the onset of graphitization at typical annealing temperatures above 800-1000° C., and it is tempting to assign the observed fraction of 10-15% "edge states" to the two out of twelve carbons covalently connected to the dodecyl termini and head groups, respectively. On the basis of its thickness, the absorption spectra, and Raman results, one may hence contemplate a tentative structure model for the carbon sublayer akin to reduced graphene oxide, with a cross-linked and defect-rich network of at least nanometer-sized graphene "flakes" that are oriented, on average, parallel to the air-water interface.

The carbon nanosheets were furthermore characterized by scanning as well as transmission electron microscopy (SEM, TEM) after transfer to a holey carbon TEM grid as support. The contrast between the free and the covered parts of the grid in SEM images taken with the in-lens detector at low working distances was only discernible at acceleration voltages of 2.0 kV and below (FIG. 24A). The films became opaque to the electron beam upon further reducing the voltage to 0.5 kV, and the images revealed carbon nanosheets that spanned the 2×2 µm² sized holes of the grid with only few defects (FIG. 24B). Both SEM and TEM micrographs showed that the film was partially draped and wrinkled at its edge while very smooth further away from the border (FIGS. 25A-25F, FIGS. 26A-26D, and FIGS. 27A-27F). Small circular holes of a few nanometers in diameter were visible in high-resolution SEM images of the free-standing carbon nanosheets, as well as some blisters on the surface of the films that otherwise appeared uniform and smooth (FIG. 24C). Although carbon materials with a typical knock-on voltage of 80 kV or lower typically suffer from beam damage at these voltages in TEM, concentrating the full power of the electron beam in one spot only resulted in the slow growth of holes already present in the carbon film and not a violent rupture of the films.

FIGS. 24A-24F shows scanning and transmission electron microscopy (SEM, TEM) images of carbon nanosheets obtained by carbonization of exemplary 1 at the air-water interface after transfer to a holey carbon TEM grid. FIGS. 24A, 24B show that a partially covered grid revealed a slight contrast difference at an accelerating voltage of 2.0 kV while the carbon nanosheets became opaque at 0.5 kV. FIG. 24C shows that high-resolution SEM images showed small circular holes in the carbon nanosheets and some blisters on its surface. FIG. 24D shows that TEM images revealed the corrugated surface of the carbon nanosheets, which can be discriminated against the background of the carbon frames of the TEM grid. FIG. 24E shows how the carbon nanosheets served as a substrate for hydrophilic gold nanoparticles deposited by drop-casting from an aqueous solution. The comparison to image regions on the 10-12 nm thick carbon of the holey carbon TEM grid highlighted the very low background contrast provided by the 2 nm thick carbon nanosheets. FIG. 24F shows that the carbon nanosheets were sufficiently stable to serve as support films under the strong electron beam (200 kV) conditions in high resolution TEM, and the obtained images showed the fringes of the lattice planes of the gold nanoparticles. See FIGS. 25A-25F, FIGS. 26A-26D, FIGS. 27A-27F, FIGS. 28A-28F, and FIGS. 29A-29F for details.

Figure 25A:
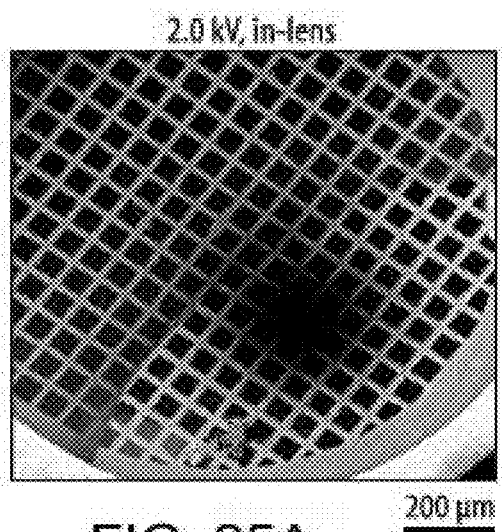
FIGS. 25A-25F show scanning electron microscopy (SEM) images of a carbon nanosheet after transfer to a holey carbon TEM grid.
Figure 25B:
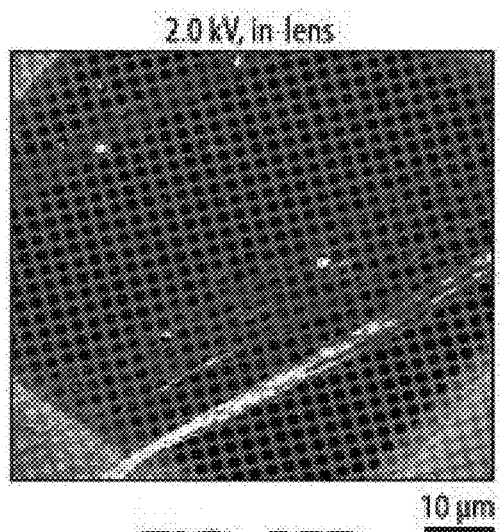
Figure 25C:
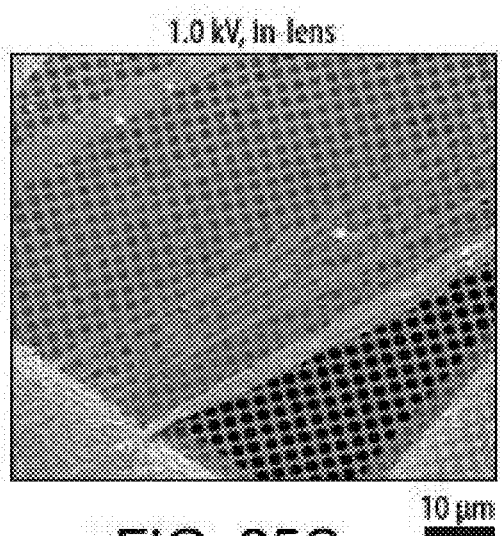
Figure 25D:
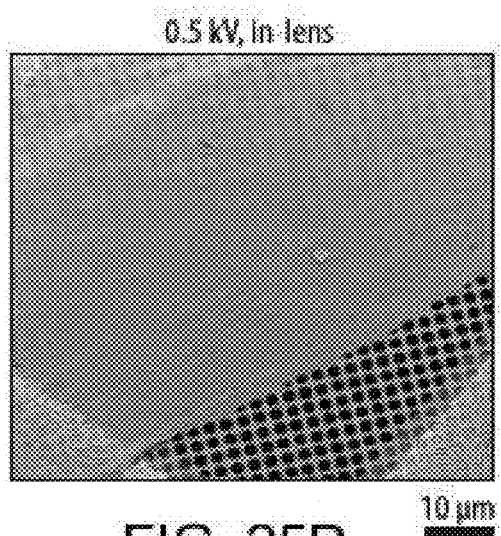
Figure 25E:
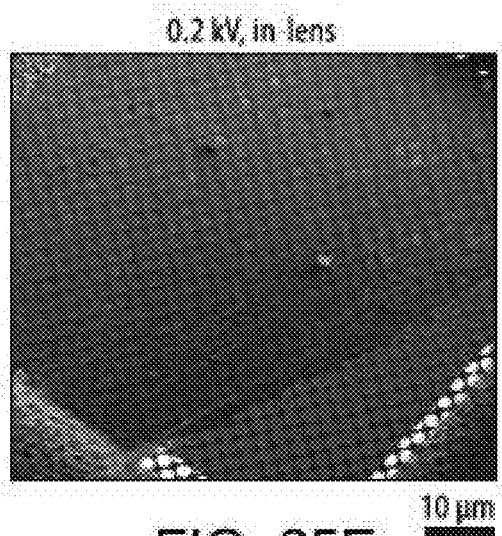
Figure 25F:
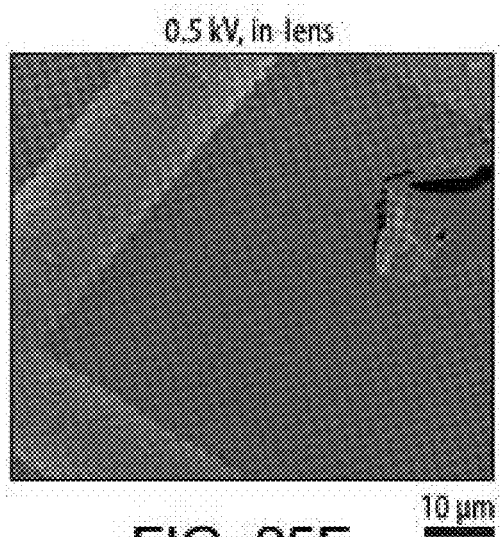

FIGS. 25A-25F shows scanning electron microscopy (SEM) of a carbon nanosheet after Langmuir-Schäfer transfer to a Quantifoil® holey carbon TEM grid as support. FIG. 25A shows that a partially covered grid imaged at an accelerating voltage of 2.0 kV with the (on axis) in-lens detector of the Gemini II column (beam booster) revealed a slight contrast between regions covered with the carbon nanosheet and others. The observed dark spot arises from the small working distance leading to a shadowing effect at low magnifications. FIGS. 25A-25E show a series of images taken at the same position highlights the influence of the accelerating voltage, as the carbon nanosheet became opaque to the electron beam at around 0.5 kV. The images were taken at the border of the film to illustrate the difference between the covered and non-covered parts of the grid. At the edge of the carbon nanosheet, draping and wrinkles were observed. FIG. 25F shows that away from the border region, the film was very smooth and uniformly spread over the grid. The defect in the supporting grid aids in identifying the carbon nanosheet.

Figure 26A:
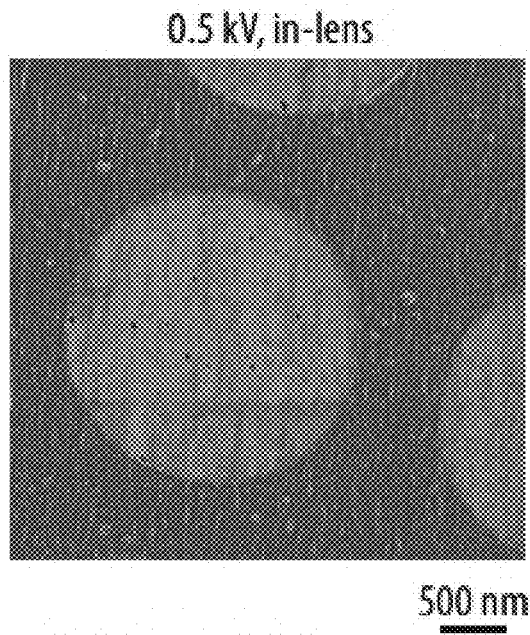
FIGS. 26A-26D show high-resolution scanning electron microsopy (SEM) images of a carbon nanosheet after transfer to a holey carbon TEM grid.
Figure 26B:
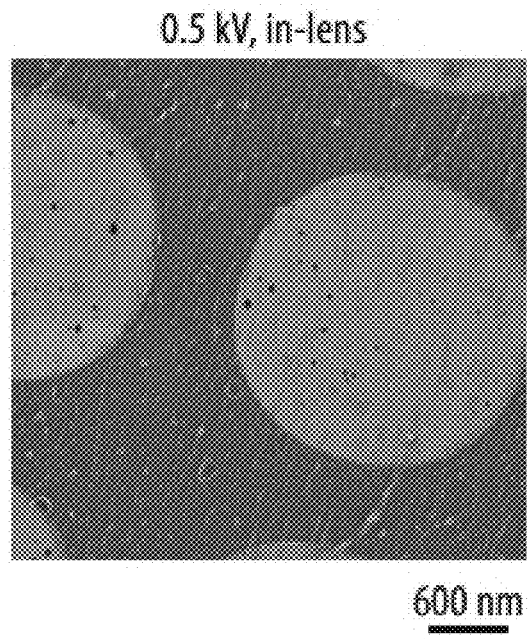
Figure 26C:
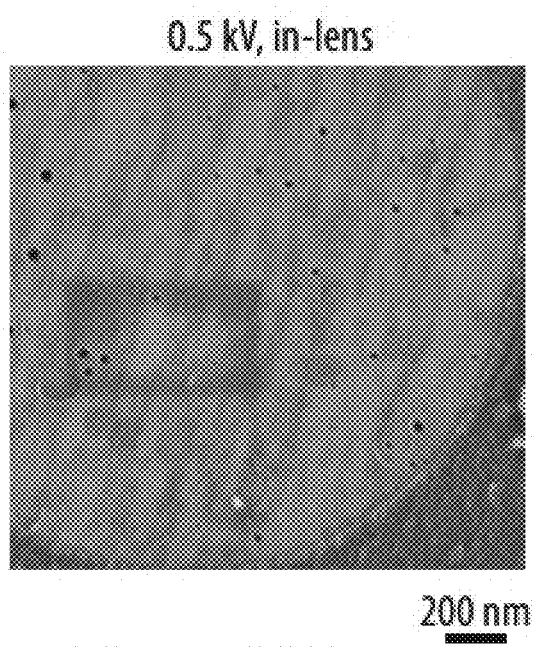
Figure 26D:
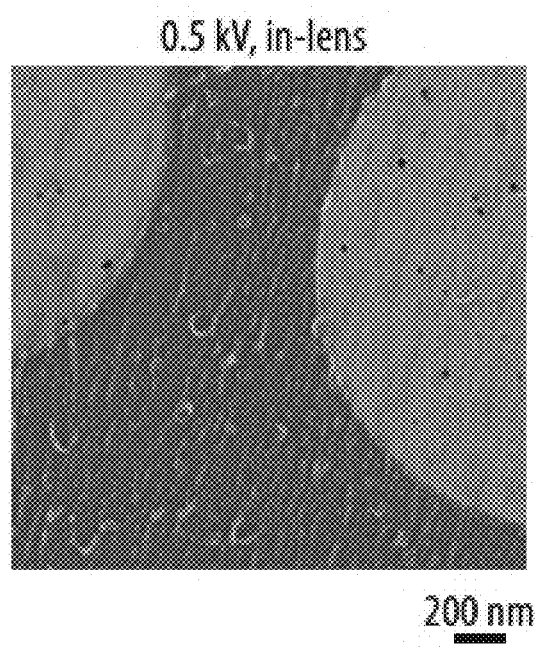

FIGS. 26A-26D shows high-resolution scanning electron microscopy (SEM) images of a carbon nanosheet after Langmuir-Schäfer transfer to a Quantifoil® holey carbon TEM grid as support. The micrographs were obtained at a low accelerating voltage of 0.5 kV with the (on axis) in-lens detector of the Gemini II column (beam booster). In FIGS. 26A-26D it is observed that the carbon nanosheets covered the 2×2 µm sized circular holes of the holey carbon support grid. At this magnification, small circular holes of few nanometers in size were observed in the free-standing nanosheet. Moreover, some blisters were observed on the surface. The dark rectangle observed in FIG. 26C is typically produced by a previous observation at higher magnification and is due to some contamination decomposition under the beam. The rectangle, thus, corresponds to the previously scanned area on the specimen.

Figure 27A:
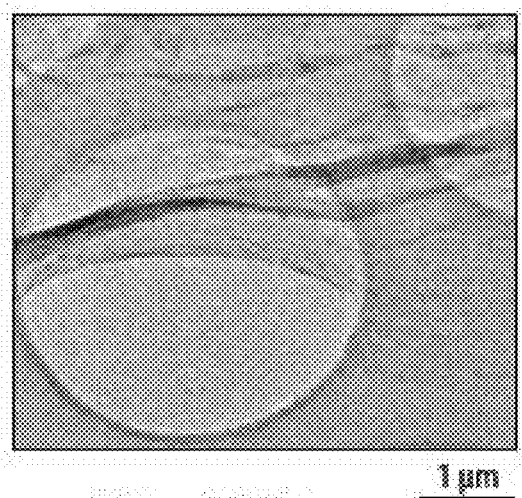
FIGS. 27A-27F show transmission electron microscopy (TEM) images of a carbon nanosheet after transfer to a holey carbon TEM grid.
Figure 27B:
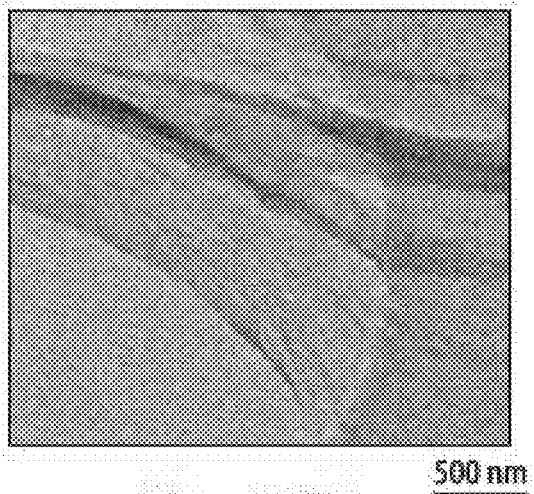
Figure 27C:
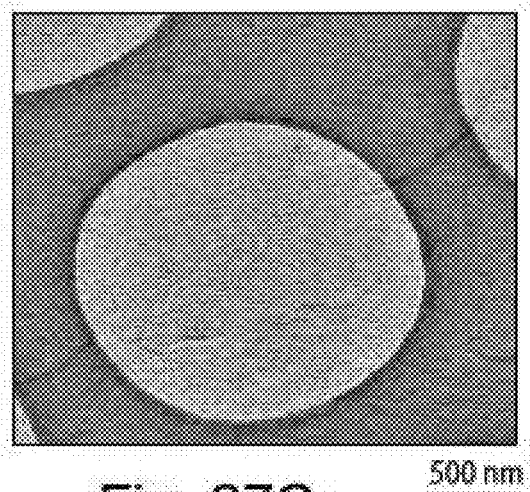
Figure 27D:
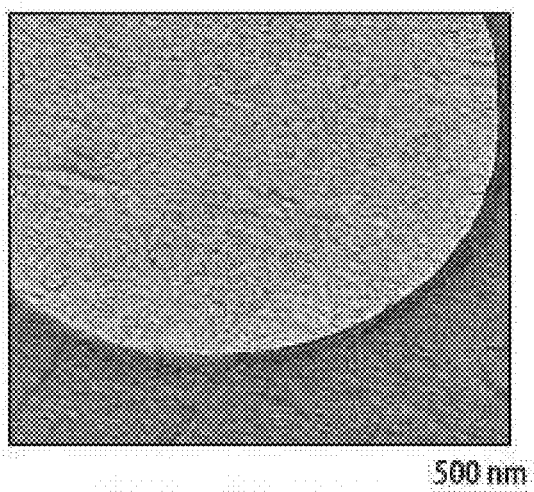
Figure 27E:
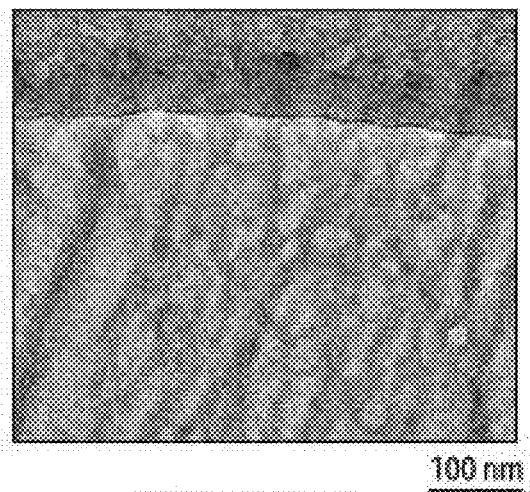
Figure 27F:
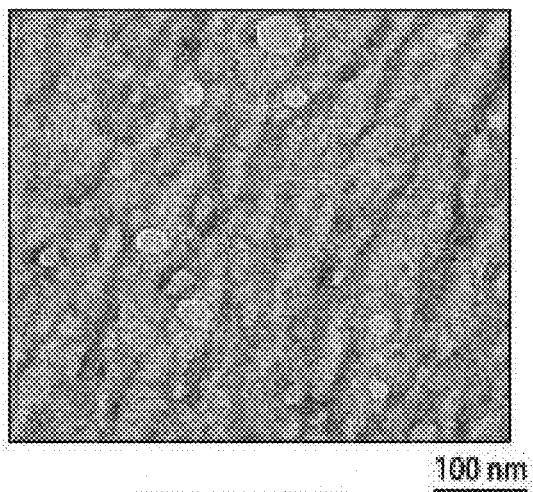

FIGS. 27A-27F shows transmission electron microscopy (TEM) images of a carbon nanosheet after Langmuir-Schäfer transfer to a Quantifoil® holey carbon TEM grid as support. FIGS. 27A-27B shows that images taken at the border of the carbon nanosheet show draping and wrinkles, as also observed by SEM. FIGS. 27C-27D show that away from the border region, the film was very smooth and uniformly spread over the grid covering the 2×2 m sized holes of the support grid. FIGS. 27E-27F show that at higher magnifications and maximum contrast, the micrographs showed small circular holes of few nanometers in size where the corrugate surface of the carbon nanosheets, which can be discriminated against the background, as also observed by high-resolution SEM (FIGS. 24A-24F). As expected for carbon materials with a typical knock-on voltage of 80 kV or lower, concentration of the electron beam lead to some beam damage that caused slow growth of the small circular holes while no violent rupture of the carbon nanosheet occurred.

Moreover, the carbon nanosheets offered very low background contrast and a functionalized, hydrophilic surface, which led to the investigation of their use as substrates for TEM imaging of other specimen, as had been previously reported for graphene oxide substrates. To this end, an aqueous solution of 4.4 nm sized gold nanoparticles coated with hydrophilic ligands was drop-cast onto a holey carbon TEM grid covered with a carbon nanosheet obtained by carbonization of 1 at the air-water interface, and imaged the deposited nanoparticles with TEM (FIGS. 24E-24F; FIGS. 28A-28F and FIGS. 29A-29F). The results demonstrated that the carbon nanosheets were a sufficiently stable support for the nanoparticles, even under the 200 kV electron beam conditions employed in high-resolution TEM imaging that showed the gold nanoparticles and the fringes of the gold lattice planes with high contrast (FIG. 24F). With a hydrophilic surface functionalization and the defined thickness of less than 2 nm, the carbon nanosheets provided a solid self-supporting substrate with properties compatible to the hydrophilic specimen without a treatment such as glow discharge and offered an extraordinarily low background contrast giving a light texture, illustrated by the comparison to image regions with the 10-12 nm thick carbon frames of the holey carbon TEM grids (FIG. 24E).

Figure 28A:
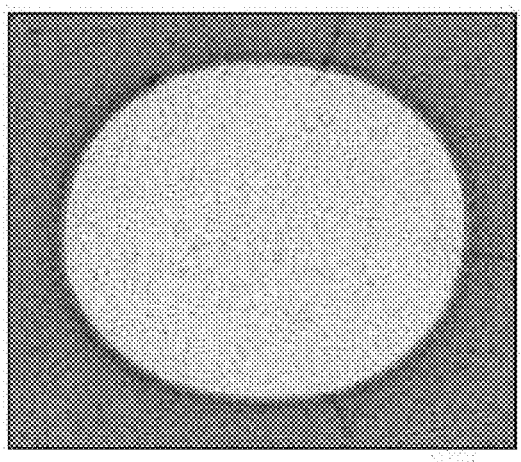
FIGS. 28A-28F show transmission electron microscopy (TEM) images of hydrophilic gold nanoparticles drop-cast on a carbon nanosheet after transfer to a holey carbon TEM grid.
Figure 28B:
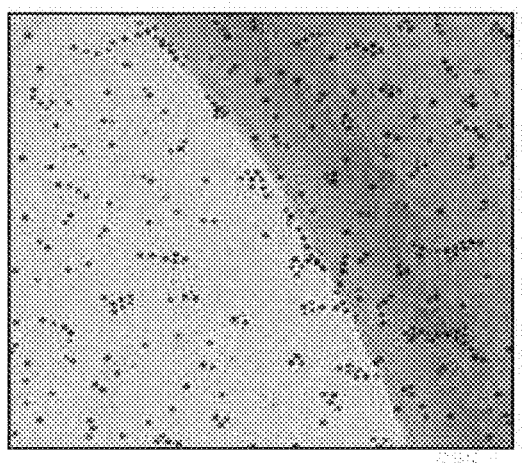
Figure 28C:
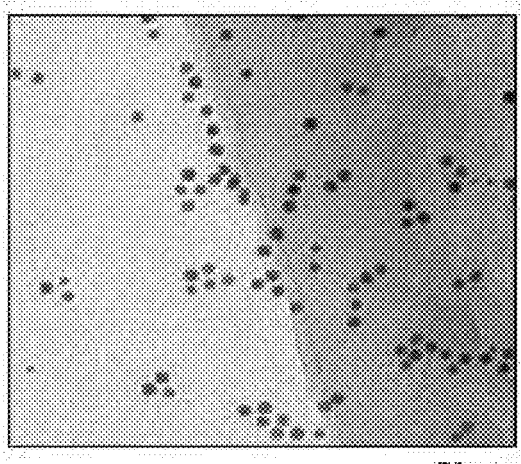
Figure 28D:
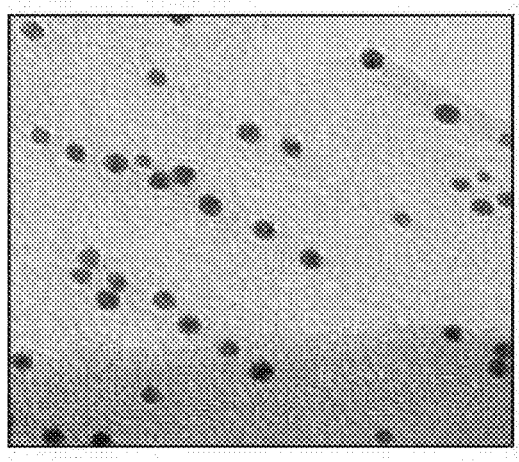
Figure 28E:
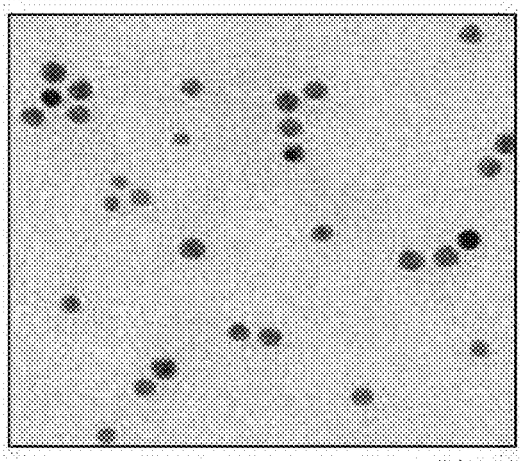
Figure 28F:
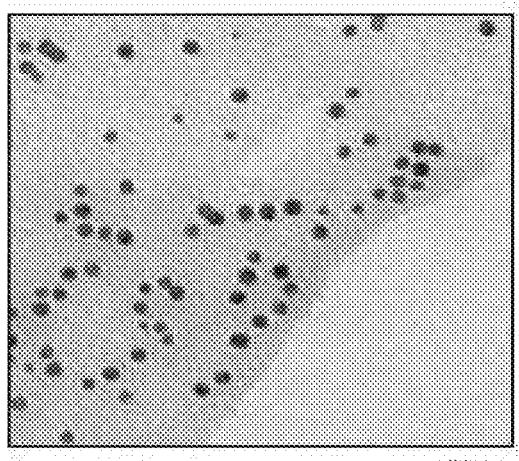

FIGS. 28A-28F shows transmission electron microscopy (TEM) images of hydrophilic gold nanoparticles drop-cast on a carbon nanosheet after Langmuir-Schäfer transfer of the carbon nanosheet to a Quantifoil® holey carbon TEM grid. FIGS. 28A-28B show that the hydrophilic nanoparticles were found to adhere well to substrate without the necessity of any previous treatment such as glow discharge and were uniformly distributed on the surface of the hydrophilic, ester-functionalized side of the carbon nanosheet. FIGS. 28C-28D show micrographs of the 1.9 nm thick carbon nanosheet next to both the 10-12 nm thick carbon of the holey carbon TEM grid and the empty space at the border of the carbon nanosheet. The very low background contrast should be uniquely suitable for the imaging of other specimen. FIGS. 28E-28F Even at higher magnifications the carbon nanosheets were sufficiently stable to the electron beam and the micrographs show the gold nanoparticles on the free-standing carbon nanosheet and next to its border.

Figure 29A:
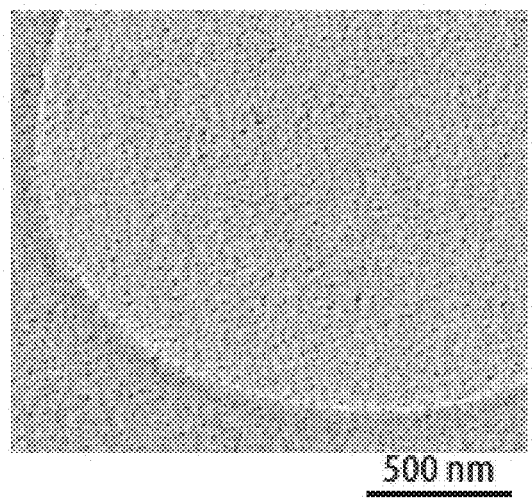
FIGS. 29A-29F show high-resolution transmission electron microsopy (HR-TEM) images of hydrophilic gold nanoparticles drop-cast on a carbon nanosheet after transfer to a holey carbon TEM grid.
Figure 29B:
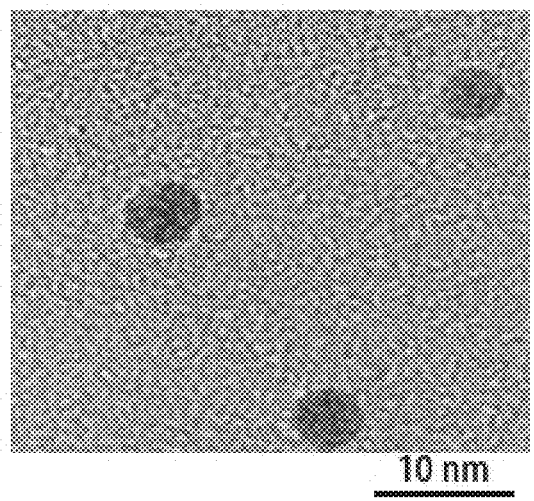
Figure 29C:
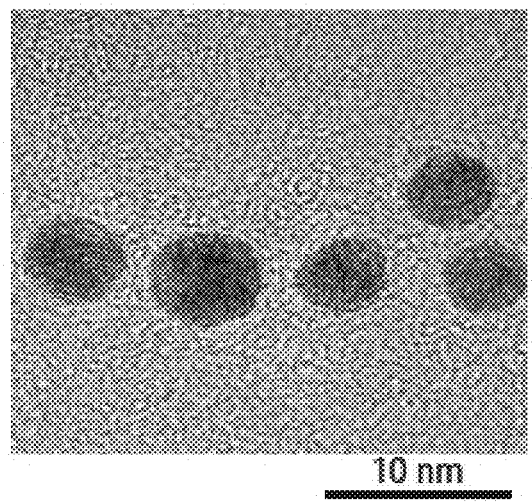
Figure 29D:
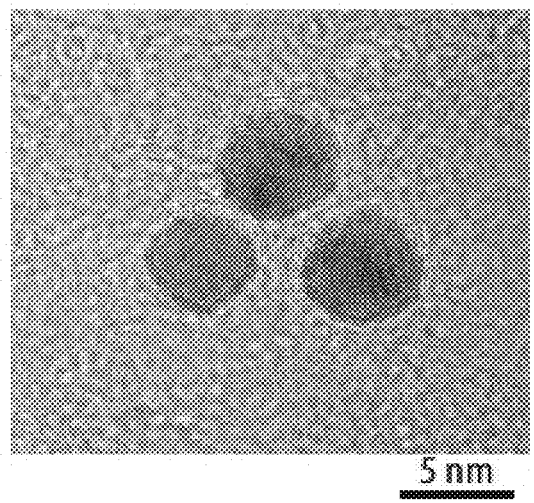
Figure 29E:
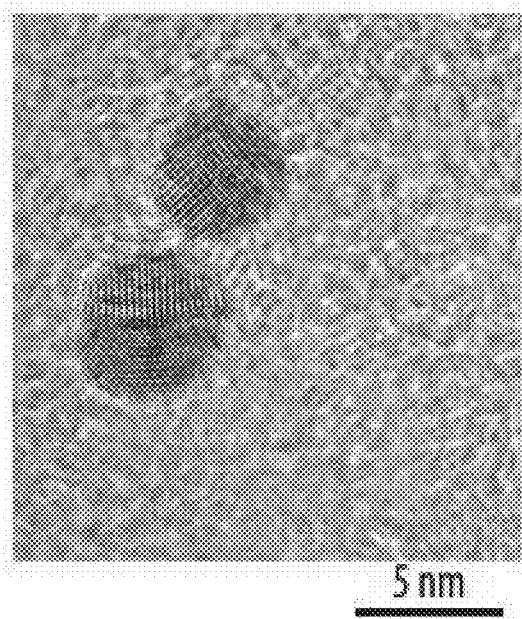
Figure 29F:
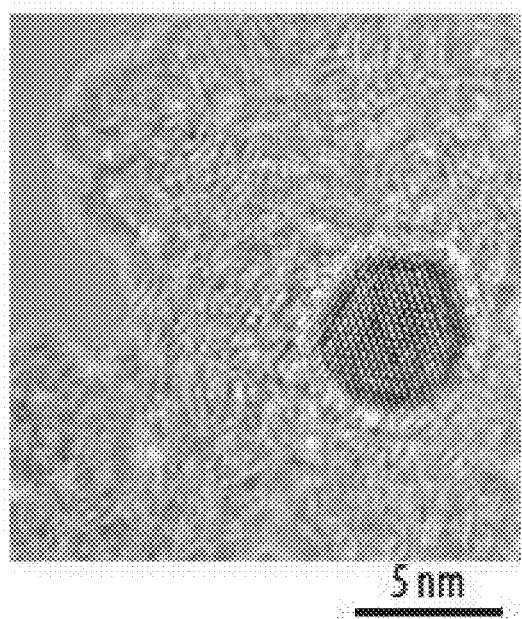

FIGS. 29A-29F shows high-resolution transmission electron microscopy (HR-TEM) images of hydrophilic gold nanoparticles drop-cast on a carbon nanosheet after Langmuir-Schäfer transfer of the carbon nanosheet to a Quantifoil® holey carbon TEM grid. FIG. 29A shows a micrograph showing the carbon nanosheet covered with gold nanoparticles next to the holey carbon support grid. FIG. 29B-29F show that the carbonized Langmuir films were sufficiently stable to serve as support under the strong electron beam (200 kV) used for HR-TEM imaging, even at the border of the sheet and at very high magnifications. The obtained micrographs nicely show the fringes of the lattice planes of the gold nanoparticles. Given the insufficient resolution of the objective lens (0.24 nm point resolution), a strong defocus was required to resolve the lattice fringes, leading to image delocalisation.

The procedure described above and illustrated in FIGS. 7A-7C to FIGS. 29A-29F provides an example for the preparation of a coating comprising at least one coating layer that consists of a thin, two-dimensional carbon nanostructure with extended lateral dimensions based on the self-assembly and subsequent carbonization of the hexayne amphiphile 1 at the air-water interface. In this example, the coating consists of one coating layer. Without wishing to be bound by theory, a detailed molecular model of the monolayer's internal structure provided strong evidence that the hexayne moieties were densely packed at π-π stacking distance, suitable for carbonization. Subsequent UV irradiation of the films resulted in the complete carbonization of the molecular precursors at room temperature, producing $sp^2$-rich carbon nanosheets with a carbon microstructure that resembled "amorphous carbon" (a-C) materials typically obtained after annealing at temperatures of 800-1000° C. In this way, mechanically stable and rigid, functionalized carbon films were produced bearing similarities to reduced graphene oxide, with a molecularly defined overall thickness of 1.9 nm and lateral dimensions on the order of centimeters that are, presumably, only limited by the dimensions of the Langmuir trough. These thin carbon nanosheets with their hydrophilic surface functionalization proved to be useful as low background contrast substrates for the high resolution TEM imaging of specimen deposited from aqueous media. The possibility to straightforwardly prepare large functional carbon nanosheets under benign conditions opens new avenues for applications such as chemoselective electron microscopy substrates, protective coatings, transparent and conformal electrodes, or membrane materials.

Langmuir Technique, Monolayer Preparation, and UV-Induced Carbonization.

Pressure-Area isotherms were recorded on a Langmuir trough equipped with movable barriers and a surface pressure microbalance (R&K, Potsdam, Germany) with a filter paper Wilhelmy plate. An external thermostat (E1 Medingen, Leipzig, Germany) was used to maintain the temperature of the subphase at 20° C. The Langmuir trough was placed in a sealed box to avoid contamination of the interface. Langmuir films were prepared by spreading solutions of 1 in DCM/chloroform (c=1 mmol/L) on Millipore water with a Hamilton syringe (Model 1810 RN SYR). For carbonization experiments, UV irradiation was carried out using a 250 W Ga-doped low-pressure Hg lamp (UV-Light Technology, Birmingham, UK) the lamp was placed 50 cm away from the air-water interface.

Infrared Reflection Absorption Spectroscopy.

Spectra were recorded on a Vertex 70 FT-IR spectrometer from Bruker equipped with a liquid nitrogen cooled mercury cadmium telluride detector attached to an external air/water reflection unit (XA-511 Bruker). The IR beam was focused onto the water surface of the trough and the measurements were carried out with p- and s-polarized light at different angles of incidence above and below the Brewster angle. A trough with two compartments in a hermetically sealed box was used. One compartment contained the system under investigation (sample), while the other was filled with the pure subphase (refence) and the trough was shuttled for illumination. The single-beam reflectance spectrum from the reference trough was taken as background for the single-beam reflectance spectrum from the sample trough to yield the reflection-absorption spectrum as $\log(R/R_0)$ and eliminate the water vapor signal. The incident IR beam was polarized with a KRS-5 wire grid polarizer. For s-polarized light, spectra were co-added over 200 scans, and spectra with p-polarized light were co-added over 400 scans. The resolution and scanner speed in all experiments were 8 $cm^{-1}$ and 20 kHz. Spectra were shifted to a common baseline for comparison.

Simulation and Fitting of IRRA Spectra.

IRRA spectra were simulated using a MATLAB program on the basis of the optical model of Kuzmin and Mickailov, that was adopted for the simulation of spectra with multiple bands. The intensity and shape of a reflection absorption band depend on the absorption coefficient k, the full width of half height fwhh, the orientation of the transition dipole moment (TDM) within the molecule a, the molecular tilt angle θ, the polarization and the angle of incidence (AoI) of the incoming light, as well as the layer thickness d and its refractive index n. Simulated spectra were fitted to the experimental data in a global fit, where all spectra recorded at different AoI and different polarisations were fitted in one non-linear least square minimization using the Levenberg-Marquardt algorithm. The layer thickness d and the refractive index n were determined from a fit of the OH stretching vibrational band (v(OH)). The determined values were then set constant, and the symmetrical $CH_2$ stretching vibrational band ($v_s(CH_2)$) as well as the acetylene stretching vibrational band (v(C≡C)) were fitted using an angle α of 90 and 0°, respectively. Fitting parameters for these bands were k, fwhh, and the tilt angle of the respective molecular moieties θ. The spectra taken with p-polarization and angles of incidence between 50° and 58° were omitted from the fit because of the low reflectivity of the monolayer absorption near the Brewster angle. The spectra were shifted to a common baseline at 3800, 2800, and 2218 $cm^{-1}$ for the fit of the v(OH), $v_s(CH_2)$ and v(C≡C) band, respectively.

Grazing Incidence X-Ray Diffraction.

The GIXD measurements were carried out at the undulator beamline BW1 using the liquid surface diffractometer at HASYLAB, DESY (Hamburg, Germany). For full experimental details see below. The GIXD setup is equipped with a temperature controlled Langmuir trough (R&K, Potsdam, Germany), which is enclosed in a sealed, helium-filled container. The trough was thermostated at 10° C. for diffraction experiments with monolayers of 1. The synchrotron X-ray beam was monochromated to a wavelength of 1.304 Å (beryllium (002) crystal) and adjusted to strike the helium/water interface at a grazing incidence angle of $α_i$=0.85 ac ($α_c$=0.13° is the critical angle for total reflection) illuminating approximately 2×50 $mm^2$ of the monolayer surface. A MYTHEN detector system (PSI, Villigen, Switzerland) measured the diffracted signal and was rotated to scan the in-plane $Q_{xy}$ component values of the scattering vector. A Soller collimator in front of the MYTHEN detector restricted the in-plane divergence of the diffracted beam to 0.090°. The vertical strips of the MYTHEN detector measure the out-of-plane $Q_z$ component of the scattering vector between 0.0 and 0.75 Å$^{-1}$. The diffraction data consist of Bragg peaks at diagnostic $Q_{xy}$ values obtained by summing the diffracted intensity over a defined vertical angle or $Q_z$-window. The in-plane lattice repeat distances d of the ordered structures in the monolayer are calculated from the Bragg peak positions: $d=2\pi/Q_{xy}$. To estimate the extent of the crystalline order in the monolayer, the in-plane coherence length $L_{Xy}$ is approximated from the full-width at half-maximum (fwhm) of the Bragg peaks using $L_{Xy}\sim0.9(2\pi)/\text{fwhm}(Q_{xy})$ using the measured fwhm($Q_{xy}$) corrected for the instrumental resolution. Integrating the diffracted intensity normal to the interface over the $Q_{xy}$ window of the diffraction peak yields the corresponding Bragg rod. The thickness of the scattering unit was estimated from the fwhm of the Bragg rod using $0.9(2\pi)/\text{fwhm}(Q_z)$.

Specular X-Ray Reflectivity.

Specular X-ray reflectivity (XR) experiments were carried out at the liquid-surface diffractometer on the undulator beamline BW1 (HASYLAB, DESY, Hamburg, Germany). The reflected intensity was measured by a NaI scintillation detector as a function of the vertical incidence angle $\alpha_i$, with the geometry $\alpha_i=\alpha_f=\alpha$, where $\alpha_f$ is the vertical exit angle of the reflected X-rays. The vertical scattering vector component $Q_z=(4\pi/\lambda)\sin\alpha_r$ was measured in a range between 0.01-0.65 Å$^{-1}$. The background scattering from, e.g., the subphase, was measured at $2\theta_{hor}=0.7°$ and subtracted from the signal measured at $2\theta_{hor}=0°$. The reflectivity data were inverted by applying a model-independent approach including linear combinations of b-splines (see below for more details). The obtained electron density profile was interpreted by assuming two Gaussian-shaped electron density distributions.

Scheme 1 a)

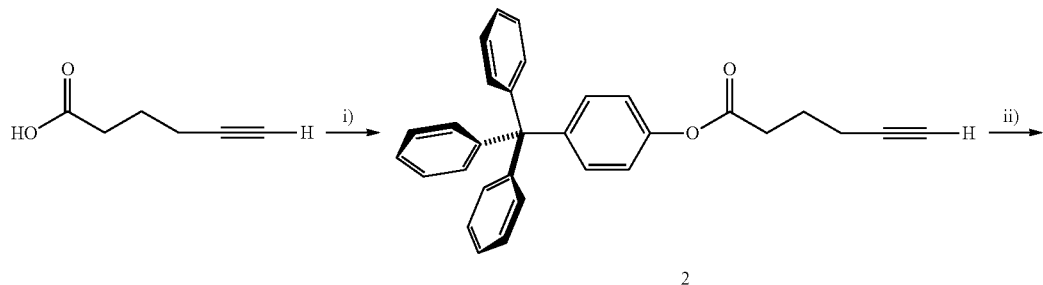

2

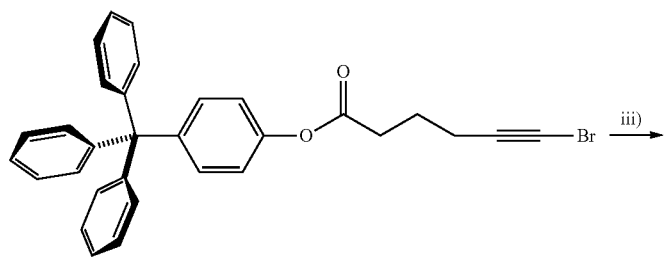

3

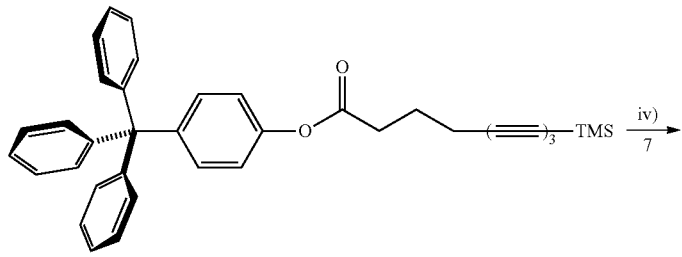

4

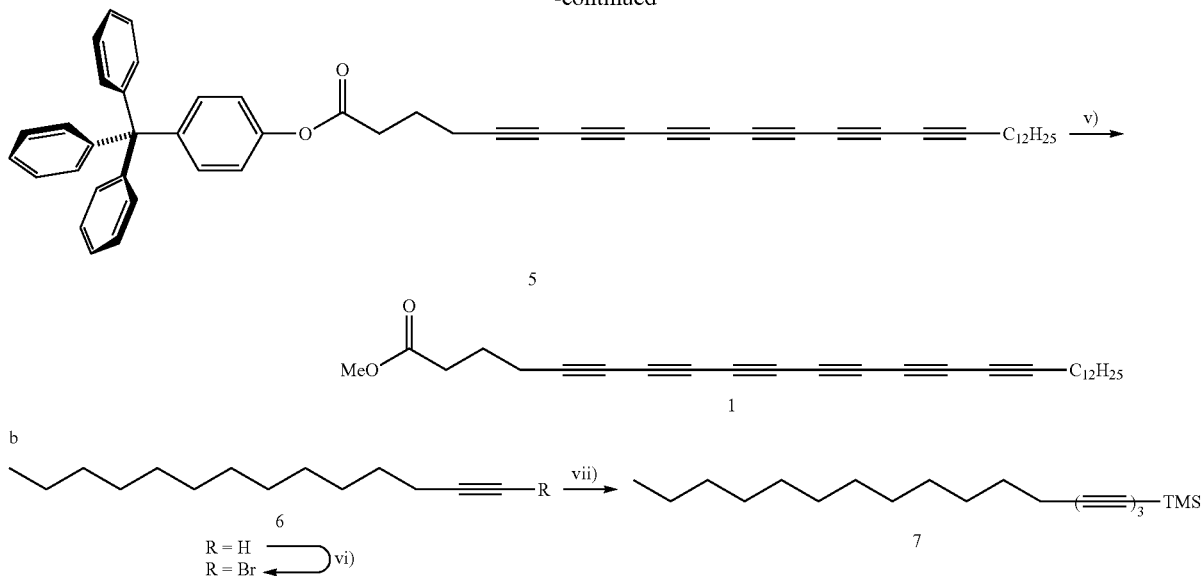

Scheme 1 shows that a) the exemplary hexayne amphiphile 1 was prepared in five steps starting from commercially available 5-hexynoic acid by sequential bromination and Pd-catalyzed elongation of the alkyne segment. Thus, the trityl-phenol ester of 5-hexynoic acid 2 was brominated and underwent a coupling with 1,4-bis(trimethylsilyl)buta-1,3-diyne to afford the trimethylsilyl (TMS) protected triyne building block 4. The corresponding bromine-terminated triyne readily dimerized upon isolation. In situ bromination of 4 and direct Pd-catalyzed cross-coupling of the afforded bromine-terminated triyne with 1-trimethylsilyloctadeca-1,3,5-triyne 7 nonetheless allowed to prepare the desired protected hexayne ester 5. Finally, reaction of 5 with sodium methanolate in a dichloromethane methanol mixture afforded the amphiphilic fatty acid ester 1. Scheme 1 b) shows that tetradecyne underwent bromination and Pd-catalyzed coupling to afford the trimethylsilyl (TMS) protected triyne building block 7. The reagents and conditions employed in Scheme 1 are as follows: Scheme 1 a) i) 4-Tritylphenol, EDCI, DPTS, DCM/toluene, 92%; Scheme 1 a) ii) AgNO$_3$, NBS, MeCN, 96%; Scheme 1 a) iii) 1,4-bis(trimethylsilyl)buta-1,3-diyne, MeLi.LiBr, ZnCl$_2$, PdCl$_2$(dppf).DCM, THF/toluene, 71%; Scheme 1 a) iv) AgF, NBS, MeCN; then 1-trimethylsilyloctadeca-1,3,5-triyne 7, MeLi.LiBr, ZnCl$_2$, PdCl$_2$(dppf).DCM, THF/toluene, 23% over two steps; Scheme 1 a) v) NaOMe, DCM, MeOH, quantitative; Scheme 1 b) vi) AgNO$_3$, NBS, MeCN, 100%; Scheme 1 b) vii) 1,4-bis(trimethylsilyl)buta-1,3-diyne, MeLi.LiBr, ZnCl$_2$, PdCl$_2$(dppf).DCM, THF/toluene, 95%. For detailed experimental procedures as well as complete analytical data of all compounds, see below.

In the following more experimental details of the exemplary synthesis is described. These details can also be found in the Supplementary Information of in Schrettl et al. Nature Chemistry, 6, 468 (2014), DOI: 10.1038/nchem.1939, which is herein expressly incorporated by reference.

Instrumentation and Methods

Chemical Analytics.

NMR Spectroscopy was carried out on Bruker Avance III 400 or 300 spectrometers at frequencies of 400.13 MHz or 300.23 MHz, respectively, for 1H nuclei and 100.62 MHz or 75.49 MHz, respectively, for $^{13}$C nuclei. High resolution mass spectra were recorded on a Bruker Daltonics maXis, a Shimadzu Axima-CFR plus, or on a Thermo Scientific LTQ FT-ICR MS for APPI. Melting points were measured on a BÜCHI Melting Point B-540 device. TLC analyses were performed on TLC plates from Merck (Silica gel 60 F$_{254}$). UV-light (254 nm) or anisaldehyde staining was used for detection. Column chromatography was conducted on Geduran silica gel Si 60 from Merck (40-60 µm).

Langmuir Technique and Monolayer Preparation.

Pressure-Area isotherms were recorded on a computer-interfaced polytetrafluoroethylene Langmuir trough equipped with one (or two) barriers and a surface pressure microbalance (R&K, Potsdam, Germany) with a filter paper Wilhelmy plate. An external thermostat (E1 Medingen, Leipzig, Germany) was used to maintain the temperature of the subphase at 20° C. The Langmuir trough was placed in a sealed box to avoid contamination of the interface. Before each measurement, the purity of the bare surface was checked by compression. Langmuir films were prepared by spreading solutions of 1 in DCM/chloroform (c=1 mmol/L) on Millipore water with a Hamilton syringe (Model 1810 RN SYR) and equilibration for 15 min allowed the solvent to evaporate. The isotherm measurements were generally performed with a compression rate of 5 Å$^2$/(molecule×min) and repeated at least two times to ensure the reproducibility of the results.

Infrared Reflection Absorption (IRRA) Spectroscopy.

Spectra were recorded on a Vertex 70 FT-IR spectrometer from Bruker equipped with a liquid nitrogen cooled MCT (mercury cadmium telluride) detector attached to an external air/water reflection unit (XA-511 Bruker). The IR beam was conducted out of the spectrometer and focused onto the water surface of the thermostated Langmuir trough. The measurements were carried out with p- and s-polarized light at different angles of incidence above and below the Brewster angle. Measurements were performed using a trough with two compartments. One compartment contained the monolayer system under investigation (sample), whereas the other was filled with the pure subphase (reference). The trough was shuttled by a computer-controlled shuttle system to illuminate either the sample or the reference. The single-beam reflectance spectrum from the reference trough was taken as background for the single-beam reflectance spectrum of the monolayer in the sample trough to calculate the reflection-absorption spectrum as log(R/R₀) in order to eliminate the water vapor signal. In order to maintain a constant water vapor content, the whole system was placed into a hermetically sealed box. The resolution and scanner speed in all experiments were 8 cm$^{-1}$ and 20 kHz. The incident IR beam was polarized with a KRS-5 wire grid polarizer. For s-polarized light, spectra were co-added over 200 scans, and spectra with p-polarized light were co-added over 400 scans. Spectra were corrected to a common baseline to allow for comparison.

Simulation and Fitting of Infrared Reflection Absorption (IRRA) Spectra.

IRRA spectra were simulated using a MATLAB program on the basis of the optical model of Kuzmin and Michailov, and we adopted the model reported by Schwieger et al. to enable the simulation of spectra with multiple bands. The intensity and shape of a reflection absorption band depend on the absorption coefficient k, the full width of half height fwhh, the orientation of the transition dipole moment (TDM) within the molecule a, the molecular tilt angle θ, the polarization and the angle of incidence (AoI) of the incoming light, as well as the layer thickness d and its refractive index n. Simulated spectra were fitted to the experimental data in a global fit, where all spectra recorded at different AoI and different polarisations were fitted in one non-linear least square minimization using the Levenberg-Marquardt algorithm. The polarizer quality was set to Γ=0.007. The optical constants of the H$_2$O subphase were taken from Bertie et al. The fitting was performed as follows: In a first step, the layer thickness d and the refractive index n were determined from a fit of the OH stretching vibrational band (ν(OH)) in the range of 3800-3000 cm$^{-1}$. The determined values were then set constant for the following fitting steps. With these parameters, the symmetrical CH$_2$ stretching vibrational band ($\nu_s$(CH$_2$)) and the acetylene stretching vibrational band (ν(C≡C)) were fitted using an angle α of 90 and 00, respectively. The $\nu_s$(CH$_2$) band was fitted in a range of 2855 and 2845 cm$^{-1}$ and the triple bond stretching ν(C≡C) band in a range of 2210 and 2190 cm$^{-1}$. Fitting parameters for these bands were k, fwhh, and the tilt angle of the respective molecular moieties θ. The spectra taken with p-polarization and angles of incidence between 50° and 58° were omitted from the fit because of the low reflectivity of the monolayer absorption near the Brewster angle. The spectra were shifted to a common baseline at 3800, 2800, and 2218 cm$^{-1}$ for the fit of the ν(OH), $\nu_s$(CH$_2$) and ν(C≡C) band, respectively.

Brewster Angle Microscopy (BAM).

BAM experiments were performed on a custom-made computer-interfaced film balance coupled with a Brewster angle microscope (BAM1+, NFT, Göttingen, Germany). The surface pressure isotherms were simultaneously measured at a compression rate of ≤2 Å$^2$/(molecule×min). According to the Wilhelmy method, the surface pressure was measured with a filter paper plate with an accuracy of ±0.1 mN m−1, and the area per molecule with ±0.5 Å$^2$. The lateral resolution of the BAM1+ was approximately 4 μm. Simple imaging processing software was used to improve the contrast.

Grazing Incidence X-ray Diffraction (GIXD).

The grazing incidence X-ray diffraction measurements were carried out at the undulator beamline BW1 using the liquid surface diffractometer at HASYLAB, DESY (Hamburg, Germany). The experimental setup and evaluation procedures have been described in detail elsewhere. The setup is equipped with a temperature controlled Langmuir trough (R&K, Potsdam, Germany), which is enclosed in a sealed, helium-filled container. The trough was thermostated at 10° C. The synchrotron X-ray beam is monochromated to a wavelength of 1.304 Å (beryllium (002) crystal) and is adjusted to strike the helium/water interface at a grazing incidence angle of $\alpha_i$=0.85 $\alpha_c$ ($\alpha_c$=0.13° is the critical angle for total reflection) illuminating approximately 2×50 mm$^2$ of the monolayer surface. A MYTHEN detector system (PSI, Villigen, Switzerland) measures the diffracted signal and is rotated to scan the in-plane $Q_{xy}$ component values of the scattering vector. A Soller collimator in front of the MYTHEN detector restricted the in-plane divergence of the diffracted beam to 0.090. The vertical strips of the MYTHEN detector measure the out-of-plane $Q_z$ component of the scattering vector between 0.0 and 0.75 Å$^{-1}$. The diffraction data consist of Bragg peaks at diagnostic $Q_{xy}$ values obtained by summing the diffracted intensity over a defined vertical angle or $Q_z$-window. The in-plane lattice repeat distances d of the ordered structures in the monolayer are calculated from the Bragg peak positions: d=2π/$Q_{xy}$. To estimate the extent of the crystalline order in the monolayer, the in-plane coherence length $L_{xy}$ is approximated from the full-width at half-maximum (fwhm) of the Bragg peaks using $L_{xy}$·0.9(2π)/fwhm($Q_{xy}$) using the measured fwhm($Q_{xy}$) corrected for the instrumental resolution. Integrating the diffracted intensity normal to the interface over the $Q_{xy}$ window of the diffraction peak yields the corresponding Bragg rod. The thickness of the scattering unit is estimated from the fwhm of the Bragg rod using 0.9(2π)/fwhm($Q_z$).

Specular X-Ray Reflectivity (XR).

Specular X-ray reflectivity (XR) experiments were performed using the same liquid-surface diffractometer on the undulator beamline BW1 (HASYLAB, DESY, Hamburg, Germany) as for the GIXD experiments. The experimental setup and evaluation procedure have been described in detail elsewhere. XR experiments reveal information on the electron-density distribution along the surface normal and may be used to determine the thickness of thin layers. The reflected intensity was measured by a NaI scintillation detector as a function of the vertical incidence angle $\alpha_i$, with the geometry $\alpha_i$=$\alpha_f$=α, where $\alpha_f$ is the vertical exit angle of the reflected X-rays. The vertical scattering vector component $Q_z$=(4π/λ) sin $\alpha_i$, was measured in a range between 0.01-0.65 Å$^{-1}$. The background scattering from, e.g., the subphase, was measured at 2θ$_{hor}$=0.7° and subtracted from the signal measured at 2θ$_{hor}$=0°. The reflectivity data were inverted by applying a model-independent approach including linear combinations of b-splines. The obtained electron density profile was interpreted by assuming two Gaussian-shaped electron density distributions.

UV-Induced Carbonization.

UV irradiation was carried out using a 250 W Ga-doped low-pressure Hg lamp (UV-Light Technology, Birmingham, United Kingdom). For carbonizations of films of 1 at the air-water interface, the box enclosing the trough was carefully opened at the side and the lamp was placed 50 cm away from the water surface while ensuring that the air-water interface was covered in the cone of light. During illumination, the temperature of the subphase was maintained at 20° C. by the thermostat.

Raman Spectroscopy.

Samples for Raman spectroscopy were obtained by carbonization of a monolayer of 1 at the air-water interface. The obtained carbon nanosheet was thereafter collapsed by further compression at the air-water interface forming multilayered material that was transferred to SiO$_2$ substrates by the Langmuir-Schäfer technique and dried in ambient conditions. Wavelength-dependent Raman spectra were acquired in a home-made microscope. The sample was measured under protected atmosphere (400 mbar of nitrogen) at room temperature. The pump was provided by the monochromated output of a tunable Argon-Krypton ion gas laser set at a 1.5 mW for all wavelengths but 496.5 nm, where the power was 0.7 mW. Both pump and Raman scattered light were focused on the sample and collected in backscattering geometry by a 0.75 NA glass-corrected objective. The scattered light was analyzed using a Princeton Instrument Acton Trivista 500 triple-stage spectrometer. The two first spectrometer stages operate in subtractive mode to filter out the pump light. The Raman signal was then dispersed by the third spectrometer stage using a 1350 lines/mm grating on a back-illuminated CCD (Princeton Instrument PyLON eXcelon). The integration time was set between 30 s and 2 min, optimizing the Raman signal versus fluorescence and noise. Different Raman/pump light polarization combinations were used for each measurement to access the spectral shape of the fluorescence in order to meaningfully remove the fluorescence baseline from the fluorescence and Raman admixed signal.

UV/Vis Spectroscopy.

Samples for UV/Vis spectroscopy were prepared at the air-water interface and transferred by the Langmuir-Blodgett technique to sapphire substrates before as well as after carbonization. The sapphire substrates were cleaned by a basic piranha treatment and stored in Millipore water prior to use. Tweezers attached to a mechanical arm were placed vertically above the Langmuir trough. Held by the tweezers, the substrates were immersed in the subphase and the air-water interface was thoroughly cleaned before the spreading of 1. For non-carbonized samples, the monolayer was compressed to 8 mN/m and the substrate was removed from the air-water interface at a speed of 1.2 mm/min while keeping the surface pressure constant. For carbonized samples, the UV irradiation was carried out at 8 mN/m with a constant surface area and the substrate was removed from the air-water interface at a speed of 1.2 mm/min while keeping the surface pressure constant. Spectra of the transferred samples were then recorded on a JACSO V-670 spectrometer with a scan speed of 400 nm per minute and an empty sapphire substrate as reference.

Scanning Electron Microscopy (SEM).

Samples for scanning electron microscopy (SEM) were prepared by carbonization (with constant surface area) of a monolayer of 1 at the air-water interface. The obtained carbon nanosheet was then transferred by the Langmuir-Schäfer technique to Quantifoil® holey carbon TEM grids as support. After allowing the sample to slowly dry in a gentle stream of N$_2$, the carbon nanosheet covered TEM grids were directly used for imaging. SEM images were recorded on a Zeiss Merlin FE-SEM (Zeiss, Göttingen, Germany) equipped with a Gemini II™ column operating between 0.1 and 5 keV with a probe current between 60 and 190 pA. The (on axis) in-lens detector of the Gemini II column (beam booster) allowed for imaging of the carbon nanosheet at all magnifications. Imaging at low magnifications and small working distances with the in-lens detector led to a shadowing effect in the center of the SEM micrographs.

Transmission Electron Microscopy (TEM).

Samples for transmission electron microscopy (TEM) were prepared by carbonization (with constant surface area) of a monolayer of 1 at the air-water interface. The obtained carbon nanosheet was then transferred by the Langmuir-Schäfer technique to Quantifoil® holey carbon TEM grids as support. After allowing the sample to slowly dry in a gentle stream of N$_2$, the carbon nanosheet covered TEM grids were directly used for imaging. The hydrophilic gold nanoparticles were deposited on these grids by drop-casting of a dilute, aqueous solution and TEM imaging was carried out after allowing the specimen to dry under ambient conditions for 30 min. TEM images of the samples were recorded on a Philips CM12 EM electron microscope operating at 100 kV. An FEI Tecnai Osiris S/TEM machine with a high brightness Schottky field emission gun (X-FEG) operating at 200 kV was used for high-resolution transmission electron microscopy (HR-TEM). HR-TEM images were acquired digitally on an 11 Megapixel Gatan ORIUS™ CCD camera Synthetic Procedures and Analytical Data Materials and General Procedures.

Unless otherwise noted, all reactions were carried out in dried Schlenk glassware in an inert Ar atmosphere. Chromatography solvents were purchased as reagent grade and distilled once prior to use. For reactions, acetonitrile, dichloromethane, tetrahydrofuran, and toluene were purchased as HPLC grade and dried using a solvent purification system from Innovative Technologies. All reagents were commercially obtained and used without further purification.

Methyl octacosa-5,7,9,11,13,15-hexaynoate 1

4-Tritylphenyl octacosa-5,7,9,11,13,15-hexaynoate 5 (208 mg, 0.289 mmol) was dissolved in CH$_2$Cl$_2$ (15 mL), and MeOH (10 mL) was added. The flask was shielded from light with aluminum foil and NaOMe (31 mg, 0.578 mmol) was added. The resulting mixture was stirred for 30 min after which it was diluted with DCM, washed once with 1 M HCl and once with saturated NaCl solution. The organic phase was dried over Na$_2$SO$_4$, and concentrated in vacuo. Column chromatography (silica gel; DCM/n-pentane 1:1) yielded 1 as a yellow solution. For analytic purposes, CDCl$_3$ (10 mL) was added, and the mixture was concentrated in vacuo. To determine the yield, the organic phase was dried to afford methyl octacosa-5,7,9,11,13,15-hexaynoate 1 (119.8 mg, 0.289 mmol, 100%) as a yellow solid. For investigations at the air-water interface compounds that had been dried were purified again by column chromatography to ensure the integrity of the product (silica gel; DCM/n-pentane 1:1). $^1$H NMR (400 MHz, CDCl$_3$): δ=3.68 (s, 3H), 2.44 (t, J=7.0 Hz, 2H), 2.42 (t, J=6.8 Hz, 2H), 2.32 (t, J=7.0 Hz, 2H), 1.88 (p, J=7.1 Hz, 2H), 1.58-1.51 (m, 2H), 1.40-1.34 (m, 2H), 1.25 (m, 18H), 0.88 (t, J=6.8 Hz, 3H). $^{13}$C NMR (101 MHz, CDCl$_3$): δ=173.2, 82.2, 80.3, 66.6, 65.8, 63.0, 62.7, 62.5, 62.3, 61.9, 61.5, 60.9, 60.5, 51.9, 32.7, 32.1, 29.8, 29.7, 29.6, 29.5, 29.1, 29.0, 28.0, 23.2, 22.8, 19.7, 19.1, 14.3. HRMS (APPI): calcd for C$_{29}$H$_{34}$O$_2$: 414.2559 ([M]$^+$); found: 414.2552. R$_f$: 0.56 (DCM/n-heptane 4:1).

4-Tritylphenyl hex-5-ynoate 2

4-Tritylphenol (20.00 g, 59.5 mmol) was dissolved in dry toluene (100 ml) and dry DCM (100 ml). 5-hexynoic acid (8.08 g, 71.4 mmol), dimethylaminopyridinium p-toluenesulfonate (0.87 g, 2.97 mmol), and 1-ethyl-3-(3-dimethylaminopropyl)carbodiimide hydrochloride (14.86 g, 71.4 mmol) were successively added to this solution. The mixture was stirred at room temperature for 8 h, after which 4-tritylphenol was consumed according to TLC. After dilution with DCM (400 ml) the mixture was washed three times with 1 M HCl, once with saturated NaHCO$_3$ solution, and once with saturated NaCl solution. The organic phase was dried over Na$_2$SO$_4$, and concentrated in vacuo. Recrystallization (DCM/n-heptane) afforded 4-tritylphenyl hex-5-ynoate (23.63 g, 54.9 mmol, 92%) as colorless crystalline solid. $^1$H NMR (400 MHz, CDCl$_3$): δ=7.44-7.07 (m, 17H, PhH), 7.06-6.87 (m, 2H, PhH), 2.72 (t, J=7.4 Hz, 2H, C$_2$H), 2.36 (td, J=7.0, 2.7 Hz, 2H, C$_4$H), 2.02 (t, J=2.7 Hz, 1H, ≡CH), 1.97 (p, J=14.4, 7.4 Hz, 2H, C$_3$H). $^{13}$C NMR (101 MHz, CDCl$_3$): δ=171.7 (COOPhTr), 148.7, 146.7, 144.4, 132.2, 131.2, 127.7, 126.1, 120.5 (24C, C—Ar), 83.2, 69.5 (2 C≡C), 64.7 (CTr), 33.1 (C2), 23.6 (C3), 17.9 (C4). HRMS (MALDI (CHCA)): calcd for C$_{31}$H$_{26}$O$_2$Na: 453.1826 ([M+Na]$^+$); found: 453.1851. R$_f$: 0.56 (EtOAc/n-heptane 1:1), 0.50 (DCM/n-heptane 2:1).

4-Tritylphenyl 6-bromohex-5-ynoate 3

4-Tritylphenyl hex-5-ynoate 2 (20.00 g, 46.5 mmol) was dissolved in dry DCM (200 ml) and dry MeCN was added (200 ml). The flask was shielded from light with aluminum foil, and N-bromosuccinimide (8.69 g, 48.8 mmol) as well as silver nitrate (2.37 g, 13.9 mmol) were successively added. The resulting mixture was stirred at room temperature for 3 h after which it was diluted with DCM, washed four times with 1 M HCl, and once with saturated NaCl solution. The organic phase was dried over Na$_2$SO$_4$, concentrated in vacuo, and purification by column chromatography afforded 4-tritylphenyl 6-bromohex-5-ynoate (22.78 g, 44.7 mmol, 96%) as a colorless solid. $^1$H NMR (400 MHz, CDCl$_3$): δ=7.33-7.16 (m, 17H, PhH), 7.08-6.94 (m, 2H, PhH), 2.71 (t, J=7.4 Hz, 2H, C$_2$H), 2.39 (t, J=6.9 Hz, 2H, C$_4$H), 1.97 (p, J=7.1 Hz, 2H, C$_3$H). $^{13}$C NMR (101 MHz, CDCl$_3$): δ=171.6 (COOPhTr), 148.7, 146.7, 144.5, 132.2, 131.2, 127.7, 126.1, 120.4 (24C, C—Ar), 79.1 (≡C), 64.7 (CTr), 39.3 (≡C), 33.1 (C2), 23.5 (C3), 19.2 (C4). HRMS (MALDI (CHCA)): calcd for C$_{31}$H$_{26}$O$_2$Na: 531.0930 ([M+Na]$^+$); found: 531.0923. R$_f$: 0.64 (DCM/n-heptane 2:1).

4-Tritylphenyl 10-(trimethylsilyl)deca-5,7,9-triynoate 4

MeLi.LiBr complex (17.9 mL, 2.2 M in Et$_2$O, 39.26 mmol) was added to 1,4-bis(trimethylsilyl)butadiyne (7.82 g, 40.24 mmol) in THF (50 mL) at 0° C., and the resulting mixture was stirred for 30 minutes. Then ZnCl$_2$ (57.5 mL, 0.7 M in THF, 40.24 mmol) was added at 0° C., and the resulting mixture was again stirred for 30 min. In another flask, 4-tritylphenyl 6-bromohex-5-ynoate 3 (10.0 g, 19.63 mmol) and PdCl$_2$(dppf).DCM (1.60 g, 1.96 mmol) were mixed in toluene (300 mL). The two solutions were combined at 0° C., and the flask was wrapped with aluminum foil. The mixture was stirred for 16 h while warming up to room temperature, before it was diluted with Et$_2$O, washed three times with saturated NH$_4$Cl solution and once with saturated NaCl solution. The organic phase was dried over Na$_2$SO$_4$ and concentrated in vacuo. Column chromatography (silica gel; DCM/n-heptane 1:1) yielded 4 (7.7 g, 71%) as a light brown solid. $^1$H NMR (400 MHz, CDCl$_3$): δ=7.30-7.16 (m, 17H), 7.01-6.95 (m, 2H), 2.69 (t, J=7.3 Hz, 2H), 2.47 (t, J=6.9 Hz, 2H), 1.98 (p, =7.0 Hz, 2H), 0.20 (s, 9H). $^{13}$C NMR (101 MHz, CDCl$_3$): δ=171.4, 148.6, 146.7, 144.5, 132.3, 131.2, 127.7, 126.1, 120.4, 88.3, 86.1, 79.3, 66.7, 64.7, 62.3, 60.6, 33.0, 23.2, 19.0, −0.3. HRMS (MALDI): calcd for C$_{38}$H$_{34}$O$_2$Si: 573.2219 ([M+Na]$^+$); found: 573.2201. R$_f$: 0.33 (DCM/n-heptane 1:1).

4-Tritylphenyl octacosa-5,7,9,11,13,15-hexaynoate 5

(i) 4-Tritylphenyl 10-(trimethylsilyl)deca5,7,9-triynoate 4 (2.00 g, 3.63 mmol) was dissolved in dry MeCN (15 mL) and dry DCM (15 mL), the flask was shielded from light with aluminum foil, and N-bromosuccinimide (679 mg, 3.81 mmol) as well as AgNO$_3$ (484 mg, 3.81 mmol) were added. The resulting mixture was stirred for 8 h after which it was diluted with DCM, washed six times with 1 M HCl, and once with saturated NaCl solution. The organic phase was dried over Na$_2$SO$_4$, and concentrated in vacuo to approximately 10 mL thoroughly shielding it from light. For synthetic purposes, toluene was added, and the mixture was concentrated in vacuo. For analytic purposes, CDCl$_3$ (10 mL) was added, and the mixture was concentrated in vacuo. $^1$H NMR (400 MHz, CDCl$_3$): δ=7.30-7.20 (m, 17H), 7.02-6.98 (m, 2H), 2.71 (t, J=7.3 Hz, 2H), 2.48 (t, J=6.9 Hz, 2H), 2.00 (tt, J=7.1 Hz, 2H). $^{13}$C NMR (101 MHz, CDCl$_3$): δ=171.2, 148.5, 146.6, 144.5, 132.2, 130.1, 127.6, 126.1, 120.4, 78.3, 66.4, 66.1, 64.7, 60.8, 59.6, 53.6, 39.9, 33.0, 23.1, 18.8. HRMS (MALDI): calcd for C$_{35}$H$_{25}$BrNaO$_2$: 581.0927 ([M+Na]$^+$); found: 581.0914. R$_f$: 0.34 (DCM/n-heptane 1:1). (ii) MeLi.LiBr complex (3.22 mL, 2.2 M in Et$_2$O, 7.08 mmol) was added to 1-trimethylsilyloctadeca-1,3,5-triyne 7 (2.28 g, 7.26 mmol) in THF (20 mL) at 0° C., and the resulting mixture was stirred for 45 min. Then ZnCl$_2$ (10.37 mL, 0.7 M in THF, 7.26 mmol) was added at 0° C., and the resulting mixture was again stirred for 45 min. In a second flask, n-butyl lithium (0.29 mL, 2.5 M in n-hexane, 0.73 mmol) was added to a suspension of PdCl$_2$(dppf).DCM (296 mg, 0.36 mmol) in toluene (100 mL) at 0° C. The cooling bath was removed, the mixture was stirred for 10 min to give an orange suspension, which was again cooled to 0° C. The toluene solution containing the 4-tritylphenyl 10-bromodeca-5,7,9-triynoate (10 mL, 3.63 mmol) and the zinc acetylide solution were simultaneously added at this temperature, and the flask was shielded from light with aluminum foil. After 48 h, the mixture was diluted with Et$_2$O, washed three times with saturated NH$_4$Cl solution, and once with saturated NaCl solution. The organic phase was dried over Na$_2$SO$_4$, and concentrated in vacuo. Column chromatography (silica gel; DCM/n-heptane 1:1) yielded 5 (0.60 g, 23%) as a brown solid. $^1$H NMR (400 MHz, CDCl$_3$): δ=7.28-7.17 (m, 17H), 7.00-6.97 (m, 2H), 2.69 (t, J=7.3 Hz, 2H), 2.50 (t, J=6.8 Hz, 2H), 2.33 (t, J=7.2 Hz, 2H), 1.99 (p, J=7.0 Hz, 2H), 1.59-1.52 (m, 2H), 1.45-1.19 (m, 20H), 0.89 (t, J=6.9 Hz, 3H). $^{13}$C NMR (101 MHz, CDCl$_3$): δ=171.2, 148.6, 146.7, 144.6, 132.3, 131.2, 127.7, 126.2, 120.4, 82.2, 80.1, 66.8, 65.8, 64.7, 63.0, 62.8, 62.5, 62.3, 62.0, 61.5, 61.1, 60.4, 33.0, 32.1, 29.8, 29.8, 29.7, 29.5, 29.5, 29.1, 29.0, 28.0, 23.1, 22.8, 19.7, 19.1, 14.3. HRMS (APPI): calcd for C$_{53}$H$_{50}$O$_2$: 718.3805 ([M]$^+$); found: 718.3800. R$_f$: 0.43 (DCM/n-heptane 1:1).

1-Bromotetradec-1-yne 6

Tetradec-1-yne (10.00 g, 51.45 mmol) and AgNO$_3$ (2.61 g, 15.44 mmol) were added successively to N-bromosuccinimide (9.65 g, 54.22 mmol) in dry MeCN (150 mL) in a flask wrapped with aluminum foil. The mixture was stirred for 2 h, before a concentrated aqueous KCl (5 mL, 1.6 g, 21.46 mmol KCl in 5 mL water) solution was added. The mixture was filtered, water (250 mL) was added, and the resulting mixture was extracted three times with pentane (3×200 mL). The combined organic phases were dried over MgSO$_4$ and concentrated in vacuo to give 1-bromotetradec-1-yne 6 (14.09 g, 100%) as a slightly yellow liquid. $^1$H NMR (500.13 MHz, CDCl$_3$): δ=2.19 (t, J=7.1 Hz, 2H, CCCH$_2$), 1.57-1.44 (m, 2H, CCCH$_2$CH$_2$), 1.41-1.22 (m, 18H, (CH$_2$)$_9$CH$_3$), 0.88 (t, J=6.7 Hz, 3H, (CH$_2$)$_{11}$CH$_3$). $^{13}$C NMR (75.49 MHz, CDCl$_3$): δ=80.6 (C≡CBr), 37.6 (C≡CBr), 32.1, 29.8, 29.8, 29.8, 29.7, 29.5, 29.2, 29.0, 28.5, 22.9 ((CH$_2$)$_{10}$CH$_3$), 19.8 (CCCH$_2$), 14.3 (CH$_3$). HRMS (EI): calcd for C$_{14}$H$_{25}$ ([M−Br]$^+$) 193.1956; found: 193.1957. R$_f$: 0.70 (n-heptane).

1-Trimethylsilyloctadeca-1,3,5-triyne 7

MeLi.LiBr complex (26.62 mL, 2.2 M in Et$_2$O, 58.56 mmol) was added to 1,4-bis(trimethylsilyl)butadiyne (11.75 g, 60.44 mmol) in THF (80 mL) at 0° C., and the resulting mixture was stirred for 30 minutes. Then ZnCl$_2$ (86.3 mL, 0.7 M in THF, 60.41 mmol) was added at 0° C., and the resulting mixture was again stirred for 30 min. In another flask, n-butyl lithium (1.6 mL, 2.5 M in n-hexane, 4.00 mmol) was added to a suspension of PdCl$_2$(dppf).DCM (599 mg, 0.73 mmol) in toluene (400 mL) at 0° C. until an orange solution was obtained. Then, the zinc diacetylide solution was transferred into the catalyst solution via a cannula, and 1-bromotetradec-1-yne 6 (10.04 g, 36.74 mmol) was added simultaneously with a syringe at 0° C. The mixture was stirred for 3 d while warming up to room temperature, before it was diluted with Et$_2$O, washed twice with saturated NH$_4$Cl solution and once with saturated NaCl solution. The organic phase was dried over MgSO$_4$, and concentrated in vacuo. Then the mixture was diluted with MeCN, extracted with pentane (3×200 mL), and the combined pentane phases were evaporated to give a brown liquid. Column chromatography (silica gel; n-heptane) yielded 7 (10.92 g, 95%) as an orange oil. $^1$H NMR (500.13 MHz, CDCl$_3$): δ=2.29 (t, J=7.0 Hz, 2H, CCCH$_2$), 1.74-1.44 (m, 2H, CCCH$_2$CH$_2$), 1.43-1.20 (m, 18H, (CH$_2$)$_9$CH$_3$), 0.88 (t, J=6.7 Hz, 3H, (CH$_2$)$_{11}$CH$_3$), 0.19 (s, 9H, Si(CH$_3$)$_3$). $^{13}$C NMR (125.77 MHz, CDCl$_3$): δ=88.6, 85.6, 81.3, 65.7, 62.7, 60.1 (6 C≡C), 32.1, 29.8, 29.8, 29.7, 29.6, 29.5, 29.2, 29.0, 28.2, 22.9 ((CH$_2$)$_{10}$CH$_3$), 19.6 (CCCH$_2$), 14.3 (CH$_3$), −0.3 (Si(CH$_3$)$_3$). m.p.: −2-0° C. HRMS (EI): calcd for C$_{20}$H$_{31}$Si ([M−Me]$^+$) 299.2195; found: 299.2189. R$_f$: 0.65 (n-heptane).

Nanoparticle Synthesis
Trimethylammonium-Functionalized Gold Nanoparticles.

The nanoparticle (NP) synthesis was carried out by a variation of the method developed by Zheng et al., and the obtained NPs were characterized by TEM imaging. All required solvents and reagents were commercially obtained and used without further purification. Chloro(triphenylphosphine)gold(I) (371.0 mg, 0.75 mmol) was dissolved in a mixture of toluene (30 mL) and MeOH (30 mL). N,N,N-Trimethyl-11-mercaptoundecylammonium chloride (211.5 mg, 0.75 mmol) was added and the mixture was stirred for 10 min. Borane morpholine complex (757.2 mg, 7.5 mmol) dissolved in toluene (30 mL) and MeOH (30 mL) was added to this mixture, and the reaction was refluxed at 95° C. for 1 h. The resulting mixture was left to cool for 30 min after which the NPs were precipitated by the addition of toluene. After decantation of the supernatant, toluene (40 mL) was added, the NPs were dispersed by sonication, and centrifugation led to the formation of a pellet of the NPs. The supernatant was again removed by decantation and this centrifugation procedure was repeated once with toluene and five times with acetone for further purification.

FIGS. 30A-30B shows a representative TEM image of the trimethylammonium functionalized gold nanoparticles on a 400 mesh carbon coated copper grid. FIG. 30B shows that the diameter distribution of the NPs as determined from the core size gave an average of 4.4±0.8 nm and a polydispersity of 19%.

The average sizes and the size distribution of the nanoparticles were determined by TEM imaging of NPs on a commercial 400 mesh copper grid covered with a carbon film (Supplementary FIG. 20). Several representative images of different parts of a grid were taken in a Philips CM12 EM transmission electron microscope operating at 100 kV. The images were analyzed using the ImageJ software package. Average size and standard deviation were obtained from a set of more than 1800 NPs.

Computational Details

Density functional optimizations were performed at the PBE-D2 level with fixed unit cell dimensions (as experimentally determined by grazing incidence X-ray diffraction) and using periodic boundary conditions with the PWscf program as implemented in the Quantum-Espresso software suite. H, C and O were described.

H, C and O were described by the pseudopotentials H.pbe-rrjkus.UPF, C.pbe-rrjkus.UPF, and O.pbe-rrjkus.UPF from http://www.quantum-espresso.org. The plane wave basis set cutoffs are 40 Ry for the wave function and 480 Ry for the electron density. The k-point grid is chosen to maintain a spacing between grid points of about 0.09 Å$^{-1}$. The number of k-points and the plane wave basis set cutoff are chosen such as to ensure the total convergence of the forces. The selected box size (z-vector=36 Å) was found to be sufficient to avoid interactions between vertically stacked layers. All thresholds were left to the default settings.

In order to guarantee that all the lattice points are equivalent, we also performed a geometry optimization using the self-consistent charge density tight binding (SCC-DFTB) approach on a supercell composed of 4×4 molecules. The SCC-DFTB computations were performed using periodic boundary conditions and the mio-1-1 parameter set as found in DFTB+. Dispersion interactions were accounted for by the Slater-Kirkwood based dispersion correction from Elstner and co-workers. The z-vector was set to 100 Å and a grid of 2×2×1 k-points was used. The maximum RMSD computed (by considering the 16 molecules) with respect to the positions averaged over the 16 molecules is 0.09 Å.

In the following an exemplary synthesis of monomers that can be employed in the method of the invention is described. Details of these examples can also be found in Schrettl et al. Chem. Sci., 2015, 6, 564, DOI: 10.1039/C4SC03154G as well as the corresponding Supplementary information which are herein expressly incorporated by reference.

Two series of oligoynes TAG2-6 and TPC2-6 (Scheme 2) bearing glycoside and carboxylate groups were prepared up to the hexayne derivatives on the multi-gram scale. To this end, derivatives with an extended spacer length between the oligoynes and the functional group were synthesized using a sterically more demanding TIPS protecting group at the oligoyne terminus. Moreover, mono-, di-, or triacetylenic building blocks were employed that could be conveniently prepared on a large scale, gave access to the corresponding zinc acetylides in situ, were compatible with the Negishi protocol, and thus allowed for the efficient and concise elongation of the oligoyne segment in few synthetic steps. It was found that the obtained oligoyne derivatives could be deprotected to yield the corresponding amphiphiles, such as the hexayne glucoside GLU6-TIPS or the methyl carboxylate MEC6-TIPS (Scheme 2). These amphiphiles gave rise to carbon-rich colloidal aggregates by supramolecular self-assembly in aqueous media. Finally, we exploited their amphiphilicity for the preparation of the novel hexayne cyclodextrin rotaxane GLU6GLU.2 CD (Scheme 2) using simple host-guest chemistry in water. Hence, we have developed the tools to access and handle amphiphilic oligoynes derivatives with labile functional groups despite their inherent chemical reactivity, which may in turn be utilized for the further preparation of carbon-rich compounds or nanomaterials.

Synthesis of Oligoyne Derivatives with Functional Groups

The synthetic approach we have applied here for the preparation of oligoynes bearing labile functional groups extends upon the facile coupling of bromoacetylenes with zinc acetylides similar to the Negishi coupling conditions. During scale-up, a significantly decreased yield for large (>10 g) batch sizes and oligoynes longer than tetraynes was noticed. For the present examples, the electronic effects of the substituents on the oligoyne moiety were reduced by increasing the spacer length, and the sterically more demanding triisopropylsilyl (TIPS) group was used for the preparation of longer oligoynes. Moreover, it was decided to utilize the silyl-protected oligoyne zinc acetylides R—(C≡C)$_m$—ZnCl 1-3 (R=TIPS, TMS; m=1-3) as building blocks in order to reduce the number of synthetic steps. To this end, the silylated precursors TIPS-C≡C—H and TIPS-(C≡C)$_2$—H were deprotonated with n-BuLi followed by the addition of ZnCl$_2$ in THF to furnish TIPS-C≡C—ZnCl 1 and TIPS-(C≡C)$_2$—ZnCl 2a. Similarly, the precursors TIPS-(C≡C)$_2$-TMS, TMS-(C≡C)$_2$-TMS, and TIPS-(C≡C)$_3$-TMS were monolithiated by the selective removal of one TMS group using MeLi.LiBr, and transmetalation with ZnCl$_2$ gave TIPS-(C≡C)$_2$—ZnCl 2a, TMS-(C≡C)$_2$—ZnCl 2b, as well as TIPS-(CC)$_3$—ZnCl 3, respectively. The resulting solutions of the zinc acetylides were then added to solutions containing the palladium catalyst and the bromoacetylenes. In this way, the series of diynes to tetraynes carrying the protected tetra-O-acetyl β-D-glucosides TAG2-4 (Scheme 2) was synthesized in only two steps from commercial precursors, and in isolated yields for the final coupling step of 87%, 78%, and 51% on a 1 g scale. In the same way, the corresponding tritylphenyl carboxylates TPC2-4 (Scheme 3) were obtained in isolated yields of 68% (1 g scale), 51% (9 g scale), and 65% (1 g scale), respectively. The key to access the higher homologues was the efficient conversion of the bromoalkynes 5 or 9 to the corresponding TMS-protected triynes 6 and 10 (77% and 71% on a 10 g scale, respectively) by Negishi coupling reactions with TMS-(C≡C)$_2$—ZnCl 2b, and their subsequent desilylative bromination to the desired bromotriynes 7 and 11, respectively. As both bromotriynes were found to rapidly degrade in the solid state, we prepared 7 directly before applying it to subsequent coupling steps, and 11 was even only generated in situ. The final Negishi coupling reactions with either the diyne 2a or the triyne 3 then furnished the tetra-O-acetyl β-D-glucosyl pentaynes and hexaynes TAG5-6 (42% and 55% on reaction scales of 1 g and 0.5 g, respectively) as well as the corresponding tritylphenyl carboxylates TPC5-6 (59% and 44% over two steps on reaction scales of 0.3 g and 2 g, respectively). Furthermore the batch size for the preparation of TAG6 to 6.5 g was increased to test the scalability of the employed procedure and obtained the desired hexayne in 43% yield.

Scheme 2

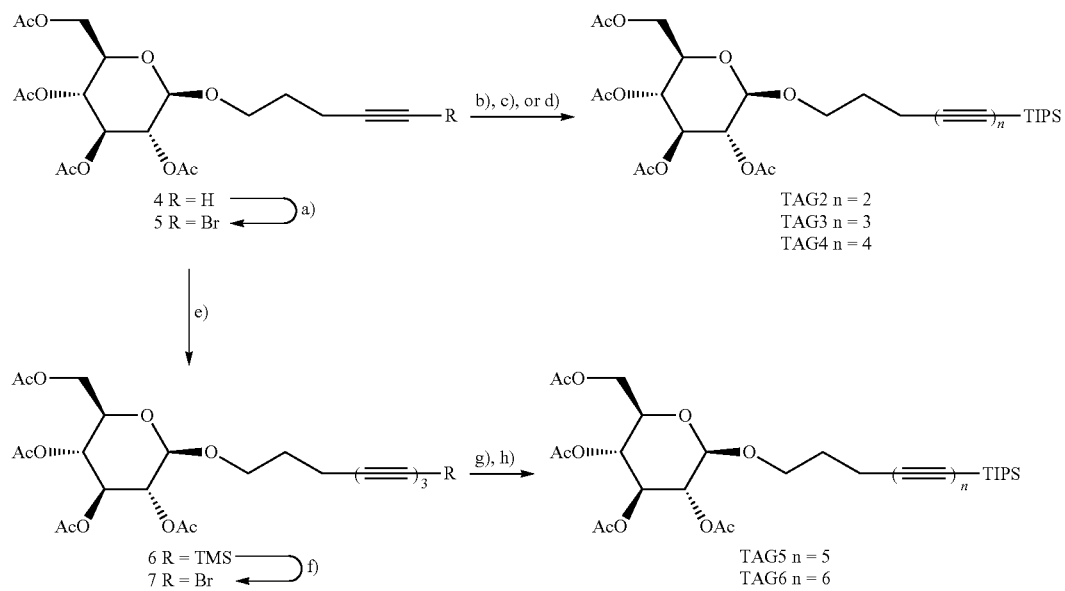

Scheme 2 above shows the synthesis of glycosylated oligoynes TAG2-6 up to the hexaynes. Reagents and conditions employed in Scheme 2 are as follows: Scheme 2 a) $AgNO_3$, NBS, MeCN, 93%; Scheme 2 b) TIPS-C≡C—ZnCl 1, $PdCl_2$(dppf).DCM, THF/toluene, 87%; Scheme 2 c) TIPS-(C≡C)$_2$—ZnCl 2a, $PdCl_2$(dppf).DCM, THF/toluene, 78%; Scheme 2 d) TIPS-(C≡C)$_3$—ZnCl 3, $PdCl_2$(dppf).DCM, THF/toluene, 51%; Scheme 2 e) TMS-(C≡C)$_2$—ZnCl 2b, $PdCl_2$(dppf).DCM, THF/toluene, 72%; Scheme 2 f) AgF, NBS, MeCN, 81%; Scheme 2 g) TIPS-(C≡C)$_2$—ZnCl 2a, $PdCl_2$(dppf).DCM, THF/toluene, 42%; Scheme 2 h) TIPS-(C≡C)$_3$—ZnCl 3, $PdCl_2$(dppf).DCM, THF/toluene, 55%.

protecting group. No decomposition was observed in the neat state, except for the hexayne TAG6 that slowly degraded at 4° C. in the bulk over a period of six weeks and was, therefore, stored in a dilute $Et_2O$ solution at −20° C. Due to the expected general sensitivity of higher oligoynes a storage at temperatures of −20° C. is nonetheless generally advisable to ensure the integrity of the compounds over the long term.

Spectroscopic Properties of the Oligoyne Derivatives

The NMR, UV-Vis, Raman, and IR spectra of the tetra-O-acetyl β-D-glucosyl oligoynes TAG2-6 and the corresponding tritylphenyl carboxylates TPC2-6 showed trends similar to what had previously been described for series of

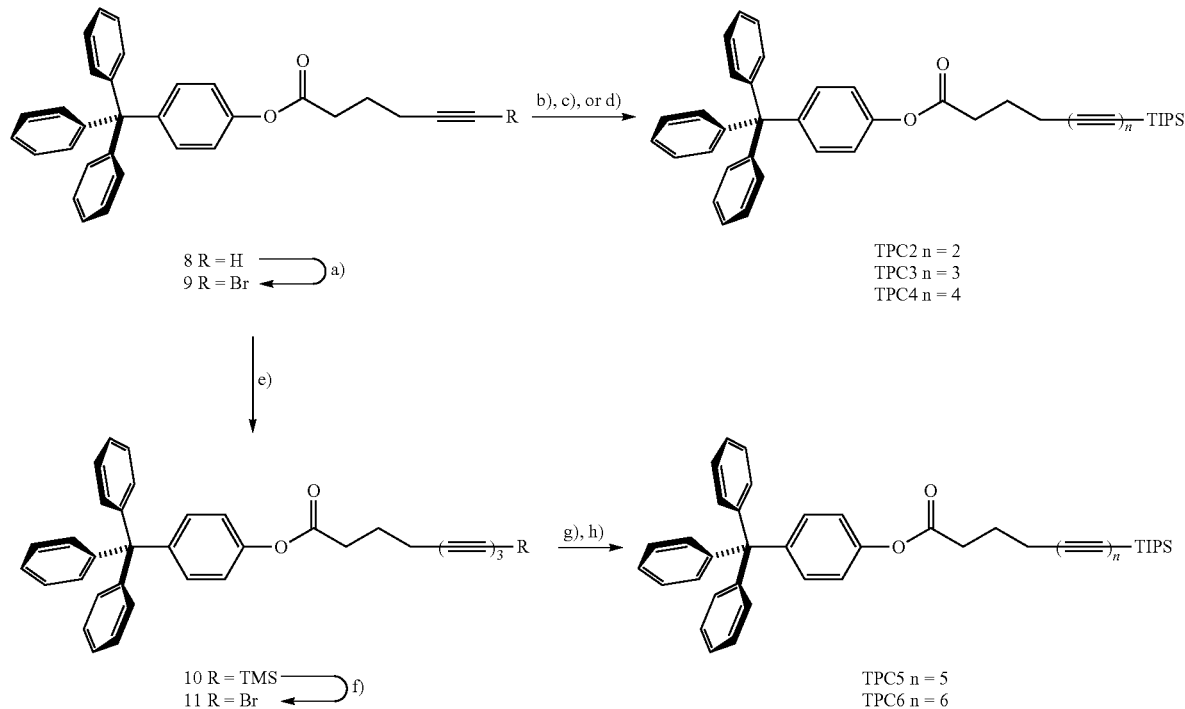

Scheme 3

Scheme 3 shows the synthesis of oligoyne tritylphenyl carboxylates TPC2-6 up to the hexaynes. Reagents and conditions employed in Scheme 3 are as follows: Scheme 3 a) $AgNO_3$, NBS, DCM/MeCN, 96%; Scheme 3 b) TIPS-C≡C—ZnCl 1, $PdCl_2$(dppf).DCM, THF/toluene, 68%; Scheme 3 c) TIPS-(C≡C)$_2$—ZnCl 2a, $PdCl_2$(dppf).DCM, THF/toluene, 51%; Scheme 3 d) TIPS-(C≡C)$_3$—ZnCl 3, $PdCl_2$(dppf).DCM, THF/toluene, 65%; Scheme 3 e) TMS-(C≡C)$_2$—ZnCl 2b, $PdCl_2$(dppo.DCM, THF/toluene, 71%; Scheme 3 f) AgF, NBS, DCM; Scheme 3 g) TIPS-(C≡C)$_2$—ZnCl 2a, $PdCl_2$(dppf).DCM, THF/toluene, 59% over two steps starting from 10; Scheme 27 h) TIPS-(C≡C)$_3$—ZnCl 3, $PdCl_2$(dppf).DCM, THF/toluene, 44% over two steps starting from 10.

Figure 32D:
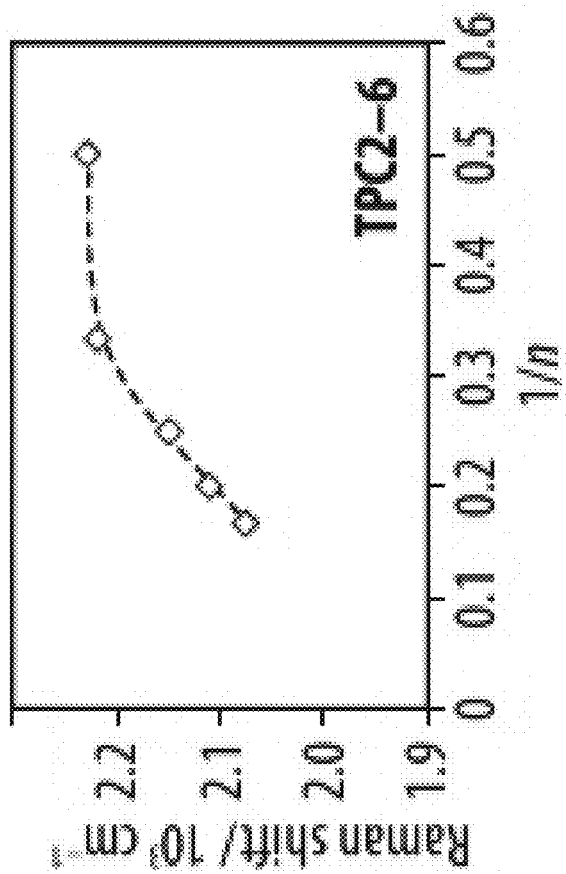
Figure 32C:
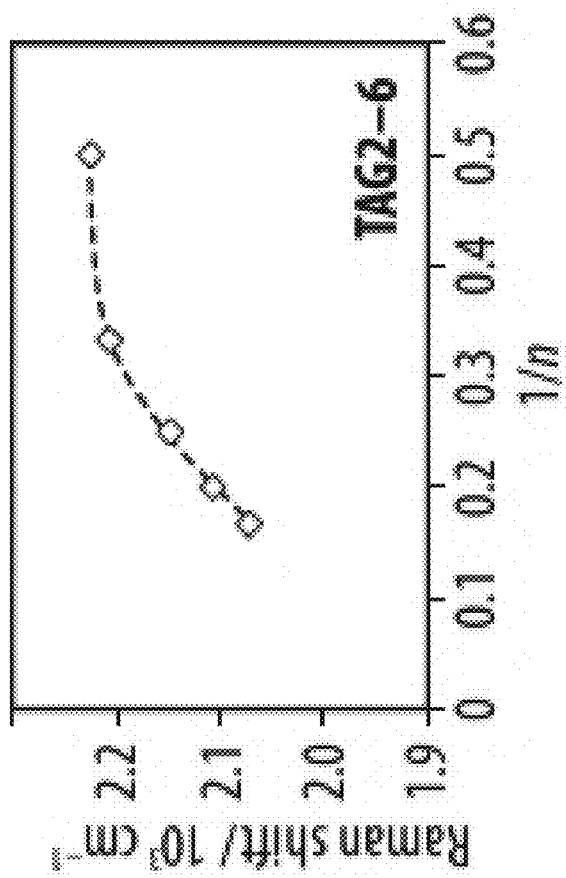
Figures 32E, 32F:
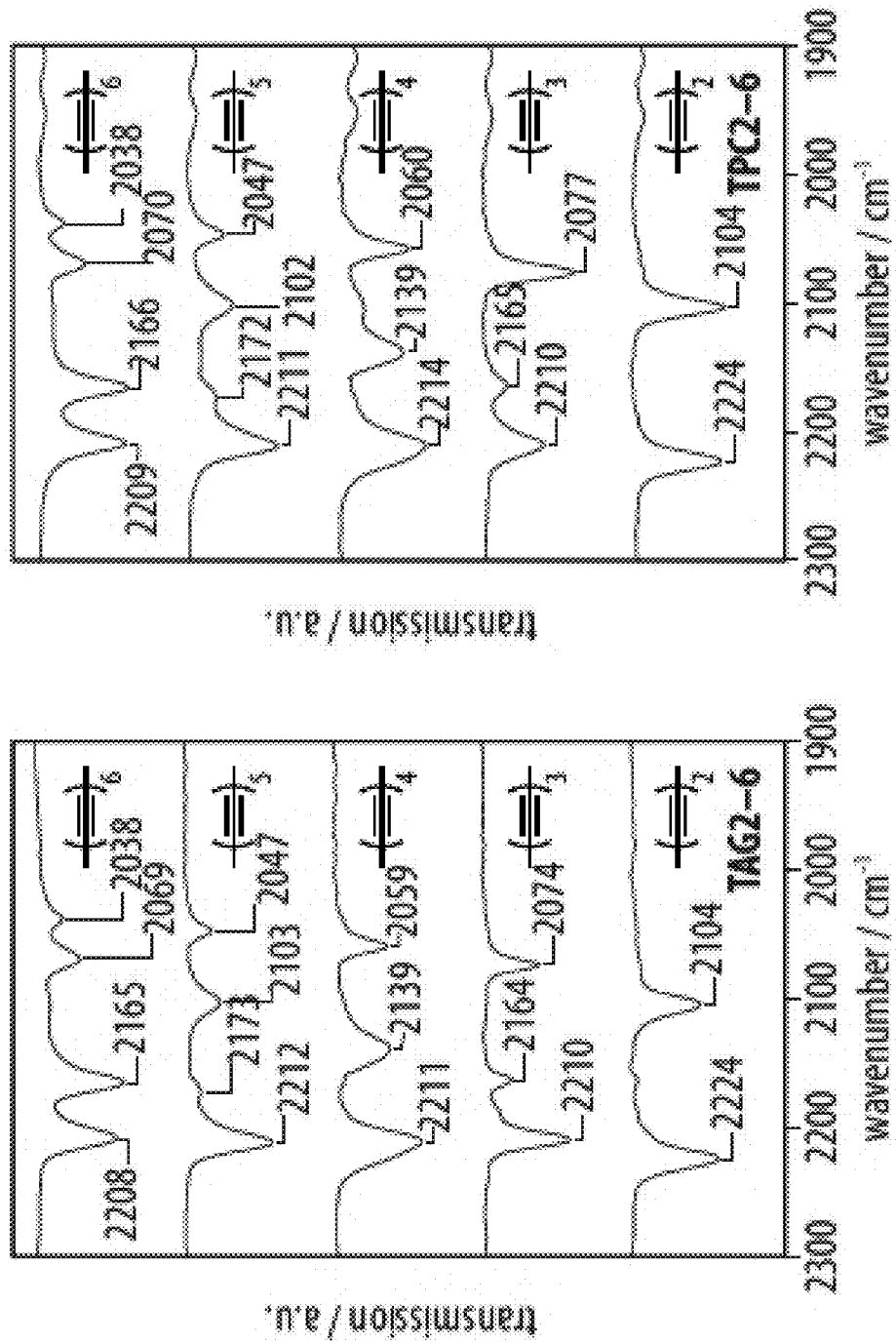
Figure 33A:
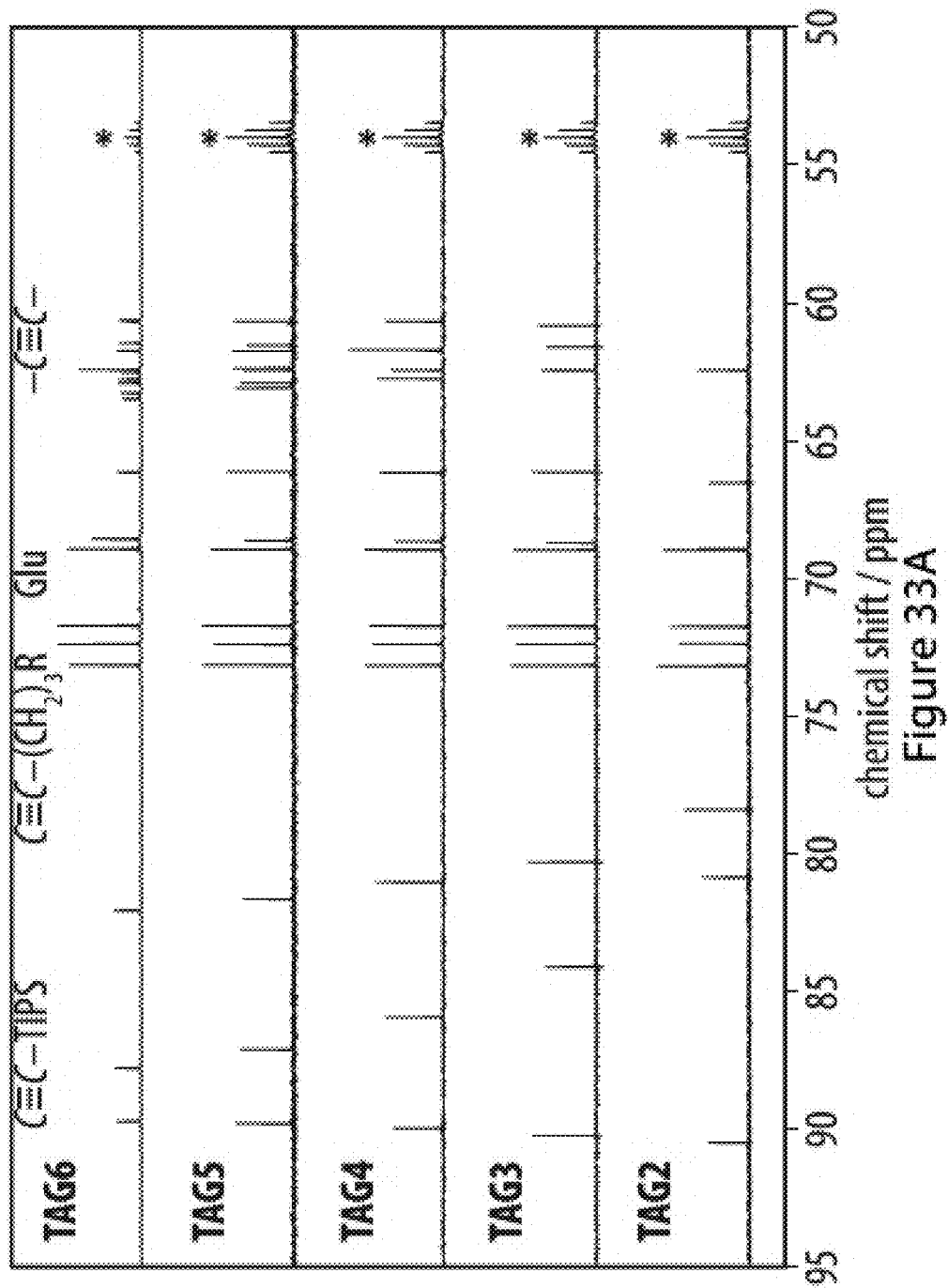
FIGS. 33A-33B show $^{13}$C-NMR spectra revealing resonances for the internal acetylene carbons for the corresponding members of the TAG2-6 series.
Figure 33B:
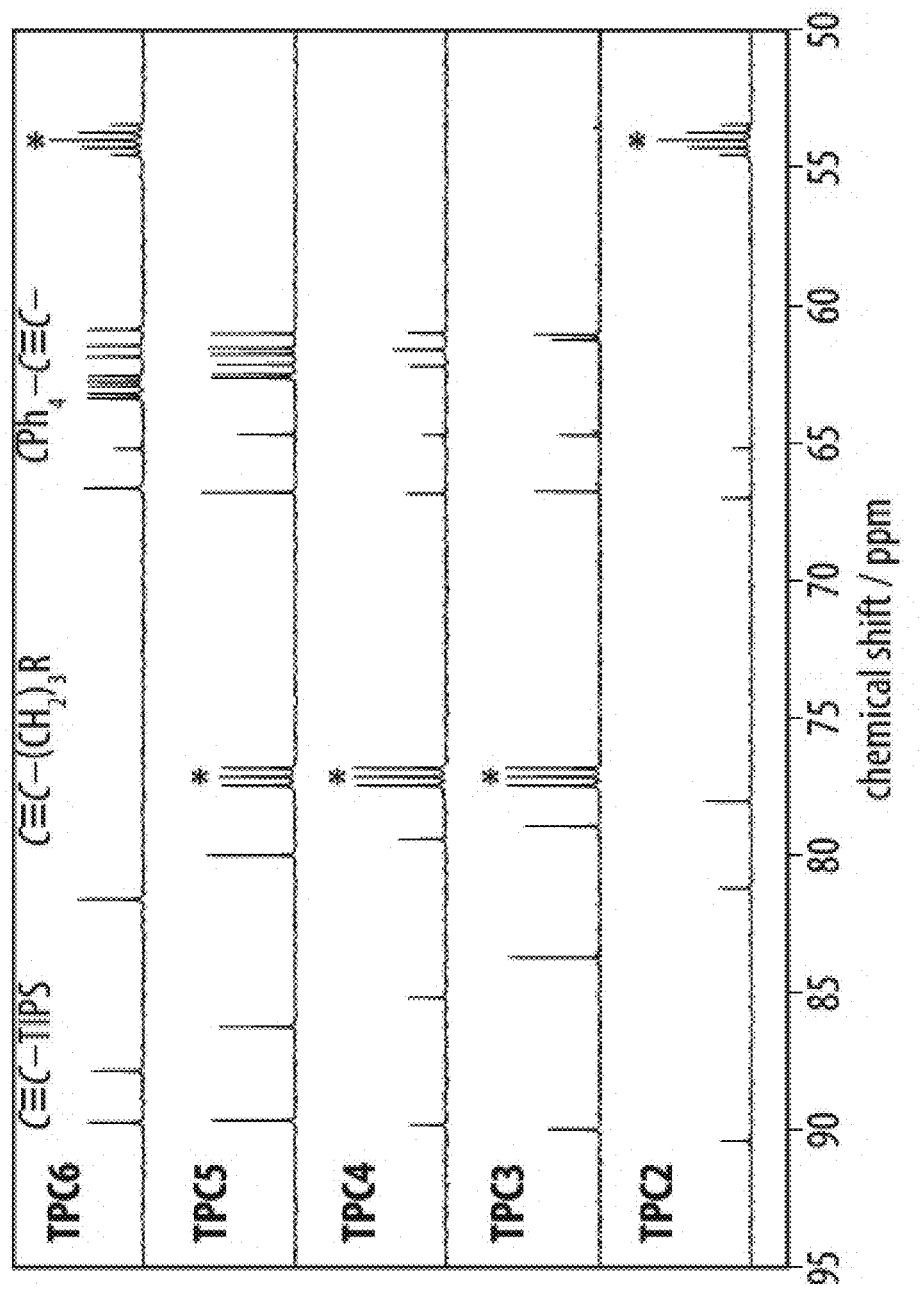

The developed synthetic pathway has, hence, allowed for the facile synthesis of unsymmetric oligoynes up to the hexaynes with different functional groups on the preparative scale. The new acetylenic building blocks significantly facilitated the procedure, and the obtained products were found to be considerably more stable than the previously reported oligoynes with a methylene spacer and a TMS symmetric oligoynes. The UV-Vis spectra for the respective members of the two series TAG2-6 in acetonitrile and TPC2-6 in cyclohexane were almost identical (FIGS. 31A-31B), and plots of the highest wavelength absorptions according to Lewis and Calvin (FIGS. 31C-31D) as well as extrapolations of the highest wavelength absorptions according to Wegner gave results in excellent agreement with previously published values. The solid state Raman spectra of TAG2-6 and TPC2-6 (FIGS. 32A-32B) revealed bands at positions that matched reasonably well with the vibronic fine structure observed in the optical spectra. Consistent with previously reported data, the positions of the Raman bands shifted toward lower wavenumbers with an increasing number of triple bonds, as illustrated by the plots of the Raman shifts versus the inverse number of triple bonds 1/n (FIGS. 32C-32D). The solid state IR spectra of corresponding members of the TAG2-6 and TPC2-6 series exhibited the same peak patterns for the oligoyne vibrations in the range of 2250-2050 $cm^{-1}$ (FIGS. 32E-32F). Finally, the $^{13}$C-NMR spectra of these series revealed resonances for the internal acetylene carbons converging to chemical shifts between 65 and 60 ppm (FIGS. 33A-33B). In both series, the signals of the two acetylene carbons next to the silyl end groups appeared above 80 ppm, while the resonances of the two acetylene carbons neighboring the propylene spacer were observed at chemical shifts of 66 and 78-82 ppm, respectively.

Figure 31F:
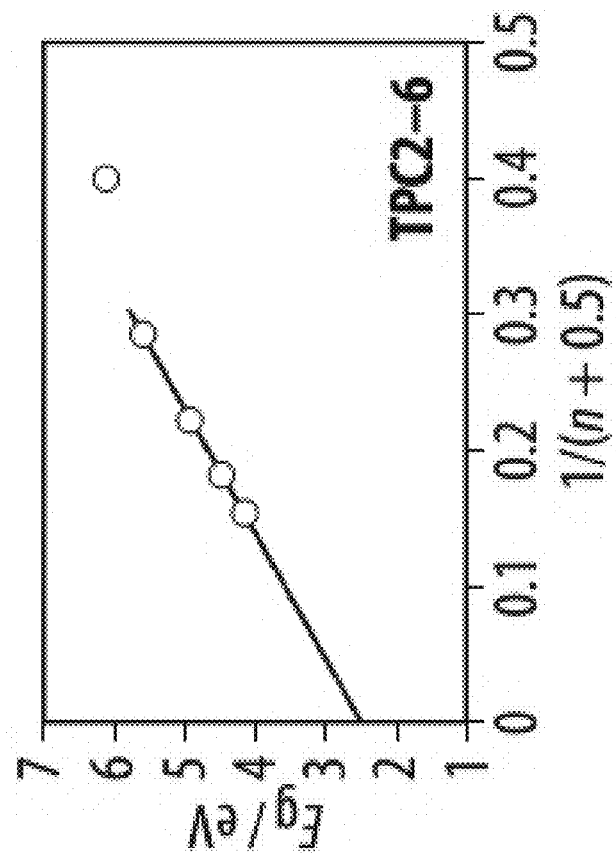
Figure 31E:
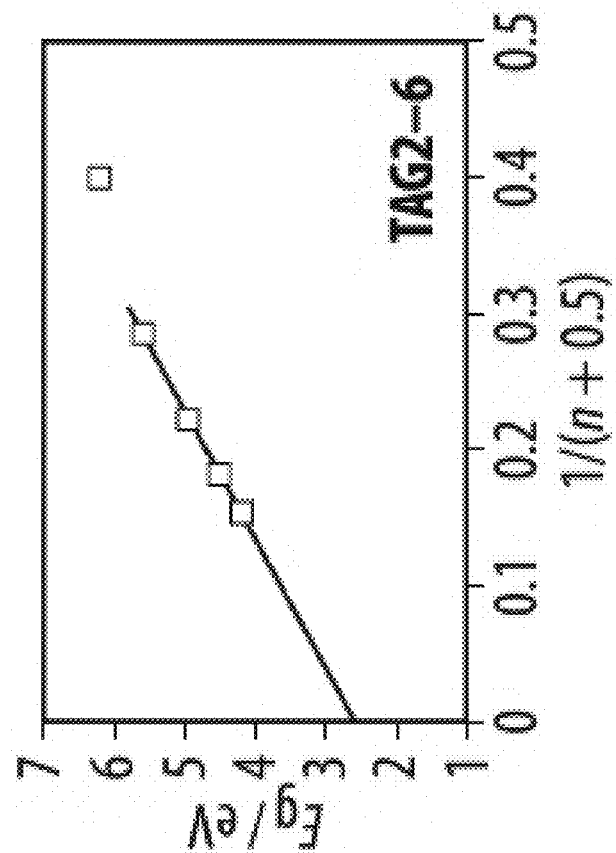

FIG. 31A above shows UV-Vis spectra of the tetra-O-acetyl β-D-glucosyl oligoynes TAG2-6 in acetonitrile (concentrations in the range of c=3.03-4.21 µmol/L), and FIG. 31B of the corresponding tritylphenyl carboxylates TPC2-6 in cyclohexane (concentrations in the range of c=5.86-6.55 πmol/L). FIGS. 31C, 31D show Lewis-Calvin plots of the UV-Vis absorption maxima of the two series with linear regressions with slopes of k=12.2·10³ and 12.4·10³ nm² ($R^2$=0.996 and 0.991). FIGS. 31E, 31F shows plots of the energy of the optical transition versus 1/(n+0.5), with the number of triple bonds n. An extrapolation of the linear regression to n=∞ yields values of 480 nm (2.6 eV) and 498 nm (2.5 eV), respectively, for the saturation wavelength of an infinitely long chain of conjugated triple bonds ($R^2$=0.999 in both cases).

FIGS. 32A-32F shows IR and Raman spectra for the series of tetra-O-acetyl β-D-glucosyl oligoynes TAG2-6 and the corresponding tritylphenyl carboxylates TPC2-6. FIGS. 32A, 32B show solid-state Raman spectra, FIGS. 32C, 32D show plots of the Raman band positions versus 1/n (the lines serve as guides to the eye), and FIGS. 32E, 32F show solid-state IR spectra of TAG2-6 and TPC2-6.

FIG. 33A shows the acetylene region of the $^{13}$C NMR spectra of the glucosylated oligoynes TAG2-6 and FIG. 33B shows the acetylene region of the $^{13}$C NMR spectra of the corresponding tritylphenyl carboxylates TPC2-6. The resonances for the internal acetylene carbons converged to chemical shifts between 65-60 ppm, the acetylene carbons neighboring the TIPS group appeared above 80 ppm, and the acetylene carbons next to the propylene spacer were observed at chemical shifts of 66 and 78-82 ppm, respectively (glucoside and tritylphenyl peaks are marked as "Glu" and "CPh₄" respectively; *=denotes residual solvent signals from either CD₂Cl₂ or CDCl₃).

Preparation of Carbon-Rich Amphiphiles and Supramolecular Self-Assembly

The obtained oligoynes serve as protected precursors of oligoyne amphiphiles that undergo supramolecular self-assembly into carbon-rich colloidal aggregates in aqueous dispersion and can be used for the formation of novel oligoynes rotaxanes with cyclodextrin hosts. We first investigated the complete deprotection of the tetra-O-acetyl β-D-glucosyl hexayne TAG6, that is, the deacetylation of the glucosyl head group by treatment with substoichiometric amounts of NaOMe in methanol according to Zemplén, and the simultaneous or subsequent desilylation with cesium fluoride (FIGS. 9A-9C). Solutions of the desilylated compound Glu6-H, however, quickly turned dark brown, indicating the fast degradation of the hexayne moieties. While this highlighted the propensity of the deprotected hexaynes to possibly undergo carbonization after deprotection, the rapid process was difficult to control. We therefore decided to investigate the presumably less reactive derivatives with a deprotected hydrophilic head group but an intact terminal silyl group. To this end, the hexaynes TAG6 and TPC6 were both deprotected using NaOMe in MeOH-containing solutions, resulting in the glucosylated amphiphile GLU6-TIPS and the methyl carboxylate MEC6-TIPS, respectively (Scheme 4).

Scheme 4

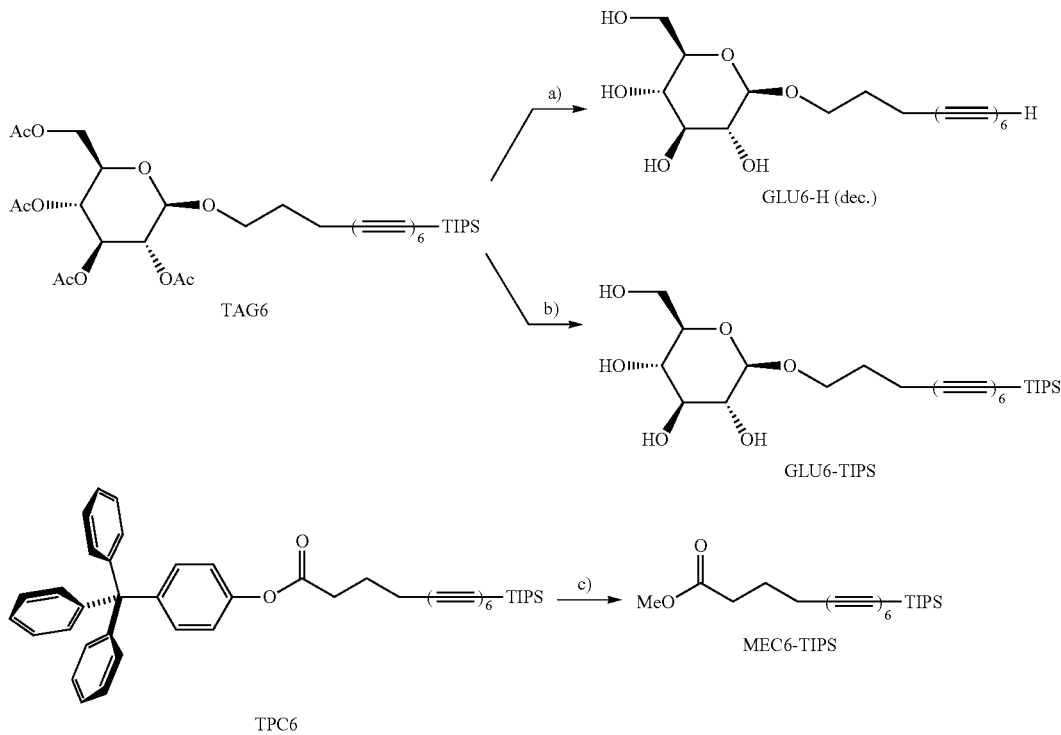

Scheme 4 above shows the synthesis of oligoyne amphiphiles. Reagents and conditions employed in Scheme 4 are as follows: Scheme 4 a) CsF, NaOMe, dioxane/MeOH, r.t., 2 h; Scheme 4 b) NaOMe, dioxane/MeOH, r.t., 2 h; then Amberlite (H+), 30 min; Scheme 4 c) NaOMe, DCM/MeOH, r.t., 5 h; then Amberlite (H+), 1 h. Conversions were quantitative in all cases, but the products were kept in solution and isolated yields not determined.

FIG. 34A shows a comparison of the solid-state IR spectra of the protected hexaynes TAG6 and TPC6 with the corresponding deprotected glucosyl hexaynes GLU6-TIPS and methyl carboxylates MEC6-TIPS. FIG. 34B shows solution-phase UV-Vis spectra of deprotected glucosyl hexayne GLU6-TIPS, and FIG. 34C shows solution-phase UV-Vis spectra of the hexayne methyl carboxylates MEC6-TIPS in acetonitrile (black, c=3.83 µmol/L, c=4.97 µmol/L, respectively), in aqueous dispersion at the same concentration (c=3.83 µmol/L, c=4.97 µmol/L, respectively), and upon diluting the latter with a three-fold excess of MeCN (c=0.96 µmol/L, c=1.24 µmol/L, respectively; shown four times magnified, for the sake of comparison).

Investigations by IR and UV-Vis spectroscopy (FIGS. 34A-34C), first of all, confirmed that the hexayne segments remained intact in both cases. Moreover, UV-Vis spectroscopy proved that both molecules underwent a reversible aggregation without premature degradation of the hexayne moiety in aqueous media. Thus, both the glucosylated hexayne GLU6-TIPS and the methyl carboxylate MEC6-TIPS showed the UV-Vis absorption bands characteristic for molecularly disperse solutions in MeCN, which gave way to a broad and less intense signal with a poorly defined fine structure in aqueous dispersion (FIGS. 34B, 34C). Diluting these dispersions with a three-fold excess of MeCN re-established the spectroscopic fine structure of the molecularly disperse species in both cases, proving the reversibility of the process. While the protected oligoyne derivatives TAG6 and TCP6 were completely insoluble in aqueous media, both the glucosylated hexayne GLU6-TIPS and the methyl carboxylate MEC6-TIPS readily formed opalescent colloidal dispersions in water, as corroborated by dynamic light scattering (DLS) experiments in combination with cryogenic transmission electronic microscopy (cryo-TEM) imaging. From DLS, we determined particle sizes of 59 (±2) nm (PDI 0.230) for GLU6-TIPS (FIG. 35A) and depolarized dynamic light scattering on the dispersions was practically zero, so that shape anisotropy can be excluded. According to representative cryogenic transmission electron microscopy (cryo-TEM) images (FIG. 35B), the dispersions contained a mixture of unilamellar and multilamellar spherical vesicles with a broad variation of diameters in the range of 20-120 nm. These vesicles exhibited a uniform wall thickness on the order of 4-5 nm, suggesting that the vesicle membranes were formed from bilayers of the molecules. By contrast, dispersions of MEC6-TIPS contained significantly larger spherical particles with a diameter of 172 (±6) nm (PDI 0.177) according to DLS (FIG. 35B) and depolarized DLS. Cryo-TEM images of these dispersion revealed what looked like filled nanospheres with a broad distribution of diameters in the range of 20-250 nm (FIG. 35D). Since the latter are up to two orders of magnitude larger than the extended molecular length of MEC6-TIPS of about 2.6 nm, one has to conclude that these nanospheres can not be micelles but represent compact droplets of MEC6-TIPS. This implies that the amphiphilicity of the methyl carboxylates was not sufficient to stabilize well-defined colloidal structures.

Figure 35A:
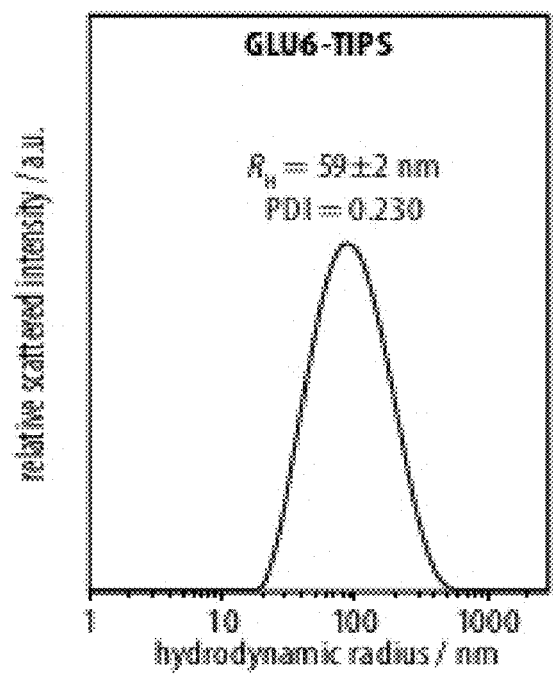
FIGS. 35A-35D show dynamic light scattering (DLS) size distributions by intensity of aqueous dispersions of glucosylated hexayne with colloidal aggregates.
Figure 35B:
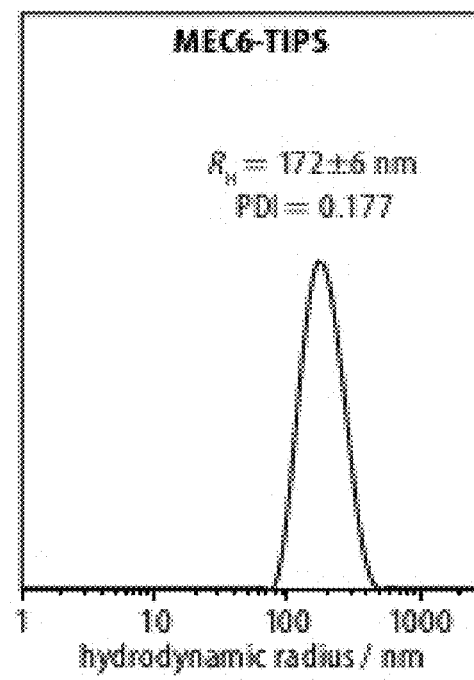
Figure 35C:
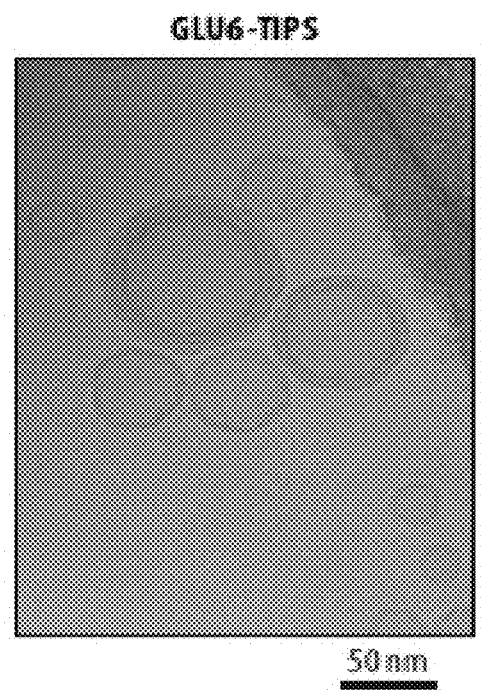
Figure 35D:
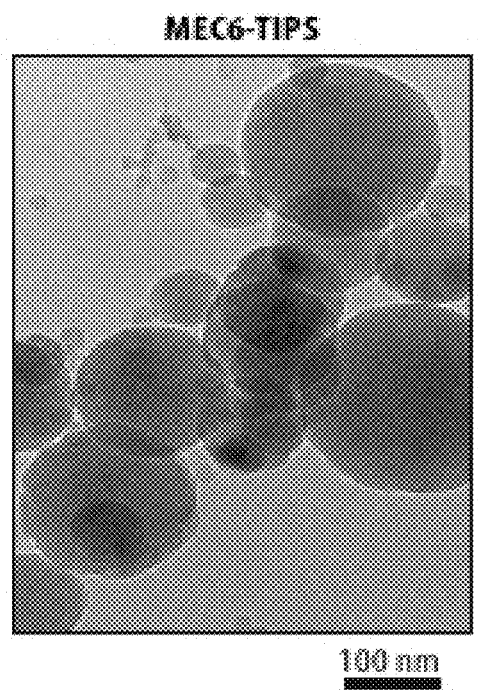

FIG. 35A shows that dynamic light scattering (DLS) size distributions by intensity of aqueous dispersions of the glucosylated hexayne GLU6-TIPS indicated the presence of colloidal aggregates with sizes of 59 (±2) nm (PDI 0.230). FIG. 35B shows that cryogenic transmission electron microscopy (cryo-TEM) images of aqueous dispersions of GLU6-TIPS revealed the presence of a mixture of unilamellar and multilamellar spherical vesicles with a broad variation of diameters. FIG. 35C shows that DLS of the methyl carboxylate MEC6-TIPS in aqueous dispersion showed colloidal aggregates with a size of 172 (±6) nm (PDI 0.177). FIG. 35D shows that cryo-TEM images of these dispersions showed filled nanospheres that supposedly represent compact droplets of MEC6-TIPS.

Rotaxane Formation with α-Cyclodextrin in Aqueous Solution

Rotaxanes of π-conjugated oligomers and polymers had previously been investigated as potential "insulated molecular wires", and cyclodextrins have frequently been used as hosts for small linear hydrophobic guests. The stabilization of oligoynes by encapsulation via rotaxane formation had also been previously discussed, but only few examples are known to date. In contrast to the previously reported examples of oligoyne rotaxanes that relied on the coordination of the copper catalyst to the macrocyclic host, we demonstrate here that the amphiphilic nature of the deprotected oligoynes can be exploited for the straightforward preparation of oligoyne rotaxanes by simple host-guest chemistry with α-cyclodextrin in hydrophilic media.

Figure 36:
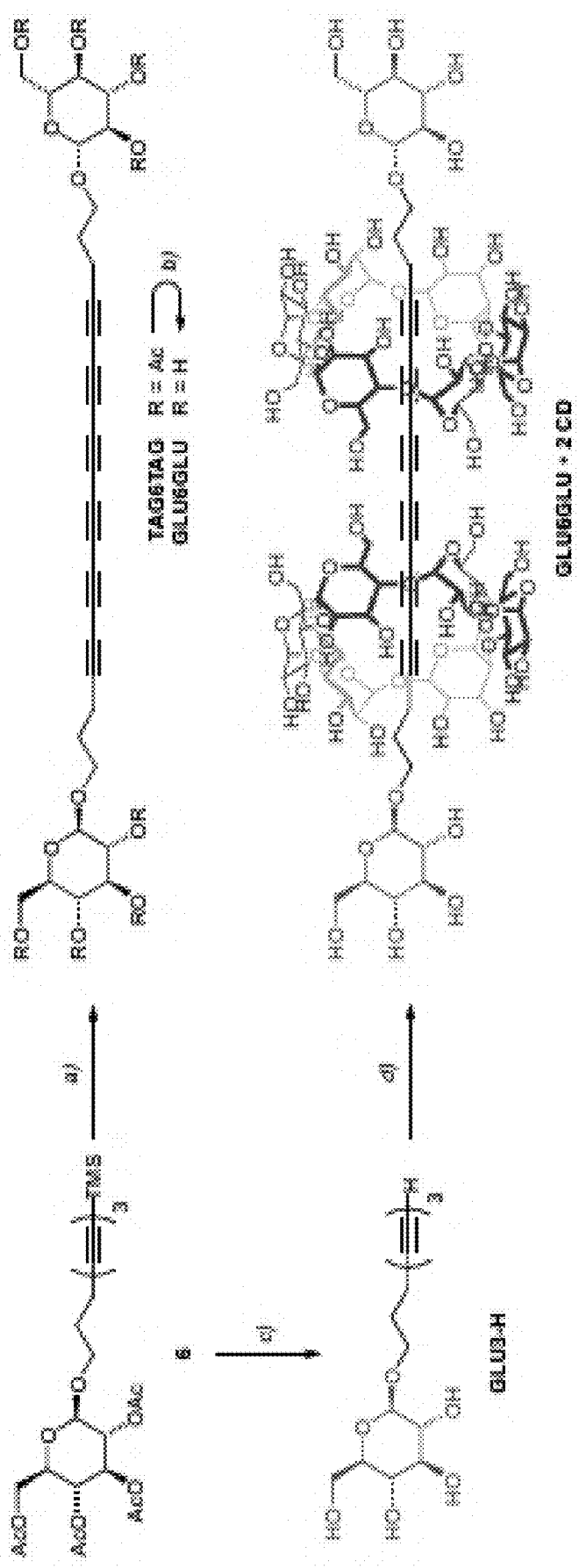
FIG. 36 shows the synthesis of hexayne rotaxane and hexayne.

FIG. 36 shows the synthesis of hexayne rotaxane GLU6GLU.2 CD and hexayne GLU6GLU. Reactions and conditions employed in FIG. 36 are as follows: FIG. 36 a) CsF, THF/H$_2$O; then Cu(OAc)$_2$, 2,6-Lutidine, DCM, 73%; FIG. 36 b) NaOMe, 1,4-Dioxane/MeOH (5:1), r.t., 3 h (yield not determined); FIG. 36 c) NaOMe, Et$_2$O/MeOH (4:1), r.t., 2 h; then Amberlite (H+) (product not isolated); FIG. 36 d) α-cyclodextrin (0.1 M in H$_2$O), 45° C., 3 h; then CuBr$_2$, TMEDA, r.t., 2 d, 21% over two steps.

In this synthesis, the reaction of the TMS-protected triyne 6 with NaOMe in an ether/methanol mixture (4:1) resulted in the complete deacetylation and simultaneous desilylation, furnishing the corresponding glucoyslated triyne amphiphile GLU3-H after neutralization with Amberlite ion exchange resin (FIG. 36). The highly reactive amphiphile was not isolated but immediately added into an aqueous solution containing an excess of α-cyclodextrin at 45° C. The resulting mixture was stirred for several hours in order to ensure the formation of the corresponding triyne pseudo-rotaxane. However, all attempts to isolate the pseudo-rotaxane failed, possibly due to de-threading of the α-cyclodextrin from the triyne upon work-up. Therefore, it was decided to perform an in situ oxidative homocoupling under Glaser-Galbraith conditions with a solution of GLU3-H in the presence of α-cyclodextrin by the addition of CuBr$_2$ and TMEDA followed by stirring of the mixture for 48 h at room temperature (FIG. 36). After purification by Sephadex column chromatography in water and preparative reverse-phase HPLC in water/acetonitrile, the corresponding [3]rotaxane GLU6GLU.2 CD was obtained in 21% isolated yield, which features two α-cyclodextrin hosts threaded onto one diglucosylated hexayne guest. For comparison, the analogous free diglucosylated TAG6TAG was also prepared by desilylation of 6 and simultaneous homocoupling with Cu(OAc)$_2$. The latter was then converted into the deprotected hexayne GLU6GLU by deacetylation with NaOH/MeOH (FIG. 36).

Figure 37C:
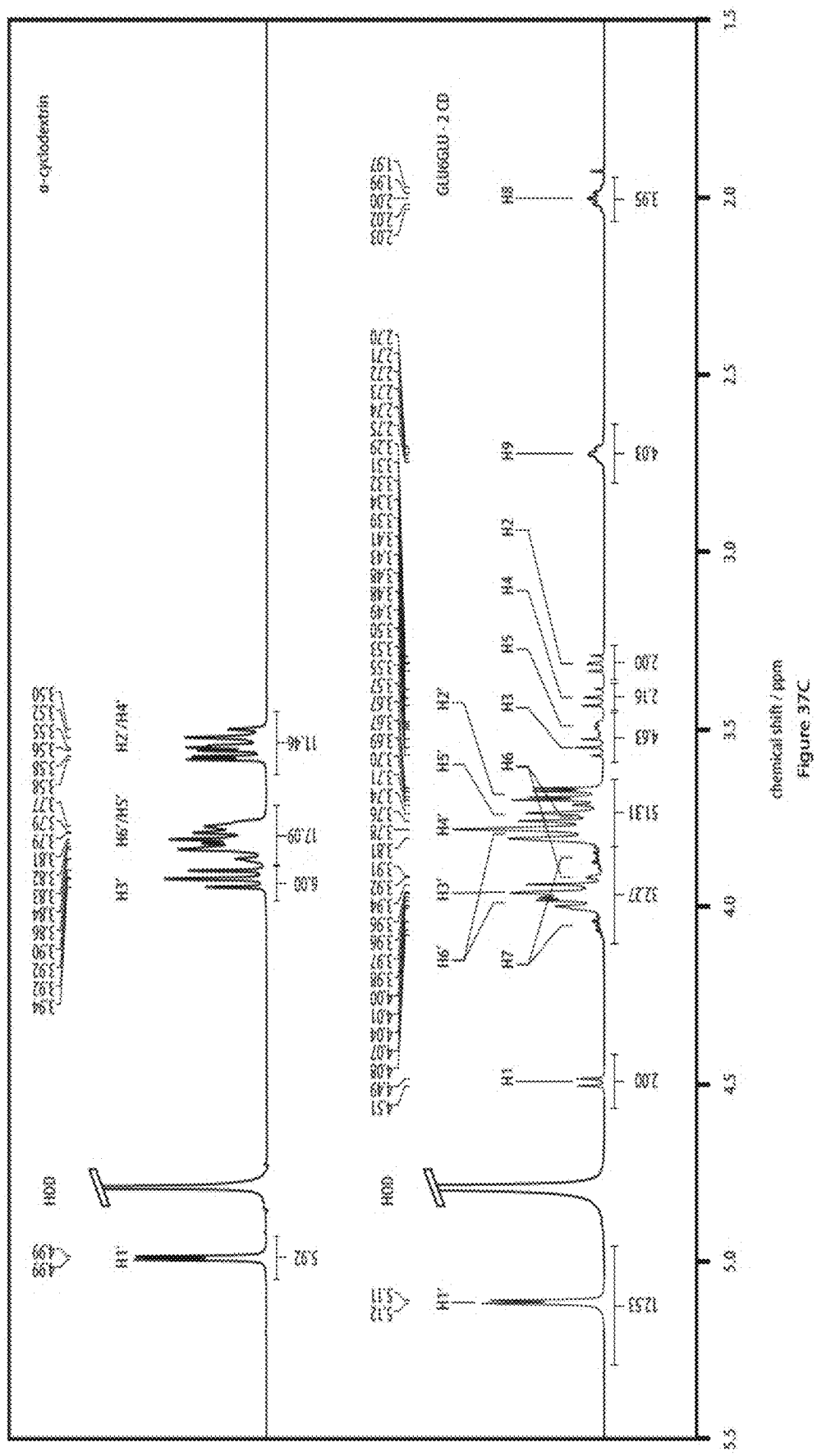

FIGS. 37A-37B show MALDI-TOF mass spectrum of GLU6GLU.2 CD; the lowest mass peak of m/z 2553.2 Dalton ([M+Na]$^+$) matched the expected monoisotopic mass of the proposed [3]rotaxane. FIG. 37C shows that the comparison of the $^1$H-NMR spectra (400 MHz, 297.2 K, D$_2$O) of the native α-cyclodextrin (top) and the [3]rotaxane GLU6GLU.2 CD (bottom) highlighted the shifts of the α-cyclodextrin proton signals that can be attributed to the threading onto the T-conjugated guest.

Figure 38A:
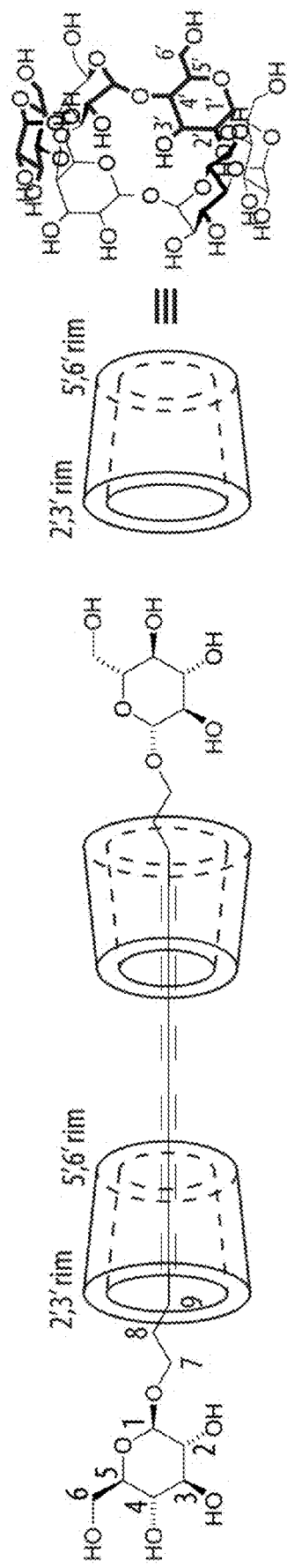

FIGS. 38A-38C shows the structure of the [3]rotaxane GLU6GLU.2 CD and the corresponding 2D NMR spectra (all 400 MHz, 297.2 K, D$_2$O). FIG. 38A shows that the proposed structure features a tail-to-tail arrangement of the two threaded α-cyclodextrin hosts. The assignment of the signals in the $^1$H and $^{13}$C-NMR spectra was established by means of the $^1$H,$^1$H-COSY NMR spectrum shown in FIG. 38B, the $^1$H,$^{13}$C-HSQC NMR spectrum shown in FIG. 38C, and the $^1$H,$^{13}$C-HMBC NMR spectrum shown in FIG. 38D. FIG. 38E shows that the $^1$H,$^1$H-ROESY NMR spectrum of the [3]rotaxane GLU6GLU.2 CD revealed through-space contacts between H3' of the wider 2,3-rim of the α-cyclodextrin host with the protons H9, H8, and H3 of the hexayne glycosyl host. See FIGS. 40 to 43 for enlarged versions and further details.

The structure of the [3]rotaxane GLU6GLU.2 CD was proven by mass spectrometry and NMR spectroscopy. Thus, MALDI-TOF mass spectra exhibited a lowest mass peak with a matching monoisotopic mass of m/z 2553.2 Dalton ([M+Na]$^+$) and the expected peak distribution (FIGS. 37A, 37B). The $^1$H NMR spectra in D$_2$O (FIG. 37C) showed the peaks of the α-cyclodextrin hosts and the amphiphilic hexayne guest with integration values (C-cyclodextrin/hexayne 2:1) consistent with the proposed molecular structure of GLU6GLU.2 CD. The anomeric H1' signal of native α-cyclodextrin at δ=4.99 ppm had been shifted downfield to δ=5.11 ppm, which can be attributed to the threading of the α-cyclodextrin onto the π-conjugated guest. Moreover, the number of peaks in the $^{13}$C NMR spectra of the product was consistent with a symmetric (head-to-head or tail-to-tail) arrangement of the two threaded α-cyclodextrin hosts. All $^1$H and $^{13}$C NMR signals were assigned by means of $^1$H,$^1$H correlation spectroscopy (COSY), heteronuclear single quantum coherence (HSQC) spectroscopy, and heteronuclear multiple-bond correlation (HMBC) spectroscopy (FIGS. 38A-38C). Notably, the diastereotopic protons in the CH$_2$ groups at C6 and C6' of both the guest and host as well as the one at C7 of the propylene spacer showed a strong splitting not observed in the free molecules. Moreover, rotating-frame nuclear Overhauser effect correlation spectroscopy (ROESY) measurements proved through-space contacts between H3' of the wider 2,3-rim of the α-cyclodextrin host with the two proton pairs H8 and H9 of the propylene spacers and H3 of the guest's glucosyl residue (FIG. 38D). Thus, the observed through-space contacts combined with the absence of desymmetrization in the 1D spectra allowed to conclude that the isolated product exclusively comprised the isomer with a tail-to-tail arrangement of the two threaded α-cyclodextrin hosts, while the other two possible isomers with a head-to-head or head-to-tail arrangement of the α-cyclodextrin hosts were absent. Although the low isolated yield of the GLU6GLU.2 CD product did not allow to exclude the formation of the other isomers, a similarly specific formation of only one of the three possible isomers of a [3]rotaxane had already been demonstrated in previous examples of α-cyclodextrin host complexes with r-conjugated guests.

Figure 39B:
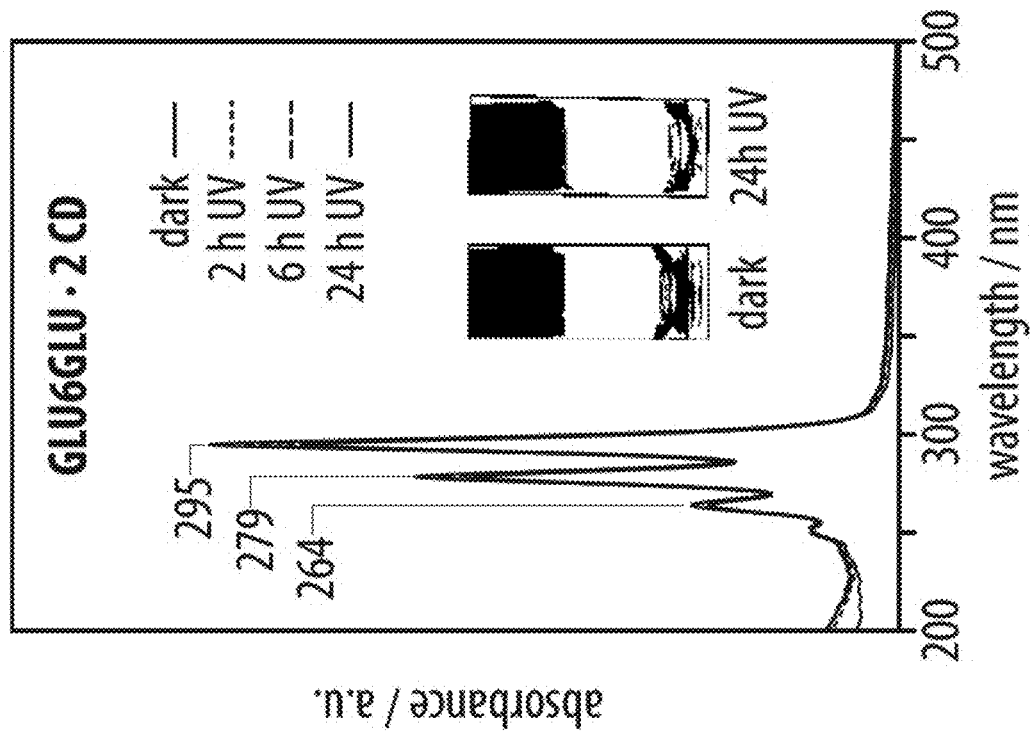
FIGS. 39A-39B show UV-Vis spectra of aqueous solutions of a dissociated rotaxane and a rotaxane featuring two α-cyclodextrin hosts upon UV radiation.
Figure 39A:
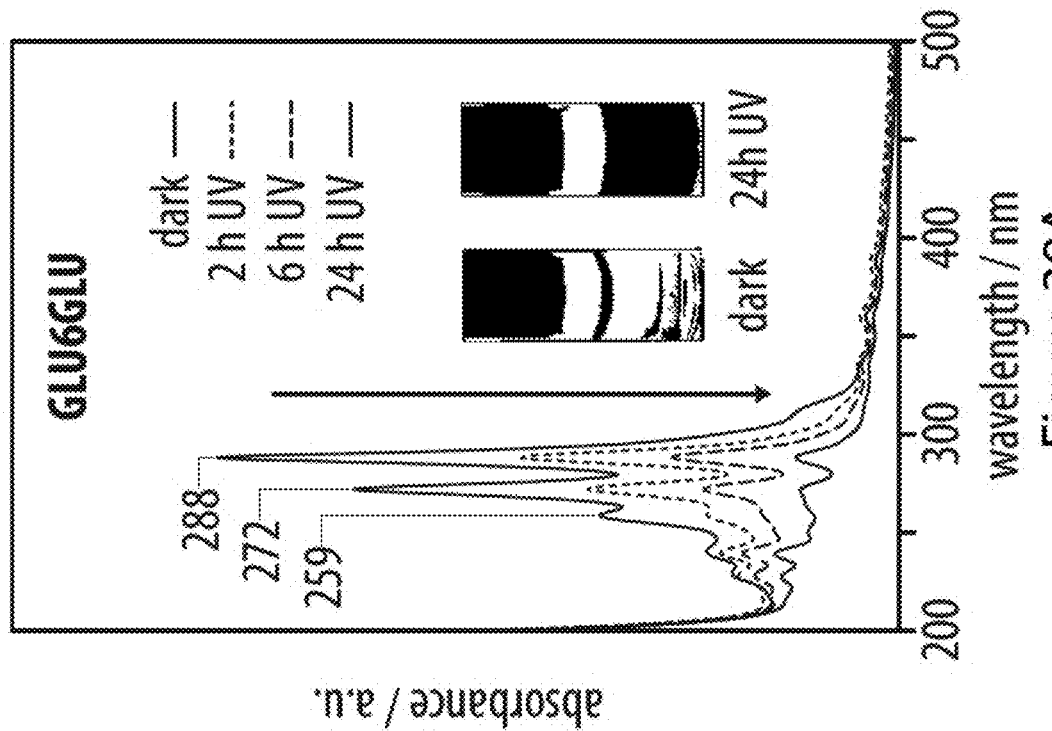

In marked contrast to the free hexayne GLU6GLU, the corresponding [3]rotaxane GLU6GLU.2 CD was remarkably stable and did not show any signs of decomposition in aqueous solution or in bulk over months at room temperature, at elevated temperatures, or upon extended exposure to daylight. In order to further elucidate this stabilizing effect of the rotaxane formation, aqueous solutions of GLU6GLU and GLU6GLU.2 CD were subjected to intense UV irradiation using a 250 W Ga-doped medium pressure mercury lamp, and their UV-Vis spectra after different irradiation times were recorded (FIGS. 39A-39B). As expected, the solution of GLU6GLU showed a drastic color change from yellow to brown over time, and the corresponding UV-Vis spectra confirmed its decomposition. In marked contrast, solutions of the hexayne [3]rotaxane GLU6GLU.2 CD did not show a color change even after 24 h of UV irradiation. Moreover, the intensity, shape, and fine structure of its UV absorption band remained unaltered. Apparently, the α-cyclodextrin hosts served as a sheath and thus effectively prevented any photo-degradation or polymerization of the hexayne moieties.

FIGS. 39A-39B shows UV-Vis spectra of aqueous solutions of free hexayne GLU6GLU (FIG. 39A) and the corresponding [3]rotaxane GLU6GLU.2 CD (FIG. 39B) upon UV irradiation after different irradiation times (ambient conditions, 250 W Ga-doped medium-pressure Hg lamp, 250-600 nm). While the unprotected hexayne moiety of GLU6GLU underwent photo-degradation, GLU6GLU.2 CD was stable under these conditions (the apparent increase in absorption is due to partial evaporation of the solvent).

Figure 40:
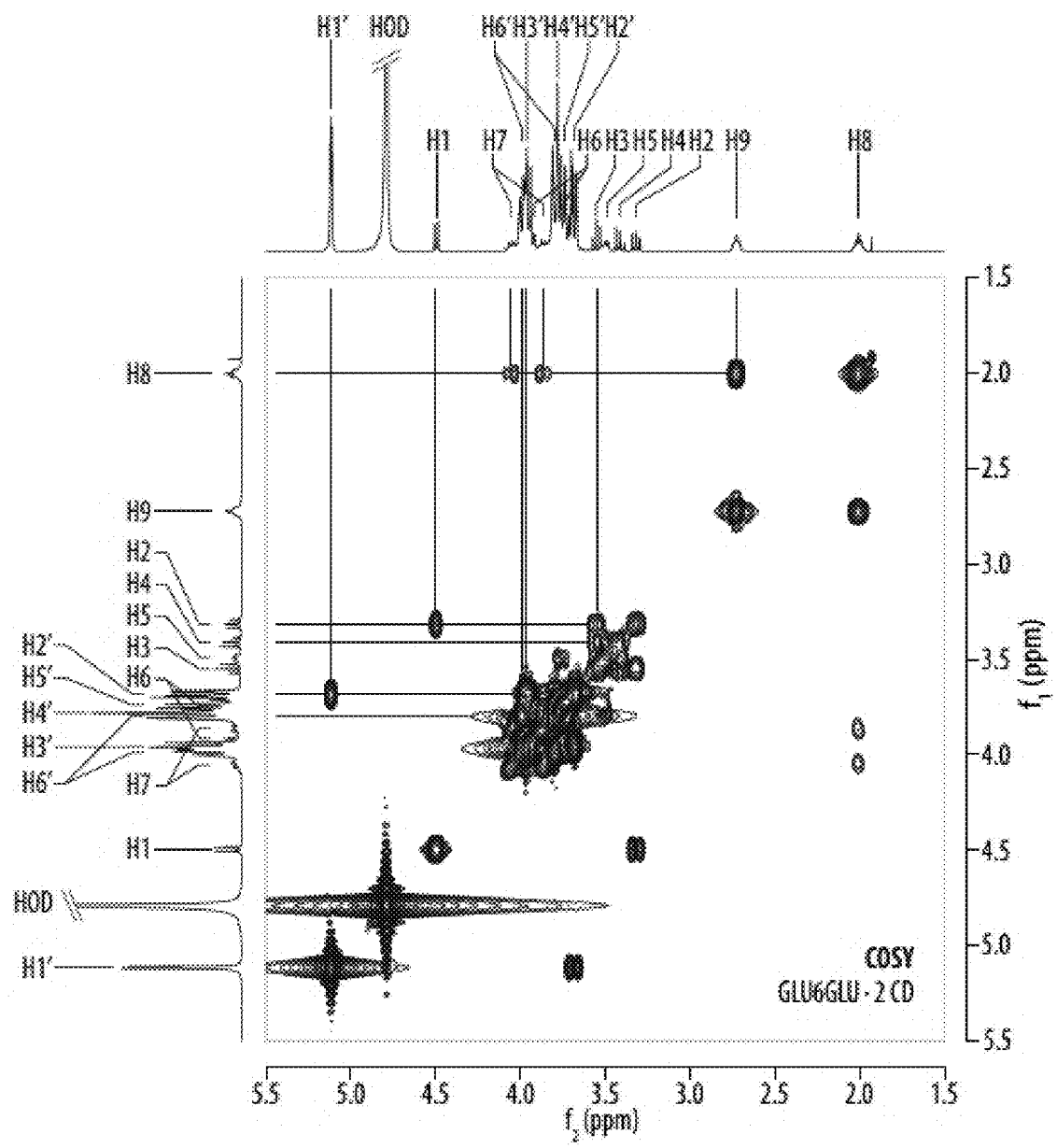
FIG. 40 shows a $^1$H,$^1$H—COSY NMR spectrum of a rotaxane featuring two α-cyclodextrin hosts.

Thus, two series of unsymmetric oligoyne derivatives bearing functional groups up to the hexaynes were prepared on the multi-gram scale. The improved molecular design and the newly introduced acetylenic building blocks that complement the Negishi coupling protocol allowed for the efficient and concise elongation of the oligoyne segment, significantly facilitating the synthetic access to this class of compounds. Moreover, the obtained molecules could be deprotected to obtain reactive, carbon-rich amphiphiles with different polar head. Furthermore, the amphiphilicity of the glucose oligoynes was used for the preparation of a water-soluble hexayne rotaxane with two threaded α-cyclodextrin hosts. This encapsulation in a host-guest complex was found to fully shield and stabilize the otherwise reactive oligoyne segments against photochemical degradation or cross-linking. The oligoyne amphiphiles described here may hence serve as carbon-rich precursors for the low-temperature preparation of novel types of carbon nanostructures from films and/or self-assembled monolayers. Alternatively, they may be stabilized by self-assembly into host-guest complexes in polar media FIG. 40 shows the $^1$H,$^1$H-COSY NMR spectrum (400 MHz, 297.2 K, D$_2$O) of the [3]rotaxane GLU6GLU.2 CD. The cross-peaks observed between H8 and H7 indicated a strong splitting of the diastereotopic protons of the CH$_2$ group at H7, contrary to the free molecule GLU6GLU.

Figure 41:
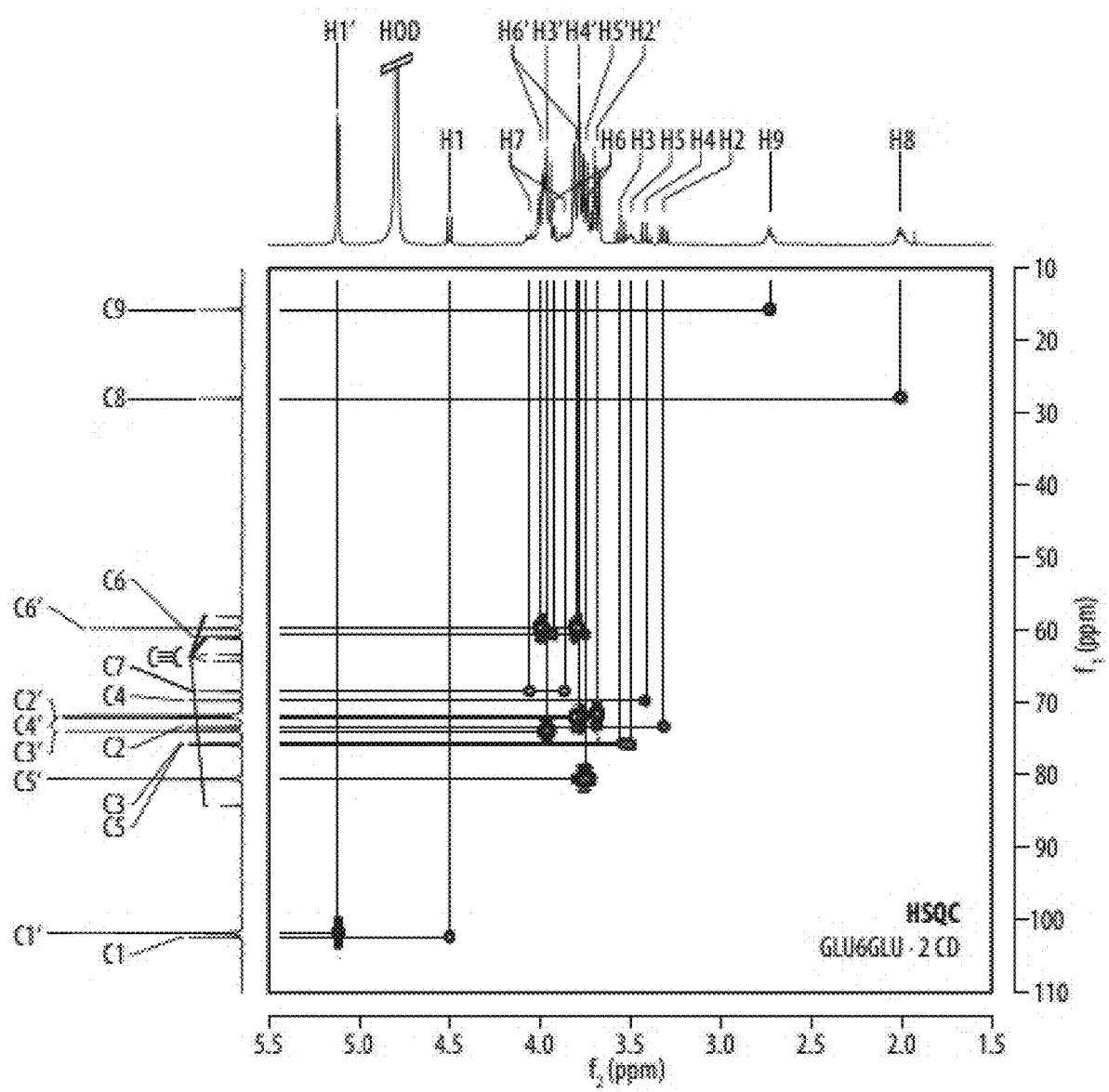
FIG. 41 shows a $^1$H,$^1$H-HSQC NMR spectrum of a rotaxane featuring two α-cyclodextrin hosts.

FIG. 41 shows the $^1$H,$^{13}$C-HSQC NMR spectrum (400 MHz, 297.2 K, D$_2$O) of the [3]rotaxane GLU6GLU.2 CD. The assignment of the signals was strongly corroborated by the cross-peaks in the HSQC spectrum; the splitting of the signal of the diastereotopic CH$_2$ protons H7 was confirmed, in addition to the splitting observed for the CH$_2$ proton signals of H6 (on the oligoyne guest) and H6' (on the cyclodextrin host).

Figure 42:
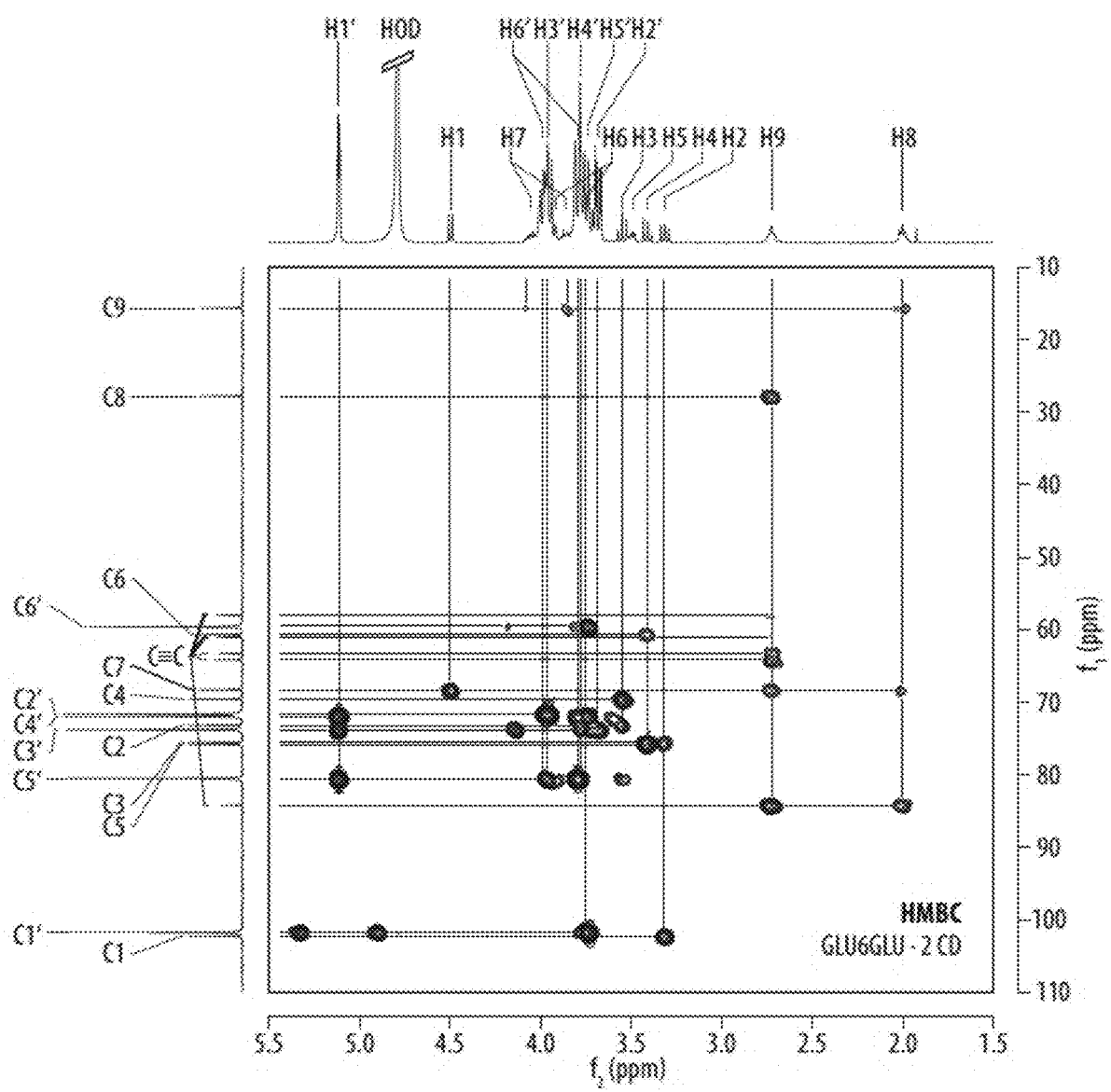
FIG. 42 shows a $^1$H,$^1$H-HMBC NMR spectrum of a rotaxane featuring two α-cyclodextrin hosts.

FIG. 42 shows the $^1$H,$^{13}$C-HMBC NMR spectrum (400 MHz, 297.2 K, D$_2$O) of the [3]rotaxane GLU6GLU.2 CD. The tentative assignment of the signals according to the $^1$H,$^1$H-COSY and $^1$H,$^{13}$C-HSQC NMR spectra was further confirmed by the cross-peaks observed in the HMBC spectrum, which also revealed the coupling of the propylene spacer CH$_2$ protons with the acetylenic carbons.

Figure 43:
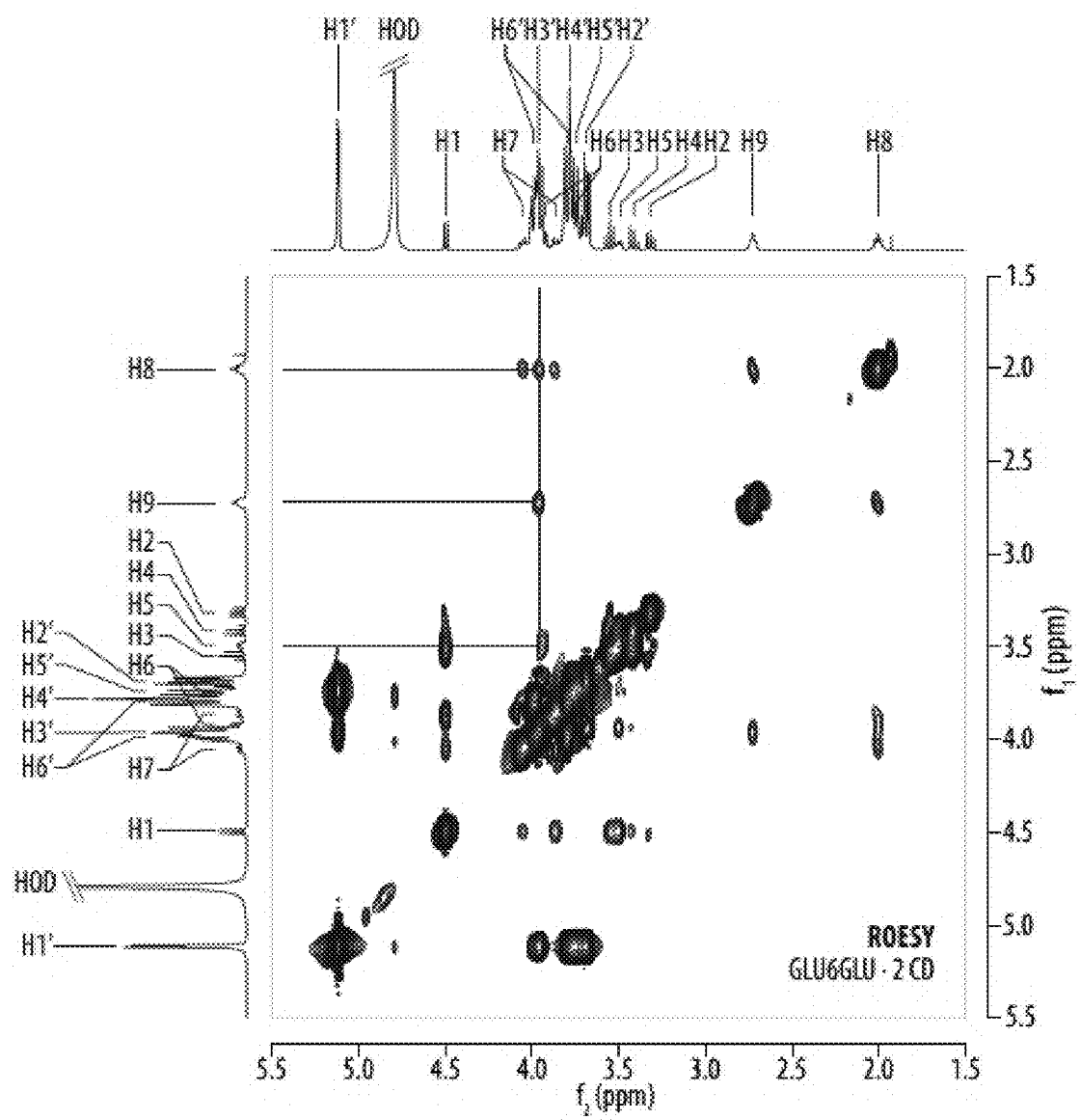
FIG. 43 shows a $^1$H,$^1$H-ROESY NMR spectrum of a rotaxane featuring two α-cyclodextrin hosts.

FIG. 43 shows the $^1$H,$^1$H-ROESY NMR spectrum (400 MHz, 297.2 K, D$_2$O) of the [3]rotaxane GLU6GLU.2 CD. In addition to multiple through-space contacts within the host and guest molecules, respectively, the ROESY NMR spectrum also revealed through-space contacts between H3' of the wider 2,3-rim of the α-cyclodextrin host with the protons H9, H8, and H3 of the hexayne guest.

In the following more experimental details of the exemplary synthesis is described. These details can also be found in the Supplementary Information of in Schrettl et al. *Chem. Sci.*, 2015, 6, 564, DOI: 10.1039/C4SC03154G, which is herein expressly incorporated by reference.

Instrumentation

NMR Spectroscopy was carried out at 297.2 K on Bruker Avance III 400 or 300 spectrometers at frequencies of 400.13 MHz or 300.23 MHz, respectively, for $^1$H nuclei and 100.62 MHz or 75.49 MHz, respectively, for $^{13}$C nuclei. Spectra were calibrated to the residual solvent peak of $CD_2Cl_2$ (5.32 ppm 1H NMR; 54.00 ppm $^{13}$C NMR), $CDCl_3$ (7.26 ppm 1H NMR; 77.16 ppm $^{13}$C NMR), DMSO-$d_6$ (2.50 ppm $^1$H NMR; 39.52 ppm $^{13}$C NMR) or $D_2O$ (4.79 ppm $^1$H NMR). Rotating frame $^1$H,$^1$H nuclear overhauser effect spectroscopy (ROESY) was performed with a mixing time of 200 ms.

High resolution mass spectra were recorded as service measurements at the mass spectrometry service of the Institute of Chemical Sciences and Engineering at EPFL or at the mass spectrometry service of the Institute of Organic Chemistry at the Department of Chemistry and Applied Biosciences at ETH Zurich. Mass spectrometry at EPFL was carried out on either on a Shimadzu Biotech AXIMA-CFR plus for MALDI-TOF, a Waters Q-TOF Ultima for ESI-TOF, or a Thermo Scientific LTQ FT-ICR MS for APPI, whereas mass spectrometry at ETH Zurich was performed on an Ionspec Ultima 494 as well as a Bruker Daltonics maXis for HiRes-ESI-MS, and a Micromass Autospec device for HiRes-EI-MS.

Melting points were measured on a BÜCHI Melting Point M-560 device.

UV/Vis spectra were recorded on a JASCO V670 using 1 cm quartz cuvettes from Hellma. IR spectra were recorded on a JASCO FT/IR 6300 spectrometer using the Miracle Acessory from PIKE. Raman spectra were recorded on a JASCO FT/IR 6300 spectrometer equipped with an RFT-6000 Raman accessory with a 1064 nm laser. Optical rotation values were measured on a JASCO P-2000 at a wavelength of λ=589 nm and with a path length of 10 cm.

Preparative reverse-phase high-performance liquid chromatography (HPLC) was performed on a Waters 600 automated gradient controller pump module, a Waters Prep Degasser, a Waters 2487 dual λ absorbance detector (at UV 220 and 330 nm, respectively), and a Waters Fraction Collector III with a preparative column (Waters Atlantis dC18 OBD 5 μm, 30×150 mm). Elution was carried out with a linear AB gradient, (A) dd $H_2O$, (B) MeCN containing 0.1% v/v acetic!? acid (pH=4) and a flow rate of 20 mL min$^{-1}$.

Materials and Methods

Preparation of Aqueous Dispersions.

Aqueous dispersions of GLU6-TIPS and MEC6-TIPS were prepared by injecting stock solutions of the compounds in organic solvent (400 μL, 10 mg/mL in 1,4-dioxane/methanol 4:1) into MilliQ water (1600 μL). The obtained aqueous dispersions exhibited concentrations of 2 mg/mL of GLU6-TIPS or MEC6-TIPS. These dispersions were vortexed four times for 30 s every 10 min.

Cryogenic Transmission Electron Microscopy (Cryo-TEM).

Cryo-TEM images were recorded on a CM12 EM electron microscope (Philips, Eindhoven, Netherlands) operating at 100 keV. The operation temperature was −180° C., and a cryo-specimen holder Gatan 626 (Warrendale, Pa., USA) was used. Digital micrographs were recorded with a Gatan MultiScan CCD-camera. Samples for cryo-TEM imaging were prepared by the 'plunge freezing' method. For this purpose, a holey or lacey carbon TEM grid was fixed between tweezers, and 5 μL of the sample dispersion were placed onto the grid. The tweezers were subsequently mounted into a 'plunge freezing' apparatus and, after blotting, the grid was immediately dropped into a container filled with liquid ethane that was surrounded by liquid nitrogen.

UV-Vis Spectroscopy with Aqueous Dispersions. For UV-Vis spectroscopy, the aqueous dispersions of GLU6-TIPS and MEC6-TIPS were further diluted with MilliQ water to a final concentration of 2 μg/mL (c=3.83 μmol/L, 4.97 μmol/L, respectively). In order to prove the reversibility of the aggregation into colloidal aggregates, the 0.5 mL of the aqueous dispersions were subsequently diluted with 1.5 mL of MeCN, to a final concentration of c=0.96 μmol/L and c=1.24 μmol/L, respectively.

Dynamic Light Scattering (DLS).

The size distribution of samples was determined by dynamic light scattering using a Nano-ZS (Malvern Instruments). For the measurements, the aqueous dispersions of GLU6-TIPS and MEC6-TIPS (c=2 mg/mL, in dioxane/MeOH/water 4:1:20) were further diluted with MilliQ water (800 μL). The scattered intensity fluctuations were collected at a fixed angle of 173° by averaging 3 runs.

Depolarized Dynamic Light Scattering (DDLS).

The DDLS measurements were performed at 21° C., using a commercial goniometer instrument (3D LS Spectrometer, LS Instruments AG, Switzerland). The incident light was formed by a linearly polarized and collimated laser beam (HeNe, 632.8 nm, 21 mW), and the scattered light was collected by single-mode optical fibers having integrated collimation optics. Collected light was coupled into two high-sensitivity APD detectors (Perkin Elmer, Single Photon Counting Module), and their outputs were fed into a two-channel multiple-tau correlator (Correlator.com). The signal-to-noise ratio was improved by cross-correlating these two channels. With respect to the primary beam, depolarized scattering was observed via cross-polarizers. The incoming laser beam passed through a Glan-Thompson polarizer with an extinction ratio of 10$^{-6}$, and another Glan-Thompson polarizer, with an extinction ratio of 10$^{-8}$, was mounted in front of the collection optics.

UV Irradiation.

The UV irradiation was carried out using a 250 W Ga-doped medium-pressure Hg lamp with multiple strong bands between wavelengths of 600-250 nm (UV-Light Technology, Birmingham, United Kingdom). The lamp was placed 50 cm away from the samples for the illumination.

Synthetic Procedures and Analytical Data

General Procedures.

Unless otherwise noted, all reactions were carried out in dried Schlenk glassware in an inert argon atmosphere. Chromatography solvents were purchased as reagent grade and distilled once prior to use. For reactions, acetonitrile, dichloromethane, tetrahydrofuran, and toluene were purchased as HPLC grade and dried using a solvent purification system from Innovative Technologies. Diethyl ether and methanol were purchased dry over molecular sieves from Acros. All reagents were commercially obtained and used without further purification. β-D-Glucose pentaacetate (98%), boron trifluoride etherate (48% $BF_3$), N-bromosuccinimide (99%), n-butyl lithium (2.5 M in hexanes), methyl lithium lithium bromide complex (2.2 M in diethyl ether) and $ZnCl_2$ (0.7 M in THF) were purchased from Acros Organics, 4-pentyn-1-ol (97%) and silver nitrate (>99%) were purchased from Sigma-Aldrich, and PdCl$_2$(dppf) DCM was purchased from Boron Molecular. TIPS-C≡C—H was purchased from Fluorochem. The acetylenic building blocks TIPS-(C≡C)$_2$-TMS, TMS-(C≡C)$_2$-TMS, and TIPS-(C≡C)$_3$-TMS as well as 4-tritylphenol, were synthesized according procedures known to the skilled person. The zinc acetylides TIPS-C≡C—ZnCl 1, TIPS-(C≡C)$_2$—ZnCl 2a, TMS-(C≡C)$_2$—ZnCl 2b, and TIPS-(C≡C)$_3$—ZnCl 3 were prepared in situ as described in the procedures below. Caution: The stability of oligoyne derivatives is strongly dependent on the end groups; Although no explosions were encountered during the work described below, great care should be taken when carrying out similar reactions.

TLC analyses were performed on TLC plates from Merck (Silica gel 60 F254). UV-light (254 nm) or anisaldehyde staining was used for detection. Column chromatography was conducted on Geduran silica gel Si 60 from Merck (40-60 µm) or on Acros ultrapure silica gel 60A (40-60 µm). For MALDI-TOF mass spectroscopy either α-cyano-4-hydroxycinnamic acid (CCA), 2,5-dihydroxybenzoic acid (DHB), or trans-2[3-(4-tert-butylphenyl)-2-methyl-2-propenylidene]malononitrile (DCTB) were used as the matrix materials.

Pent-4'-ynyl 2,3,4,6-tetra-O-acetyl-β-D-glucopyranoside 4

β-D-Glucose pentaacetate (47.25 g, 121.05 mmol) and 4-pentyn-1-ol (15.71 g, 186.76 mmol) were dissolved in DCM (600 mL). The mixture was cooled to 0° C., and boron trifluoride etherate (35.4 g, 249.44 mmol) was added. The cooling bath was removed, and the reaction was stirred for 7 h. The mixture was washed three times with saturated aqueous NaHCO$_3$ solution and once with saturated aqueous NaCl solution. The organic phase was dried over MgSO$_4$, and column chromatography (silica gel, heptane/EtOAc 1:2) yielded 4 (23.55 g, 47%) as a colorless syrup which solidified after two days. $^1$H NMR (400 MHz, CD$_2$Cl$_2$): δ=5.19 (dd, J=9.6 Hz, 1H, H3), 5.03 (dd, J=9.9 Hz, 1H, H4), 4.91 (dd, J=8.0 Hz, 9.7 Hz, 1H, H2), 4.51 (d, J=8.0 Hz, 1H, H1), 4.24 (dd, J=4.8 Hz, 12.3 Hz, 1H, H6), 4.09 (dd, J=2.5 Hz, 12.3 Hz, 1H, H6), 3.92 (dt, J=9.8 Hz, 5.7 Hz, 1H, OCHH), 3.71 (ddd, J=10.0 Hz, 4.8 Hz, 2.5 Hz, 1H, H5), 3.62 (ddd, J=9.8 Hz, 7.7 Hz, 5.4 Hz, 1H, OCHH), 2.23 (dt, J=7.4 Hz, 2.7 Hz, 2H, CCCH$_2$), 2.05 (s, 3H, CH$_3$), 2.02 (s, 3H, CH$_3$), 1.99 (s, 3H, CH$_3$), 1.98 (t, J=2.7 Hz, CCH), 1.96 (s, 3H, CH$_3$), 1.83-1.70 (m, 2H, CCCH$_2$CH$_2$). 13C NMR (101 MHz, CD$_2$Cl$_2$) δ=171.0, 170.5, 169.9, 169.8 (4 C=O), 101.5 (C1), 83.9 (C≡C), 73.2 (C3), 72.3 (C5), 71.8 (C2), 69.1 (C4), 69.0 (OCH$_2$), 69.0 (C≡C), 62.5 (C6), 28.9 (OCH$_2$CH$_2$), 21.0, 21.0, 21.0, 21.0 (4 COCH$_3$), 15.3 (CCCH$_2$). IR (ATR) ν 3290, 3273, 2957, 2886, 1737, 1430, 1367, 1253, 1219, 1169, 1056, 1031 (cm$^{-1}$). [α]$_D^{23}$ 126.7 (c 0.22, MeCN). HRMS (ESI): calcd C$_{19}$H$_{30}$NO$_{10}$: ([M+NH$_4$]$^+$) 432.1864; found 409.1870 R$_f$: 0.39 (EtOAc/n-heptane 1:1).

5'-Bromopent-4'-ynyl 2,3,4,6-tetra-O-acetyl-β-D-glucopyranoside 5

Pent-4'-ynyl 2,3,4,6-tetra-O-acetyl-β-D-glucopyranoside 4 (12.49 g, 30.15 mmol) was dissolved in MeCN (250 mL), and the flask was wrapped with aluminum foil. N-Bromosuccinimide (5.15 g, 31.60 mmol) and AgNO$_3$ (2.55 g, 15.01 mmol) were added, and the mixture was stirred for 15 h. The reaction was quenched by the addition of a concentrated aqueous KCl solution (1.33 g, 17.77 mmol KCl in 5 mL DI water). The mixture was filtered through a paper filter and precipitated into deionized water (3 L). The mixture was stirred for 2 d, and the precipitate was filtered and redissolved with acetone. The solution was concentrated, DCM was added, and the solution was washed once with water and once with saturated aqueous NaCl solution. The organic phase was dried over MgSO$_4$ and evaporated in vacuo to yield 5'-bromopent-4'-ynyl 2,3,4,6-tetra-O-acetyl-β-D-glucopyranoside 5 (13.77 g, 93%) as a colorless solid. $^1$H NMR (400 MHz, CD$_2$Cl$_2$) δ=5.19 (dd, J=9.6 Hz, 1H, H3), 5.03 (dd, J=9.7 Hz, 1H, H4), 4.91 (dd, J=9.7, 8.0 Hz, 1H, H2), 4.50 (d, J=8.0 Hz, 1H, H1), 4.24 (dd, J=12.3, 4.9 Hz, 1H, H6), 4.09 (dd, J=12.3, 2.5 Hz, 1H, H6), 3.90 (dt, J=9.9, 5.6 Hz, 1H, OCHH), 3.72 (ddd, J=10.0, 4.8, 2.5 Hz, 1H, H5), 3.59 (ddd, J=9.8, 7.7, 5.4 Hz, 1H, OCHH), 2.27 (t, J=7.0 Hz, 2H, CCCH$_2$), 2.05 (s, 3H, CH$_3$), 2.02 (s, 3H, CH$_3$), 1.99 (s, 3H, CH$_3$), 1.97 (s, 3H, CH$_3$), 1.83-1.68 (m, 2H, CCCH$_2$CH$_2$). $^{13}$C NMR (101 MHz, CD$_2$Cl$_2$) δ=171.0, 170.5, 169.9, 169.8 (4 C=O), 101.5 (C1), 79.9 (C≡C), 73.2 (C3), 72.3 (C5), 71.8 (C2), 69.0 (C4), 68.9 (OCH$_2$), 62.5 (C6), 38.5 (C≡C), 28.7 (OCH$_2$CH$_2$), 21.0, 21.0, 21.0, 21.0 (4 COCH$_3$), 16.5 (CCCH$_2$). IR (ATR) ν 2965, 2943, 2882, 1740, 1431, 1370, 1221, 1166, 1056, 1032 (cm$^{-1}$). [α]$_D^{23}$ 148.4 (c 0.20, MeCN). HRMS (ESI): calcd for C$_{19}$H$_{25}$BrO$_{10}$Na ([M+Na]$^+$) 515.0523; found 515.0530. R$_f$: 0.39 (EtOAc/n-heptane 1:1).

9'-Trimethylsilylnona-4',6',8'-triynyl 2,3,4,6-tetra-O-acetyl-β-D-glucopyranoside 6

1,4-Bis(trimethylsilyl)butadiyne (8.08 g, 41.56 mmol) was dissolved in THF (65 mL), cooled to 0° C., and MeLi.LiBr complex (18.5 mL, 2.2 M in Et$_2$O, 40.70 mmol) was added. The cooling bath was removed and the mixture was stirred for 60 min before it was cooled to 0° C. again. ZnCl$_2$ (60 mL, 0.7 M in THF, 42.0 mmol) was added, the cooling bath was removed, and the resulting mixture was stirred for 60 min in order to form TMS-(C≡C)$_2$—ZnCl 2b. In a second flask, 5'-bromopent-4'-ynyl 2,3,4,6-tetra-O-acetyl-β-D-glucopyranoside 5 (10.00 g, 20.27 mmol) was dissolved in dry toluene (300 mL), and PdCl$_2$(dppf).DCM (1.66 g, 2.03 mmol) was added. The two solutions were combined at 0° C., the flask was wrapped with aluminum foil, and the resulting mixture was stirred for 20 h at 0° C. before it was diluted with Et$_2$O, washed once with saturated NH$_4$Cl solution, and once with saturated NaCl solution. The organic phase was dried over MgSO$_4$ and concentrated in vacuo. Column chromatography (silica gel; EtOAc/n-heptane 1:2) yielded 6 (8.37 g, 77%) as a light brown solid. $^1$H NMR (400 MHz, CD$_2$Cl$_2$) δ=5.19 (dd, J=9.6 Hz, 1H, H3), 5.03 (dd, J=9.9 Hz, 1H, H4), 4.90 (dd, J=9.7, 8.0 Hz, 1H, H2), 4.50 (d, J=8.0 Hz, 1H, H1), 4.24 (dd, J=12.3, 4.9 Hz, 1H, H6), 4.09 (dd, J=12.3, 2.5 Hz, 1H, H6), 3.90 (dt, J=9.9, 5.5 Hz, 1H, OCHH), 3.72 (ddd, J=10.0, 4.9, 2.5 Hz, 1H, H5), 3.59 (ddd, J=9.9, 7.8, 5.2 Hz, 1H, OCHH), 2.38 (t, J=7.0 Hz, 2H, CCCH$_2$), 2.05 (s, 3H, CH$_3$), 2.02 (s, 3H, CH$_3$), 1.99 (s, 3H, CH$_3$), 1.96 (s, 3H, CH$_3$), 1.88-1.72 (m, 2H, CCCH$_2$CH$_2$), 0.19 (s, 9H, Si(CH$_3$)$_3$). $^{13}$C NMR (101 MHz, CD$_2$Cl$_2$) δ=170.9, 170.5, 169.9, 169.8 (4 C=O), 101.5 (C1), 88.4, 86.5, 80.7 (3 C≡C), 73.2 (C3), 72.4 (C5), 71.7 (C2), 69.0 (C4), 68.7 (OCH$_2$), 66.1, 62.6 (2 C≡C), 62.5 (C6), 60.4 (C≡C), 28.5 (OCH$_2$CH$_2$), 21.0, 21.0, 21.0, 21.0 (4 COCH$_3$), 16.4 (CCCH$_2$), −0.3 (Si(CH$_3$)$_3$). IR (ATR) ν 2960, 2939, 2898, 2206, 2163, 2072, 1745, 1378, 1365, 1240, 1206, 1165, 1068, 1035 (cm$^{-1}$). UV (MeCN) λ$_{max}$ (log ε) 220 (5.02), 209 (5.06), 200 (4.89) nm. [α]$_D^{23}$ 149.8 (c 0.21, MeCN). HRMS (ESI): calcd for $C_{26}H_{34}O_{10}SiNa$ ([M+Na]$^+$) 557.1813; found 557.1832. $R_f$: 0.40 (EtOAc/n-heptane 1:1).

9'-Bromonona-4',6',8'-triynyl 2,3,4,6-tetra-O-acetyl-β-D-glucopyranoside 7.

9'-Trimethylsilylnona-4',6',8'-triynyl 2,3,4,6-tetra-O-acetyl-β-D-glucopyranoside 6 (3.50 g, 6.55 mmol) was dissolved in dry MeCN (80 mL) and the flask was wrapped with aluminum foil. N-Bromosuccinimide (1.23 g, 6.87 mmol) and AgF (872 mg, 6.87 mmol) were added, and the resulting mixture was stirred for 3 h. The mixture was precipitated into deionized water (1 L), and the precipitate was filtered to yield 7 (2.86 g, 81%) as a yellow solid. $^1$H NMR (400 MHz, $CD_2Cl_2$) δ=5.19 (dd, J=9.6 Hz, 1H, H3), 5.03 (dd, J=9.7 Hz, 1H, H4), 4.90 (dd, J=9.7, 8.0 Hz, 1H, H2), 4.50 (d, =8.0 Hz, 1H, H1), 4.24 (dd, J=12.3, 4.9 Hz, 1H, H6), 4.09 (dd, J=12.3, 2.4 Hz, 1H, H6), 3.90 (dt, J=9.9, 5.5 Hz, 1H, OCHH), 3.72 (ddd, J=10.0, 4.8, 2.5 Hz, 1H, H5), 3.59 (ddd, J=9.9, 7.8, 5.2 Hz, 1H, OCHH), 2.37 (t, J=7.0 Hz, 2H, CCCH$_2$), 2.05 (s, 3H, CH$_3$), 2.02 (s, 3H, CH$_3$), 1.99 (s, 3H, CH$_3$), 1.96 (s, 3H, CH$_3$), 1.89-1.71 (m, 2H, CCCH$_2$CH$_2$). $^{13}$C NMR (101 MHz, $CD_2Cl_2$) δ=170.9, 170.5, 169.9, 169.8 (4 C=O), 101.4 (C1), 79.7 (C≡C), 73.1 (C3), 72.4 (C5), 71.7 (C2), 68.9 (C4), 68.7 (OCH$_2$), 66.3, 65.9 (2 C≡C), 62.4 (C6), 60.6, 60.1, 40.4 (3 C=C), 28.4 (OCH$_2$CH$_2$), 21.0, 21.0, 21.0, 21.0 (4 COCH$_3$), 16.3 (CCCH$_2$). IR (ATR) ν 2958, 2931, 2878, 2218, 2186, 1738, 1426, 1373, 1232, 1206, 1161, 1092, 1066, 1052, 1035 (cm$^{-1}$). UV (MeCN) $\lambda_{max}$ (log ε) 212 (4.97) nm. $[\alpha]_D^{23}$ 127.75 (c 0.24, MeCN). HRMS (ESI): calcd for $C_{23}H_{25}BrO_{10}Na$ ([M+Na]$^+$) 563.0523; found 563.0526. $R_f$: 0.35 (EtOAc/n-heptane 1:1).

5-Tritylphenyl hex-5-ynoate 8

4-Tritylphenol (20.00 g, 59.5 mmol) was dissolved in a mixture of dry toluene (100 mL) and dry DCM (100 mL). 5-Hexynoic acid (8.08 g, 71.4 mmol), 4-dimethylaminopyridinium p-toluenesulfonate (0.87 g, 2.97 mmol), as well as 1-ethyl-3-(3-dimethylaminopropyl)-carbodiimide hydrochloride (14.86 g, 71.4 mmol) were successively added to this solution. The mixture was stirred at room temperature for 8 h, after which 4-tritylphenol was consumed according to TLC. After dilution with DCM (400 mL) the mixture was washed three times with 1 M HCl, once with saturated NaHCO$_3$ solution, and once with saturated NaCl solution. The organic phase was dried over Na$_2$SO$_4$, and concentrated in vacuo. Recrystallization (DCM/n-heptane 1:2) afforded 4-tritylphenyl hex-5-ynoate 8 (23.63 g, 54.9 mmol, 92%) as a colorless crystalline solid. $^1$H NMR (400 MHz, CDCl$_3$): δ=7.44-7.07 (m, 17H, PhH), 7.06-6.87 (m, 2H, PhH), 2.72 (t, J=7.4 Hz, 2H, C$_2$H), 2.36 (td, =7.0, 2.7 Hz, 2H, C$_4$H), 2.02 (t, J=2.7 Hz, 1H, —CH), 1.97 (p, =14.4, 7.4 Hz, 2H, C$_3$H). $^{13}$C NMR (101 MHz, CDCl$_3$): δ=171.7 (COOPhTr), 148.7, 146.7, 144.4, 132.2, 131.2, 127.7, 126.1, 120.5 (24C, C—Ar), 83.2, 69.5 (2 C≡C), 64.7 (CTr), 33.1 (C2), 23.6 (C3), 17.9 (C4). Mp: 174-175° C. IR (ATR) ν 3260, 3082, 3053, 3030, 2975, 1747, 1591, 1491, 1441, 1383, 1339, 1254, 1203, 1168, 1134, 1081, 1035, 1014 (cm$^{-1}$). HRMS (MALDI): calcd for $C_{31}H_{26}O_2Na$: ([M+Na]$^+$) 453.1826; found: 453.1851. $R_f$: 0.56, (EtOAc/n-heptane 1:1), 0.50 (DCM/n-heptane 2:1).

4-Tritylphenyl 6-bromohex-5-ynoate 9

4-Tritylphenyl hex-5-ynoate 8 (20.0 g, 46.5 mmol) was dissolved in dry DCM (200 mL), and dry MeCN was added (200 mL). The flask was shielded from light with aluminum foil, and N-bromosuccinimide (8.69 g, 48.8 mmol) as well as silver nitrate (2.37 g, 13.9 mmol) were successively added. The resulting mixture was stirred at room temperature for 3 h after which it was diluted with DCM, washed four times with 1 M HCl, and once with saturated NaCl solution. The organic phase was dried over Na$_2$SO$_4$ and concentrated in vacuo. Column chromatography (silica gel; DCM/n-heptane 2:1) afforded 4-tritylphenyl 6-bromohex-5-ynoate 9 (22.78 g, 44.7 mmol, 96%) as an off-white solid. $^1$H NMR (400 MHz, CDCl$_3$): δ=7.33-7.16 (m, 17H, PhH), 7.08-6.94 (m, 2H, PhH), 2.71 (t, J=7.4 Hz, 2H, C$_2$H), 2.39 (t, J=6.9 Hz, 2H, C$_4$H), 1.97 (p, J=7.1 Hz, 2H, C$_3$H). $^{13}$C NMR (101 MHz, CDCl$_3$): δ=171.6 (COOPhTr), 148.7, 146.7, 144.5, 132.2, 131.2, 127.7, 126.1, 120.4 (24C, C—Ar), 79.1 (≡C), 64.7 (CTr), 39.3 (≡C), 33.1 (C2), 23.5 (C3), 19.2 (C4). Mp: 124-125° C. IR (ATR) ν 3085, 3055, 3029, 2940, 2909, 1755, 1594, 1492, 1444, 1409, 1370, 1311, 1265, 1204, 1169, 1083, 1034, 1017 (cm$^{-1}$). HRMS (MALDI): calcd for $C_{31}H_{26}O_2Na$: ([M+Na]$^+$) 531.0930; found: 531.0923. $R_f$: 0.64 (DCM/n-heptane 2:1).

4-Tritylphenyl 10-(trimethylsilyl)deca-5,7,9-triynoate 10

MeLi.LiBr complex (17.9 mL, 2.2 M in Et$_2$O, 39.26 mmol) was added to 1,4-bis(trimethylsilyl)butadiyne (7.82 g, 40.24 mmol) in THF (50 mL) at 0° C., and the resulting mixture was stirred for 30 minutes. Then ZnCl$_2$ (57.5 mL, 0.7 M in THF, 40.24 mmol) was added at 0° C., and the resulting mixture was again stirred for 30 min in order to form TMS-(C≡C)$_2$—ZnCl 2b. In another flask, 4-tritylphenyl 6-bromohex-5-ynoate 9 (10.0 g, 19.63 mmol) and PdCl$_2$(dppf).DCM (1.60 g, 1.96 mmol) were mixed in toluene (300 mL). The two solutions were combined at 0° C., and the flask was wrapped with aluminum foil. The mixture was stirred for 16 h while warming up to room temperature, before it was diluted with Et$_2$O, washed three times with saturated NH$_4$Cl solution and once with saturated NaCl solution. The organic phase was dried over Na$_2$SO$_4$ and concentrated in vacuo. Column chromatography (silica gel; DCM/n-heptane 1:1) yielded 10 (7.7 g, 71%) as a light brown solid. $^1$H NMR (400 MHz, CDCl$_3$): δ=7.30-7.16 (m, 17H), 7.01-6.95 (m, 2H), 2.69 (t, J=7.3 Hz, 2H), 2.47 (t, J=6.9 Hz, 2H), 1.98 (p, J=7.0 Hz, 2H), 0.20 (s, 9H). $^{13}$C NMR (101 MHz, CDCl$_3$): δ=171.4, 148.6, 146.7, 144.5, 132.3, 131.2, 127.7, 126.1, 120.4, 88.3, 86.1, 79.3, 66.7, 64.7, 62.3, 60.6, 33.0, 23.2, 19.0, −0.3. Mp: 119-121° C. IR (ATR) ν 3086, 3056, 3030, 2956, 2922, 2851, 2210, 2168, 2079, 1758, 1595, 1492, 1444, 1409, 1369, 1335, 1308, 1251, 1205, 1170, 1130, 1018 (cm$^{-1}$). UV (cyclohexane) $\lambda_{max}$ (log E) 221 (5.02), 212 (5.02) nm. HRMS (MALDI): calcd for $C_{38}H_{34}O_2SiNa$: 573.2219 ([M+Na]$^+$); found: 573.2201. $R_f$: 0.33 (DCM/n-heptane 1:1).

4-Tritylphenyl 10-bromodeca-5,7,9-triynoate 11

4-Tritylphenyl 10-(trimethylsilyl)-deca-5,7,9-triynoate 10 (0.493 g, 0.908 mmol) was dissolved in DCM (12 mL) and acetonitrile (10 mL) was added. The flask was wrapped in aluminum foil, and N-bromosuccinimide (0.172 g, 0.953 mmol) as well as silver fluoride (0.122 g, 0.953 mmol) were added at room temperature. After 6 h, the reaction mixture was transferred into a separatory funnel and diluted with DCM (30 mL). The organic phase was washed six times with 1 M HCl (100 mL) and once with saturated NaCl solution. The organic phase was dried over Na$_2$SO$_4$, and concentrated to approximately 10 mL while thoroughly shielding it from light. For synthetic purposes, toluene was added, and the mixture was concentrated in vacuo. For analytic purposes, CDCl$_3$ (10 mL) was added, and the mixture was concentrated in vacuo. $^1$H NMR (400 MHz, CDCl$_3$): δ=7.30-7.20 (m, 17H), 7.02-6.98 (m, 2H), 2.71 (t, J=7.3 Hz, 2H), 2.48 (t, J=6.9 Hz, 2H), 2.00 (tt, J=7.1 Hz, 2H). $^{13}$C NMR (101 MHz, CDCl$_3$): δ=171.2, 148.5, 146.6, 144.5, 132.2, 130.1, 127.6, 126.1, 120.4, 78.3, 66.4, 66.1, 64.7, 60.8, 59.6, 53.6, 39.9, 33.0, 23.1, 18.8. HRMS (MALDI): calcd for C$_{35}$H$_{25}$BrNaO$_2$: 581.0927 ([M+Na]$^+$); found: 581.0914.

7'-Triisopropylsilylhepta-4',6'-diynyl 2,3,4,6-tetra-O-acetyl-β-D-glucopyranoside TAG2

Ethynyl-triisopropylsilane (0.82 mL, 3.65 mmol) was dissolved in THF (10 mL). The mixture was cooled to 0° C., and n-butyl lithium (1.42 mL, 2.5 M in n-hexane, 3.55 mmol) was added. The cooling bath was removed, and the mixture was stirred for 30 min before it was cooled to 0° C. again. ZnCl$_2$ (5.08 mL, 0.7 M in THF, 3.55 mmol) was added, the cooling bath was removed, and the resulting mixture was stirred for 30 min in order to form TIPS-C≡C—ZnCl 1. In a second flask, 5'-bromopent-4'-ynyl 2,3,4,6-tetra-O-acetyl-β-D-glucopyranoside 5 (1.00 g, 2.03 mmol) was dissolved in dry toluene (30 mL), and PdCl$_2$(dppf).DCM (66 mg, 0.102 mmol) was added. The two solutions were combined at 0° C., the flask was wrapped with aluminum foil, and the resulting mixture was stirred over night at 0° C. The following day, [1,1'-bis(ditert.-butyl phosphino)ferrocene]palladiumdichloride (10 mg, 0.015 mmol) was added. The mixture was stirred for 3 h at 0° C., before more [1,1'-bis(ditert.-butyl phosphino)ferrocene] palladiumdichloride (11 mg, 0.017 mmol) was added, and the resulting mixture was stirred for 4 d at room temperature. Then, the mixture was diluted with Et$_2$O, washed once with saturated NH$_4$Cl solution, and once with saturated NaCl solution. The organic phase was dried over MgSO$_4$ and concentrated in vacuo. Column chromatography (silica gel, EtOAc/n-heptane 1:2) yielded TAG2 (971 mg, 87%) as a yellow oil, which solidified after two weeks. $^1$H NMR (400 MHz, CD$_2$Cl$_2$) δ=5.19 (dd, J=9.6 Hz, 1H, H3), 5.03 (dd, J=10.0 Hz, 1H, H4), 4.91 (dd, J=9.7, 8.0 Hz, 1H, H2), 4.52 (d, J=8.0 Hz, 1H, H1), 4.25 (dd, J=12.3, 4.9 Hz, 1H, H6), 4.09 (dd, J=12.3, 2.5 Hz, 1H, H6), 3.90 (dt, J=9.9, 5.6 Hz, 1H, OCHH), 3.72 (ddd, J=10.0, 4.9, 2.5 Hz, 1H, H5), 3.62 (ddd, J=9.9, 7.8, 5.3 Hz, 1H, OCHH), 2.36 (t, J=7.0 Hz, 2H, CCCH$_2$), 2.05 (s, 3H, CH$_3$), 2.03 (s, 3H, CH$_3$), 1.99 (s, 3H, CH$_3$), 1.97 (s, 3H, CH$_3$), 1.86-1.72 (m, 2H, CCCH$_2$CH$_2$), 1.07 (s, 21H, Si(CH(CH$_3$)$_2$)$_3$). $^{13}$C NMR (101 MHz, CD$_2$Cl$_2$) δ=171.0, 170.5, 169.9, 169.8 (4 C=O), 101.5 (C1), 90.5, 80.9, 78.4 (3 C≡C), 73.2 (C3), 72.4 (C5), 71.8 (C2), 69.0 (C4), 68.9 (OCH$_2$), 66.5 (C≡C), 62.5 (C6), 28.7 (OCH$_2$CH$_2$), 21.1, 21.0, 21.0, 21.0 (4 COCH$_3$), 18.9 (Si(CH(CH$_3$)$_2$)$_3$), 16.2 (CCCH$_2$), 11.8 (Si(CH(CH$_3$)$_2$)$_3$). IR (ATR) ν 2945, 2864, 2225, 2104, 1741, 1462, 1428, 1365, 1255, 1225, 1168, 1130, 1090, 1060, 1036 (cm$^{-1}$). UV (MeCN, c=4.21 μmol/L) λ$_{max}$ (log ε) 196 (4.65) nm. [α]$_D^{23}$ 123.00 (c 0.25, MeCN). HRMS (ESI): calcd. for C$_{30}$H$_{50}$NO$_{10}$Si ([M+NH$_4$]$^+$) 612.3198; found 612.3197. R$_f$: 0.45 (EtOAc/n-heptane 1:1).

9'-Triisopropylsilylnona-4',6',8'-triynyl 2,3,4,6-tetra-O-acetyl-β-D-glucopyranoside TAG3

1-Triisopropylsilyl-4-trimethysilylbutadiyne (1.02 g, 3.65 mmol) was dissolved in THF (10 mL), cooled to 0° C., and MeLi.LiBr complex (1.61 mL, 2.2 M in Et$_2$O, 3.55 mmol) was added. The cooling bath was removed and the resulting mixture was stirred for 30 min before it was cooled to 0° C. again. ZnCl$_2$ (5.08 mL, 0.7 M in THF, 3.55 mmol) was added, the cooling bath was removed, and the resulting mixture was stirred for 30 min in order to form TIPS-(C≡C)$_2$—ZnCl 2a. In a second flask, 5'-bromopent-4'-ynyl 2,3,4,6-tetra-O-acetyl-β-D-glucopyranoside 5 (1.00 g, 2.03 mmol) was dissolved in dry toluene (30 mL), and PdCl$_2$(dppf).DCM (83 mg, 0.102 mmol) was added. The two solutions were combined at 0° C., the flask was wrapped with aluminum foil, the resulting mixture was stirred for 6 h at 0° C. and allowed to warm to room temperature over night. Then, the mixture was diluted with Et$_2$O, washed once with saturated NH$_4$Cl solution, and once with saturated NaCl solution. The organic phase was dried over MgSO$_4$ and concentrated in vacuo. Column chromatography (silica gel; EtOAc/n-heptane 1:2) yielded TAG3 (974 mg, 78%) as a light brown solid. $^1$H NMR (400 MHz, CD$_2$Cl$_2$) δ=5.19 (dd, J=9.6 Hz, 1H, H3), 5.03 (dd, j=10.0 Hz, 1H, H4), 4.91 (dd, =9.7, 8.0 Hz, 1H, H2), 4.50 (d, J=8.0 Hz, 1H, H1), 4.24 (dd, J=12.3, 4.9 Hz, 1H, H6), 4.10 (dd, J=12.3, 2.5 Hz, 1H, H6), 3.90 (dt, J=9.9, 5.5 Hz, 1H, OCHH), 3.72 (ddd, J=10.0, 4.9, 2.5 Hz, 1H, H5), 3.60 (ddd, J=9.9, 7.8, 5.2 Hz, 1H, OCHH), 2.38 (t, J=6.9 Hz, 2H, CCCH$_2$), 2.05 (s, 3H, CH$_3$), 2.02 (s, 3H, CH$_3$), 1.99 (s, 3H, CH$_3$), 1.97 (s, 3H, CH$_3$), 1.88-1.71 (m, 2H, CCCH$_2$CH$_2$), 1.11-1.02 (m, 21H, Si(CH(CH$_3$)$_2$)$_3$)). $^{13}$C NMR (101 MHz, CD$_2$Cl$_2$) δ=171.0, 170.5, 169.9, 169.8 (4 C=O), 101.5 (C1), 90.2, 84.1, 80.3 (3 C≡C), 73.2 (C3), 72.4 (C5), 71.8 (C2), 69.0 (C4), 68.7 (C≡C), 66.1 (OCH$_2$), 62.5 (C6), 61.6, 60.8 (2 C≡C), 28.5 (OCH$_2$CH$_2$), 21.0, 21.0, 21.0, 21.0 (4 COCH$_3$), 18.8 (Si(CH(CH$_3$)$_2$)$_3$), 16.4 (CCCH$_2$), 11.8 (Si(CH(CH$_3$)$_2$)$_3$). IR (ATR) ν 2948, 2867, 2210, 2163, 2074, 1748, 1460, 1432, 1366, 1239, 1206, 1165, 1100, 1067, 1032 (cm$^{-1}$). UV (MeCN, c=3.65 μmol/L) λ$_{max}$ (log E) 222 (4.96), 213 (4.95) nm. [α]$_D^{23}$ 139.34 (c 0.23, MeCN). HRMS (ESI): calcd. for C$_{32}$H$_{50}$NO$_{10}$Si ([M+NH$_4$]$^+$) 636.3198; found 636.3214. R$_f$: 0.45 (EtOAc/n-heptane 1:1).

11'-Triisopropylsilylundeca-4',6',8',10'-tetraynyl 2,3,4,6-tetra-O-acetyl-β-D-glucopyranoside TAG4

1-Triisopropylsilyl-6-trimethysilylhexatriyne (1.15 g, 3.8 mmol) was dissolved in THF (10 mL), cooled to 0° C., and MeLi.LiBr complex (1.61 mL, 2.2 M in Et$_2$O, 3.55 mmol) was added. The cooling bath was removed and the resulting mixture was stirred for 30 min before it was cooled to 0° C. again. ZnCl$_2$ (5.08 mL, 0.7 M in THF, 3.55 mmol) was added, the cooling bath was removed, and the resulting mixture was stirred for 30 min in order to form TIPS-(C≡C)$_3$—ZnCl 3. In a second flask, 5'-bromopent-4'-ynyl 2,3,4,6-tetra-O-acetyl-β-D-glucopyranoside 5 (1.00 g, 2.03 mmol) was dissolved in dry toluene (30 mL), and PdCl$_2$(dppf).DCM (83 mg, 0.102 mmol) was added. The two solutions were combined at 0° C., the flask was wrapped with aluminum foil, the resulting mixture was stirred for 6 h at 0° C. and allowed to warm to room temperature over night. After 4 d at room temperature, the mixture was diluted with Et$_2$O, washed once with saturated NH$_4$Cl solution, and once with saturated NaCl solution. The organic phase was dried over MgSO$_4$ and concentrated in vacuo. Column chromatography (silica gel; EtOAc/n-heptane 1:2) yielded TAG4 (666 mg, 51%) as a brown foam. $^1$H NMR (400 MHz, CD$_2$Cl$_2$) δ=5.19 (dd, J=9.6 Hz, 1H, H3), 5.03 (dd, =10.0 Hz, 1H, H4), 4.91 (dd, J=9.7, 8.0 Hz, 1H, H2), 4.51 (d, J=8.0 Hz, 1H, H1), 4.24 (dd, J=12.3, 4.9 Hz, 1H, H6), 4.10 (dd, J=12.3, 2.5 Hz, 1H, H6), 3.90 (dt, J=9.9, 5.5 Hz, 1H, OCHH), 3.72 (ddd, J=10.0, 4.9, 2.5 Hz, 1H, H5), 3.60 (ddd, J=9.9, 7.8, 5.1 Hz, 1H, OCHH), 2.40 (t, J=6.9 Hz, 2H, CCCH$_2$), 2.05 (s, 3H, CH$_3$), 2.02 (s, 3H, CH$_3$), 2.00 (s, 3H, CH$_3$), 1.97 (s, 3H, CH$_3$), 1.89-1.73 (m, 2H, CCCH$_2$CH$_2$), 1.17-1.00 (m, 21H, Si(CH(CH$_3$)$_2$)$_3$)). $^{13}$C NMR (101 MHz, CD$_2$C$_2$) δ=171.0, 170.5, 169.9, 169.8 (4 C=O), 101.5 (C1), 90.0, 85.9, 81.4 (3 C≡C), 73.2 (C3), 72.4 (C5), 71.8 (C2), 69.0 (C4), 68.7 (C≡C), 66.2 (OCH$_2$), 62.8 (C6), 62.5, 61.7, 61.7, 60.7 (4 C≡C), 28.4 (OCH$_2$CH$_2$), 21.0, 21.0, 21.0, 21.0 (4 COCH$_3$), 18.8 (Si(CH(CH$_3$)$_2$)$_3$), 16.5 (CCCH$_2$), 11.8 (Si(CH(CH$_3$)$_2$)$_3$). IR (ATR) ν 2944, 2866, 2211, 2139, 2059, 1748, 1461, 1428, 1365, 1214, 1169, 1032 (cm$^{-1}$). UV (MeCN, c=3.04 μmol/L) λ$_{max}$ (log ε) 251 (5.18), 240 (5.06), 226 (4.82) nm. [α]$_D^{23}$ 159.94 (c 0.20, MeCN). HRMS (ESI): calcd for C$_{34}$H$_{50}$NO$_{10}$Si ([M+NH$_4$]$^+$) 660.3198; found 660.3204. R$_f$: 0.45 (EtOAc/n-heptane 1:1).

13'-Triisopropylsilylundeca-4',6',8',10',12'-pentaynyl 2,3,4,6-tetra-O-acetyl-β-D-glucopyranoside TAG5

1-Triisopropylsilyl-4-trimethysilylbutadiyne (0.99 g, 3.55 mmol) was dissolved in dry THF (8 mL), cooled to 0° C., and MeLi.LiBr complex (1.60 mL, 2.2 M in Et$_2$O, 3.52 mmol) was added. The cooling bath was removed and the resulting mixture was stirred for 30 min before it was cooled to 0° C. again. ZnCl$_2$ (5.18 mL, 0.7 M in THF, 3.63 mmol) was added, the cooling bath was removed, and the resulting mixture was stirred for 30 min in order to form TIPS-(C≡C)$_2$—ZnCl 2a. In a second flask, 9'-bromonona-4',6',8'-triynyl 2,3,4,6-tetra-O-acetyl-β-D-glucopyranoside 7 (1.02 g, 1.88 mmol) was dissolved in dry toluene (30 mL), and PdCl$_2$(dppf).DCM (75 mg, 0.09 mmol) was added. The two solutions were combined at 0° C., the flask was wrapped with aluminum foil, and the resulting mixture was stirred for 6 h at 0° C. and allowed to warm to room temperature over night. After 30 h at room temperature, the mixture was diluted with Et$_2$O, washed once with saturated NH$_4$Cl solution, and once with saturated NaCl solution. The combined aqueous phases were extracted once with Et$_2$O, and the combined organic phases were dried over MgSO$_4$ and concentrated in vacuo. Column chromatography (silica gel; EtOAc/n-heptane 1:2) yielded TAG5 (0.52 g, 42%) as a light brown syrup. $^1$H NMR (400 MHz, CD$_2$Cl$_2$) δ=5.19 (dd, J=9.6 Hz, 1H, H3), 5.03 (dd, =9.9 Hz, 1H, H4), 4.91 (dd, J=9.7, 8.0 Hz, 1H, H2), 4.51 (d, J=8.0 Hz, 1H, H1), 4.24 (dd, J=12.3, 4.9 Hz, 1H, H6), 4.10 (dd, J=12.3, 2.4 Hz, 1H, H6), 3.90 (dt, J=10.0, 5.5 Hz, 1H, OCHH), 3.72 (ddd, J=10.0, 4.9, 2.5 Hz, 1H, H5), 3.60 (ddd, J=9.9, 7.8, 5.1 Hz, 1H, OCHH), 2.42 (t, J=7.0 Hz, 2H, CCCH$_2$), 2.05 (s, 3H, CH$_3$), 2.02 (s, 3H, CH$_3$), 2.00 (s, 3H, CH$_3$), 1.97 (s, 3H, CH$_3$), 1.87-1.76 (m, 2H, CCCH$_2$CH$_2$), 1.13-1.04 (m, 21H, Si(CH(CH$_3$)$_2$)$_3$)). $^{13}$C NMR (101 MHz, CD$_2$Cl$_2$) δ=170.9, 170.5, 169.9, 169.8 (4 C=O), 101.5 (C1), 89.8, 87.1, 81.2 (3 C≡C), 73.2 (C3), 72.4 (C5), 71.8 (C2), 69.0 (C4), 68.6 (C≡C), 66.1 (OCH$_2$), 63.1, 62.9, 62.5 (3 C≡C), 62.4 (C6), 61.8, 61.6, 60.7 (3 C≡C), 28.4 (OCH$_2$CH$_2$), 21.1, 21.0, 21.0, 21.0 (4 COCH$_3$), 18.8 (Si(CH(CH$_3$)$_2$)$_3$), 16.5 (CCCH$_2$), 11.8 (Si(CH(CH$_3$)$_2$)$_3$). IR (ATR) ν 2943, 2866, 2212, 2102, 2047, 1748, 1460, 1429, 1366, 1215, 1170, 1035 (cm$^{-1}$). UV (MeCN, c=3.19 μmol/L) λ$_{max}$ (log ε) 275 (5.28), 260 (5.17), 247 (4.87) nm. [α]$_D^{23}$ 149.03 (c 0.21, MeCN). HRMS (ESI): calcd for C$_{36}$H$_{50}$NO$_{10}$Si ([M+NH4]$^+$) 684.3198; found 684.3207. R$_f$: 0.45 (EtOAc/n-heptane 1:1).

15'-Triisopropylsilylundeca-4',6',8',10',12',14'-hexaynyl 2,3,4,6-tetra-O-acetyl-β-D-gluco-pyranoside TAG6

Preparation on a 0.5 g Scale.

1-Triisopropylsilyl-6-trimethysilylhexatriyne (577 mg, 1.91 mmol) was dissolved in dry THF (4 mL), cooled to 0° C., and MeLi.LiBr complex (0.84 mL, 2.2 M in Et$_2$O, 1.85 mmol) was added. The cooling bath was removed and the resulting mixture was stirred for 30 min before it was cooled to 0° C. again. ZnCl$_2$ (2.70 mL, 0.7 M in THF, 1.89 mmol) was added, the cooling bath was removed, and the mixture was stirred for 30 min in order to form TIPS-(C≡C)$_3$—ZnCl 3. In a second flask, 9'-bromonona-4',6',8'-triynyl 2,3,4,6-tetra-O-acetyl-β-D-glucopyranoside 7 (0.50 g, 0.92 mmol) was dissolved in dry toluene (15 mL), and PdCl$_2$(dppf).DCM (77 mg, 0.09 mmol) was added. The two solutions were combined at 0° C., the flask was wrapped with aluminum foil, and the resulting mixture was stirred for 6 h at 0° C. and allowed to warm to room temperature over night. PdCl$_2$(dppf).DCM (38 mg, 0.05 mmol) was added. After 72 h at room temperature, the mixture was diluted with Et$_2$O, washed once with saturated NH$_4$Cl solution, and once with saturated NaCl solution. The combined aqueous phases were once extracted with Et$_2$O, and the combined organic phases were dried over MgSO$_4$ and concentrated in vacuo. Column chromatography (silica gel; EtOAc/n-heptane 1:2) yielded TAG6 (0.35 g, 55%) as a brown syrup.

Preparation on a 5 g Scale.

1-Triisopropylsilyl-6-trimethysilylhexatriyne (6.36 g, 21.01 mmol) was dissolved in dry THF (45 mL), cooled to 0° C., and MeLi.LiBr complex (9.3 mL, 2.2 M in Et$_2$O, 20.41 mmol) was added. The cooling bath was removed and the mixture was stirred for 30 min before it was cooled again to 0° C. ZnCl$_2$ (30.02 mL, 0.7 M in THF, 21.01 mmol) was added, the cooling bath was removed, and the mixture was stirred for 30 min in order to form TIPS-(C≡C)$_3$—ZnCl 3. In a second flask, 9'-bromonona-4',6',8'-triynyl 2,3,4,6-tetra-O-acetyl-β-D-glucopyranoside 7 (6.50 g, 0.92 mmol) was dissolved in dry toluene (15 mL), and PdCl$_2$(dppf).DCM (196 mg, 0.24 mmol) was added. The two solutions were combined at 0° C., the flask was wrapped with aluminum foil, and the resulting mixture was stirred for 6 h at 0° C. and allowed to warm to room temperature over night. The mixture was cooled to 0° C. several times over 5 days and PdCl$_2$(dppf).DCM (791 mg, 0.97 mmol) was added in portions of 200-300 mg. Then, the mixture was diluted with Et$_2$O, washed once with saturated NH$_4$Cl solution, and once with saturated NaCl solution. The combined aqueous phases were once extracted with Et$_2$O, and the combined organic phases were dried over MgSO$_4$ and concentrated in vacuo. Column chromatography (silica gel; EtOAc/n-heptane 1:2) yielded TAG6 (3.56 g, 43%) as a brown resin. $^1$H NMR (400 MHz, CD$_2$Cl$_2$) δ=5.19 (dd, J=9.6 Hz, 1H, H3), 5.02 (dd, J=9.7 Hz, 1H, H4), 4.90 (dd, J=9.6, 8.1 Hz, 1H, H2), 4.51 (d, J=8.0 Hz, 1H, H1), 4.24 (dd, J=12.3, 4.8 Hz, 1H, H6), 4.09 (dd, J=12.3, 2.3 Hz, 1H, H6), 3.96-3.82 (m, 1H, OCHH), 3.72 (ddd, J=9.9, 4.6, 2.3 Hz, 1H, H5), 3.60 (ddd, J=9.7, 7.7, 5.2 Hz, 1H, OCHH), 2.42 (t, J=6.9 Hz, 2H, CCCH$_2$), 2.04 (s, 3H, CH$_3$), 2.01 (s, 3H, CH$_3$), 1.99 (s, 3H, CH$_3$), 1.96 (s, 3H, CH$_3$), 1.89-1.73 (m, 2H, CCCH$_2$CH$_2$), 1.17-1.00 (m, 21H, Si(CH(CH$_3$)$_2$)$_3$)). $^{13}$C NMR (101 MHz, CDCl$_3$) δ=170.9, 170.5, 169.9, 169.8 (4 C=O), 101.4 (C1), 89.7, 87.8, 82.1 (3 C≡C), 73.2 (C3), 72.4 (C5), 71.7 (C2), 68.9 (C4), 68.6 (OCH$_2$), 66.2, 63.5, 63.3, 62.9, 62.8, 62.5 (6 C≡C), 62.4 (C6), 61.7, 61.5, 60.6 (3 C≡C), 28.4 (OCH$_2$CH$_2$), 21.0, 21.0, 21.0, 20.9 (4 COCH$_3$), 18.8 (Si(CH(CH$_3$)$_2$)$_3$), 16.6 (CCCH$_2$), 11.8 (Si(CH(CH$_3$)$_2$)$_3$). IR (ATR) ν 2943, 2866, 2208, 2165, 2069, 2037, 1749, 1461, 1427, 1366, 1214, 1169, 1035 (cm$^{-1}$). UV (MeCN, c=3.03 μmol/L) λ$_{max}$ (log ε) 296 (5.46), 280 (5.32), 266 (4.98), 252 (4.64) nm. [α]$_D^{23}$ 150.92 (c 0.21, MeCN). HRMS (ESI): calcd for C$_{38}$H$_{50}$NO$_{10}$Si ([M+NH$_4$]$^+$) 708.3198; found 708.3212. R$_f$: 0.45 (EtOAc/n-heptane 1:1).

4-Tritylphenyl 8-(triisopropylsilyl)octa-5,7-diynoate TPC2

Butyl lithium (2.35 mL, 2.5 M in n-hexane, 5.88 mmol) was added to ethynyltriisopropylsilane (1.09 g, 5.99 mmol) in THF (5 mL) at 0° C., and the resulting mixture was stirred for 10 min. Then ZnCl$_2$ (8.56 mL, 0.7 M in THF, 5.99 mmol) was added at 0° C., and the resulting mixture was again stirred for 30 min in order to form TIPS-C≡C—ZnCl 1. In another flask, 4-tritylphenyl 6-bromohex-5-ynoate 9 (1.0 g, 1.96 mmol) and PdCl$_2$(dppf).DCM (0.16 g, 0.196 mmol) were dissolved in toluene (25 mL). The two solutions were combined at 0° C. and the mixture was stirred for 17 h while warming up to room temperature. After removal of the solvent in vacuo, column chromatography (silica gel; DCM/n-heptane 1:2) yielded TPC2 (812 mg, 1.33 mmol, 68%) as a light brown solid. $^1$H NMR (400 MHz, CD$_2$Cl$_2$): δ=7.31-7.18 (m, 17H, PhH), 7.04-6.97 (m, 2H, PhH), 2.69 (t, J=7.3 Hz, 2H, CH$_2$), 2.46 (t, =6.9 Hz, 2H, CH$_2$), 1.96 (p, J=7.1 Hz, 2H, CH$_2$), 1.09 (s, 21H, Si(CH(CH$_3$)$_2$)$_3$). $^{13}$C NMR (101 MHz, CD$_2$Cl$_2$): δ=171.9 (COOPhTr), 149.2, 147.3, 145.0, 132.5, 131.5, 128.2, 126.5, 121.1 (24C, C—Ar), 90.4, 81.2, 78.1, 67.0 (4C, —C), 65.2 (CTr), 33.6, 23.8, 19.2 (3C, CH$_2$), 18.9 (Si(CH(CH$_3$)$_2$)$_3$), 11.8 (Si(CH(CH$_3$)$_2$)$_3$). Mp: 84-85° C. IR (ATR) ν 3086, 3057, 3030, 2942, 2891, 2864, 2224, 2104, 1758, 1595, 1492, 1461, 1445, 1366, 1310, 1265, 1205, 1170, 1129, 1073, 1035, 1017 (cm$^{-1}$). UV (cyclohexane, c=6.55 μmol/L) λ$_{max}$ (log ε) 203 (4.98) nm. HRMS (MALDI): calcd for C$_{42}$H$_{46}$O$_2$SiNa: ([M+Na]$^+$) 633.3157; found: 633.3189. R$_f$: 0.42 (DCM/n-heptane 1:2).

4-Tritylphenyl 10-(triisopropylsilyl)deca-5,7,9-triynoate TPC3

1-Triisopropylsilylbutadiyne (6.70 g, 32.5 mmol) was dissolved in THF (50 mL), cooled to −78° C., and butyl lithium (12.6 mL, 2.5 M in n-hexane, 31.5 mmol) was added. The cooling bath was removed and the resulting mixture was stirred for 1 h before it was cooled to 0° C. again. ZnCl$_2$ (45.0 mL, 0.7 M in THF, 31.5 mmol) was added, and the resulting mixture was stirred for 30 min at 0° C. and then 1 h at room temperature in order to form TIPS-(C≡C)$_2$—ZnCl 2a. In a second flask, 4-tritylphenyl 6-bromohex-5-ynoate 9 (9.15 g, 18.0 mmol) was dissolved in dry toluene (250 mL), and PdCl$_2$(dppf).DCM (1.50 g, 1.843 mmol) was added. The two solutions were combined at 0° C., the flask was wrapped with aluminum foil, and the resulting mixture was stirred for 6 h at 0° C. and allowed to warm to room temperature over night. Then, the mixture was diluted with Et$_2$O, washed once with saturated NH$_4$Cl solution, and once with saturated NaCl solution. The organic phase was dried over MgSO$_4$ and concentrated in vacuo. Column chromatography (silica gel; DCM/n-heptane 1:2) yielded TPC3 (5.80 g, 51%) as a light brown solid. $^1$H NMR (400 MHz, CDCl$_3$): δ=7.27-7.22 (m, 17H, PhH), 7.01-6.98 (m, 2H, PhH), 2.71 (t, J=7.3 Hz, 2H, CH$_2$), 2.49 (t, J=6.8 Hz, 2H, CH$_2$), 1.99 (p, J=7.1 Hz, 2H, CH$_2$), 1.10 (s, 21H, Si(CH(CH$_3$)$_2$)$_3$). $^{13}$C NMR (101 MHz, CD$_2$Cl$_2$): δ=171.3 (COOPhTr), 148.6, 146.7, 144.5, 132.2, 131.2, 127.7, 126.1, 120.4 (24C, C—Ar), 90.0, 83.7, 78.9, 66.8 (4C, —C), 64.7 (CTr), 61.3, 61.1 (2C, —C), 33.0, 23.3, 18.9 (3C, CH$_2$), 18.6 (Si(CH(CH$_3$)$_2$)$_3$), 11.4 (Si(CH(CH$_3$)$_2$)$_3$). IR (ATR) ν 3086, 3057, 3031, 2943, 2891, 2865, 2210, 2164, 2077, 1759, 1595, 1492, 1461, 1445, 1367, 1335, 1308, 1281, 1206, 1170, 1129, 1072, 1035, 1018 (cm$^{-1}$). Mp: 99-101° C. UV (cyclohexane, c=6.30 μmol/L) λ$_{max}$ (log ε) 222 (4.97), 212 (5.04) nm. HRMS (MALDI): calcd for C$_{31}$H$_{26}$O$_2$Na: 531.0930 ([M+Na]$^+$); found: 531.0923. R$_f$: 0.42 (DCM/n-heptane 1:2).

4-Tritylphenyl 12-(triisopropylsilyl)dodeca-5,7,9,11-tetraynoate TPC4

MeLi.LiBr complex (1.78 mL, 2.2 M in Et$_2$O, 3.93 mmol) was added to 1-triisopropylsilyl-6-trimethylsilylhexatriyne (1.22 g, 4.02 mmol) in THF (10 mL) at 0° C., and the resulting mixture was stirred for 30 min. Then ZnCl$_2$ (5.75 mL, 0.7 M in THF, 4.02 mmol) was added at 0° C., and the resulting mixture was again stirred for 30 min in order to form TIPS-(C≡C)$_3$—ZnCl 3. In another flask, 4-tritylphenyl 6-bromohex-5-ynoate 11 (1.0 g, 1.96 mmol) and PdCl$_2$(dppf).DCM (0.16 g, 0.196 mmol) were mixed in toluene (40 mL). The two solutions were combined at 0° C., and the flask was wrapped with aluminum foil. The mixture was stirred for 2 d while warming up to room temperature before the solvent was removed in vacuo. Column chromatography (silica gel; DCM/n-heptane 1:2) yielded TPC4 (0.84 g, 1.27 mmol, 65%) as a light brown solid. $^1$H NMR (400 MHz, CDCl$_3$): δ=7.30-7.16 (m, 17H, PhH), 7.03-6.94 (m, 2H, PhH), 2.70 (t, J=7.3 Hz, 2H, CH$_2$), 2.50 (t, J=6.9 Hz, 2H, CH$_2$), 1.99 (p, J=7.1 Hz, 2H, CH$_2$), 1.12-1.07 (m, 21H, Si(CH(CH$_3$)$_2$)$_3$). $^{13}$C NMR (101 MHz, CDCl$_3$): δ=171.3 (COOPhTr), 148.6, 146.7, 144.5, 132.3, 131.2, 127.7, 126.2, 120.5, 120.4 (24C, C—Ar), 89.8, 85.2, 79.4, 66.9 (4C, —C), 64.7 (CTr), 62.2, 61.6, 61.0 (4C, —C), 33.0, 23.2, 19.0 (3C, CH$_2$), 18.7 (Si(CH(CH$_3$)$_2$)$_3$), 11.4 (Si(CH(CH$_3$)$_2$)$_3$). IR (ATR) ν 3086, 3057, 3030, 2943, 2891, 2865, 2211, 2138, 2058, 1757, 1595, 1492, 1461, 1444, 1366, 1309, 1205, 1170, 1130, 1034, 1017 (cm$^{-1}$). UV (cyclohexane, c=6.07 μmol/L) λ$_{max}$ (log ε) 252 (4.86), 240 (4.77) nm. HRMS (APPI): calcd for C$_{46}$H$_{46}$O$_2$Si: 658.3267 ([M]$^+$); found: 658.3267. R$_f$: 0.43 (DCM/n-heptane 1:1).

4-Tritylphenyl 14-(triisopropylsilyl)tetradeca-5,7,9,11,13-pentaynoate TPC5

(i) 4-Tritylphenyl 10-(trimethylsilyl)deca-5,7,9-triynoate 10 (0.30 g, 0.55 mmol) was dissolved in dry MeCN (8 mL) and dry DCM (10 mL). The flask was shielded from light with aluminum foil, and N-bromosuccinimide (102 mg, 0.57 mmol) as well as AgF (73 mg, 0.57 mmol) were added. The resulting mixture was stirred for 4 h after which it was diluted with DCM, washed five times with 1 M HCl, and once with saturated NaCl solution. The organic phase was dried over Na$_2$SO$_4$, and concentrated in vacuo to approximately 10 mL while thoroughly shielding it from light. Toluene was added (10 mL), the mixture was concentrated in vacuo, and this solution containing the bromotriacetylene 11 was used without further purification in the next step. (ii) MeLi.LiBr complex (0.74 mL, 2.2 M in Et$_2$O, 1.64 mmol) was added to 1-triisopropylsilyl-4-trimethylsilylbutadiyne (463 mg, 1.66 mmol) in THF (4 mL) at 0° C., and the resulting mixture was stirred for 40 min. Then ZnCl$_2$ (2.37 mL, 0.7 M in THF, 1.66 mmol) was added at 0° C., and the resulting mixture was stirred for additional 3 h in order to form TIPS-(C≡C)$_2$—ZnCl 2a. In a second flask, PdCl$_2$(dppf) DCM (44.5 mg, 0.36 mmol) was added to toluene (70 mL) at 0° C. The toluene solution containing the 4-tritylphenyl 10-bromodeca-5,7,9-triynoate 11 (10 mL, 0.55 mmol) and the zinc acetylide solution were simultaneously added at this temperature, and the flask was shielded from light with aluminum foil. The mixture was stirred for 2 d while slowly warming to room temperature before the solvent was removed in vacuo. Column chromatography (silica gel; DCM/n-heptane 1:2) furnished the 4-tritylphenyl 14-(triisopropylsilyl)tetradeca-5,7,9,11,13-pentaynoate TPC5 (218 mg, 0.32 mmol, 59%) as a brown solid. $^1$H NMR (400 MHz, CDCl$_3$): δ=7.32-7.22 (m, 17H, PhH), 7.05-7.01 (m, 2H, PhH), 2.73 (t, J=7.2 Hz, 2H, CH$_2$), 2.53 (t, J=6.8 Hz, 2H, CH$_2$), 2.03 (p, J=7.1 Hz, 2H, CH$_2$), 1.15-1.08 (m, 21H, Si(CH(CH$_3$)$_2$)$_3$). $^{13}$C NMR (101 MHz, CDCl$_3$): δ=171.2 (COOPhTr), 148.6, 146.7, 144.5, 132.2, 131.2, 127.7, 126.1, 120.4 (24C, C—Ar), 89.7, 86.3, 80.0, 66.8 (4C, —C), 64.7 (CTr), 62.7, 62.5, 62.2, 61.8, 61.6, 61.1 (8C, —C), 33.0, 23.1, 19.0 (3C, CH$_2$), 18.6 (Si(CH(CH$_3$)$_2$)$_3$), 11.4 (Si(CH(CH$_3$)$_2$)$_3$). IR (ATR) v 3086, 3057, 3030, 2943, 2890, 2865, 2211, 2173, 2102, 2047, 1756, 1595, 1492, 1461, 1444, 1367, 1311, 1264, 1205, 1170, 1130, 1071, 1017 (cm$^{-1}$). UV (cyclohexane, c=5.86 μmol/L) λ$_{max}$ (log ε) 277 (5.29), 262 (5.16), 249 (4.84) nm. HRMS (APPI): calcd for C$_{48}$H$_{46}$O$_2$Si: 682.3267 ([M]$^+$); found: 682.3264. R$_f$: 0.54 (DCM/n-heptane 1:1).

4-Tritylphenyl 16-(triisopropylsilyl)hexadeca-5,7,9,11,13,15-hexaynoate TPC6

(i) 4-Tritylphenyl 10-(trimethylsilyl)deca-5,7,9-triynoate 10 (2.00 g, 3.63 mmol) was dissolved in dry MeCN (18 mL) and dry DCM (18 mL). The flask was shielded from light with aluminum foil, and N-bromosuccinimide (679 mg, 3.81 mmol) as well as AgF (484 mg, 3.81 mmol) were added. The resulting mixture was stirred for 28 h after which it was diluted with DCM, washed four times with 1 M HCl, and once with saturated NaCl solution. The organic phase was dried over Na$_2$SO$_4$, and concentrated in vacuo to approximately 10 mL while thoroughly shielding it from light. Toluene was added (15 mL), the mixture was concentrated in vacuo, and this solution containing the bromotriacetylene 11 was used without further purification in the next step. (ii) MeLi.LiBr complex (3.30 mL, 2.2 M in Et$_2$O, 7.26 mmol) was added to 1-triisopropylsilyl-6-trimethylsilylhexatriyne (2.25 g, 7.44 mmol) in THF (15 mL) at 0° C., and the resulting mixture was stirred for 40 min. Then ZnCl$_2$ (10.63 mL, 0.7 M in THF, 7.44 mmol) was added at 0° C., and the resulting mixture was stirred for additional 45 min in order to form TIPS-(C≡C)$_3$—ZnCl 3. In a second flask, PdCl$_2$(dppf).DCM (296 mg, 0.36 mmol) was added to toluene (150 mL) at 0° C. The toluene solution containing the 4-tritylphenyl 10-bromodeca-5,7,9-triynoate 11 (10 mL, 3.63 mmol) and the zinc acetylide solution were simultaneously added at this temperature, and the flask was shielded from light with aluminum foil. After 24 h, the mixture was diluted with Et$_2$O, washed two times with saturated NH$_4$Cl solution, and once with saturated NaCl solution. The organic phase was dried over Na$_2$SO$_4$, and concentrated in vacuo. Column chromatography (silica gel; DCM/n-heptane 1:2) yielded 4-tritylphenyl 16-(triisopropylsilyl)hexadeca-5,7,9,11,13,15-hexaynoate TPC6 (1.13 g, 1.60 mmol, 44%) as a brown solid. $^1$H NMR (400 MHz, CD$_2$Cl$_2$): δ=7.29-7.18 (m, 17H, PhH), 7.00-6.96 (m, 2H, PhH), 2.67 (t, J=7.3 Hz, 2H, CH$_2$), 2.51 (t, J=6.9 Hz, 2H, CH$_2$), 1.97 (p, J=7.1 Hz, 2H, CH$_2$), 1.11-1.07 (m, 21H, Si(CH(CH$_3$)$_2$)$_3$). $^{13}$C NMR (101 MHz, CD$_2$Cl$_2$): δ=171.6 (COOPhTr), 149.2, 147.3, 147.3, 145.1, 132.5, 131.5, 128.2, 126.5, 121.0 (24C, C—Ar), 89.7, 87.9, 81.6, 66.6 (4C, ≡C), 65.2 (CTr), 63.4, 63.2, 62.9, 62.7, 62.6, 61.8, 61.4, 60.8 (8C, —C), 33.4, 23.5, 19.5 (3C, CH$_2$), 18.8 (Si(CH(CH$_3$)$_2$)$_3$), 11.8 (Si(CH(CH$_3$)$_2$)$_3$). IR (ATR) v 3086, 3057, 3030, 2943, 2891, 2865, 2209, 2166, 2069, 2038, 1759, 1595, 1493, 1461, 1445, 1367, 1325, 1206, 1170, 1131, 1073, 1018 (cm$^{-1}$). UV (cyclohexane, c=5.66 μmol/L) λ$_{max}$ (log ε) 299 (5.47), 282 (5.33), 267 (4.98) 254 (4.58) nm. HRMS (ESI): calcd for C$_{50}$H$_{50}$NO$_2$Si: 724.3605 ([M+NH$_4$]$^+$); found: 724.3616. R$_f$: 0.45 (DCM/n-heptane 1:1).

15'-Triisopropylsilylpentadeca-4',6',8',10',12',14'-hexynyl β-D-glucopyranoside GLU6-TIPS In a flask shielded from light with aluminum foil, 15'-triisopropylsilylpentadeca-4',6',8',10',12',14'-hexynyl 2,3,4,6-tetra-O-acetyl-β-D-glucopyranoside TAG6 (10.5 mg, 0.015 mmol) was dissolved in 1,4-dioxane (2 mL). MeOH (0.4 mL). NaOMe (1 mg, 0.017 mmol) was added, and the resulting mixture was stirred for 2 h. Then, Amberlite IR-120 (H$^+$) was added until the solution was neutralized, and the resulting mixture was stirred for 30 min. The solution was filtered from the Amberlite and transferred into a brown glass vial using a syringe with a fine needle. The crude compound was purified by column chromatography (silica gel; EtOAc/MeOH 4:1). Removal of the solvent by freeze-drying yielded GLU6-TIPS as a yellow oil that was immediately redissolved in dioxane/MeOH and stored in the refrigerator. $^1$H NMR (400 MHz, DMSO) δ=5.01 (d, J=4.8 Hz, 1H, OH), 4.93 (d, J=4.8 Hz, 1H, OH), 4.89 (d, J=5.0 Hz, 1H, OH), 4.47 (dd, J=5.9 Hz, 1H, OH), 4.09 (d, J=7.8 Hz, 1H, H1), 3.78 (dt, J=6.0 Hz, 10.2 Hz, 1H, OCHH), 3.65 (ddd, J=1.9 Hz, 5.6 Hz, 11.6 Hz, 1H, H6), 3.54-3.37 (m, 2H, OCHH and H6), 3.15-2.98 (m, 3H, H3, H4, H5), 2.92 (ddd, J=4.8 Hz, 7.9 Hz, 8.9 Hz, 1H, H2), 2.59 (t, J=7.1 Hz, 2H, CCCH$_2$), 1.83-1.71 (m, 2H, CCCH$_2$CH$_2$), 1.09-1.01 (m, 21H, Si(CH(CH$_3$)$_2$)$_3$). $^{13}$C NMR (101 MHz, DMSO) δ=102.8, 88.6, 87.9, 84.7, 76.8, 76.6, 73.4, 70.0, 66.9, 64.5, 63.7, 63.0, 62.3, 62.1, 61.7, 61.0, 60.9, 60.7, 59.3, 27.6, 18.3, 15.6, 10.6. IR (ATR) v 3337, 2944, 2925, 2889, 2866, 2244, 2209, 2165, 2088, 2068, 2039, 1717, 1648, 1597, 1460, 1366, 1250, 1207, 1159, 1072, 1032, 1017 (cm$^{-1}$). HRMS (ESI): calcd for C$_{30}$H$_{38}$NaO$_6$Si ([M+Na]$^+$) 545.2330; found 545.2333. R$_f$: 0.09 (EtOAc).

Methyl 16-(triisopropylsilyl)hexadeca-5,7,9,11,13,15-hexaynoate MEC6-TIPS

In a flask shielded from light with aluminum foil 4-tritylphenyl-16-(triisopropylsilyl)hexadeca-5,7,9,11,13,15-hexaynoate TPC6 (240 mg, 0.340 mmol) was dissolved in DCM (5 mL) and MeOH (1 mL). NaOMe (45 mg, 0.833 mmol) was added, and the resulting mixture was stirred for 3 h. NaOMe (20 mg) was added, and the mixture was again stirred for 2 h. Then, Amberlite IR-120 (H+) was added until the solution was neutralized, and the resulting mixture was stirred for 1 h. The Amberlite was filtered off, and the solution was transferred into a brown glass vial using a syringe with a fine needle. The crude compound was purified by column chromatography (silica gel; DCM). Removal of the solvent by freeze-drying yielded MEC6-TIPS as a yellow oil that was immediately redissolved in dioxane/MeOH and stored in the refrigerator. $^1$H NMR (400 MHz, CDCl$_3$) δ=3.68 (s, 3H, CH$_3$), 2.43 (dt, J=7.0 Hz, 4.8 Hz, 4H, 2 CH$_2$), 1.88 (p, J=7.1 Hz, 2H, CH$_2$), 1.09-1.01 (m, 21H, Si(CH (CH$_3$)$_2$)$_3$). $^{13}$C NMR (101 MHz, CDCl$_3$)=173.5 (COOCH$_3$), 89.9, 87.3, 81.0, 69.9, 63.3, 63.2, 62.9, 62.9, 62.7, 62.1, 61.8, 61.2 (12C, ≡C), 52.2 (COOCH$_3$), 33.0, 23.5, 19.5 (3C, CH$_2$), 19.0 (Si(CH(CH$_3$)$_2$)$_3$), 11.7 (Si(CH(CH$_3$)$_2$)$_3$). IR (ATR) ν 2944, 2894, 2866, 2209, 2173, 2081, 2038, 1739, 1460, 1435, 1420, 1364, 1317, 1256, 1206, 1153, 1071, 1017, 1000 (cm$^{-1}$). R$_f$: 0.83 (DCM).

Octadeca-4,6,8,10,12,14-hexayne-1,18-diyl bis(2,3,4,6-tetra-O-acetyl-β-D-glucopyranoside) TAG6TAG In a flask shielded from light with aluminum foil, 9'-trimethylsilylnona-4',6',8'-triynyl 2,3,4,6-tetra-O-acetyl-β-D-glucopyranoside 6 (1.00 g, 1.88 mmol) was dissolved in THF (20 mL) and water (10 mL). CsF (370 mg, 2.44 mmol) was added, and the resulting mixture was stirred for 2 h. The mixture was diluted with water (50 mL), and then extracted with ethyl acetate (three times 100 mL). The combined organic phases were dried over Na$_2$SO$_4$, concentrated in vacuo to a volume of 10 mL, and filtered through a plug of silica using DCM as the eluent. The combined fractions were concentrated in vacuo to a volume of 50 mL, Cu (OAc)$_2$.H$_2$O (1.88 g, 9.40 mmol) and 2,6-dimethylpyridine (6.6 mL, 56.40 mmol) were added, and the resulting mixture was stirred for 24 h. To this mixture 1 M HCl (100 mL) was added and the aqueous layer was extracted with DCM. The combined organic phases were washed with saturated NaCl solution, dried over Na$_2$SO$_4$, and concentrated in vacuo. Column chromatography (silica gel; DCM→DCM/acetone 10:1) yielded TAG6TAG (630 mg, 73%) as a light brown solid. $^1$H NMR (400 MHz, CDCl$_3$): δ=5.20 (dd, J=9.5 Hz, 1H, H3), 5.07 (dd, J=9.7 Hz, 1H, H4), 4.97 (dd, J=9.6, 8.1 Hz, 1H, H2), 4.49 (d, J=8.0 Hz, 1H, H1), 4.26 (dd, J=12.3, 4.7 Hz, 1H, H6), 4.13 (dd, J=12.3, 2.2 Hz, 1H, H6), 3.93 (dt, J=10.2, 5.3 Hz, 1H, OCHH), 3.75-3.64 (m, 1H, H5), 3.65-3.50 (m, 1H, OCHH), 2.41 (t, J=6.7 Hz, 2H, CCCH$_2$), 2.09 (s, 3H, CH$_3$), 2.05 (s, 3H, CH$_3$), 2.02 (s, 3H, CH$_3$), 2.00 (s, 3H, CH$_3$), 1.95-1.70 (m, 2H, CCCH$_2$CH$_2$). $^{13}$C NMR (101 MHz, CDCl$_3$): δ=170.8, 170.4, 169.6, 169.5 (4 C=O), 101.1 (C1), 80.7 (C≡C), 72.9 (C3), 72.0 (C5), 71.4 (C2), 68.5 (C4), 68.1 (OCH$_2$), 66.2 (C≡C), 62.6, 62.5 (2 C≡C), 62.0 (C6), 61.8, 60.7 (2 C≡C), 27.9 (OCH$_2$CH$_2$), 20.9, 20.8, 20.8, 20.7 (4 COCH$_3$), 16.1 (CCCH$_2$). HRMS (APPI): calcd for C$_{46}$H$_{50}$O$_{20}$: 922.2895 ([M]$^+$); found: 922.2892. R$_f$: 0.76 (DCM/Acetone 10:1).

Octadeca-4,6,8,10,12,14-hexayne-1,18-diyl bis(β-D-glucopyranoside) GLU6GLU

Octadeca-4',6',8',10',12',14'-hexayne-1',18'-diyl bis(2,3,4,6-tetra-O-acetyl-β-D-glucopyranoside) TAG6TAG (100 mg, 0.108 mmol) was dissolved in 1,4-dioxane (20 mL) and MeOH (4 mL). NaOMe (15 mg, 0.245 mmol) was added, and the resulting mixture was stirred for 3 h. Then, Amberlite IR-120 (H+) was added until the solution was neutralized, and the resulting mixture was stirred for 30 min. The solution was filtered from the Amberlite and transferred into a brown glass vial using a syringe with a fine needle. The crude compound was purified by column chromatography (silica gel; EtOAc/MeOH 3:1). Removal of the solvent by freeze-drying yielded GLU6GLU as a yellow solid that was immediately redissolved in dioxane/MeOH and stored in the refrigerator. $^1$H NMR (400 MHz, MeOD) δ=4.25 (d, =7.4 Hz, 1H), 4.00-3.91 (m, 1H), 3.85 (d, J=11.8 Hz, 1H), 3.71-3.58 (m, 2H), 3.40-3.24 (m, 3H), 3.16 (t, J=8.2 Hz, 1H), 2.55 (t, J=6.5 Hz, 2H), 1.92-1.81 (m, 2H). $^{13}$C NMR (101 MHz, MeOD) δ=104.4, 83.4, 78.0, 77.9, 75.1, 71.6, 69.0, 65.8, 63.7, 62.9, 62.7, 61.7, 60.3, 29.3, 16.8. R$_f$: 0.26 (EtOAc/MeOH 3:1).

(T,T)-[3]{[Octadeca-4,6,8,10,12,14-hexayne-1,18-diyl bis(β-D-glucopyranoside)]-rotaxa-[2] [α-cyclodextrin]} GLU6GLU.2 CD In a flask shielded from light with aluminum foil, 9'-trimethylsilylnona-4',6',8'-triynyl 2,3,4,6-tetra-O-acetyl-β-D-glucopyranoside 6 (70 mg, 0.131 mmol) was dissolved in diethyl ether (1 mL) and MeOH (0.2 mL). NaOMe (2.2 mg, 0.04 mmol) was added, and the resulting mixture was stirred for 2 h. Then, Amberlite IR-120 (H+) was added until the solution was neutralized, and the resulting mixture was stirred for 1 h. The Amberlite was filtered off, and the solution was transferred into a brown glass vial using a syringe with a fine needle. MeOH (0.3 mL) was added to rinse the flask. An aqueous solution of α-cyclodextrin (0.1 mol/L, 6.9 mL) was added to this solution, and the resulting mixture was heated to 45° C. for 3 h under a slight argon stream in order to remove the diethyl ether. The mixture was then cooled to room temperature, CuBr$_2$ (79 mg, 0.354 mmol) and TMEDA (41 mg, 0.354 mmol) were added, and the reaction mixture was stirred for 2 d. A precipitate formed that was filtered off and purified by column chromatography on a Sephadex G25 column (water) and subsequently by reverse-phase HPLC. [3]Rotaxane GLU6GLU.2 CD was obtained as a slightly yellow solid (68 mg, 21%). $^1$H NMR (400 MHz, D$_2$O) δ=5.11 (d, J=3.3 Hz, 12H, H CD), 4.50 (d, J=7.9 Hz, 2H), 4.11-3.64 (m, 72H CD+8H), 3.59-3.46 (m, 4H), 3.45-3.37 (m, 2H), 3.31 (dd, J=9.3 Hz, 8.0 Hz, 2H), 2.76-2.68 (m, 4H), 2.00 (p, J=6.3 Hz, 4H). $^{13}$C NMR (101 MHz, D$_2$O) δ=102.3 (CD), 101.7, 84.3, 80.5 (CD), 75.8, 75.6, 73.8 (CD), 73.2, 72.0 (CD), 71.7 (CD), 69.6, 68.3, 64.2, 63.3, 61.1, 60.7, 59.6 (CD), 58.0, 27.9, 15.7. MS (MALDI): calcd for C$_{102}$H$_{154}$NaO$_{72}$ ([M+Na]$^+$) 2553.8; found 2553.2.

The invention claimed is:

1. A method for the manufacture of a coating comprising at least one coating layer on a substrate, said method comprising the steps of
   a. providing monomers of the type R—(N)$_x$-(L)$_m$-(C≡C)$_n$-(L')$_o$-(N')$_y$-R', wherein
      R is a head moiety wherein R is selected from the group consisting of phosphonic acid and its derivatives, phosphate and its derivatives, carboxy, ester, hydroxyl, mercapto, oligoethylenoxy, oxiranyl, trihalosilyl and trialkoxysilyl,
      R' is a tail moiety wherein R' is selected from the group consisting of unbranched alkyl, unbranched perfluoroalkyl, phosphonic acid and its derivatives, phosphate and its derivatives, mercapto, oligoethylenoxy, oxiranyl, trihalosilyl, and trialkoxysilyl,
      (C≡C)$_n$ is an oligoyne moiety,
      L and L' are linker moieties,
      N and N' independently are branched or unbranched optionally substituted C$_1$-C$_{25}$ alkyl moieties optionally containing 1 to 5 heteroatoms,
      x, m, o, and y are independently 0 or 1,
      n is 4, 5, 6, 7, or 8, and
   wherein said head moiety allows for an interaction with a surface of said substrate;
   b. bringing said monomers into contact with said substrate wherein said interaction of said head moieties of said monomers with the surface of said substrate induces at least a part of said monomers to align in a defined manner thereby forming a film on said surface and bringing said oligoyne moieties of said monomers into close contact with each other;

c. depositing a layer of an additional substrate on said film;

d. inducing a reaction between oligoyne moieties by providing an external stimulus so as to at least partially cross-link said aligned monomers, thereby forming a coating layer on said substrate;

e. transferring the at least one coating layer from said substrate to a different substrate, wherein said substrate is a liquid substrate.

2. The method according to claim 1, characterized in that said monomers are brought into contact with said substrate in solution in a solvent that is immiscible with water.

3. The method according to claim 1, characterized in that said linker components L and/or L' are independently selected from the group consisting of methylene, ethylene, propylene, butylene, and pentylene.

4. The method according to claim 1, characterized in that said tail moiety R' allows for an interaction with a surface of said additional substrate.

5. The method according to claim 1, characterized in that said head moiety R and said tail moiety R' are identical.

6. The method according to claim 1, characterized in that said interaction of said head moiety R of said monomers with said surface of said substrate is specific binding.

7. The method according to claim 6, characterized in that said specific binding allows for reversible and/or dynamic bond formation between said head moiety R and said surface of said substrate at room temperature.

8. The method according to claim 7, characterized in that said specific binding allows for the formation of covalent or non-covalent bonds between said head moieties R and said surface using said head moieties R of said monomers as ligands that have an affinity to a matching receptor site on said surface.

9. The method according to claim 7, characterized in that
(i) the strength of said bonds of said specific binding is from 5 kJ/mol to 460 kJ/mol, from 10 kJ/mol to 200 kJ/mol, or from 10 kJ/mol to 100 kJ/mol; or
(ii) at least part of said monomers align such on said surface that a diffractogram measured in the plane of said film displays at least a first-order reflection.

10. The method according to claim 1, characterized in that
(i) at least part of said monomers align such on said surface that the centers of gravity of said oligoyne moieties of said monomers are on a regular lattice within the immediate surroundings of a monomer;
(ii) said close contact of said oligoyne moieties of said monomers is van-der-Waals contact;
(iii) said head moieties R of said monomers are in contact with said surface of said substrate;
(iv) said oligoyne moieties of said monomers are substantially devoid of contact with said surface of said substrate; and
(v) each monomer has a long axis defined as the axis through the two carbon atoms of said oligoyne moiety that are farthest apart from each other and that said monomers are oriented with their respective long axes standing up from said surface of said substrate.

11. The method according to claim 10, characterized in that said immediate surroundings at least one of said monomers is within a radius of at least 0.5 nm from the center of gravity of the oligoyne moiety of that monomer.

12. The method according to claim 10, characterized in that said immediate surroundings at least one of the monomers is within a radius of at least 1 nm from the center of gravity of the oligoyne moiety of that monomer.

13. The method according to claim 1, characterized in that said film on said surface has a thickness of from 0.1 to 500 nm.

14. The method according to claim 1, characterized in that said external stimulus is heat, electromagnetic irradiation, and/or a chemical radical initiator.

15. The method according to claim 1, characterized in that said reaction between oligoyne moieties is a carbonization reaction.

16. The method according to claim 1, characterized in that said different substrate is selected from the group consisting of glass, quartz, indium tin oxide, ceramics, mica, brass, aluminum, steel, iron, tin, solder, titanium, magnesium, zinc, chrome, copper, nickel, silicon, cobalt, tantalum, zirconium and oxides and chalcogenides thereof, silver, gold, platinum, palladium, osmium, and alloys thereof, silver oxide, polymers such as epoxy resins, polyesters, poly(ethylene terephthalate), poly(ethylene naphthalate), poly(lactic acid), polyamides, polyurethanes, poly(vinylic) polymers, poly (vinyl alcohol), poly(vinyl acetate), poly(vinylidene chloride), polyolefins, dienic polymers, poly(isoprene), poly (methacrylate)s, and poly(acrylate)s.

17. The method according to claim 1, characterized in that
(i) said coating layer on said substrate has a thickness of from 0.1 to 500 nm; or
(ii) said coating layer on said substrate comprises an atomically dense carbon layer.

18. A coating obtainable by a method according to claim 1.

19. The method according to claim 1, characterized in that said coating layer on said substrate has a thickness of from 0.3 to 30 nm.

20. A method for the manufacture of a coating comprising at least one coating layer on a target substrate, said method comprising the steps of a. providing monomers of the type R—(N)$_x$-(L)$_m$-(C≡C)$_n$-(L')$_o$-(N')$_y$-R', wherein R is a head moiety wherein R is selected from the group consisting of phosphoric acid and its derivatives, phosphate and its derivatives, carboxy, ester, hydroxyl, mercapto, oligoethylenoxy, oxiranyl, trihalosilyl, and trialkoxysilyl, R' is a tail moiety wherein R' are selected from the group consisting of unbranched alkyl, unbranched perfluoroalkyl, phosphonic acid and its derivatives, phosphate and its derivatives, mercapto, oligoethylenoxy, oxiranyl, trihalosilyl, and trialkoxysilyl, (C≡C)$_n$ is an oligoyne moiety, L and L' are linker moieties, N and N' independently are branched or unbranched optionally substituted $C_1$-$C_{25}$ alkyl moieties optionally containing 1 to 5 heteroatoms, x, m, o, and y are independently 0 or 1, n is 4, 5, 6, 7, or 8, and wherein said head moiety allows for an interaction with the surface of an auxiliary substrate and/or with the surface of said target substrate;

b. bringing said monomers into contact with said auxiliary substrate wherein said interaction of said head moieties of said monomers with the surface of said auxiliary substrate induces at least a part of said monomers to align in a defined manner thereby forming a film on said surface of said auxiliary substrate and bringing said oligoyne moieties of said monomers into close contact with each other;

c. optionally, reducing the surface area of said surface of said auxiliary substrate;

d. depositing a layer of the target substrate on said film; and e. inducing a reaction between oligoyne moieties by providing an external stimulus so as to at least partially cross-link said aligned monomers, thereby forming a coating layer on said target substrate, wherein said auxiliary substrate is a liquid substrate.

21. The method according to claim 20, characterized in that said target substrate is a liquid substrate.

22. The method according to claim 20, characterized in that said monomers have the formula $CH_3-O-C(=O)-(CH_2)_3-(C\equiv C)_n-C_{12}H_{25}$.

* * * * *